United States Patent [19]

Fuccio et al.

[11] Patent Number: 5,249,281
[45] Date of Patent: Sep. 28, 1993

[54] TESTABLE RAM ARCHITECTURE IN A MICROPROCESSOR HAVING EMBEDDED CACHE MEMORY

[75] Inventors: Michael Fuccio, Santa Clara; Sanjay Desai, Sunnyvale, both of Calif.

[73] Assignee: LSI Logic Corporation, Milpitas, Calif.

[21] Appl. No.: 596,986

[22] Filed: Oct. 12, 1990

[51] Int. Cl.[5] .................. G06F 13/00; G06F 11/00; G11C 29/00
[52] U.S. Cl. ..................... 395/425; 364/DIG. 1; 364/240; 364/243.41; 395/575; 365/201
[58] Field of Search ............... 395/425, 575; 364/DIG. 1; 365/49, 201, 189.04

[56] References Cited

U.S. PATENT DOCUMENTS

| | | |
|---|---|---|
| 4,161,024 | 7/1979 | Joyce et al. ............... 364/200 |
| 4,575,792 | 3/1986 | Keeley ....................... 395/575 |
| 4,686,621 | 8/1987 | Keeley et al. ............. 395/575 |
| 4,882,673 | 11/1989 | Witt ........................... 364/200 |
| 4,937,738 | 6/1990 | Uchiyama et al. ......... 364/200 |
| 4,937,781 | 6/1990 | Lee et al. .................. 364/900 |
| 4,945,472 | 7/1990 | Sakamura et al. ........ 364/200 |
| 4,945,512 | 7/1990 | DeKarske et al. ........ 365/49 |

*Primary Examiner*—Alyssa H. Bowler
*Attorney, Agent, or Firm*—Gerald E. Linden; Michael D. Rostoker

[57] ABSTRACT

A microprocessor with embedded cache memory is disclosed. In a "test mode" of operation, caches are accessed directly from the memory interface signals. Direct writing and reading to/from the instruction and data caches allows the testing of the functionality of the cache memory arrays. External memory interface is granted to an external master via a bus arbitration mechanism so that the test mode operation can be utilized.

2 Claims, 13 Drawing Sheets

SIGNAL TABLE

| NAME | I/O | FROM/ TO | CLASS | DESCRIPTION |
|---|---|---|---|---|
| ZIIA(31:2) | I | BIU/ | 2S | INSTRUCTION ADDRESS BUS |
| ZDDA(31:2) | I | BIU/ | 2V | DATA ADDRESS BUS |
| ZIB(31:0) | I/O | /CPU/ | IV | INSTRUCTION BUS(SETUP=5.5ns) |
| ZDATA(31:0) | I/O | /CPU/ | 2V | DATA BUS (SETUP= 6:6ns) |
| ZIHPMN | O | /BIU | IV | INSTRUCTION HIT/MISS |
| ZDHPMN | O | /BIU | IV | DATA HIT/MISS |
| ZISELP | I | BIU/ | IS | INSTRUCTION CACHE SELECT |
| ZDSELP | I | BIU/ | IS | DATA CACHE SELECT |
| ZWEBN(3:0) | I | BIU/ | 2S | DATA WRITE ENABLES |
| ZIREFILLP | I | BIU/ | IV | ICACHE REFILL |
| ZDREFILLP | I | BIU/ | IV | DCACHE REFILL |
| ZIRFLSTBN | I | BIU/ | IV | ICACHE REFILL DATA VALID STROBE |
| ZDRFLSTBN | I | BIU/ | IV | DCACHE REFILL DATA VALID STROBE |
| ZINOBLKN | I | BIU/ | 2V | SINGLE WORD INSTRUCTION REFILL |
| ZDNOBLKN | I | BIU/ | 2V | SINGLE WORD DATA WORD REFILL |
| ZIBLKSZ(1:0) | I | BIU/ | IS | INSTRUCTION BLOCK REFILL SIZE |
| ZDBLKSZ(1:0) | I | BIU/ | IS | DATA BLOCK REFILL SIZE |
| ZIWEN | I | BIU/ | IS | INSTRUCTION CACHE WRITE ENABLE |
| ZITESTP | I | BIU/ | IV | INSTRUCTION CACHE TEST MODE |
| ZDTESTP | I | BIU/ | IV | DATA CACHE TEST MODE |
| ZSNOOPINGP | I | BIU/ | IV | SNOOPING MODE |
| ZCERRORP | I | BIU/ | | ERROR ON REFILL |
| ZHIGHZN | I | BIU/ | 2S | TRI-STATE ON POWER UP |
| ZRESETN | I | BIU/ | 2S | RESET |
| ZSYSCLK | I | BIU/ | | SYSTEM CLOCK |
| ZICINVP | I | CPU/ | 2S | INSTRUCTION CACHE INVALIDATE |
| ZDCINVP | I | CPU/ | 2S | DATA CACHE INVALIDATE |
| ZILINVN | I | CPU/ | 2S | INSTRUCTION LINE INVALIDATE |
| ZDLINVN | I | CPU/ | 2S | DATA LINE INVALIDATE |

*FIG. 7B*

TESTABLE RAM ARCHITECTURE IN A MICROPROCESSOR HAVING EMBEDDED CACHE MEMORY

CROSS-REFERENCE TO RELATED APPLICATIONS

Attention is directed to copending, commonly-owned U.S. patent application No. 07/596,680 entitled EMBEDDED MEMORY CONTROL ARCHITECTURE FOR MICROPROCESSORS, filed on even date herewith by Michael Fuccio and Robert Caulk.

TECHNICAL FIELD

The present invention relates to microprocessors and, more particularly, to those having on-chip (embedded) cache memory.

BACKGROUND OF THE INVENTION

Modern microprocessors often have embedded cache memory and cache memory control to allow for faster read/write access to main memory. Typically, cache memory is SRAM-based (Static Random Access Memory), having access times on the order of 20 nanoseconds (ns), and the main memory is DRAM-based (Dynamic Random Access Memory), having access times on the order of 80-150 ns. While SRAM is generally faster, it is generally more expensive than DRAM. However, the cost/performance tradeoff can be minimized by using a relatively small cache (e.g., 32 Kbytes) to provide quick access to blocks of a relatively large main memory. Various algorithms are known and employed to manage cache operation, but the present invention is not limited by the choice of algorithm.

U.S. Pat. No. 4,945,512, issued Jul. 31, 1990, discloses a high speed associative cache memory wherein each of four data array boards comprise a quarter word data array, a full tag array and a memory address register. Each (quarter word) data array board also includes a match comparator for comparing the tag portion of the memory address to the output of the tag array, and generates four tag compare signals which are applied to monitoring and error detection circuits.

U.S. Pat. No. 4,945,472, issued Jul. 31, 1990, discloses a data processor with I/O area detection, and is illustrative of a data processing system having a data processor, memory, and I/O interface, all of which are interconnected via an address bus, a data bus and a control bus.

U.S. Pat. No. 4,937,781, issued Jun. 26, 1990, discloses a dual port ram with arbitration status register, and is illustrative of a multi-port RAM having an array of memory locations for storing data, with each of the memory locations having an address associated therewith.

U.S. Pat. No. 4,937,738, issued Jun. 26, 1990, discloses a data processing system which selectively bypasses a cache memory in fetching information based upon bit information of an instruction, wherein a particular region of memory is assigned for data that is to be used repeatedly. When data is to be read out from other regions, operation of the memory is executed immediately without waiting for the reference of cache memory.

These patents are cited as representative of the general state of the art dealing with cache memory management.

FIG. 1 shows a typical cache architecture 100. Main memory (not shown) is accessed by a microprocessor (not shown) over an address bus 102 and a data bus 104. In this example, the address bus 102 is 32 bits wide (A31..A0), for accessing up to a gigabyte of main memory, and the data bus is 32 bits wide (D31..D0).

Cache memory 106 is divided into portions (parts)—a "data" part 108 and a "tag" part 110. In this example, the size of the data part 108 is 32K × 32 (for storing 32K 32-bit words). In practice, the 32K × 32 data part 108 may be formed as a 128K × 8 SRAM array.

When, for instance, a data write cycle is initiated, a low order portion (A16..A2) of the (main memory) address is provided to the data part 108. This may involve stripping the low order portion of the address off a full 32-bit data bus, or by providing separate low order (AdrLo) and high order (AdrHi) portions of the address bus. The low order portion (A16..A2) of the address corresponds on a one-to-one basis with the 32K physical locations (P14..P0) in the data part 108, and is used to select one of those locations, or "cells", for example location "AF73-data" (hex), for storing a data word. (The first two bits A0,A1 of the address may be used for byte gathering, i.e. for assembling four 8-bit bytes into a 32 bit word.) The 32-bit data word (D0..D31) corresponding to the full address is provided over the data bus 104 to the selected location ("AF73-data") in the data part 108.

The tag part 110 has 32K physical locations (T14..T0). The higher order portion (A31..A17) of the address (A0..A30) is provided to the tag part 110 in a location corresponding on a one-to-one basis to the selected location (AF73-data) of the stored data in the data part 108. In this example, the higher order portion of the address (A31..A17) would be stored in location "AF73-tag" in the tag part 110.

Evidently, the tag part 110 can be smaller than the data part 108. In this example, the tag part is 32K × 14.

Hence, the total address (A31..A0) is ultimately represented by corresponding physical locations in the data and tag parts (AF73-data=AF73-tag=A16..A2), and the higher order portion (A31..A17) stored in the tag part.

Data stored in cache memory can be either "data" or "instructions". In many cases, cache memory is segmented into a "data" cache (DCache) having a data part and a tag part, and an "instruction" cache (ICache) having a data part (containing "instructions") and a tag part. Functionally, the data cache and instruction cache operate identically, although they may be sized differently. For tee most part hereinafter, discussion directed to data cache is applicable to instruction cache.

Evidently, verifying proper operation of an embedded cache is more difficult than testing an external cache. Nevertheless, testing the data (or instruction) part is relatively straightforward. The contents of selected locations of the data part 112 are read, or tested (by the microprocessor, not shown) against what was written thereto.

Testing the tag part is somewhat more involved. Typically, to verify operation of the tag part, a read operation is initiated, such as by providing an address over the address bus 102. The stored tag (T14..T0) is compared in a comparator 112 with the higher order portion of the address (A31..A17), taken directly from the bus. If they compare, a "hit" signal issues from the comparator. If they mis-match, a "miss" signal issues.

It is virtually a necessity to exercise and test the integrity of cache memory. In the past, this has involved testing the memory (RAM) off-line. In the context of an embedded cache memory, such as disclosed herein, existing testing techniques are not feasible.

DISCLOSURE OF THE INVENTION

It is therefore an object of the present invention to provide a testable cache memory and, more broadly speaking, a testable RAM architecture in a microprocessor-based system, particularly in a system where the cache is embedded, or on-chip with the microprocessor.

It is also an object of the present invention to provide a technique for testing cache memory, particularly the RAMs thereof, in a microprocessor-based system.

It is a further object of the invention to provide a testable cache RAM structure without making the RAM structure bigger and/or slower.

It is a further object of the invention to provide a testable cache memory without significantly increasing the I/O pin count.

According to the invention, a microprocessor chip includes a central processing unit (CPU), cache control, cache memory and a bus interface unit (BIU). A special test mode of operation is provided for the cache controller and the bus interface unit. The test mode is initiated by an external tester which then directly accesses the cache to read or write the data (or instruction) and tag parts thereof. Once access is made, the tester can verify the integrity of the individual RAMs by writing and reading patterns.

The test mode of operation is entered when the BIU grants a "Test Mode Read" or "Test Mode Write" request for either the instruction or the data cache. There are 4 types of "test" mode requests: 1) Instruction Cache Test Mode Read; 2) Instruction Cache Test Mode Write; 3) Data Cache Test Mode Read; and 4) Data Cache Test Mode Write.

Once its request is granted, the tester provides an address to the BIU of the cache location to be tested. The BIU passes this address to the cache controller which uses it to access the proper location in the tag part. For a "Test Mode Write" request, the tester also provides the BIU with a "bit pattern" to be written. The BIU passes this bit pattern to the cache controller which will write it at the addressed location. If it is a "Test Mode Read" request, the cache controller will provide the BIU with the bit pattern stored at the addressed location along with a cache "Hit/Miss" signal. The BIU passes this bit pattern and the "Hit/Miss" signal to the tester.

Further according to the invention, the cache comparator itself can be tested for proper operation by "forcing" misses at specific locations in cache, and checking for appropriate comparator output. In other words, if one bit pattern is written to a cache location, and a different bit pattern is provided with a read request, the comparator should issue a "miss" signal.

Other objects, features and advantages of the present invention will become evident in light of the following description thereof.

In the description, the following terms and abbreviations are or may be used: central processing unit, or processor (CPU), Random Access Memory (RAM), Dynamic RAM (DRAM), Static RAM (SRAM), Input/Output (I/O), kilo (k). Further various signals are designated by generally accepted acronyms, such as enable (EN), read (RD), write (WR), fetch (FTCH), memory (M), data (D), instruction (I), test (TEST), acknowledge (ACK), block (BLK), etc., which may be compounded to provide descriptive signal names. In some cases, these signals are followed by a notation [##:#] or (B##..B#) which indicates byte-wide signals, and their bit count.

BRIEF DESCRIPTION OF THE DRAWINGS

FIG. 7B Table of signals related to the test mode of operation.

DETAILED DESCRIPTION OF THE INVENTION

Figure 1:
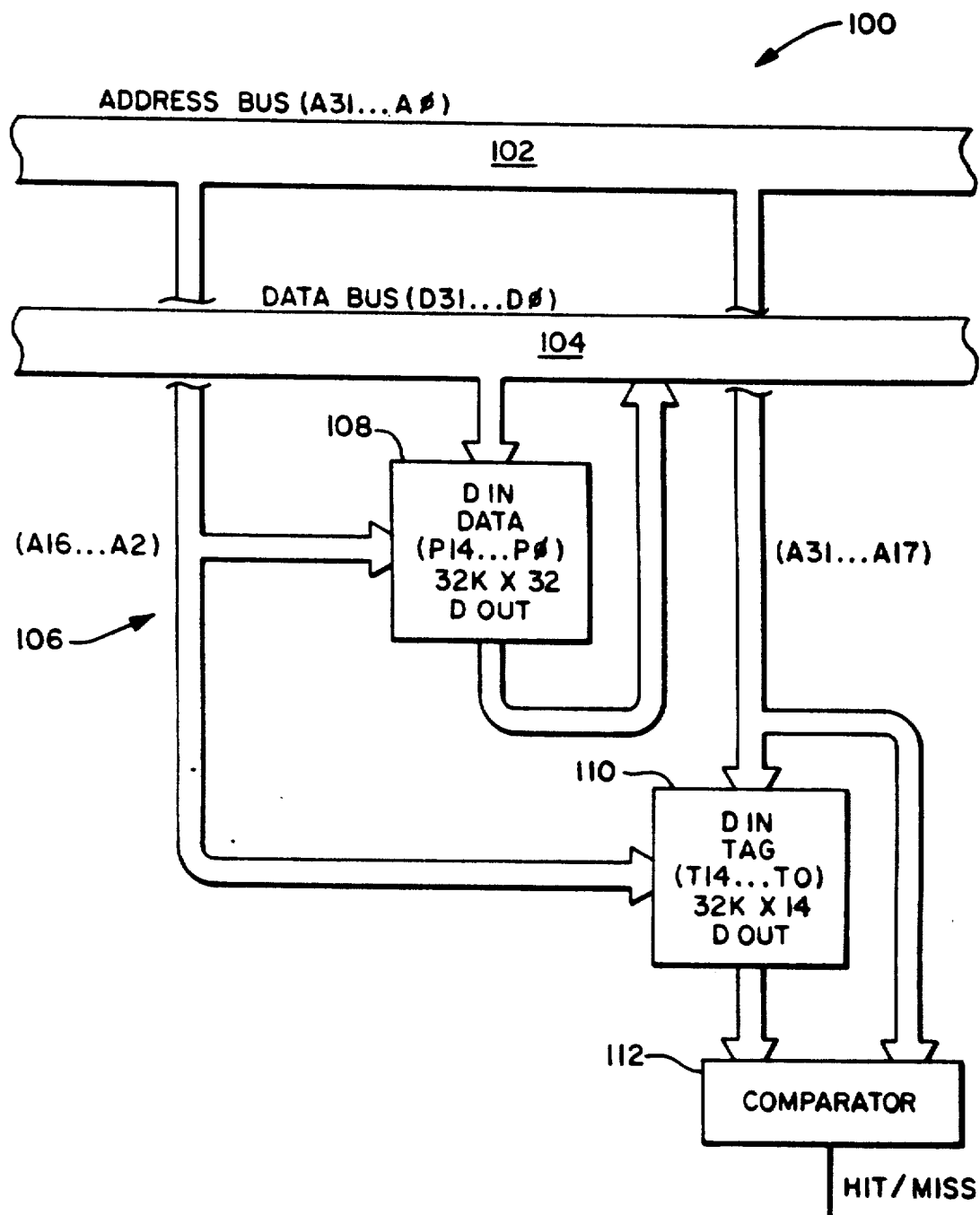
FIG. 1 is a block diagram of a typical cache memory.

FIG. 1 describes organization and function of a typical cache memory, and is described hereinabove.

Figure 2:
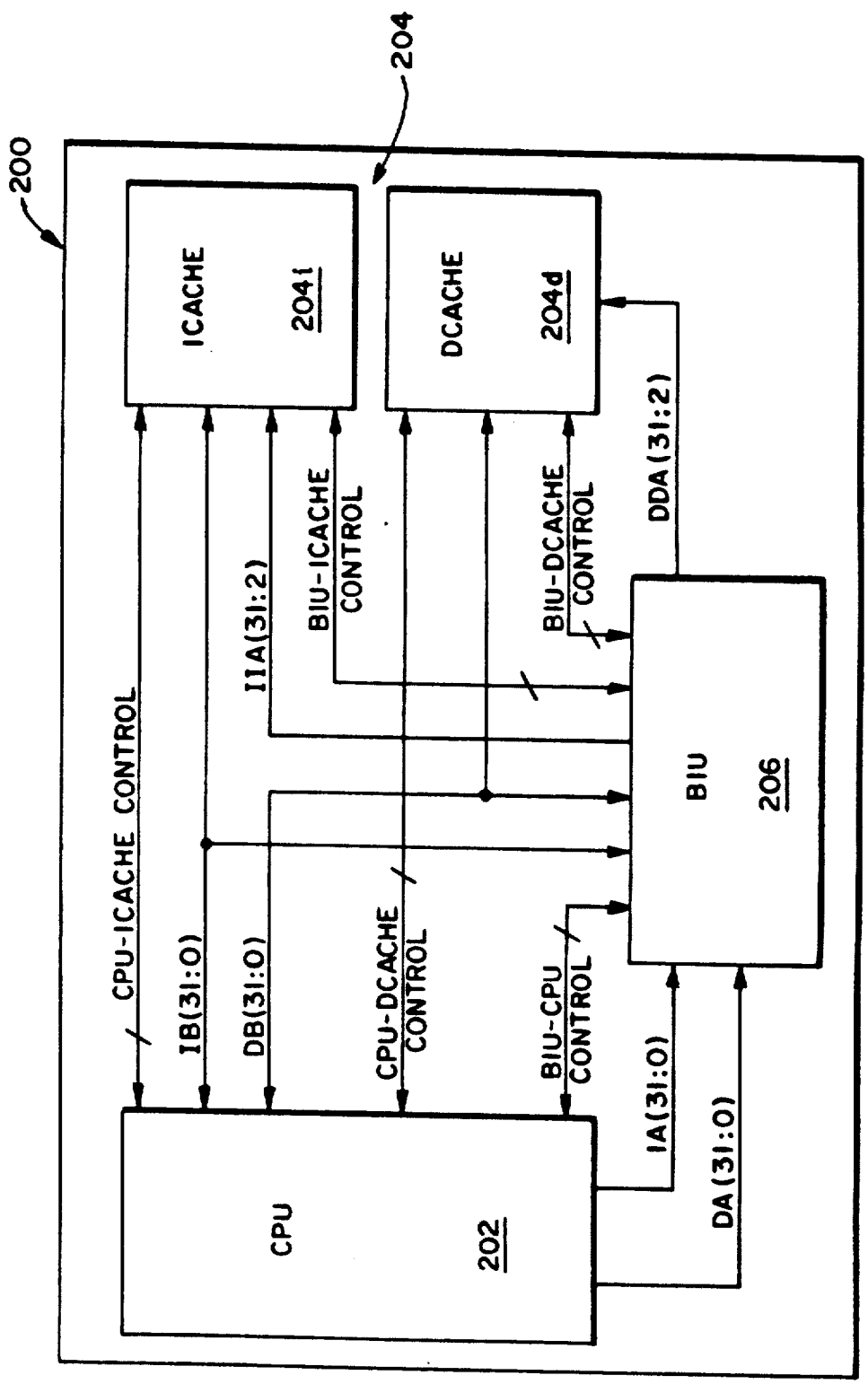
FIG. 2 is a block diagram of a microprocessor with embedded cache memory, according to the present invention.

FIG. 2 shows the general (gross) architecture of an embedded cache memory microprocessor 200, according to the present invention, which includes a central processing unit (CPU) 202, a cache 204, and a bus interface unit (BIU) 206. As will be discussed hereinbelow, the cache 204 is partitioned into an Instruction Cache (ICache) 204i and a Data Cache (DCache) 204d, each of which has corresponding instruction or data parts and tag parts. The present invention is primarily concerned with testing (exercising) the embedded tag part or parts, whether or not cache is partitioned into ICache or DCache,

CPU 102

An LR3000 Microprocessor, available from LSI Logic Corporation, Milpitas, Calif., is suitably employed for the CPU 102. The LR3000 Microprocessor is a MIPS (trademark of MIPS Computer Systems Inc.) RISC (Reduced Instruction Set Computer) microprocessor, and includes on-chip memory management, cache interface and control and main memory control logic. The LR3000's on-chip memory management function is fully associative, employing a 64-entry translation lookaside buffer. The on-chip cache control manages separate external instruction and data caches, of up to 356 Kbytes each, both of which can be accessed during a single CPU cycle. The LR3000 generates all the required cache and main memory control and address signals for attached coprocessors.

The existing LR3000's on-chip cache control supports external instruction and data cache memories, up to 256 Kbytes (from 4 Kbytes to 256 Kbytes) each, and both cache memories can be accessed during a single CPU cycle. The caches are direct-mapped, and "normally" (without the improvements of the present invention) would be built using commercially available, high speed SRAMs. The LR3000 processor directly drives the cache control signals, eliminating the skew and delay of external buffers. The LR3000 supports block refill of both the instruction and data caches. The D-Cache can be isolated from main memory, and the instruction and data caches can be swapped. These operations are used to support cache flushing, diagnostics and trouble-shooting. In the present invention, the instruction and data caches are preferably embedded (on-chip) with the CPU. (There are easier ways to test external caches than the techniques disclosed herein.)

A more detailed description of the LR3000 Microprocessor is contained in a specification sheet (preliminary, 1988) appended hereto as Appendix 1 and available from LSI Logic. As noted therein, at page 10, "all data written into cache should be written through main memory." The present invention represents a significant departure from that philosophy, and an improvement to the baseline functionality of the LR3000.

The "noral" (external) signal configuration of the LR3000 Microprocessor includes:

a) a 32-bit (D31:0) bidirectional Data Bus carrying all data and instructions between the CPU, caches, main memory and coprocessors;

b) an 18-bit (AdrLo 17:0) Address Low Bus carrying low-order address bits to the caches and memory subsystem. Only the 16 most significant bits (AdrLo 17:2) are used to access cache locations;

c) a 20-bit (Tag 31:12) Tag Bus transferring cache tags into the CPU during cache reads. During cache writes, the tag bus carries tag bits into the cache. For main memory accesses, the 16 most significant bits are combined with the AdrLo bus to form a 32-bit physical address;

d) a Tag Valid (TagV) signal carrying the valid bit between the LR3000 and the caches. During cache reads, TagV is used as one of the criteria in determining whether a cache hit has occurred. In the microprocessor 200, this signal is internal.

e) a 3-bit (TagP2:0) bidirectional Tag Parity bus containing parity for the Tag Bus and the Tag Valid signal. Tag Parity is generated for cache writes, and is checked during cache reads. A tag parity error is treated as a cache miss. In the microprocessor 200, this signal is internal.

f) I-Cache Read (IRd1 and IRd2)and D-Cache Read (DRd1 and DRd2) signals, which are asserted during I-Cache and D-Cache read operations to enable the outputs of the cache RAMs;

g) I-Cache Write (IWr1 and IWr2) and D-Cache Write (DWr1 and DRw2) signals, which are asserted during I-Cache and D-Cache write operations. These signals are typically used s the write-enable or write-strobe inputs to the cache RAMs; and h) I-Cache Latch Clock (IClk) and D-Cache Latch Clock (DClk) signals, which are asserted during every cycle, and are used to latch addresses into external latches and onto the address bus for the cache RAMs.

As discussed hereinbelow, in a test mode of operation, an additional external signal from the cache comparator output indicates a cache hit or miss during cache reads and writes.

Cache 204

Figure 3:
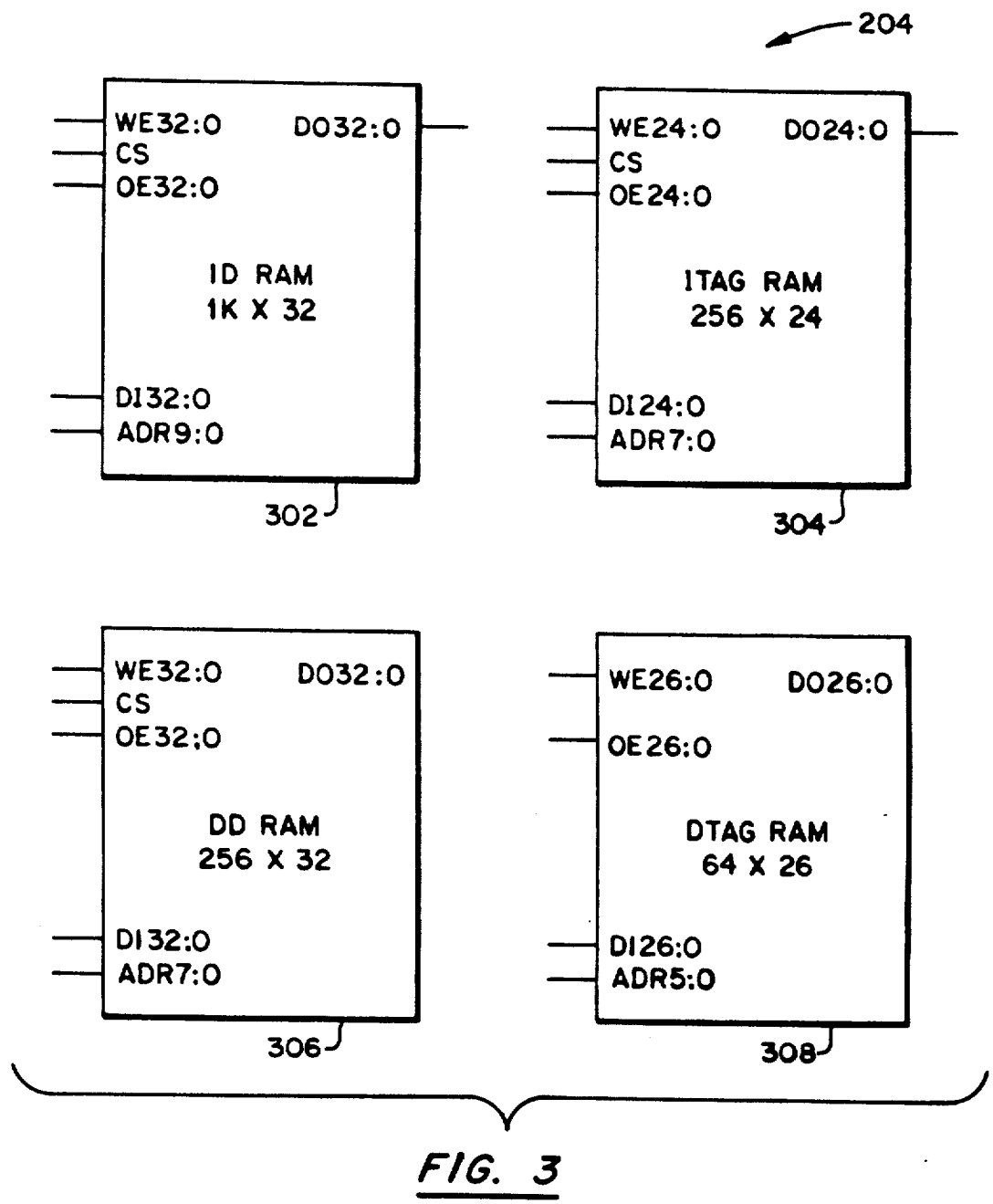
FIG. 3 is a block diagram of a exemplary configuration for the cache memory of FIG. 2.

FIG. 3 shows the gross physical organization of the cache 204. Cache 204 includes instruction data part (ID) 302, an instruction tag part (ITag) 304, a data data part (DD) 306 and a data tag part (DTag) 308. These parts 302, 304, 306 and 308 are made up of SRAM arrays, configured as noted in the drawing (e.g., the ID part 302 is a 1K×32 SRAM array).

The ID part 302 holds IK 32-bit instruction words (1K×32). The ITAG part 304 holds 20 bit tag and 4 valid bits for each line (256×24). Both the ID and ITAG parts are preferably high-density RAM arrays with bit read, bit write, tristate outputs and chip select (CS) power down features.

The DD part 306 holds 256 32-bit data words (256×32). The DTag part 308 holds 64 22-bit tag and 4 valid bits for each line (64×26). Both the DD and DTAG parts are preferably high density (high speed) RAM arrays with bit read, bit write, tristate outputs and CS power down features.

An exemplary physical and functional configuration of the ICache (ID part 302 ITag part 304) and DCache (DD part 306 and DTag part 308) is:

|  | ICache | DCache |
|---|---|---|
| Size | 8K bytes | 1K bytes |
| Organization | Direct mapped | Direct mapped |
| Line size | 16 bytes | 16 bytes |
| Refill size | Configurable | Configurable |
| Write policy | WTWNWA | WTWNWA |
| Byte write | -n/a- | supported |
| Bus snooping | supported | supported |

"WTWNWA" indicates Write Through With No Write Access. The byte write feature (DCache only) is supported only for run cycles, and not for refill cycles. A refill operation has to be either a word or block refill of words (block size of either 2, 4, 8 or 16 words).

Bus Interface Unit (BIU) 206

The Bus Interface Unit (BIU) 206 is the intermediary logic between the CPU 202, the cache 204, and other system components such as timers, DRAM control, etc. It controls the CPU interface to external memory, as well as to on-chip instruction and data caches (ICache and DCache).

Figure 4A:
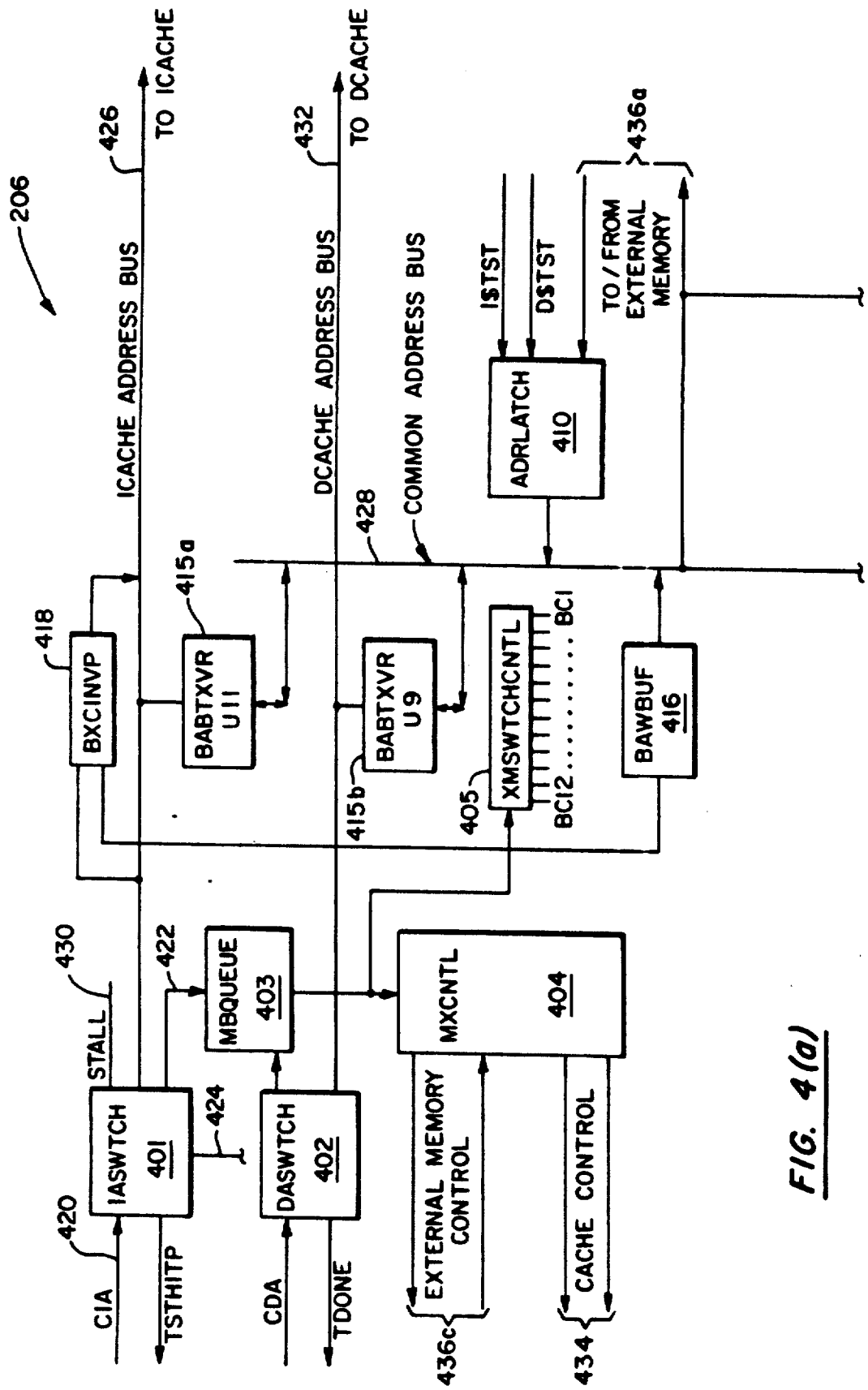
FIGS. 4A and 4B are a functional block diagram of the Bus Interface Unit (BIU) of FIG. 2.
Figure 4B:
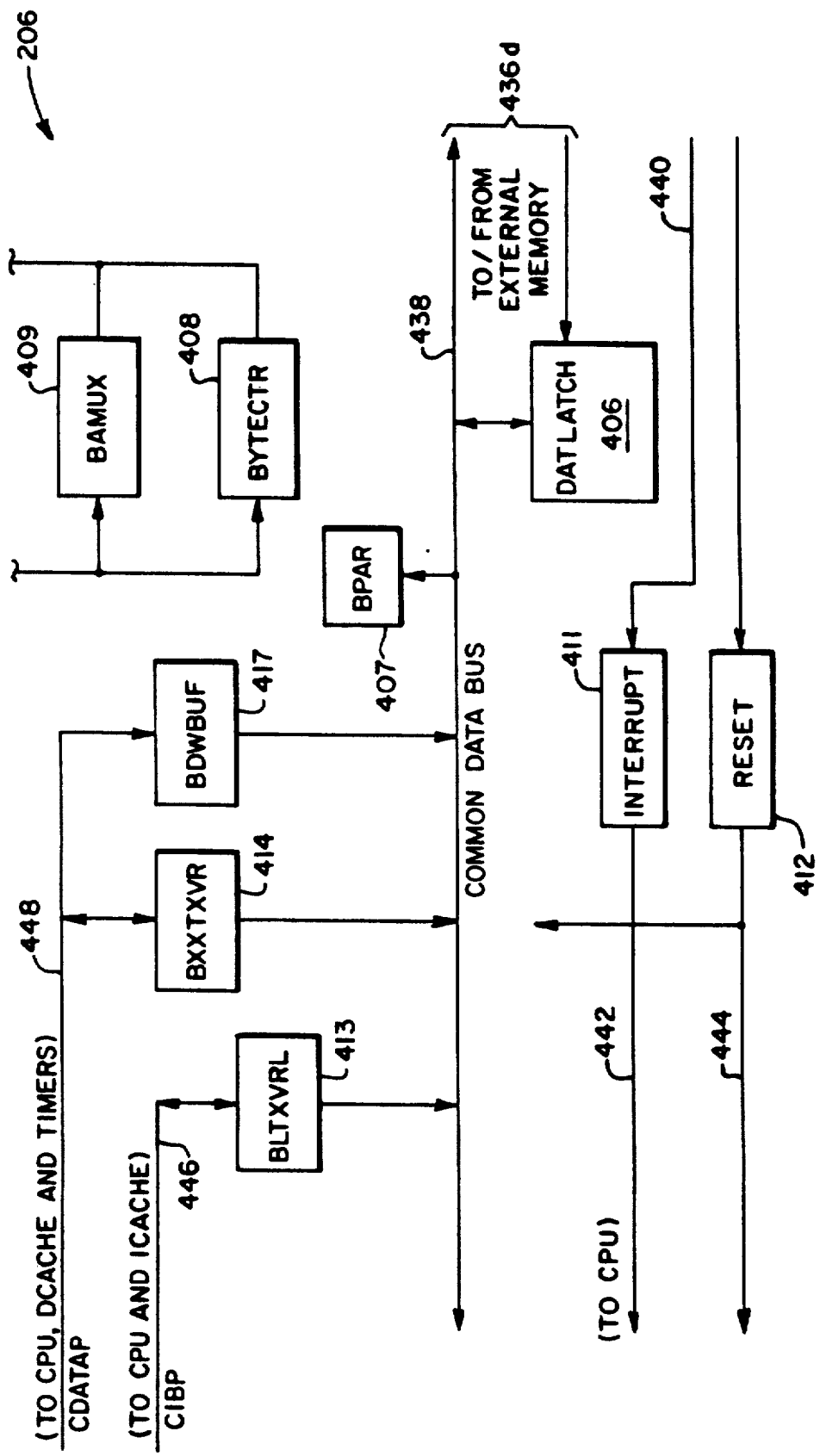

FIG. 4 shows functional layout of the BIU 206, which includes the nineteen functional blocks shown. The functions of these blocks are described in detail in Appendix 6. In this section, the blocks are described only briefly, or in greater detail as they are relevant to the present invention, particularly for entering a test mode for direct cache read/writes.

An Instruction Address Switch (IASWTCH) block 401 determines whether an instruction fetch on a bus (CIA) 420 from the CPU 202 (FIG. 2) is for cacheable or non-cacheable memory space. For cacheable memory space, the IASWTCH issues an ICache select signal on a line 422 to the MBQUEUE (403, discussed below), and waits for a hit/miss indication from the ICache (i.e., the ICache tag comparator), provided over a line 424. Normally, if the ICache indicates a hit, the IASWTCH will issue a request, via the MBQUEUE to the MXCNTL (404, discussed below) to fetch from external memory. This function is bypassed in the test mode of the present invention. Latched addresses are provided to the ICache Address Bus 426, as well as to the BIU's common address bus 426 via transceivers (BABTXVR, discussed below) for presentation off-chip.

The IASWTCH issues an instruction stall request over a line 430 to the CPU 202 a) during a transaction (reads/writes to cache), b) if an instruction fetch is required, c) when bus snooping is being performed, and d) in the test mode (ICache access mode) of the present invention.

A Data Address Switch (DASWTCH) block 402 is analogous to the IASWTCH, except that it performs services for the DCache and data memory transactions. Latched addresses are provided to the DCAche Address Bus 432, and to the BIU's common address bus 428, and a stall request is issued to the CPU in the test mode.

A Memory Block Queue (MBQUEUE) block 403 maintains information pertaining to external memory access, including a) an external memory start bit, which is bypassed in the test mode, b) an instruction/data transaction bit for selecting ICache or DCache, c) a cacheable/non-cacheable transaction bit, which is set to "cacheable" in the test mode, and d) a read/write transaction bit, which is provided via MXCNTL (404, discussed below) to the respective instruction and data caches.

A memory transaction control (MXCNTL) block 404 issues external memory control signals and responds to external control inputs. The MXCNTL block issues memory control sequences to the CPU based upon information in the queue of the MBQUEUE block 403. Control signals are issued to the appropriate cache over lines 434 (CACHE CONTROL) to perform cache reads/writes, and transaction done signals (TDONE) are issued (to blocks 401, 402, 403, 416 and 417) in response to data ready signals (from lines 436c; DRAM control) from the respective caches.

An external memory switch control (XMSWTCHCNTL) 405 controls the BIU data path configuration during various operations, which includes test mode read/writes of the instruction and data caches, by issuing a number of data path control signals BC1-BC12. These control signals are described in Appendix 6 (BIU MODULE BLOCK DESCRIPTIONS) at pages 6-7 thereof.

A data latch (DATLATCH) block 406 is used to sample data on the external memory data bus 436, passing it through to or from a common data bus 438. For testing cache, an external tester (see FIG. 5C) applies data and instructions to the data bus 438 through the DATLATCH 406. Generally, the tester connects to buses 436a and 436d.

A block parity (BPAR) block 407 checks parity o read operations. Data (i.e., instructions and data) is provided to this block via the DATLATCH 406 from the external memory data bus 436.

A byte counter (BYTECTR) block 408 is used to generate the byte address in an 8-bit port fetch where byte gathering is done. (This is more relevant to the aforementioned copending U.S. patent application No. 07/596,680.

A block address multiplexer (BAMUX) block 409 multiplexes the proper number of bits onto the external memory address bus 436 so that a block address is generated for DRAM or other accesses. (This is more relevant to the, aforementioned copending U.S. patent application No. 07/596,680.

An address latch (ADRLATCH) block 410 requests, in the test mode, appropriate stall cycles for the test mode to be generated in the IASWTCH and DASWTCH blocks (which generate appropriate instruction/data stall requests, as discussed hereinabove).

An interrupt (INTERRUPT) block 411 latches external interrupt signals on a line 440 and passes them on to the CPU 202 over a line 442.

A reset (RESET) block 412 ("BRST" in Appendix 6) generates reset signals on a line 444 for cold and warm resets of various elements of the BIU, as well as for the CPU.

A block transceiver latch (BLTXVRL) 413 connects a latched version of the BIU's common data bus 438 to the CPU's (32-bit) instruction bus (CIBP) 446, via 3-state transceivers. This block provides a flow through path for data during the test mode to/from the ICache and the BIU's common data bus 438.

A bus transceiver latch (BXXTXVR) 414 connects the CPU's data bus (CDATAP) 448 to a latched version of the BIU's common data bus 438 via 3-state transceivers.

An address bus transceiver (BABTXVR, U11) 415a connects the instruction cache's address bus 426 to the BIU's common address bus 428 via 3-state transceivers. In the test mode, an address supplied by the tester is provided through ADRLATCH 410 over the common address bus 428 to the transceiver 415a.

A second address bus transceiver (BABTXVR, U9) 415b connects the data cache's address bus 432 to the BIU's common address bus 428 via 3-state transceivers. In the test mode, an address supplied by the tester is provided through ADRLATCH 410 over the common address bus 428 to the transceiver 415b.

A bus address write buffer (BAWBUF) 416 forms an address portion of the write buffer function. In this block, addresses for write transactions are stored until used by an external write transaction.

A bus data write buffer (BDWBUF) 417 forms a data portion of the write buffer function. In this block, data for write transactions are stored until used by an external write transaction.

A cache invalidation (BXCINV) block 418 contains a multiplexer which is used to place an invalidation address on the ICache address bus 426.

FIGS. 5A-5D show the signal interfaces between the instruction and data caches 204i and 204d, respectively, the BIU 10 206, the CPU 202 and an external tester 502. These interfaces are discussed in greater detail in Appendix 2 (Module Definition of the Cache Megacell), and at pages 41-59 of Appendix 3 (BIU Module Definition).

Cache Access Modes

The instruction and data caches are accessed to read or write under four different circumstances, termed "Modes". The four different Modes are: "Mode 1", in which, during a normal run cycle, instructions are read and data is read or written; "Mode 2", in which, during a block refill, a block of data is written into either the ICache or DCache; "Mode 3", in which, during testing of the respective cache RAMs, reading and writing to the RAMs takes place; and "Mode 4", in which, during bus snooping on DMA writes, reading and writing to the RAMs may occur.

The mechanics of accessing the cache are different for each mode, because the source of addresses and the source/destination of data is different in each mode. Also, depending on the mode, the access to cache is either read only or write only or both read and write.

For "Mode 1", the CPU issues the addresses and is the source/destination of the data. In this mode, the ICache is read only, whereas the DCache can be read or written.

For "Mode 2", the source of address is the address latch/counter in the cache unit, and the source of data is the BIU, which receives the data from main memory. In this mode, the caches are written only—there is no cache read operation.

Figure 5B:
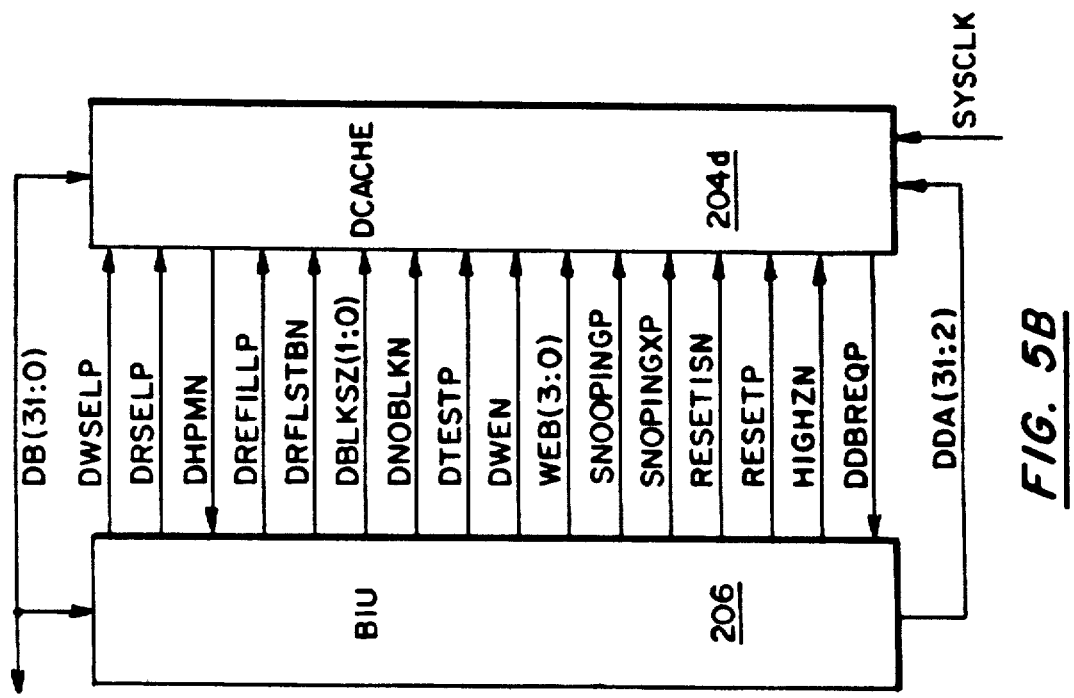
FIG. 5B is a block diagram of the interface between the data cache and BIU of FIG. 2.
Figure 5A:
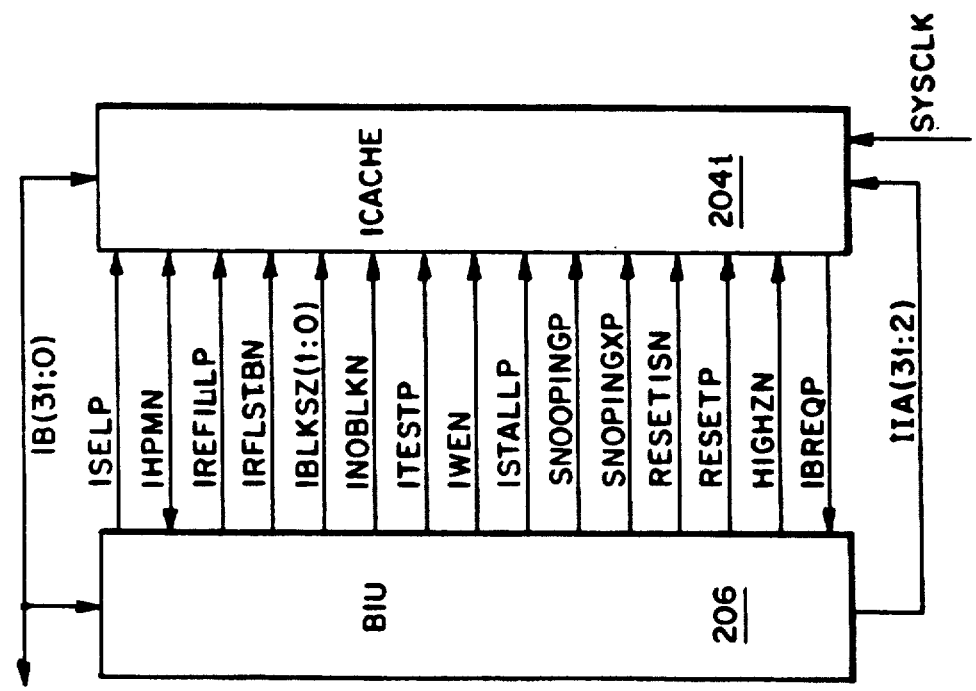
FIG. 5A is a block diagram of the interface between the instruction cache and the BIU of FIG. 2.
Figure 5C:
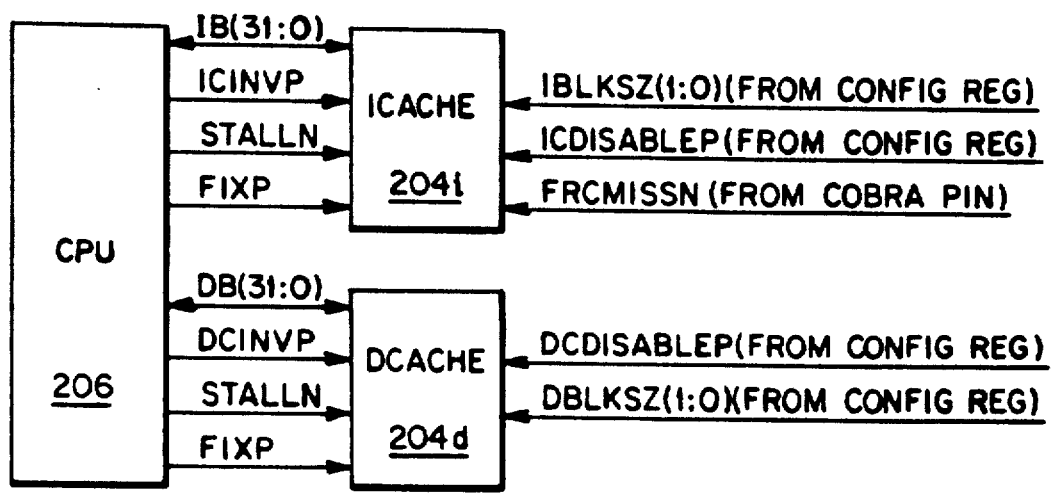
FIG. 5C is a block diagram of the interface between the instruction and data caches and the CPU of FIG. 2.
Figure 5D:
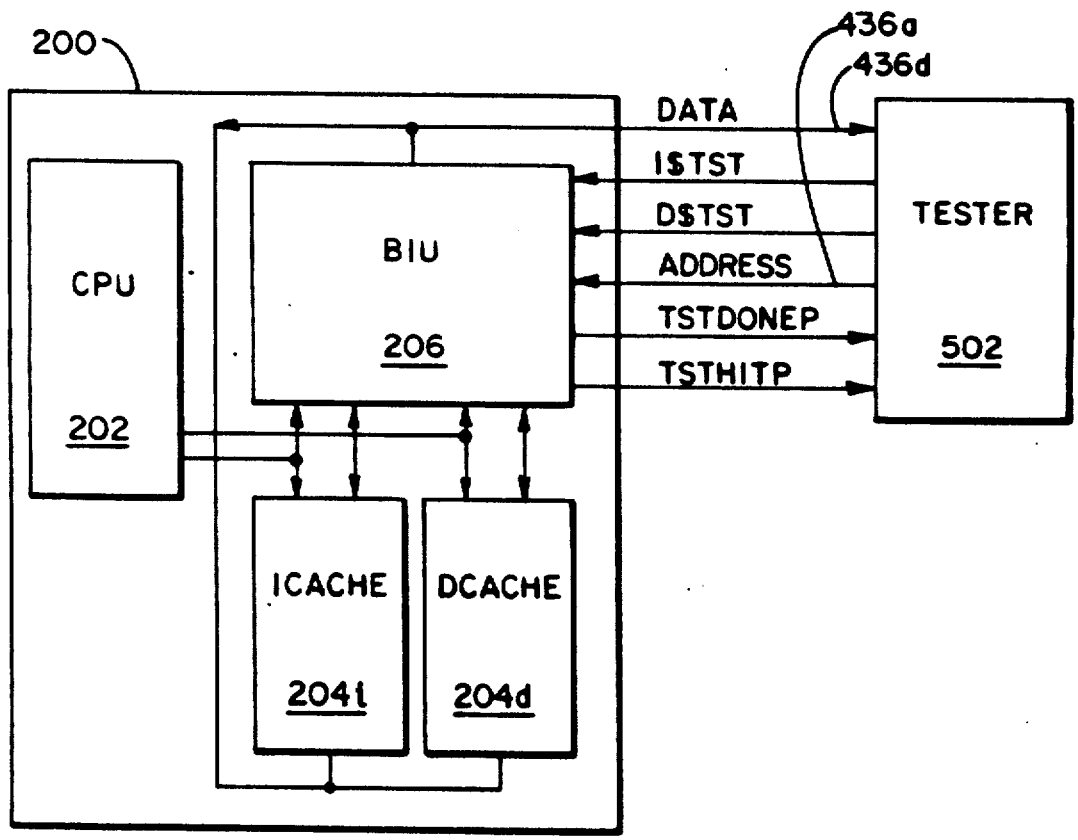
FIG. 5D is a block diagram of the interface between the CPU, the BIU, the cache, and an external tester, according to the present invention.

For "Mode 3", the source of address as well as the source/destination of the data is the BIU, which receives the address/data from an external tester (502, FIG. 5D). In this mode, the caches can be written and read. "Mode 3" is described in greater detail hereinbelow.

For "Mode 4", the source of addresses is the BIU, which receives the addresses from an external bus master such as an external processor, DMA or the like. There is no data transfer in this mode. There is only tag comparison and invalidation.

Cache Architecture

Figure 6A:
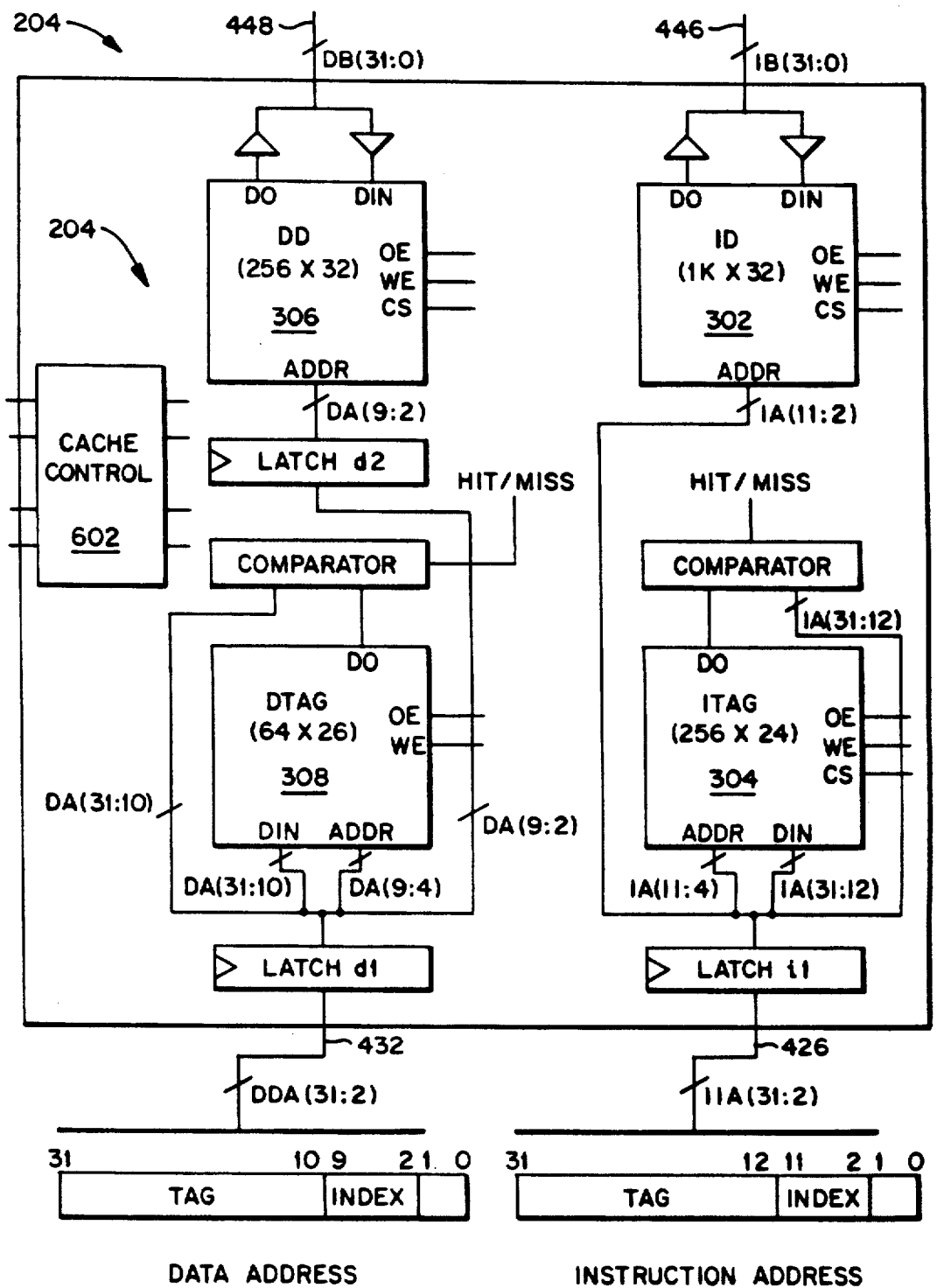
FIG. 6A is a block diagram of the cache of FIG. 2.
Figure 6B:
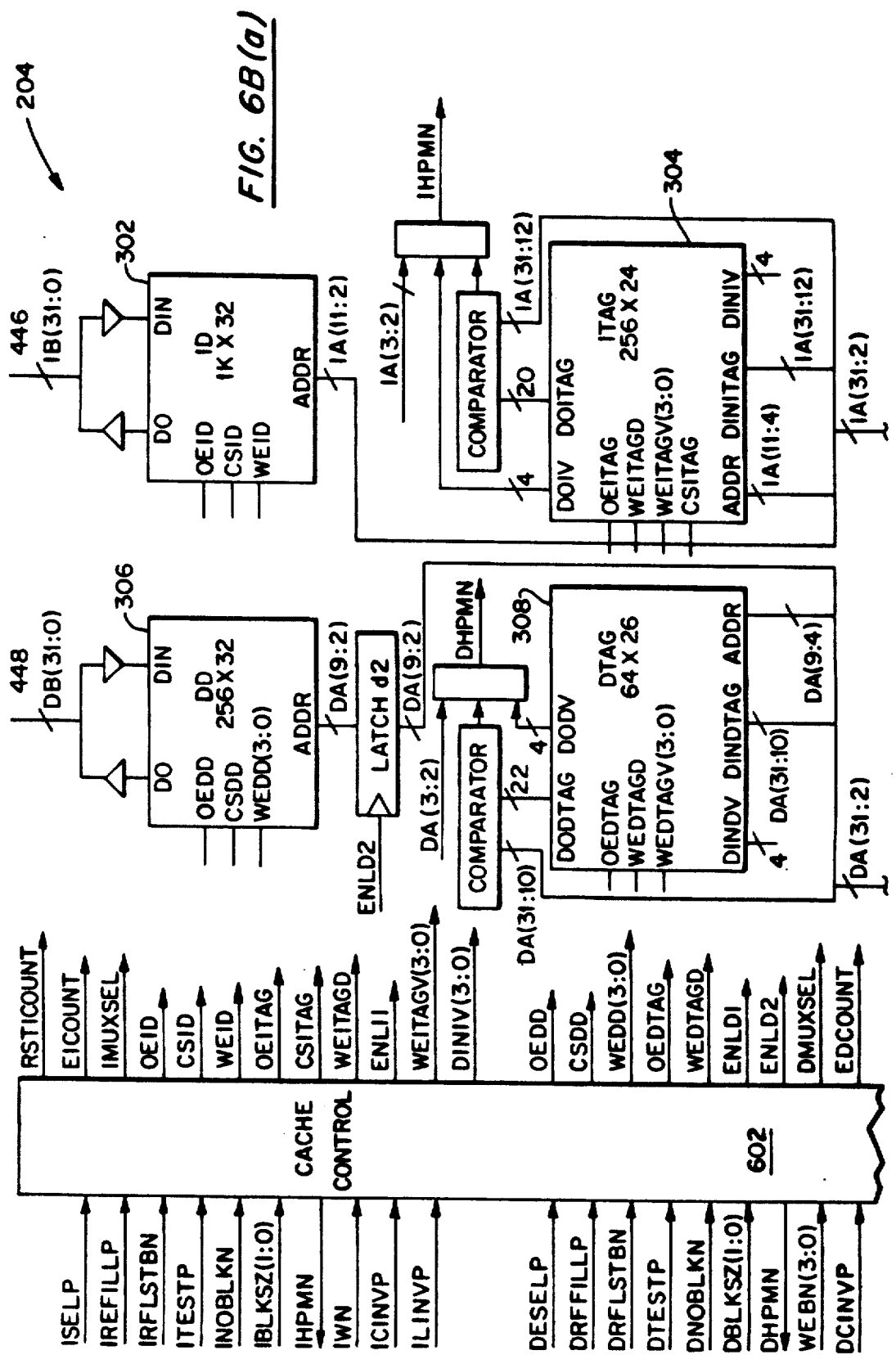
FIG. 6B is a more detailed block diagram of the cache of FIG. 6A.

FIGS. 6A and 6B show a physical embodiment of the cache 204, which is presented herein only as an example of a viable architecture. The present invention extends beyond testing a particular cache architecture to testing any embedded cache memory while bypassing external memory functions normally implemented during cache reads/writes.

The cache 204 includes an instruction data part 302, an instruction tag part 304, a data data part 306 and a data tag part 308, which were discussed with respect to FIG. 3.

A cache control 602 is shown, the function of which has already been discussed with respect to FIG. 4 as being distributed among various functional blocks of the BIU. Cache control is basically a shared function of the cache 204 and the BIU 206. The CPU is stalled in Mode 3 (test mode), until the testing is complete.

Testing Cache ("Mode 3")

In "Mode 3", the cache unit is accessed by the testing agency (tester 502, FIG. 5D) in order to check the integrity of the ITag, ID, Dtag and DD RAMs. During testing, the BIU stalls the CPU (see e.g., 430, FIG. 4) and asserts either an ITESTP (I$TST) or a DTESTP (D$TST) signal to the respective instruction or data cache unit, depending upon whether it is an instruction cache test operation or a data cache test operation, respectively.

Testing of a cache involves writing the tag, the data and the valid bits at the addressed location, and later reading that location. If the read operation results in a "miss", then it indicates a Tag RAM (ITag or DTag) failure. If the read operation indicates a "hit", then the word read out from the Data RAM is compared by the testing agency with the word it had written, and the result indicates the working or failure of the Data RAM (ID or DD).

Figure 7A:
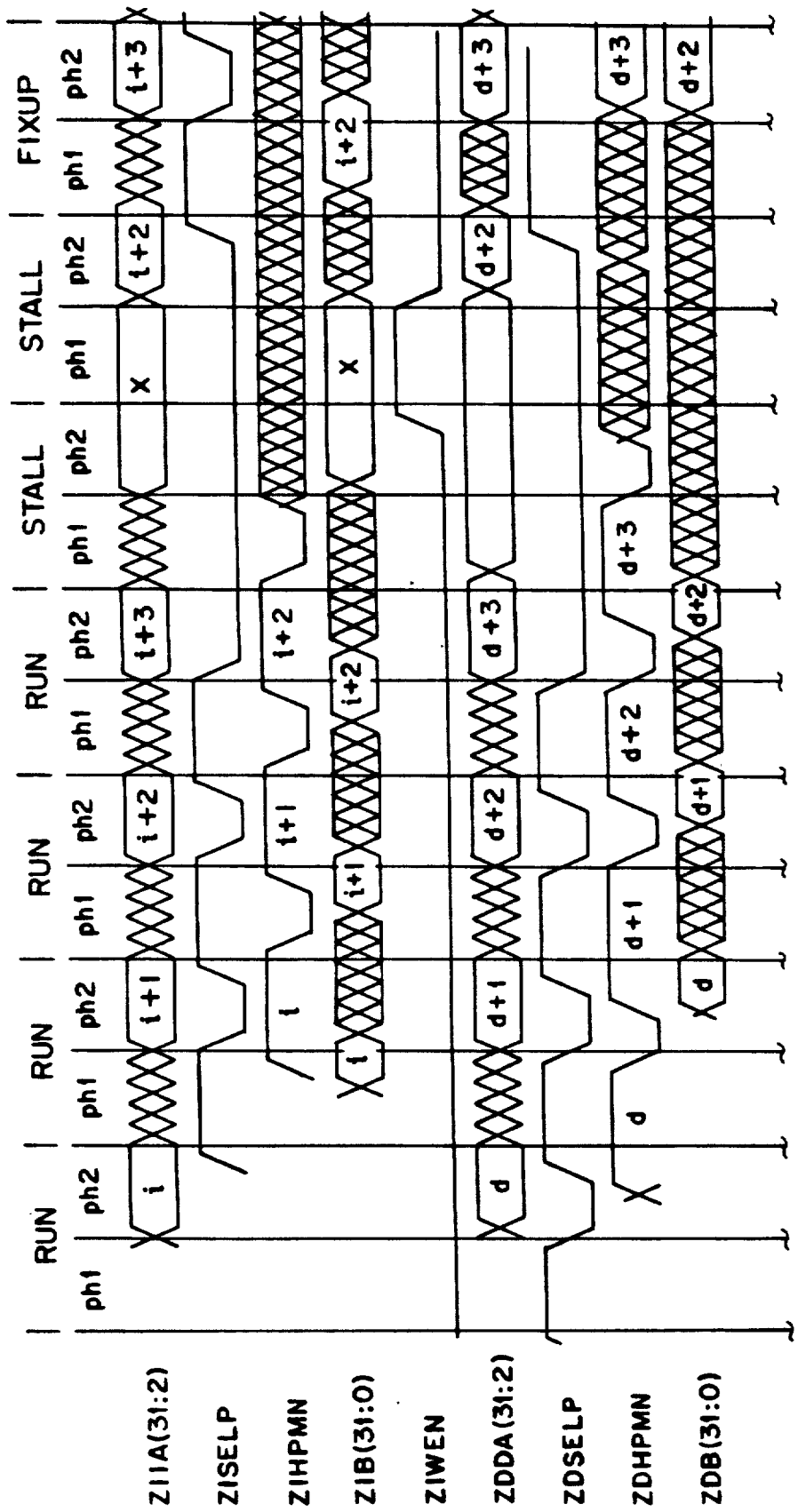
FIG. 7A is a timing diagram of signals issued in a "test mode" for directly exercising the cache of FIG. 2.

FIG. 7A illustrates the mechanics of the testing operation. FIG. 7B is a Table of signal designations. The assertion of the ITESTP or the DTESTP signal by the BIU indicates to the cache unit that testing is underway. This signal (ITESTP or DTESTP) is asserted at the beginning of phase 1 of the stall cycle. During testing, as during block refill ("Mode 2"), both Tag and Data RAMs are written. However, unlike during block refill, the address is generated externally, by the testing agency.

Force Miss Feature

This feature is present in the ICache to facilitate circuit emulation. It consists of a dedicated (external) pin. When a signal is asserted on this pin, a "miss" is forced whether or not the current instruction access by the CPU is mapped in the ICache. It causes the processor to stall and go external to fetch the instruction. Thus, this feature can be used to interrupt the processor executing out of the cache and force instructions to the CPU from the outside. These external instructions may not be cached. (See Appendix 2 (Module Definition of the Cache Megacell) at page 26.)

APPENDICES

Further description of the above can be found in the following documents, appended hereto:

1. *LR3000 High Performance RISC Microprocessor (Preliminary)*, September, 1988, LSI Logic Corporation, Milpitas, Calif. (Order No. LR3000).
2. *Module Definition of the Cache Megacell*, Sanjay Desai, Dec. 7, 1989 (Rev. 3.0 dated Sep. 25, 1990), LSI Logic Corporation, Milpitas, Calif.
3. *BIU Module Definition*, Michael L. Fuccio, Dec. 4, 1989 (Rev #1.0 dated Jan. 8, 1990), LSI Logic Corporation, Milpitas, Calif.
4. *COBRA-MIPS High Performance Embedded Processor (Preliminary)*, Apr. 30, 1990, (Rev. 1.6), LSI Logic Corporation, Milpitas, Calif.
5. *Cobra Microprocessor Memory Interface*, Jun. 20, 1990, (Version 1.2), LSI Logic Corporation, Milpitas, Calif.
6. *BIU Module Block Descriptions*, Michael L. Fuccio, Aug. 29, 1990 (Rev. #1.2, dated Oct. 4, 1990), LSI Logic Corporation, Milpitas, Calif.
7. *On an 8-bit bus size*, Michael L. Fuccio, Dec. 14, 1989, LSI Logic Corporation, Milpitas, Calif.

LR3000
High Performance
RISC Microprocessor
Preliminary

APPENDIX 1

Description

The LR3000 CPU is the third generation of the MIPS RISC (Reduced Instruction Set Computer) microprocessor architecture. The LR3000 is an extension of the RISC architecture developed by MIPS Computer Systems Inc. and maintains binary compatibility with the previous generation LR2000 chip set. This architecture delivers performance exceeding 20 VAX 11/780 mips. The processor includes on-chip memory management and support for up to three coprocessors including the LR3010 Floating-Point Accelerator.

Figure 1 shows a representative system configuration using the LR3000. The processor has been designed with system trade-offs in mind; incorporating in hardware only those features which will yield a net performance gain. The CPU contains interfaces to three subsystems. Cache control for separate data and instruction caches permits implementation of off-chip caches using standard SRAM devices. Main memory control logic interfaces with the LR3020 Write Buffer to improve memory bandwidth. The coprocessor interface links up to three additional coprocessors including the LR3010 Floating-Point Accelerator (FPA). The LR3000 generates all the required cache and main memory control and address signals for the attached coprocessors.

Figure 1. Representative System Configuration

Features

- Reduced Instruction Set Computer (RISC) architecture
  - MIPS instruction set
  - Simple 32-bit instructions, single addressing mode
  - Register-to-register, load-store operation
  - All instructions (except MPY and DIV) execute in a single cycle
  - LR2000 binary code compatibility
- High performance
  - Fast instruction cycle with five-stage pipeline
  - Efficient handling of pipeline stalls and exceptional events
- Two speed versions
  - LR3000 LC   16.7 MHz  12 VAX mips equivalents
  - LR3000 ALC  25 MHz    20 VAX mips equivalents
- Optional devices tightly coupled for high performance
  - LR3010   Floating-Point Accelerator (FPA)
  - LR3020   Write Buffers (WB)
- 32 general-purpose registers
- On-chip memory management unit (MMU)
  - Fully-associative, 64-entry translation lookaside buffer (TLB)
  - Supports 4-Gbyte virtual address space
- On-chip cache control
  - Separate external instruction and data cache memories
  - Up to 256 Kbytes each
  - Both cache memories accessed during a single CPU cycle
  - Dual cache bandwidth up to 200 Mbytes/second
- Multi-tasking support
  - User and kernel (supervisor) modes
- Seamless coprocessor interface
  - Generates all addresses and handles memory interface control
  - Supports up to three external coprocessors
- Strong, integrated software support
  - UMIPS operating system
    - System V.3, 4.3 BSD
  - Optimizing compilers
    - C              Ada (Verdix)
    - FORTRAN        COBOL (LPI)
    - Pascal         PL-1 (LPI)
- Development system support
  - MIPS M-Series systems provide hardware, software and applications development environment
- 172 ceramic leaded chip carrier ©1988 LSI Logic Corporation    September 1988    Order Number LR3000

LR3000
High Performance
RISC Microprocessor
Preliminary

Block Diagram

The LR3000 processor shown in Figure 2 consists of two integrated processors. In addition to a RISC (Reduced Instruction Set Computer) CPU there is a system control coprocessor (CP0) which contains a fully associative TLB (translation lookaside buffer) and control registers to support a virtual memory subsystem.

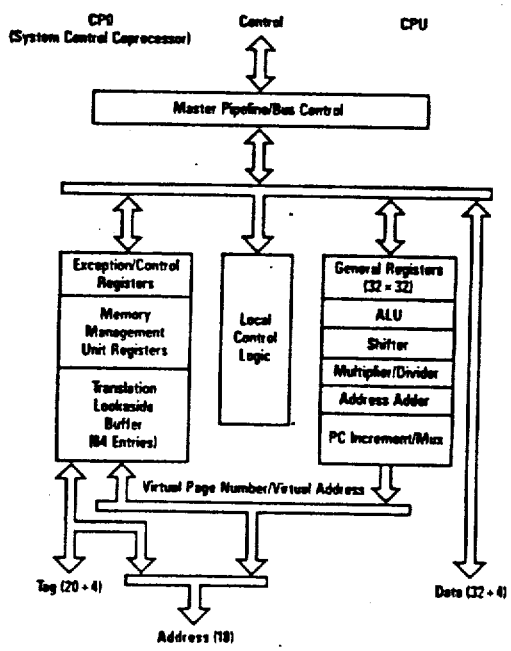

Figure 2. Functional Block Diagram

LR3000
High Performance
RISC Microprocessor
Preliminary

Pipeline Architecture

The execution of a single LR3000 instruction consists of five primary steps:

IF  Instruction Fetch. Access the TLB and calculate the instruction address required to read an instruction from the I-cache. Note that the instruction is not actually read into the processor until the beginning (phase 1) of the RD pipe stage.

RD  Read any required operands from CPU registers (RF – Register Fetch) while decoding the instruction.

ALU  Perform the required operation on instruction operands.

MEM  Access memory (D-cache) if required (for a Load or Store instruction).

WB  Write ALU results back to the register file.

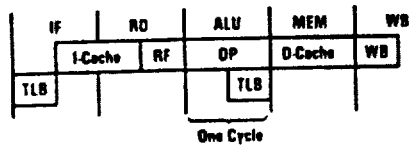

Figure 3. Instruction Execution Sequence

Each of these steps requires an average of one CPU cycle. The LR3000 uses a five-stage pipeline to achieve an instruction execution rate approaching one instruction per CPU cycle. See Figures 3 and 4. This pipeline operates efficiently because different CPU resources (address and data bus accesses, ALU operations, register accesses, etc.) are utilized on a non-interfering basis. Even Load and Store operations execute in a single cycle.

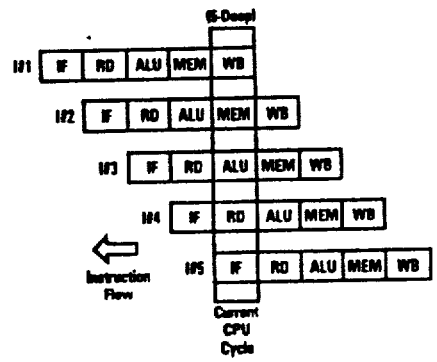

Figure 4. Instruction Pipeline

LR3000
High Performance RISC Microprocessor
Preliminary

Data and Register Organization

As described in Figure 5A, the LR3000 CPU provides 32 general purpose 32-bit registers, a 32-bit program counter and two 32-bit registers which hold the results of integer multiply and divide operations. The functions traditionally provided by a program status word (PSW) register are handled by the status and cause registers in the CP0.

The 32 general registers are treated symmetrically with two exceptions: r0 is hardwired to a zero value; and, r31 is the link register for jump and link instructions. Register r0 may be specified as a target register for any instruction when the result of the operation is discarded. The register maintains a value of zero under all conditions when used as a source register.

The LR3000 defines a 32-bit word, a 16-bit half word and an 8-bit byte. The byte ordering is configurable (configuration occurs during RESET) into either big-endian or little-endian byte ordering.

```
32        General Purpose Registers        0
         ┌──────────────────────────────┐
         │       r0 (Hardwired 0)       │
         ├──────────────────────────────┤
         │              r1              │
         ├──────────────────────────────┤
         │              r2              │
         ├──────────────────────────────┤
         │              •               │
         │              •               │
         │              •               │
         ├──────────────────────────────┤
         │             r29              │
         ├──────────────────────────────┤
         │             r30              │
         ├──────────────────────────────┤
         │             r31              │
         └──────────────────────────────┘

32        Multiply/Divide Registers        0
         ┌──────────────────────────────┐
         │              HI              │
         ├──────────────────────────────┤
         │              LO              │
         └──────────────────────────────┘

32        Program Counter                  0
         ┌──────────────────────────────┐
         │              PC              │
         └──────────────────────────────┘
```

Figure 5A. CPU Registers

When configured as a big-endian system, byte 0 is always the most significant (leftmost) byte, thereby providing compatibility with MC68000 and IBM 370 conventions.

When configured as a little-endian system, byte 0 is always the least significant (rightmost) byte, which is compatible with iAPX x86, NS32000 and DEX VAX conventions.

Bit 0 is always the least significant (rightmost) bit; thus bit designations are always little endian (although no instructions explicitly designate bit positions within words). Figures 5B and 5C below show the ordering of bytes within words and the ordering of words within multiple-word structures of the big-endian and little-endian conventions.

```
                    Big Endian
Higher                                        Word
Address  31    24 23   16 15    8 7    0      Address
  ↑     ┌──────┬──────┬──────┬──────┐
        │  8   │  9   │  10  │  11  │          8
        ├──────┼──────┼──────┼──────┤
        │  4   │  5   │  6   │  7   │          4
Lower   ├──────┼──────┼──────┼──────┤
Address │  0   │  1   │  2   │  3   │          0
        └──────┴──────┴──────┴──────┘
```

Most significant byte is at lowest address.
Word is addressed by byte address of most significant byte.

Figure 5B. Addresses of Bytes within Words: Big Endian

```
                   Little Endian
Higher                                        Word
Address  31    24 23   16 15    8 7    0      Address
  ↑     ┌──────┬──────┬──────┬──────┐
        │  11  │  10  │  9   │  8   │          8
        ├──────┼──────┼──────┼──────┤
        │  7   │  6   │  5   │  4   │          4
Lower   ├──────┼──────┼──────┼──────┤
Address │  3   │  2   │  1   │  0   │          0
        └──────┴──────┴──────┴──────┘
```

Least significant byte is at lowest address.
Word is addressed by byte address of least significant byte.

Figure 5C. Addresses of Bytes within Words: Little Endian

LR3000
High Performance
RISC Microprocessor
Preliminary

Instructions

All LR3000 instructions are 32 bits in length. To simplify instruction decoding, only three instruction formats are supported (immediate, jump and register). The instruction set can be divided into the following groups.

- Load/Store instructions move data between memory and the general registers. All instructions are then executed on values stored in the general registers. There are no operations performed directly in memory. Loads and stores are all I-type instructions since the only addressing mode supported is base register + 16-bit immediate offset.

- Computational instructions perform arithmetic, logical and shift operations on values in registers. These can be R-type (both operands are registers) or I-type (one operand is a 16-bit immediate) instruction formats.

- Jump and Branch instructions change program flow. All jump and branch instructions occur with a one-instruction delay. The instruction immediately following the jump or branch is always executed while the target instruction is being fetched from storage. Jumps are always to a paged absolute address formed by combining a 26-bit target with four bits of the program counter (J-type format for subroutine calls), or 32-bit register byte addresses (R-type for returns and dispatches). Branches have 16-bit offsets relative to the program counter (I-type). Jump and link instructions save a return address in Register 31.

- Coprocessor instructions perform operations in the coprocessors. Coprocesser loads and stores are I-type, or have coprocessor-dependent formats. Coprocessor 0 instructions perform operations on the CP0 registers to manipulate memory management and exception handling facilities.

- Special instructions perform a variety of tasks including movement of data between special and general registers, trap, and breakpoint. They are always R-type.

LR3000
High Performance
RISC Microprocessor
Preliminary

Table 1. Instruction Summary

| OP | Description |
|---|---|
| | Load/Store Instructions |
| LB | Load Byte |
| LBU | Load Byte Unsigned |
| LH | Load Halfword |
| LHU | Load Halfword Unsigned |
| LW | Load Word |
| LWL | Load Word Left |
| LWR | Load Word Right |
| SB | Store Byte |
| SH | Store Halfword |
| SW | Store Word |
| SWL | Store Word Left |
| SWR | Store Word Right |
| | Arithmetic Instructions (ALU Immediate) |
| ADDI | Add Immediate |
| ADDIU | Add Immediate Unsigned |
| SLTI | Set on Less than Immediate |
| SLTIU | Set on Less than Immediate Unsigned |
| ANDI | AND Immediate |
| ORI | OR Immediate |
| XORI | Exclusive OR Immediate |
| LUI | Load Upper Immediate |
| | Arithmetic Instructions (3-operand, register-type) |
| ADD | Add |
| ADDU | Add Unsigned |
| SUB | Subtract |
| SUBU | Subtract Unsigned |
| SLT | Set on Less than |
| SLTU | Set on Less than Unsigned |
| AND | AND |
| OR | OR |
| XOR | Exclusive OR |
| NOR | NOR |
| | Shift Instructions |
| SLL | Shift Left Logical |
| SRL | Shift Right Logical |
| SRA | Shift Right Arithmetic |
| SLLV | Shift Left Logical Variable |
| SRLV | Shift Right Logical Variable |
| SRAV | Shift Right Arithmetic Variable |

| OP | Description |
|---|---|
| | Multiply/Divide Instructions |
| MULT | Multiply |
| MULTU | Multiply Unsigned |
| DIV | Divide |
| DIVU | Divide Unsigned |
| MFHI | Move From HI |
| MTHI | Move to HI |
| MFLO | Move From LO |
| MTLO | Move to LO |
| | Jump and Branch Instructions |
| J | Jump |
| JAL | Jump and Link |
| JR | Jump to Register |
| JALR | Jump and Link Register |
| BEQ | Branch on Equal |
| BNE | Branch on Not Equal |
| BLEZ | Branch on Less than or Equal to Zero |
| BGTZ | Branch on Greater than Zero |
| BLTZ | Branch on Less than Zero |
| BGEZ | Branch on Greater than or Equal to Zero |
| BLTZAL | Branch on Less than Zero and Link |
| BGEZAL | Branch on Greater than or Equal to Zero and Link |
| | Special Instructions |
| SYSCALL | System Call |
| BREAK | Break |
| | Coprocessor Instructions |
| LWCz | Load Word to Coprocessor |
| SWCz | Store Word from Coprocessor |
| MTCz | Move to Coprocessor |
| MFCz | Move from Coprocessor |
| CTCz | Move Control to Coprocessor |
| CFCz | Move Control from Coprocessor |
| COPz | Coprocessor Operation |
| BCzT | Branch on Coprocessor z True |
| BCzF | Branch on Coprocessor z False |
| | System Control Coprocessor (CP0) Instructions |
| MTC0 | Move to CP0 |
| MFC0 | Move from CP0 |
| TLBR | Read Indexed TLB Entry |
| TLBWI | Write Indexed TLB Entry |
| TLBWR | Write Random TLB Entry |
| TLBP | Probe TLB for Matching Entry |
| RFE | Restore from Exception |

LR3000
High Per...mance
RISC Microprocessor
Preliminary

Instructions (Continued)

I-Type (Immediate)
```
31   26 25   21 20   16 15            0
| OP  |  RS  |  RT  |  Immediate    |
```

J-Type (Jump)
```
31   26 25                           0
| OP  |         Target               |
```

R-Type (Register)
```
31   26 25   21 20   16 15   11 10  6 5    0
| OP  |  RS  |  RT  |  RD  | Shamt | Funct |
```

Figure 6B:
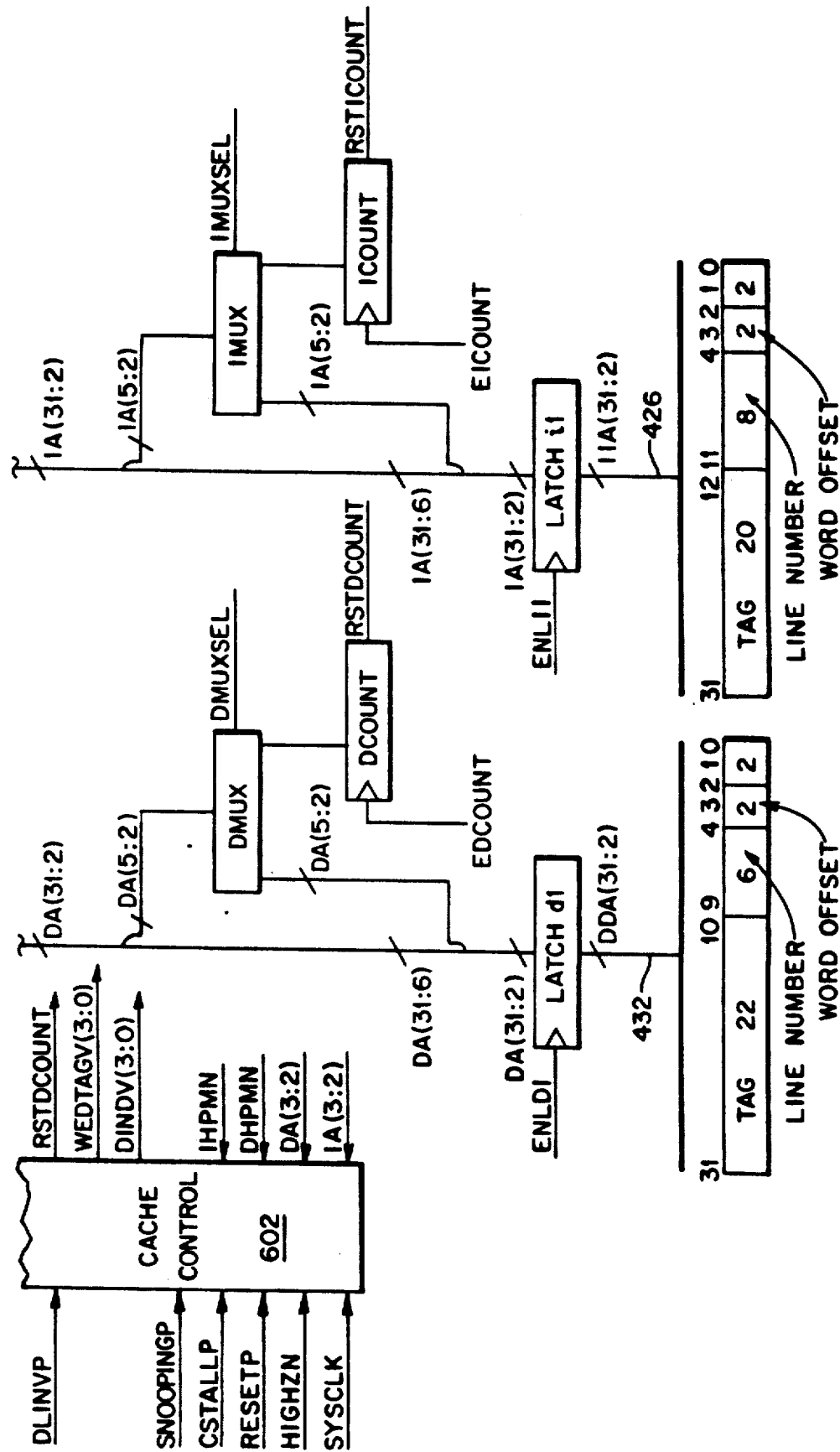

Figure 6. LR3000 Instruction Formats

Where:

| | |
|---|---|
| OP | A 6-bit operation code |
| Rs | A 5-bit source register specifier |
| Rt | A 5-bit target (source/destination) register or branch condition |
| Immediate | A 16-bit immediate, branch displacement or address displacement |
| Target | A 26-bit jump target address |
| Rd | A 5-bit destination register specifier |
| Shamt | A 5-bit shift amount |
| Funct | A 6-bit function field |

System Control Coprocessor (CP0)

The LR3000 can operate with up to four coprocessors (CP0 through CP3). The system control coprocessor (CP0) is on-chip and supports the virtual memory system and exception handling functions of the LR3000. The virtual memory system is implemented using a translation lookaside buffer and a group of programmable registers.

Figure 7A:
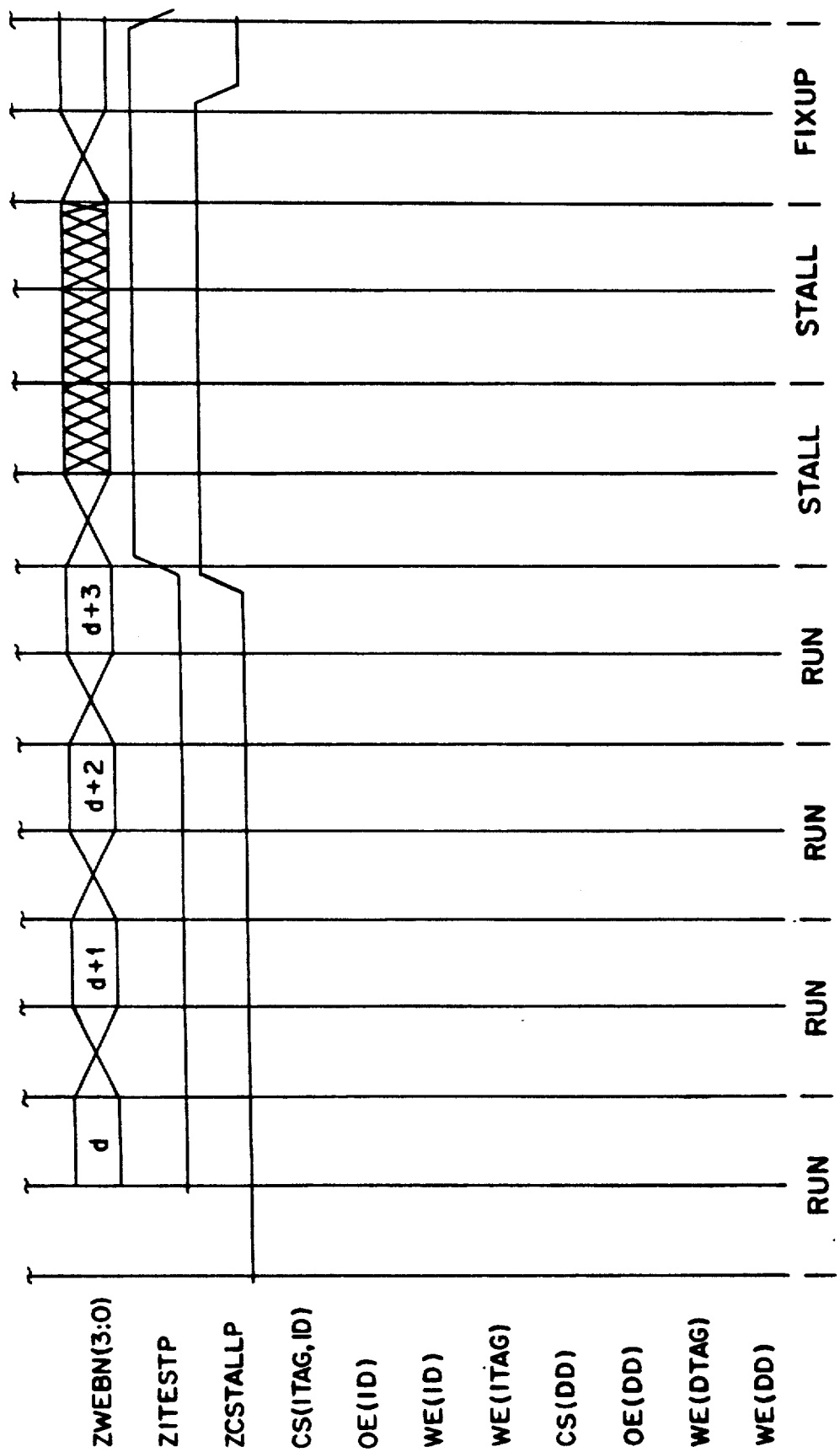

The CP0 registers shown in Figure 7 are used to manipulate the memory management and exception handling capabilities. Table 2 provides a description of each register.

Table 2. System Control Coprocessor (CP0) Registers

| Register | Description |
|---|---|
| EntryHi | High half of a TLB entry |
| EntryLo | Low half of a TLB entry |
| Index | Programmable pointer into TLB array |
| Random | Pseudo-random pointer into TLB array |
| Status | Mode, interrupt enables, and diagnostic status info |
| Cause | Indicates nature of last exception |
| EPC | Exception program counter |
| Context | Pointer into kernel's virtual page table entry array |
| BadVA | Most recent bad virtual address |
| PRId | Processor revision identification |

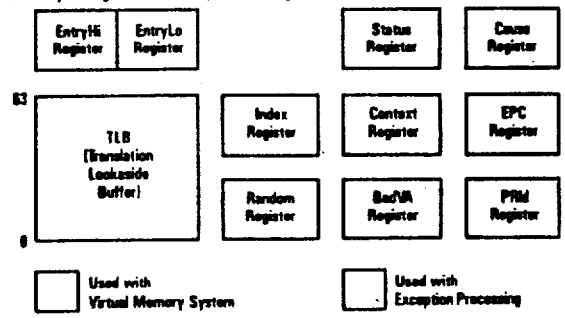

Figure 7. CP0 Registers

High Performance RISC Microprocessor Preliminary

| | | |
|---|---|---|
| Coprocessors | Three types of coprocessor instructions are supported: loads and stores, internal operations, and moves between the coprocessors. The LR3000 coprocessors and the main processor share the same instruction stream. Coprocessor instructions | are not explicitly passed to a coprocessor by the LR3000. Instead, coprocessors continuously monitor the data bus, receive instruction/data pairs, and decode valid instructions at the same rate as the main processor. |
| Memory Management System | The LR3000 supports interfaces to cache memory and main memory. Often-used operands and instructions are placed into cache memory where the processor can access them quickly. Two direct-mapped caches for instructions (I-cache) and data (D-cache) can range in size from 4 Kbytes to 256 Kbytes. Cache memory access operations take a single cycle to complete. A main memory interface supports reads to and writes from main (non-cached) memory.<br><br>The LR3000 has an addressing range of 4 Gbytes (2 Gbytes for the user, 2 Gbytes for the kernel). Since most systems implement physical memory sizes under 4 Gbytes, the LR3000 provides for the logical expansion of memory space by translating | addresses composed in a large virtual address space into available physical memory address.<br><br>The on-chip translation lookaside buffer provides very fast virtual memory access and is well matched to the requirements of multi-tasking operating systems. The fully-associative TLB contains 64 entries, each of which maps a 4 Kbyte page, with controls for read/write access, cacheability and process identification.<br><br>The D-cache can be isolated from main memory. The processor also allows swapping of the instruction and data caches. Both operations are used to support cache flushing, diagnostics and troubleshooting. |

LR3000
High Performance
RISC Microprocessor
Preliminary

Operating Modes

The LR3000 has two operating modes: user mode and kernel mode. The processor normally operates in user mode until an exception is detected forcing it into the kernel mode. It remains in kernel mode until a restore from exception (RFE) instruction is executed. The manner in which the memory addresses are mapped depends on the operating mode of the LR3000. Figure 8 shows the virtual address space for the two operating modes.

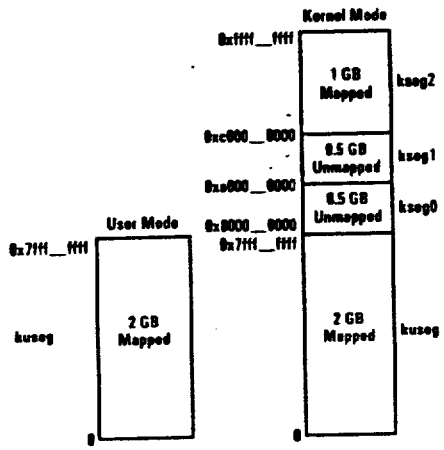

Figure 8. LR3000 Virtual Addressing

User Mode – In this mode, a single, uniform virtual address space (kuseg) of 2 Gbytes is available. Each virtual address is extended with a 6-bit process identifier field to form unique virtual addresses for up to 64 processes. All references to this segment are mapped through the TLB. Use of the cache is determined by bit settings for each page within the TLB entries.

Kernel Mode – Four separate segments are defined in this mode:

kuseg – when in kernel mode, references to this segment are treated like user mode references, sreamlining kernel access to user data.

kseg0 – references to this 512-Mbyte segment use cache memory but are not mapped through the TLB. Instead they always map to the first 0.5 Gbytes of physical memory.

kseg1 – references to this 512-Mbyte segment are not mapped through the TLB and do not use cache. Instead, they are hard-mapped into the same 0.5 Gbyte segment of physical memory space as kseg0.

kseg2 – references to this 1-Gbyte segment are always mapped through the TLB. Use of the cache is determined by bit setting within the TLB entries.

High Performance
RISC Microprocessor
Preliminary

| | | |
|---|---|---|
| Memory System Hierarchy | The LR3000 supports a high-performance memory hierarchy which centers on the use of external caches. Separate data and instruction caches allow the processor to obtain data and instructions at the CPU cycle rate. These caches are built using commercially available high-speed static RAMs. To en- | sure data consistency, all data written into cache should be written through main memory. LR3020 Write Buffers capture output data from the CPU at the system clock rate and update slower main memory. |
| LR2000 Compatibility | The LR3000 is instruction set compatible with the LR2000 processor and is in most other respects similar to the LR2000. The principal differences are in the memory interface. These differences are outlined below.<br><br>■ The LR3000 supports block refill of both the instruction and the data caches. Block sizes of 4, 8, 16, or 32 words are supported with size independently selectable for each cache. In general, the block size is chosen based on the size of the cache and the main memory latency. Blocks are written into the cache at one word per cycle.<br><br>■ The LR3000 supports concurrent refill and execution of instructions. In many cases, this concurrency permits instruction cache refill to occur transparently.<br><br>■ During memory read stalls, the processor indicates whether the reference is cached or uncached. This information is used to determine whether or not a multiword transaction is required. | ■ A processor output has been added to directly control the output enable of the register between the memory system and the processor data bus.<br><br>Differences not relating to the memory interface are as follows.<br><br>■ The maximum cache size supported has been extended to 256 Kbytes for both the instruction and data caches.<br><br>■ Partial word stores are executed as read-modify-write operations. If the store hits in the cache, the appropriate bytes of the cached word and the new word are merged and the cache is updated.<br><br>■ The LR3000 processor directly drives the cache control signals eliminating the skew and delay of external buffers.<br><br>■ The coprocessor busy input is mode selectable to be either active low or active high. This allows systems which have only the floating-point accelerator to directly connect the floating-point-busy output to the coprocessor-busy input. |
| Software and Development Support | The UMIPS operating system is licensable in compiled form from LSI Logic and source code form from MIPS Computer Systems, Inc. UMIPS is available in both System V.3 and 4.3BSD. UMIPS includes the full complement of UNIX software development utilities such as text editing, source code checking, source code debugging, performance analysis, document formatting, software project management and compiler generation. | Compilers for C, Pascal, FORTRAN, Ada, COBOL and PL-1 are available from LSI Logic or third parties.<br><br>Board-level products are also available to use as machine code compatible execution vehicles to verify correctness and performance of machine-level instructions. |

LR3000 High Performance RISC Microprocessor
Preliminary

Pin Descriptions

(Note: an asterisk* indicates an Active-LOW signal)

Data Bus (D31:0)
The 32-bit bidirectional data bus carries all data and instructions between the CPU, caches, main memory and coprocessors.

Data Parity (DataP3:0)
The four-bit bidirectional data parity bus provides even parity for each of the four bytes of the 32-bit data bus.

Address Low Bus (AdrLo17:0)
The 18-bit AdrLo output carries low-order address bits to the caches and memory subsystem. Only the 16 most significant bits are used to access cache locations. The AdrLo bus is set to high impedance when reset* is asserted or when the processor is brought out of reset in the test state.

Tag Bus (Tag31:12)
The 20-bit tag bus transfers cache tags into the CPU during cache reads. During cache writes, the tag bus carries tag bits into the cache. For main memory accesses, the 16 most significant bits are combined with the AdrLo bus to form a 32-bit physical address.

Tag Valid (TagV)
TagV carries the valid bit between the LR3000 and the caches. During write operation, TagV is HIGH when writing a full 32-bit word to cache and LOW otherwise. During cache reads, TagV is used as one of the criteria in determining whether a cache hit has occurred.

Tag Parity Bus (TagP2:0)
This 3-bit bidirectional bus contains even parity for Tag31:12 and TagV. Tag parity is generated for cache writes and checked during caches reads. A tag parity error is treated as a cache miss.

I-Cache Read (IRd1)
D-Cache Read (DRd1)
These outputs are asserted during I-cache and D-cache read operations to enable the outputs of the cache RAMs.

I-Cache Read (IRd2)
D-Cache Read (DRd2)
Identical copies of IRd1 and DRd1 to split the load.

I-Cache Write (IWr1)
D-Cache Write (DWr1)
These outputs are asserted during I-cache and D-cache write operations. These signals are typically used as the write-enable or write-strobe input to the cache RAMs.

I-Cache Write (IWr2)
D-Cache Write (DWr2)
An identical copy of IWr1 and DWr1 to split the load.

**I-Cache Latch Clock (IClk*)**
**D-Cache Latch Clock (DClk*)**
These outputs are asserted during every cycle. These signals are used to latch addresses into external latches and onto the address bus for the cache RAMs.

Access Type (AccTyp2:0)
AccTyp1 and AccTyp0 indicate the data size for memory accesses and processor-coprocessor transfers as shown below in Table 3.

Table 3. Access Type Bit Decoding

| AccTyp 1 0 | Data Size |
|---|---|
| 0 0 | Byte (8 bits) |
| 0 1 | Half-word (16 bits) |
| 1 0 | Three bytes (24 bits) |
| 1 1 | Word (32 bits) |

AccTyp2 indicates the purpose of an access: During stall cycles, when main memory read is as a result of an I-cache miss, (AccTyp2 is HIGH) or as a result of a D-cache miss (AccTyp2 is LOW).

During run cycles, when the processor data bus will be used during the current cycle, AccTyp2 is LOW, otherwise AccTyp2 is HIGH.

**Memory Write (MemWr*)**
The MemWr* output is LOW when the processor is performing any write-to-memory. This signal indicates that the tag and address-low buses contain a valid byte address.

**Memory Read (MemRd*)**
The MemRd* input is LOW when the processor is performing any read-from-memory. This indicates that the tag and address-low buses contain a valid byte address.

LR3000
High Performance RISC Microprocessor
Preliminary

Pin Descriptions (Continued)

**Read Enable (XEn*)**
The read enable for the read buffer.

Write Busy (WrBusy)
The main memory subsystem places the WrBusy* input LOW to inform the processor that it is not able to accept write data. If the processor needs to perform a write operation while WrBusy* is LOW, the processor stalls until WrBusy* becomes HIGH.

Read Busy (RdBusy)
The main memory subsystem places RdBusy input HIGH to indicate that it is not ready to supply read data requested by the processor. Whenever there is a cache miss, the processor always initiates a read stall while it performs a main memory read. When RdBusy is HIGH it causes the processor to remain in a main memory read stall until it goes LOW.

Run*
The Run* input is LOW when the processor is performing a run cycle and is HIGH when the processor is performing stall cycles.

Exception*
The Exception* output is LOW when the processor is responding to an exception and its instruction pipeline has been disrupted. Coprocessors are expected to terminate any instructions in their pipelines.

**Coprocessor Busy (CpBusy*)**
The input is set LOW by the coprocessor if it needs more time to resolve a data dependency in the instruction stream. When this occurs, the processor initiates a stall which is terminated when CpBusy* goes HIGH.

Coprocessor Condition (CPCond0:1)
A 2-bit bus used to transfer conditional branch status from the coprocessors to the main processor.

BusError*
This input indicates that a bus error (such as a bus time-out or invalid physical address) has occurred during a RdBusy or WrBusy* stall and causes either a data or instruction bus error exception. The BusError* input is to be used only with synchronous events such as cache miss refills, uncached references and unbuffered writes. A bus error resulting from a buffered write must be signaled using one of the interrupt inputs, since the processor is not in a stall and the address that caused the bus error may not still be available to the processor.

Reset*
Reset* is the synchronous initialization input. It must be LOW for a minimum of six cycles to guarantee correct processor initialization, and it must go HIGH with the LR3000 clocks. When Reset* is LOW, the processor initiates a non-maskable exception and subsequently proceeds to reinitialize the system using a predefined bootstrap routine.

**Interrupt 0 (Intr0*)**
When Reset* is HIGH, the value of Intr0* determines byte ordering or endianness. A HIGH results in a little endian ordering and a LOW results in big endian ordering.

**Interrupt 1 (Intr1*)**
When Reset* is HIGH, a LOW on Intr1* causes the processor to place all outputs into high impedance to allow external logic to drive signals for board-level testing.

**Interrupt 2 (Intr2*)**
When Reset* is LOW, the value of Intr2* determines whether caches are presumed present for instructions and data.

**Interrupt 3 (Intr3*)**
When Reset* is LOW, a LOW on Intr3* causes the processor to place its data and tag outputs into high impedance during write-busy and coprocessor-busy stalls. If Intr3* is HIGH during reset, the data and tag buses are driven during phase 2 of stall cycles. For designs that do not use buses during such stalls, enabling the bus drive prevents the buses from floating for extended periods and avoids overall system design problems.

**Interrupt 4 (Intr4*)**
When Reset* is LOW, a LOW value of Intr4* causes the processor to insert additional phase delay into its input clock paths. This allows coprocessors to phase lock to the processor and minimize skew.

**Interrupt 5 (Intr5*)**
Intr5* must be held HIGH during phase 2 while Reset* is HIGH. This will maintain compatibility with future product revisions.

**SysOut*, CpSync***
Synchronizing Clock Outputs.

Clk2xSys, Clk2xSmp, Clk2xRd, Clk2xPhi
Four clock inputs. These can be adjusted to obtain optimal positioning of cache interface signals. The relative differences between the clocks are more important than the absolute clock timing. These differences are used to establish the parameters for cache timing.

LR3000
High Performance
RISC Microprocessor
Preliminary

Operating Parameters

Absolute Maximum Ratings[1]

| Parameter | Description | Min | Max | Units |
|---|---|---|---|---|
| VCC | Supply Voltage | −0.5 | +7.0 | V |
| VIN | Input Voltage | −0.5[2] | +7.0 | V |
| TST | Storage Temperature | −65 | +150 | C |
| TA | Operating Temperature | 0 | +70 | C |
| CLD | Load Capacitance on Any Pin | | 100 | pF |

Operating Range

| Range | Ambient Temperature | VCC |
|---|---|---|
| Commercial | 0°C to 70°C | 5V ± 5% |

Notes:
1. Operation beyond the limits set forth in this table may impair the useful life of the device.
2. VIN Min. = −3.0 V for pulse width less than 15 ns.
3. Not more than one output should be shorted at a time. Duration of the short should not exceed 30 seconds.

Packaging

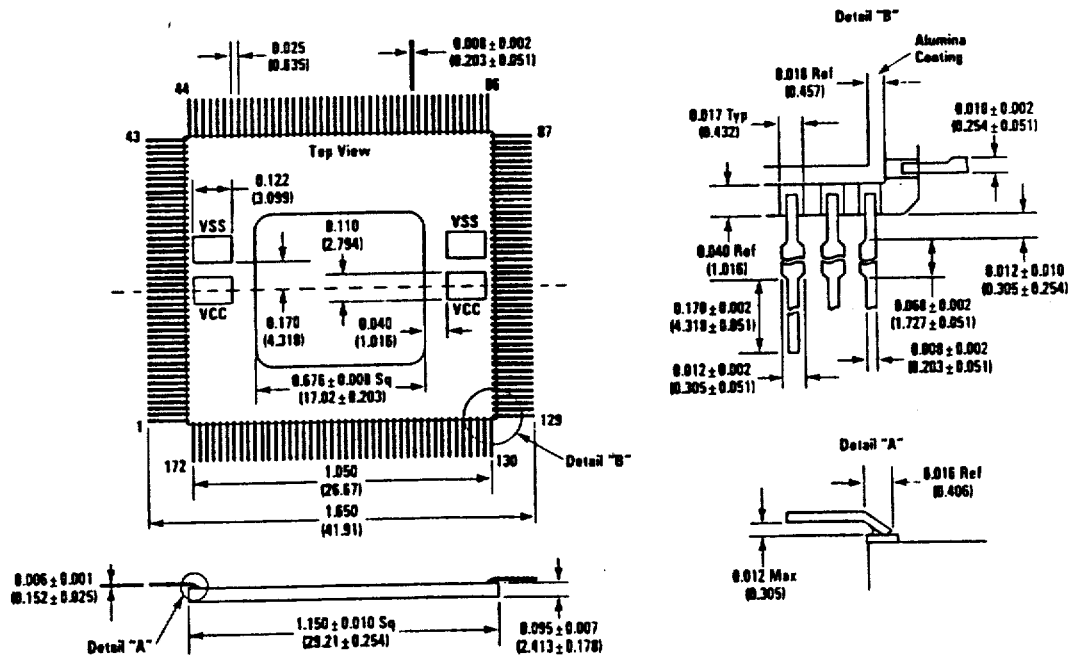

Note: Pin 1 identifiers on the 172 CLDCC package should be ignored. The correct pin ordering is as shown above.

LR3000
High Performance
RISC Microprocessor
Preliminary

Pin Assignments

Table 4. Pinout 172-Pin Ceramic Flat Pack

| Pin Name | Pin Number | Pin Name | Pin Number | Pin Name | Pin Number | Pin Name | Pin Number |
|---|---|---|---|---|---|---|---|
| Data(0) | 84 | Tag(12) | 130 | AdrLo(0) | 85 | VCC1 | 10 |
| Data(1) | 83 | Tag(13) | 131 | AdrLo(1) | 86 | VCC2 | 11 |
| Data(2) | 82 | Tag(14) | 132 | AdrLo(2) | 87 | VCC3 | 19 |
| Data(3) | 79 | Tag(15) | 133 | AdrLo(3) | 88 | VCC4 | 20 |
| Data(4) | 78 | Tag(16) | 135 | AdrLo(4) | 89 | VCC5 | 21 |
| Data(5) | 77 | Tag(17) | 136 | AdrLo(5) | 90 | VCC6 | 25 |
| Data(6) | 76 | Tag(18) | 137 | AdrLo(6) | 91 | VCC7 | 26 |
| Data(7) | 81 | Tag(19) | 138 | AdrLo(7) | 92 | VCC8 | 57 |
| Data(8) | 75 | Tag(20) | 139 | AdrLo(8) | 93 | VCC9 | 58 |
| Data(9) | 74 | Tag(21) | 140 | AdrLo(9) | 94 | VCC10 | 61 |
| Data(10) | 73 | Tag(22) | 141 | AdrLo(10) | 95 | VCC11 | 62 |
| Data(11) | 54 | Tag(23) | 148 | AdrLo(11) | 96 | VCC12 | 63 |
| Data(12) | 53 | Tag(24) | 154 | ArdLo(12) | 97 | VCC13 | 67 |
| Data(13) | 52 | Tag(25) | 156 | AdrLo(13) | 98 | VCC14 | 68 |
| Data(14) | 51 | Tag(26) | 157 | AdrLo(14) | 99 | VCC15 | 100 |
| Data(15) | 59 | Tag(27) | 160 | AdrLo(15) | 111 | VCC16 | 101 |
| Data(16) | 50 | Tag(28) | 161 | AdrLo(16) | 117 | VCC17 | 102 |
| Data(17) | 49 | Tag(29) | 162 | AdrLo(17) | 118 | VCC18 | 105 |
| Data(18) | 48 | Tag(30) | 163 | XEn* | 34 | VCC19 | 106 |
| Data(19) | 45 | Tag(31) | 165 | IRD1* | 15 | VCC20 | 108 |
| Data(20) | 44 | TagP(0) | 134 | IRD2* | 5 | VCC21 | 109 |
| Data(21) | 43 | TagP(1) | 150 | IWr1* | 13 | VCC22 | 110 |
| Data(22) | 42 | TagP(2) | 164 | IWr2* | 3 | VCC23 | 142 |
| Data(23) | 47 | TagV | 166 | DRd1* | 14 | VCC24 | 143 |
| Data(24) | 41 | Int*(0) | 119 | DRd2* | 4 | VCC25 | 144 |
| Data(25) | 40 | Int*(1) | 120 | DWr1* | 12 | VCC26 | 149 |
| Data(26) | 39 | Int*(2) | 121 | DWr2* | 2 | VCC27 | 155 |
| Data(27) | 36 | Int*(3) | 122 | IClk | 6 | Gnd1 | 17 |
| Data(28) | 35 | Int*(4) | 123 | DClk | 7 | Gnd2 | 18 |
| Data(29) | 33 | Int*(5) | 124 | Rcsvd0 | 72 | Gnd3 | 22 |
| Data(30) | 32 | CpCond(0) | 112 | Resvd1 | 114 | Gnd4 | 23 |
| Data(31) | 38 | CpCond(1) | 113 | Resvd2 | 153 | Gnd5 | 24 |
| DataP(0) | 80 | AccTyp(0) | 169 | Gnd17 | 104 | Gnd6 | 28 |
| DataP(1) | 55 | AccTyp(1) | 168 | Gnd18 | 107 | Gnd7 | 29 |
| DataP(2) | 46 | AccTyp(2) | 167 | Gnd19 | 115 | Gnd8 | 56 |
| DataP(3) | 37 | MemWr* | 1 | Gnd20 | 116 | Gnd9 | 60 |
| Clk2xSys | 16 | MemRd* | 172 | Gnd21 | 145 | Gnd10 | 64 |
| Clk2xSmp | 27 | Run* | 170 | Gnd22 | 146 | Gnd11 | 65 |
| Clk2xRd | 9 | Exc* | 31 | Gnd23 | 147 | Gnd12 | 66 |
| Clk2xPhi | 30 | BusError* | 128 | Gnd24 | 151 | Gnd13 | 69 |
| RdBusy | 127 | Reset* | 129 | Gnd25 | 152 | Gnd14 | 70 |
| WrBusy* | 126 | SysOut* | 8 | Gnd26 | 158 | Gnd15 | 71 |
| CpBusy | 125 | CpSync* | 171 | Gnd27 | 159 | Gnd16 | 103 |

Note: An asterisk * indicates an Active-LOW signal.

LR3000
High Performance RISC Microprocessor
Preliminary

Description

The LR3000 CPU is the third generation of the MIPS RISC (Reduced Instruction Set Computer) microprocessor architecture. The LR3000 is an extension of the RISC architecture developed by MIPS Computer Systems Inc. and maintains binary compatibility with the previous generation LR2000 chip set. This architecture delivers performance exceeding 20 VAX 11/780 mips. The processor includes on-chip memory management and support for up to three coprocessors including the LR3010 Floating-Point Accelerator.

Figure 1 shows a representative system configuration using the LR3000. The processor has been designed with system trade-offs in mind; incorporating in hardware only those features which will yield a net performance gain. The CPU contains interfaces to three subsystems. Cache control for separate data and instruction caches permits implementation of off-chip caches using standard SRAM devices. Main memory control logic interfaces with the LR3020 Write Buffer to improve memory bandwidth. The coprocessor interface links up to three additional coprocessors including the LR3010 Floating-Point Accelerator (FPA). The LR3000 generates all the required cache and main memory control and address signals for the attached coprocessors.

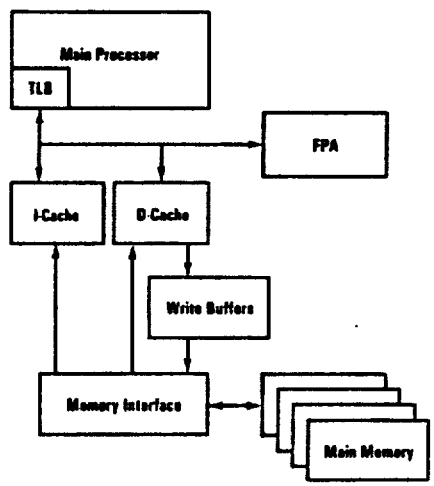

Figure 1. Representative System Configuration

Features

- Reduced Instruction Set Computer (RISC) architecture
  - MIPS instruction set
  - Simple 32-bit instructions, single addressing mode
  - Register-to-register, load-store operation
  - All instructions (except MPY and DIV) execute in a single cycle
  - LR2000 binary code compatibility
- High performance
  - Fast instruction cycle with five-stage pipeline
  - Efficient handling of pipeline stalls and exceptional events
- Two speed versions
  LR3000 LC  16.7 MHz  12 VAX mips equivalents
  LR3000 ALC 25 MHz  20 VAX mips equivalents
- Optional devices tightly coupled for high performance
  LR3010    Floating-Point Accelerator (FPA)
  LR3020    Write Buffers (WB)
- 32 general-purpose registers
- On-chip memory management unit (MMU)
  - Fully-associative, 64-entry translation lookaside buffer (TLB)
  - Supports 4-Gbyte virtual address space

- On-chip cache control
  - Separate external instruction and data cache memories
  - Up to 256 Kbytes each
  - Both cache memories accessed during a single CPU cycle
  - Dual cache bandwidth up to 200 Mbytes/second
- Multi-tasking support
  - User and kernel (supervisor) modes
- Seamless coprocessor interface
  - Generates all addresses and handles memory interface control
  - Supports up to three external coprocessors
- Strong, integrated software support
  UMIPS operating system
    System V.3, 4.3 BSD
  Optimizing compilers
    C              Ada (Verdix)
    FORTRAN        COBOL (LPI)
    Pascal         PL-1 (LPI)
- Development system support
  - MIPS M-Series systems provide hardware, software and applications development environment
- 172 ceramic leaded chip carrier

**LR3000
High Perfor...nce
RISC Microprocessor
Preliminary**

Block Diagram

The LR3000 processor shown in Figure 2 consists of two integrated processors. In addition to a RISC (Reduced Instruction Set Computer) CPU there is a system control coprocessor (CP0) which contains a fully associative TLB (translation lookaside buffer) and control registers to support a virtual memory subsystem.

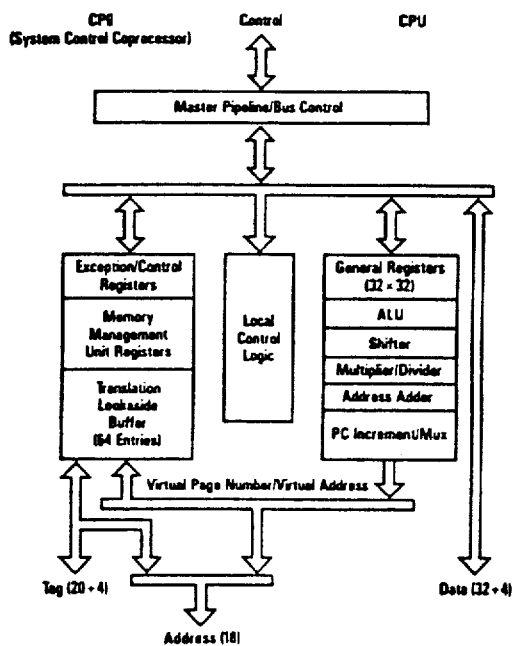

Figure 2. Functional Block Diagram

LR3000
High Performance
RISC Microprocessor
Preliminary

Pipeline Architecture

The execution of a single LR3000 instruction consists of five primary steps:

IF — Instruction Fetch. Access the TLB and calculate the instruction address required to read an instruction from the I-cache. Note that the instruction is not actually read into the processor until the beginning (phase 1) of the RD pipe stage.

RD — Read any required operands from CPU registers (RF = Register Fetch) while decoding the instruction.

ALU — Perform the required operation on instruction operands.

MEM — Access memory (D-cache) if required (for a Load or Store instruction).

WB — Write ALU results back to the register file.

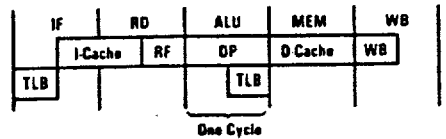

Figure 3. Instruction Execution Sequence

Each of these steps requires an average of one CPU cycle. The LR3000 uses a five-stage pipeline to achieve an instruction execution rate approaching one instruction per CPU cycle. See Figures 3 and 4. This pipeline operates efficiently because different CPU resources (address and data bus accesses, ALU operations, register accesses, etc.) are utilized on a non-interfering basis. Even Load and Store operations execute in a single cycle.

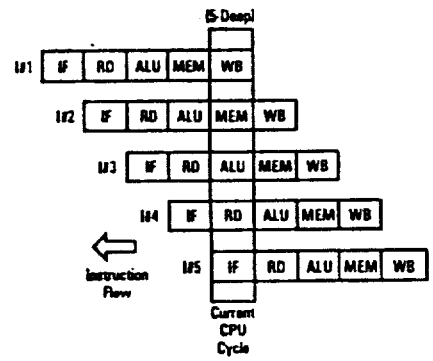

Figure 4. Instruction Pipeline

LR3000
High Performance
RISC Microprocessor
Preliminary

Data and Register Organization

As described in Figure 5A, the LR3000 CPU provides 32 general purpose 32-bit registers, a 32-bit program counter and two 32-bit registers which hold the results of integer multiply and divide operations. The functions traditionally provided by a program status word (PSW) register are handled by the status and cause registers in the CP0.

The 32 general registers are treated symmetrically with two exceptions: r0 is hardwired to a zero value; and, r31 is the link register for jump and link instructions. Register r0 may be specified as a target register for any instruction when the result of the operation is discarded. The register maintains a value of zero under all conditions when used as a source register.

The LR3000 defines a 32-bit word, a 16-bit half word and an 8-bit byte. The byte ordering is configurable (configuration occurs during RESET) into either big-endian or little-endian byte ordering.

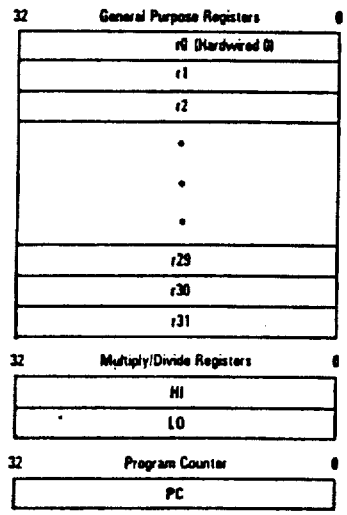

Figure 5A. CPU Registers

When configured as a big-endian system, byte 0 is always the most significant (leftmost) byte, thereby providing compatibility with MC68000 and IBM 370 conventions.

When configured as a little-endian system, byte 0 is always the least significant (rightmost) byte, which is compatible with iAPX x86, NS32000 and DEX VAX conventions.

Bit 0 is always the least significant (rightmost) bit; thus bit designations are always little endian (although no instructions explicitly designate bit positions within words). Figures 5B and 5C below show the ordering of bytes within words and the ordering of words within multiple-word structures of the big-endian and little-endian conventions.

| Higher Address | Big Endian | | | | Word Address |
|---|---|---|---|---|---|
| 31 | 24 23 | 16 15 | 8 7 | 0 | |
| ⇧ | 8 | 9 | 10 | 11 | 8 |
| | 4 | 5 | 6 | 7 | 4 |
| Lower Address | 0 | 1 | 2 | 3 | 0 |

Most significant byte is at lowest address.
Word is addressed by byte address of most significant byte.

Figure 5B. Addresses of Bytes within Words: Big Endian

| Higher Address | Little Endian | | | | Word Address |
|---|---|---|---|---|---|
| 31 | 24 23 | 16 15 | 8 7 | 0 | |
| ⇧ | 11 | 10 | 9 | 8 | 8 |
| | 7 | 6 | 5 | 4 | 4 |
| Lower Address | 3 | 2 | 1 | 0 | 0 |

Least significant byte is at lowest address.
Word is addressed by byte address of least significant byte.

Figure 5C. Addresses of Bytes within Words: Little Endian

LR3000
High Performance
RISC Microprocessor
Preliminary

| Instructions | All LR3000 instructions are 32 bits in length. To simplify instruction decoding, only three instruction formats are supported (immediate, jump and register). The instruction set can be divided into the following groups. |
|---|---|

- Load/Store instructions move data between memory and the general registers. All instructions are then executed on values stored in the general registers. There are no operations performed directly in memory. Loads and stores are all I-type instructions since the only addressing mode supported is base register + 16-bit immediate offset.

- Computational instructions perform arithmetic, logical and shift operations on values in registers. These can be R-type (both operands are registers) or I-type (one operand is a 16-bit immediate) instruction formats.

- Jump and Branch instructions change program flow. All jump and branch instructions occur with a one-instruction delay. The instruction immediately following the jump or branch is always executed while the target instruction is being fetched from storage. Jumps are always to a paged absolute address formed by combining a 26-bit target with four bits of the program counter (J-type format for subroutine calls), or 32-bit register byte addresses (R-type for returns and dispatches). Branches have 16-bit offsets relative to the program counter (I-type). Jump and link instructions save a return address in Register 31.

- Coprocessor instructions perform operations in the coprocessors. Coprocesser loads and stores are I-type, or have coprocessor-dependent formats. Coprocessor 0 instructions perform operations on the CP0 registers to manipulate memory management and exception handling facilities.

- Special instructions perform a variety of tasks including movement of data between special and general registers, trap, and breakpoint. They are always R-type.

LR3000
High Performance
RISC Microprocessor
Preliminary

Table 1. Instruction Summary

| OP | Description |
|---|---|
| | Load/Store Instructions |
| LB | Load Byte |
| LBU | Load Byte Unsigned |
| LH | Load Halfword |
| LHU | Load Halfword Unsigned |
| LW | Load Word |
| LWL | Load Word Left |
| LWR | Load Word Right |
| SB | Store Byte |
| SH | Store Halfword |
| SW | Store Word |
| SWL | Store Word Left |
| SWR | Store Word Right |
| | Arithmetic Instructions (ALU Immediate) |
| ADDI | Add Immediate |
| ADDIU | Add Immediate Unsigned |
| SLTI | Set on Less than Immediate |
| SLTIU | Set on Less than Immediate Unsigned |
| ANDI | AND Immediate |
| ORI | OR Immediate |
| XORI | Exclusive OR Immediate |
| LUI | Load Upper Immediate |
| | Arithmetic Instructions (3-operand, register-type) |
| ADD | Add |
| ADDU | Add Unsigned |
| SUB | Subtract |
| SUBU | Subtract Unsigned |
| SLT | Set on Less than |
| SLTU | Set on Less than Unsigned |
| AND | AND |
| OR | OR |
| XOR | Exclusive OR |
| NOR | NOR |
| | Shift Instructions |
| SLL | Shift Left Logical |
| SRL | Shift Right Logical |
| SRA | Shift Right Arithmetic |
| SLLV | Shift Left Logical Variable |
| SRLV | Shift Right Logical Variable |
| SRAV | Shift Right Arithmetic Variable |

| OP | Description |
|---|---|
| | Multiply/Divide Instructions |
| MULT | Multiply |
| MULTU | Multiply Unsigned |
| DIV | Divide |
| DIVU | Divide Unsigned |
| MFHI | Move From HI |
| MTHI | Move to HI |
| MFLO | Move From LO |
| MTLO | Move to LO |
| | Jump and Branch Instructions |
| J | Jump |
| JAL | Jump and Link |
| JR | Jump to Register |
| JALR | Jump and Link Register |
| BEQ | Branch on Equal |
| BNE | Branch on Not Equal |
| BLEZ | Branch on Less than or Equal to Zero |
| BGTZ | Branch on Greater than Zero |
| BLTZ | Branch on Less than Zero |
| BGEZ | Branch on Greater than or Equal to Zero |
| BLTZAL | Branch on Less than Zero and Link |
| BGEZAL | Branch on Greater than or Equal to Zero and Link |
| | Special Instructions |
| SYSCALL | System Call |
| BREAK | Break |
| | Coprocessor Instructions |
| LWCz | Load Word to Coprocessor |
| SWCz | Store Word from Coprocessor |
| MTCz | Move to Coprocessor |
| MFCz | Move from Coprocessor |
| CTCz | Move Control to Coprocessor |
| CFCz | Move Control from Coprocessor |
| COPz | Coprocessor Operation |
| BCzT | Branch on Coprocessor z True |
| BCzF | Branch on Coprocessor z False |
| | System Control Coprocessor (CP0) Instructions |
| MTC0 | Move to CP0 |
| MFC0 | Move from CP0 |
| TLBR | Read Indexed TLB Entry |
| TLBWI | Write Indexed TLB Entry |
| TLBWR | Write Random TLB Entry |
| TLBP | Probe TLB for Matching Entry |
| RFE | Restore from Exception |

LR3000
High Performance
RISC Microprocessor
Preliminary

Instructions (Continued)

I-Type (Immediate)

| 31 26 | 25 21 | 20 16 | 15 0 |
|---|---|---|---|
| OP | RS | RT | Immediate |

J-Type (Jump)

| 31 26 | 25 0 |
|---|---|
| OP | Target |

R-Type (Register)

| 31 26 | 25 21 | 20 16 | 15 11 | 10 6 | 5 0 |
|---|---|---|---|---|---|
| OP | RS | RT | RD | Shamt | Funct |

Figure 6. LR3000 Instruction Formats

Where:

| | |
|---|---|
| OP | A 6-bit operation code |
| Rs | A 5-bit source register specifier |
| Rt | A 5-bit target (source/destination) register or branch condition |
| Immediate | A 16-bit immediate, branch displacement or address displacement |
| Target | A 26-bit jump target address |
| Rd | A 5-bit destination register specifier |
| Shamt | A 5-bit shift amount |
| Funct | A 6-bit function field |

System Control Coprocessor (CP0)

The LR3000 can operate with up to four coprocessors (CP0 through CP3). The system control coprocessor (CP0) is on-chip and supports the virtual memory system and exception handling functions of the LR3000. The virtual memory system is implemented using a translation lookaside buffer and a group of programmable registers.

The CP0 registers shown in Figure 7 are used to manipulate the memory management and exception handling capabilities. Table 2 provides a description of each register.

Table 2. System Control Coprocessor (CP0) Registers

| Register | Description |
|---|---|
| EntryHi | High half of a TLB entry |
| EntryLo | Low half of a TLB entry |
| Index | Programmable pointer into TLB array |
| Random | Pseudo-random pointer into TLB array |
| Status | Mode, interrupt enables, and diagnostic status info |
| Cause | Indicates nature of last exception |
| EPC | Exception program counter |
| Context | Pointer into kernel's virtual page table entry array |
| BadVA | Most recent bad virtual address |
| PRId | Processor revision identification |

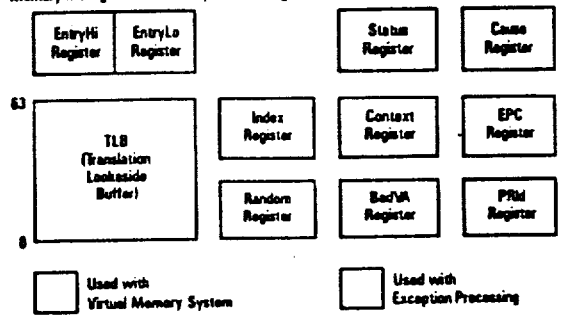

Figure 7. CP0 Registers

LR3000
High Perfor...nce
RISC Microprocessor
Preliminary

| | | |
|---|---|---|
| Coprocessors | Three types of coprocessor instructions are supported: loads and stores, internal operations, and moves between the coprocessors. The LR3000 coprocessors and the main processor share the same instruction stream. Coprocessor instructions | are not explicitly passed to a coprocessor by the LR3000. Instead, coprocessors continuously monitor the data bus, receive instruction/data pairs, and decode valid instructions at the same rate as the main processor. |
| Memory Management System | The LR3000 supports interfaces to cache memory and main memory. Often-used operands and instructions are placed into cache memory where the processor can access them quickly. Two direct-mapped caches for instructions (I-cache) and data (D-cache) can range in size from 4 Kbytes to 256 Kbytes. Cache memory access operations take a single cycle to complete. A main memory interface supports reads to and writes from main (non-cached) memory.<br><br>The LR3000 has an addressing range of 4 Gbytes (2 Gbytes for the user, 2 Gbytes for the kernel). Since most systems implement physical memory sizes under 4 Gbytes, the LR3000 provides for the logical expansion of memory space by translating | addresses composed in a large virtual address space into available physical memory address.<br><br>The on-chip translation lookaside buffer provides very fast virtual memory access and is well matched to the requirements of multi-tasking operating systems. The fully-associative TLB contains 64 entries, each of which maps a 4 Kbyte page, with controls for read/write access, cacheability and process identification.<br><br>The D-cache can be isolated from main memory. The processor also allows swapping of the instruction and data caches. Both operations are used to support cache flushing, diagnostics and troubleshooting. |

LR3000
High Performance
RISC Microprocessor
Preliminary

Operating Modes

The LR3000 has two operating modes: user mode and kernel mode. The processor normally operates in user mode until an exception is detected forcing it into the kernel mode. It remains in kernel mode until a restore from exception (RFE) instruction is executed. The manner in which the memory addresses are mapped depends on the operating mode of the LR3000. Figure 8 shows the virtual address space for the two operating modes.

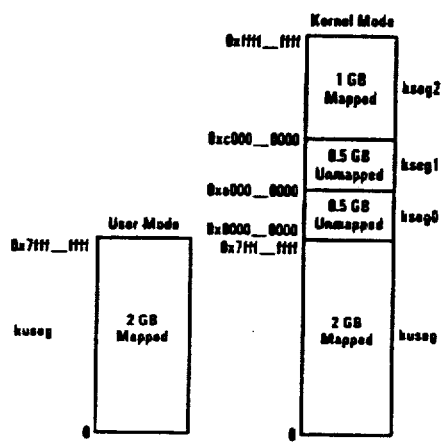

Figure 8. LR3000 Virtual Addressing

User Mode – In this mode, a single, uniform virtual address space (kuseg) of 2 Gbytes is available. Each virtual address is extended with a 6-bit process identifier field to form unique virtual addresses for up to 64 processes. All references to this segment are mapped through the TLB. Use of the cache is determined by bit settings for each page within the TLB entries.

Kernel Mode – Four separate segments are defined in this mode:

kuseg – when in kernel mode, references to this segment are treated like user mode references, sreamlining kernel access to user data.

kseg0 – references to this 512-Mbyte segment use cache memory but are not mapped through the TLB. Instead they always map to the first 0.5 Gbytes of physical memory.

kseg1 – references to this 512-Mbyte segment are not mapped through the TLB and do not use cache. Instead, they are hard-mapped into the same 0.5 Gbyte segment of physical memory space as kseg0.

kseg2 – references to this 1-Gbyte segment are always mapped through the TLB. Use of the cache is determined by bit setting within the TLB entries.

LR3000
High Performance
RISC Microprocessor
Preliminary

| | | |
|---|---|---|
| Memory System Hierarchy | The LR3000 supports a high-performance memory hierarchy which centers on the use of external caches. Separate data and instruction caches allow the processor to obtain data and instructions at the CPU cycle rate. These caches are built using commercially available high-speed static RAMs. To en- | sure data consistency, all data written into cache should be written through main memory. LR3020 Write Buffers capture output data from the CPU at the system clock rate and update slower main memory. |
| LR2000 Compatibility | The LR3000 is instruction set compatible with the LR2000 processor and is in most other respects similar to the LR2000. The principal differences are in the memory interface. These differences are outlined below.<br><br>■ The LR3000 supports block refill of both the instruction and the data caches. Block sizes of 4, 8, 16, or 32 words are supported with size independently selectable for each cache. In general, the block size is chosen based on the size of the cache and the main memory latency. Blocks are written into the cache at one word per cycle.<br><br>■ The LR3000 supports concurrent refill and execution of instructions. In many cases, this concurrency permits instruction cache refill to occur transparently.<br><br>■ During memory read stalls, the processor indicates whether the reference is cached or uncached. This information is used to determine whether or not a multiword transaction is required. | ■ A processor output has been added to directly control the output enable of the register between the memory system and the processor data bus.<br><br>Differences not relating to the memory interface are as follows.<br><br>■ The maximum cache size supported has been extended to 256 Kbytes for both the instruction and data caches.<br><br>■ Partial word stores are executed as read-modify-write operations. If the store hits in the cache, the appropriate bytes of the cached word and the new word are merged and the cache is updated.<br><br>■ The LR3000 processor directly drives the cache control signals eliminating the skew and delay of external buffers.<br><br>■ The coprocessor busy input is mode selectable to be either active low or active high. This allows systems which have only the floating-point accelerator to directly connect the floating-point-busy output to the coprocessor-busy input. |
| Software and Development Support | The UMIPS operating system is licensable in compiled form from LSI Logic and source code form from MIPS Computer Systems, Inc. UMIPS is available in both System V.3 and 4.3BSD. UMIPS includes the full complement of UNIX software development utilities such as text editing, source code checking, source code debugging, performance analysis, document formatting, software project management and compiler generation. | Compilers for C, Pascal, FORTRAN, Ada, COBOL and PL-1 are available from LSI Logic or third parties.<br><br>Board-level products are also available to use as machine code compatible execution vehicles to verify correctness and performance of machine-level instructions. |

LSI 

LR3000
High Performance
RISC Microprocessor
Preliminary

---

Pin Descriptions (Continued)

**Read Enable (XEn*)**
The read enable for the read buffer.

Write Busy (WrBusy)
The main memory subsystem places the WrBusy* input LOW to inform the processor that it is not able to accept write data. If the processor needs to perform a write operation while WrBusy* is LOW, the processor stalls until WrBusy* becomes HIGH.

Read Busy (RdBusy)
The main memory subsystem places RdBusy input HIGH to indicate that it is not ready to supply read data requested by the processor. Whenever there is a cache miss, the processor always initiates a read stall while it performs a main memory read. When RdBusy is HIGH it causes the processor to remain in a main memory read stall until it goes LOW.

Run*
The Run* input is LOW when the processor is performing a run cycle and is HIGH when the processor is performing stall cycles.

Exception*
The Exception* output is LOW when the processor is responding to an exception and its instruction pipeline has been disrupted. Coprocessors are expected to terminate any instructions in their pipelines.

**Coprocessor Busy (CpBusy*)**
The input is set LOW by the coprocessor if it needs more time to resolve a data dependency in the instruction stream. When this occurs, the processor initiates a stall which is terminated when CpBusy* goes HIGH.

Coprocessor Condition (CPCond0:1)
A 2-bit bus used to transfer conditional branch status from the coprocessors to the main processor.

BusError*
This input indicates that a bus error (such as a bus time-out or invalid physical address) has occurred during a RdBusy or WrBusy* stall and causes either a data or instruction bus error exception. The BusError* input is to be used only with synchronous events such as cache miss refills, uncached references and unbuffered writes. A bus error resulting from a buffered write must be signaled using one of the interrupt inputs, since the processor is not in a stall and the address that caused the bus error may not still be available to the processor.

Reset*
Reset* is the synchronous initialization input. It must be LOW for a minimum of six cycles to guarantee correct processor initialization, and it must go HIGH with the LR3000 clocks. When Reset* is LOW, the processor initiates a non-maskable exception and subsequently proceeds to reinitialize the system using a predefined bootstrap routine.

**Interrupt 0 (Intr0*)**
When Reset* is HIGH, the value of Intr0* determines byte ordering or endianness. A HIGH results in a little endian ordering and a LOW results in big endian ordering.

**Interrupt 1 (Intr1*)**
When Reset* is HIGH, a LOW on Intr1* causes the processor to place all outputs into high impedance to allow external logic to drive signals for board-level testing.

**Interrupt 2 (Intr2*)**
When Reset* is LOW, the value of Intr2* determines whether caches are presumed present for instructions and data.

**Interrupt 3 (Intr3*)**
When Reset* is LOW, a LOW on Intr3* causes the processor to place its data and tag outputs into high impedance during write-busy and coprocessor-busy stalls. If Intr3* is HIGH during reset, the data and tag buses are driven during phase 2 of stall cycles. For designs that do not use buses during such stalls, enabling the bus drive prevents the buses from floating for extended periods and avoids overall system design problems.

**Interrupt 4 (Intr4*)**
When Reset* is LOW, a LOW value of Intr4* causes the processor to insert additional phase delay into its input clock paths. This allows coprocessors to phase lock to the processor and minimize skew.

**Interrupt 5 (Intr5*)**
Intr5* must be held HIGH during phase 2 while Reset* is HIGH. This will maintain compatibility with future product revisions.

**SysOut*, CpSync***
Synchronizing Clock Outputs.

Clk2xSys, Clk2xSmp, Clk2xRd, Clk2xPhi
Four clock inputs. These can be adjusted to obtain optimal positioning of cache interface signals. The relative differences between the clocks are more important than the absolute clock timing. These differences are used to establish the parameters for cache timing.

LR3000 High Performance RISC Microprocessor
Preliminary

Operating Parameters

Absolute Maximum Ratings[1]

| Parameter | Description | Min | Max | Units |
|---|---|---|---|---|
| VCC | Supply Voltage | -0.5 | +7.0 | V |
| VIN | Input Voltage | -0.5[2] | +7.0 | V |
| TST | Storage Temperature | -65 | +150 | C |
| TA | Operating Temperature | 0 | +70 | C |
| CLD | Load Capacitance on Any Pin | | 100 | pF |

Notes:
1. Operation beyond the limits set forth in this table may impair the useful life of the device.
2. VIN Min. = -3.0 V for pulse width less than 15 ns.
3. Not more than one output should be shorted at a time. Duration of the short should not exceed 30 seconds.

Operating Range

| Range | Ambient Temperature | VCC |
|---|---|---|
| Commercial | 0°C to 70°C | 5V ± 5% |

Packaging

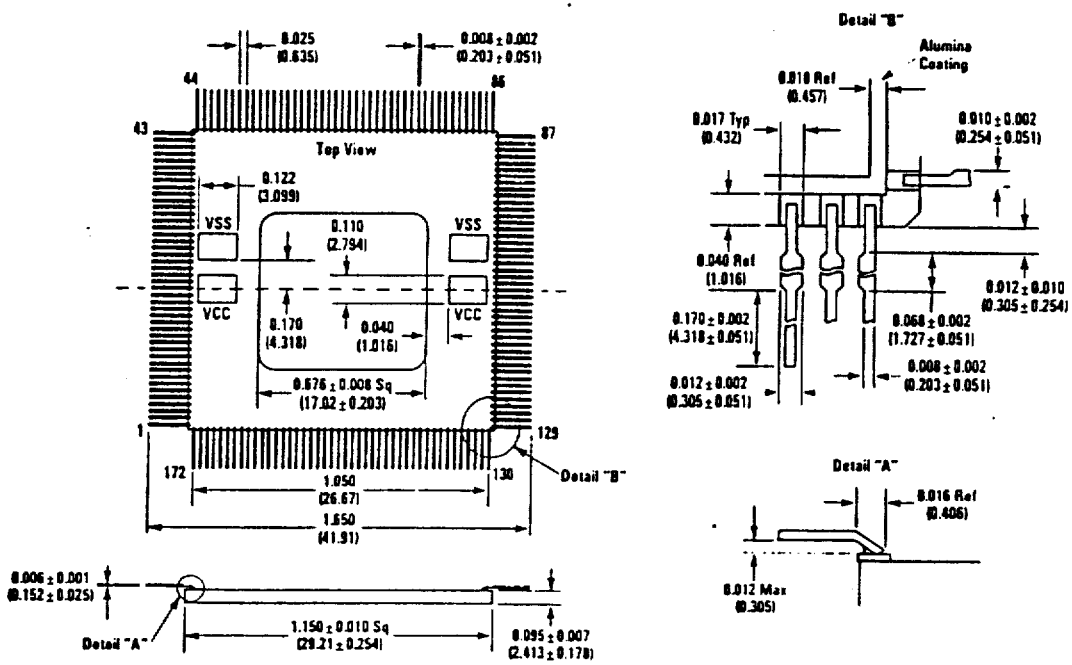

Note: Pin 1 identifiers on the 172 CLDCC package should be ignored. The correct pin ordering is as shown above.

LR3000
High Performance
RISC Microprocessor
Preliminary

Pin Assignments

Table 4. Pinout 172-Pin Ceramic Flat Pack

| Pin Name | Pin Number | Pin Name | Pin Number | Pin Name | Pin Number | Pin Name | Pin Number |
|---|---|---|---|---|---|---|---|
| Data(0) | 84 | Tag(12) | 130 | AdrLo(0) | 85 | VCC1 | 10 |
| Data(1) | 83 | Tag(13) | 131 | AdrLo(1) | 86 | VCC2 | 11 |
| Data(2) | 82 | Tag(14) | 132 | AdrLo(2) | 87 | VCC3 | 19 |
| Data(3) | 79 | Tag(15) | 133 | AdrLo(3) | 88 | VCC4 | 20 |
| Data(4) | 78 | Tag(16) | 135 | AdrLo(4) | 89 | VCC5 | 21 |
| Data(5) | 77 | Tag(17) | 136 | AdrLo(5) | 90 | VCC6 | 25 |
| Data(6) | 76 | Tag(18) | 137 | AdrLo(6) | 91 | VCC7 | 26 |
| Data(7) | 81 | Tag(19) | 138 | AdrLo(7) | 92 | VCC8 | 57 |
| Data(8) | 75 | Tag(20) | 139 | AdrLo(8) | 93 | VCC9 | 58 |
| Data(9) | 74 | Tag(21) | 140 | AdrLo(9) | 94 | VCC10 | 61 |
| Data(10) | 73 | Tag(22) | 141 | AdrLo(10) | 95 | VCC11 | 62 |
| Data(11) | 54 | Tag(23) | 148 | AdrLo(11) | 96 | VCC12 | 63 |
| Data(12) | 53 | Tag(24) | 154 | ArdLo(12) | 97 | VCC13 | 67 |
| Data(13) | 52 | Tag(25) | 156 | AdrLo(13) | 98 | VCC14 | 68 |
| Data(14) | 51 | Tag(26) | 157 | AdrLo(14) | 99 | VCC15 | 100 |
| Data(15) | 59 | Tag(27) | 160 | AdrLo(15) | 111 | VCC16 | 101 |
| Data(16) | 50 | Tag(28) | 161 | AdrLo(16) | 117 | VCC17 | 102 |
| Data(17) | 49 | Tag(29) | 162 | AdrLo(17) | 118 | VCC18 | 105 |
| Data(18) | 48 | Tag(30) | 163 | XEn* | 34 | VCC19 | 106 |
| Data(19) | 45 | Tag(31) | 165 | IRD1* | 15 | VCC20 | 108 |
| Data(20) | 44 | TagP(0) | 134 | IRD2* | 5 | VCC21 | 109 |
| Data(21) | 43 | TagP(1) | 150 | IWr1* | 13 | VCC22 | 110 |
| Data(22) | 42 | TagP(2) | 164 | IWr2* | 3 | VCC23 | 142 |
| Data(23) | 47 | TagV | 166 | DRd1* | 14 | VCC24 | 143 |
| Data(24) | 41 | Int*(0) | 119 | DRd2* | 4 | VCC25 | 144 |
| Data(25) | 40 | Int*(1) | 120 | DWr1* | 12 | VCC26 | 149 |
| Data(26) | 39 | Int*(2) | 121 | DWr2* | 2 | VCC27 | 155 |
| Data(27) | 36 | Int*(3) | 122 | IClk | 6 | Gnd1 | 17 |
| Data(28) | 35 | Int*(4) | 123 | DClk | 7 | Gnd2 | 18 |
| Data(29) | 33 | Int*(5) | 124 | Resvd0 | 72 | Gnd3 | 22 |
| Data(30) | 32 | CpCond(0) | 112 | Resvd1 | 114 | Gnd4 | 23 |
| Data(31) | 38 | CpCond(1) | 113 | Resvd2 | 153 | Gnd5 | 24 |
| DataP(0) | 80 | AccTyp(0) | 169 | Gnd17 | 104 | Gnd6 | 28 |
| DataP(1) | 55 | AccTyp(1) | 168 | Gnd18 | 107 | Gnd7 | 29 |
| DataP(2) | 46 | AccTyp(2) | 167 | Gnd19 | 115 | Gnd8 | 56 |
| DataP(3) | 37 | MemWr* | 1 | Gnd20 | 116 | Gnd9 | 60 |
| Clk2xSys | 16 | MemRd* | 172 | Gnd21 | 145 | Gnd10 | 64 |
| Clk2xSmp | 27 | Run* | 170 | Gnd22 | 146 | Gnd11 | 65 |
| Clk2xRd | 9 | Exc* | 31 | Gnd23 | 147 | Gnd12 | 66 |
| Clk2xPhi | 30 | BusError* | 128 | Gnd24 | 151 | Gnd13 | 69 |
| RdBusy | 127 | Reset* | 129 | Gnd25 | 152 | Gnd14 | 70 |
| WrBusy* | 126 | SysOut* | 8 | Gnd26 | 158 | Gnd15 | 71 |
| CpBusy | 125 | CpSync* | 171 | Gnd27 | 159 | Gnd16 | 103 |

Note: An asterisk * indicates an Active-LOW signal.

LR3000
High Performance
RISC Microprocessor
Preliminary
Notes

LSI LOGIC

LR3000
High Performance
RISC Microprocessor
Preliminary

---

Sales Offices and Design Resource Centers

LSI Logic Corporation Headquarters
Milpitas CA
■ 408.433.8000

Arizona
602.951.4560

California
San Jose
408.248.5100

Irvine
■ 714.553.5600

Sherman Oaks
■ 818.906.0333

Colorado
303.756.8800

Florida
Altamonte Springs
407.339.2242

Boca Raton
■ 407.395.6200

Georgia
404.448.4898

Illinois
■ 312.773.0111

Maryland
■ 301.897.5800

Massachusetts
■ 617.890.0180 (Design Ctr)
617.890.0161 (Sales Ofc)

Michigan
313.930.6975

Minnesota
■ 612.921.8300

New Jersey
■ 201.549.4500

New York
914.454.6593

North Carolina
■ 919.872.8400

Ohio
614.438.2644

Oregon
503.644.6697

Pennsylvania
215.245.4705

Texas
Austin
512.338.2140

Dallas
■ 214.788.2966

Washington
■ 206.822.4384

Austria
LSI Logic/Steiner
■ 43.222.827474.0

LSI Logic Corporation of Canada, Inc.
Headquarters
Calgary
■ 403.262.9292

Edmonton
■ 403.450.4400

Ottawa
■ 613.592.1263

Montreal
■ 514.694.2417

Toronto
416.622.0403

Vancouver
■ 604.433.5705

France
LSI Logic S.A.
■ 33.1.46212525

Israel
LSI Logic Limited
■ 972.3.5403741

Italy
LSI Logic SPA
■ 39.39.651575

Japan
LSI Logic K. K.
Tokyo
■ 81.3.589.2711

Tsukuba-Shi
■ 81.298.52.8371

Osaka
■ 81.6.947.5281

LSI Logic Corporation of Korea Limited
■ 82.2.785.1693

Netherlands
LSI Logic/Arcobel
■ 31.4120.30335

Scotland
LSI Logic Limited
■ 44.506.416767

Sweden
LSI Logic Limited
46.8.703.4680

Switzerland
LSI Logic/Sulzer
■ 41.32.515441

United Kingdom
LSI Logic Limited
■ 44.344.426544

West Germany
LSI Logic GmbH
Headquarters
Munich
■ 49.89.926903.0

Dusseldorf
■ 49.211.5961066

Stuttgart
■ 49.711.2262151

LSI Logic/EKB
Berlin
■ 49.30.311006.0

LSI Logic/Purfürst
Isernhagen
■ 49.511.6104.0

LSI Logic/TEP Elektronik Ingenieurtechnik
Luebeck
■ 49.451.893941

■ Sales Offices with Design Resource Centers

Printed in USA
078 83 0S017.7500 IM JD

LSI Logic and logo design are trademarks of LSI Logic Corporation.
MIPS is a trademark of MIPS Computer Systems, Inc. Ada is a trademark of the Joint Program Office, U.S. Department of Defense.
LPI COBOL and LPI PL 1 are trademarks of Language Processors, Inc.
UNIX is a registered trademark of AT&T Bell Labs. VAX is a trademark of Digital Equipment Corporation.

LSI Logic Corporation reserves the right to make changes to any products and services herein at any time without notice. LSI Logic does not assume any responsibility or liability arising out of the application or use of any product or service described herein, except as expressly agreed to in writing by LSI Logic; nor does the purchase, lease, or use of a product or service from LSI Logic convey a license under any patent rights, copyrights, trademark rights, or any other of the intellectual property rights of LSI Logic or of third parties. All rights reserved.

MIPS NOTES

MIPS Notes

SUBJECT: Module Definition of the Cache Megacell

AUTHOR: Sanjay Desai

CREATED: Dec 7, '89

FILE NAME: ~sanjay/reports/cachedef/newdef4

*Appendix 2*

Revision History

| Revision # | Rev Date | Rev Time | Rev Author | Revision |
|---|---|---|---|---|
| 1.0 | 12/07/89 | 11:10 | Sanjay Desai | Initial Release |
| 2.0 | 01/17/90 | | Sanjay Desai | Module definition review edits |
| 3.0 | 09/25/90 | | Sanjay Desai | Post design edits. |

LSI Logic Corp.

Confidential

MIPS Notes

1.0 INTRODUCTION

1.1 Overview of the Cache Unit:

The cache megacell consists of the instruction cache, the data cache and the cache controller (Fig. 1.1). The cache controller directs the operation of the cache unit. The features of the two caches are given below:

|  | I-CACHE | D-CACHE |
|---|---|---|
| Size | 8K bytes | 1K bytes |
| Organisation | Direct Mapped | Direct Mapped |
| Line Size | 16 bytes | 16 bytes |
| Refill Size | Configurable | Configurable |
| Write policy | WTWNWA * | WTWNWA* |
| Byte write | - | supported |
| Bus snooping | supported | supported |

*WTWNWA = Write Through With No Write Allocate

NOTE: Byte write feature is supported only for Run cycles and not for Refill cycles. A Refill operation has to be either a word or Block Refill of words (Block size of either 2,4,8 or 16 words).

The figure below shows the logical/physical organisation of the cache RAMs.

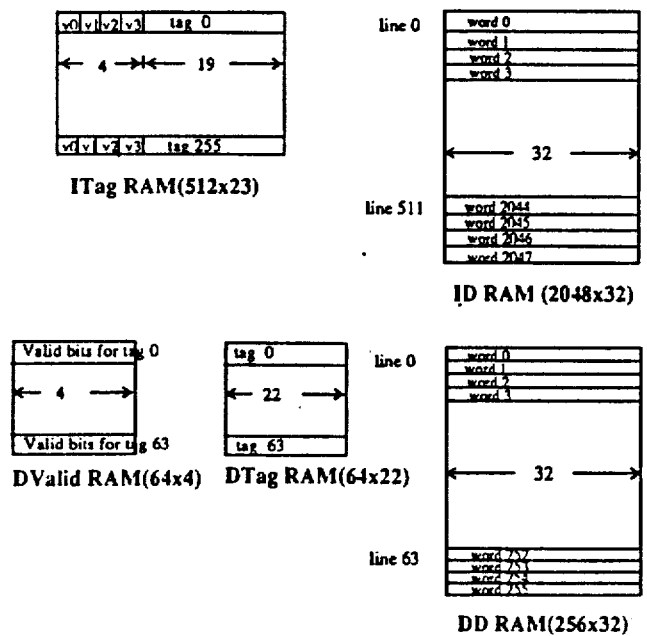

LSI Logic Corp.           Confidential

MIPS Notes

ICache Implementation: The Instruction Cache (fig.1.1) consists of the 1Kx32 Instruction Data (ID) RAM which holds 1K 32-bit instruction words, and the 256x24 Instruction Tag (ITag) RAM which holds the 20 bit tag and 4 valid bits for each line. Both the ID and ITag RAMs are High-Density RAMs with bit read, bit write, Tristate outputs and CS Power Down features. Also, the RAMs have separate Datain and Dataout pins. Logical diagrams for the ITag and ID RAMs are given below.

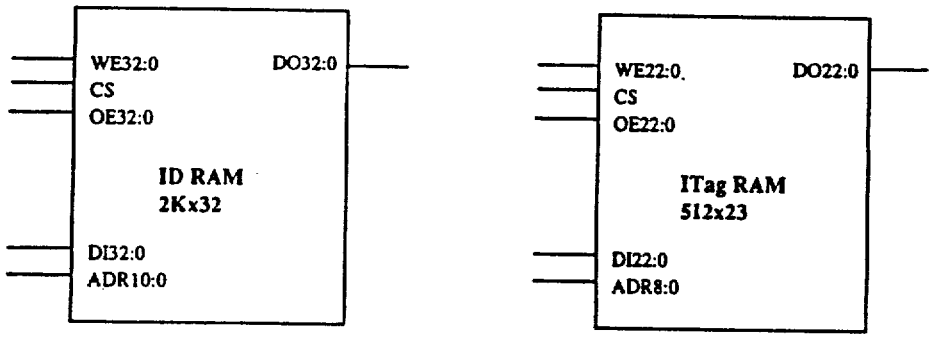

DCache Implementation: The Data Cache (fig.1.1) consists of the 256x32 Data Data (DD) RAM which holds 256 32-bit data words, and the 64x22 Data Tag (DTag) RAM which holds the 22 bit tag and the 64x4 Valid RAM which holds the 4 valid bits for each tag. The DD RAM is of the same type as the above mentioned ID and ITag RAMs. The DTag RAM is of the low-power variety and does not have the CS input present in the other RAMs. The logical diagrams for the DD and DTag RAMs are given below. The DTag RAM has only one Write Enable and one Output Enable. The Valid RAM has 4 of each corresponding to the 4 valid bits which have to be individually writable and readable. The DCache Tag RAM has been implemented in this way in order to save space by having only one WE for the DTag RAM instead of 22 write enables (which are not really needed). The (ICache Tag RAM is integrated and not split like the DCache Tag because it is implemented with high density RAMs which by their nature have bit write enables only.)

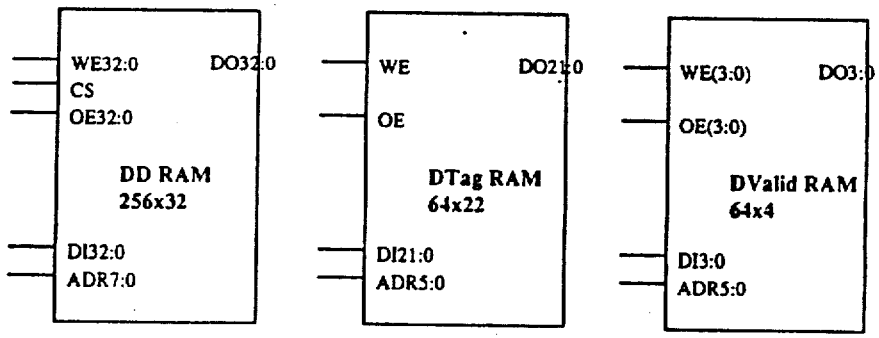

Fig. 1.2 shows the Cache Megacell with all the interface signals and the internal control LSI Logic Corp.   Confidential

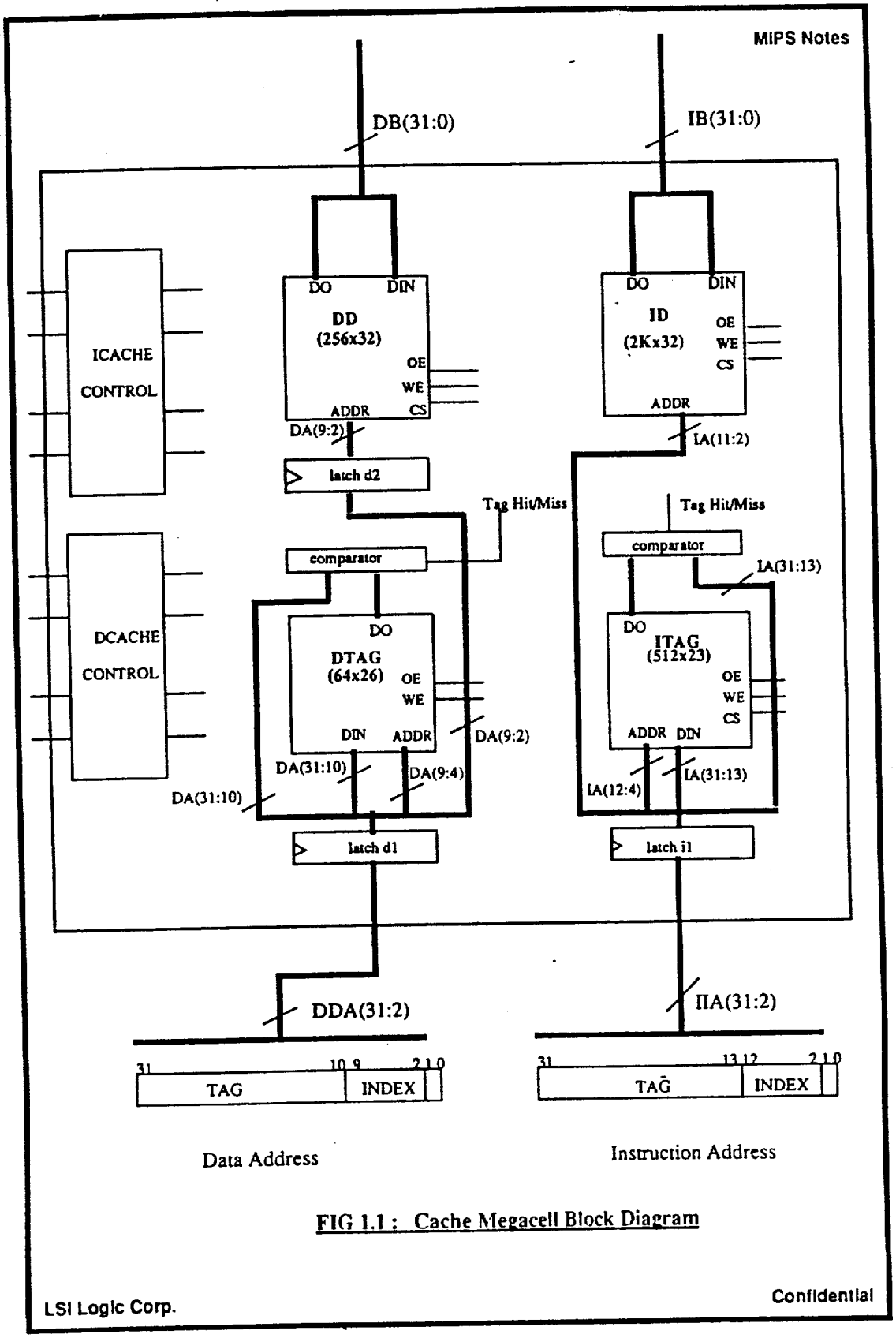
FIG 1.1 : Cache Megacell Block Diagram

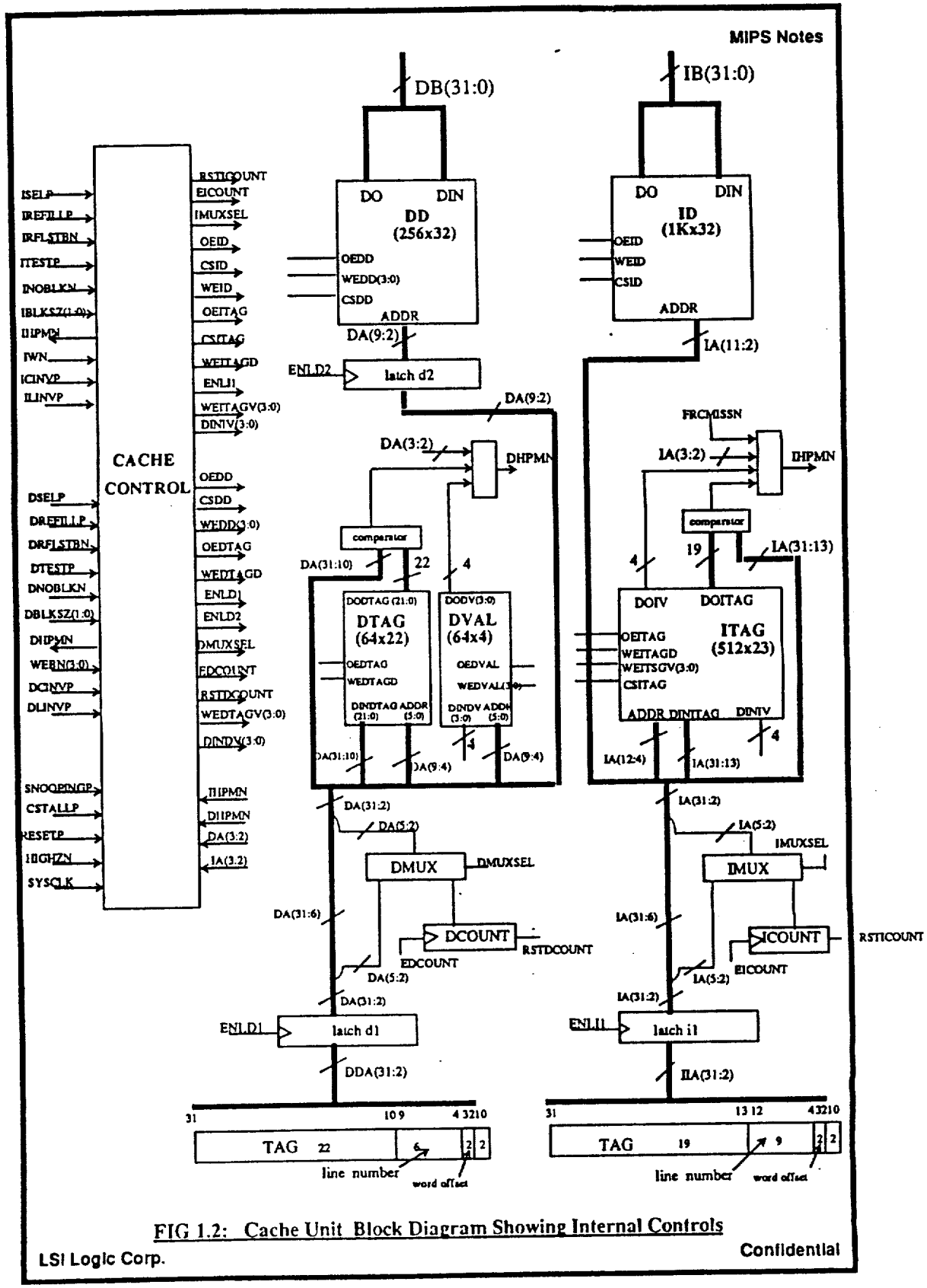
FIG 1.2: Cache Unit Block Diagram Showing Internal Controls

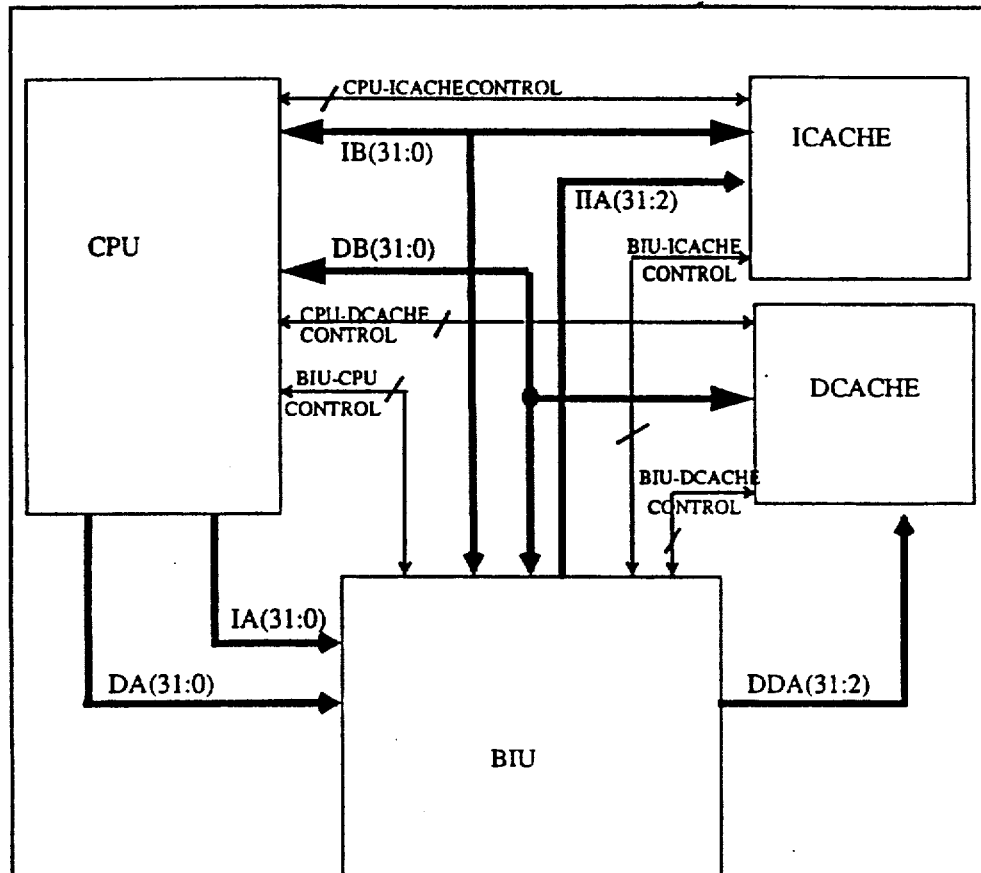
FIG 2: CPU - BIU - CACHE INTERFACE

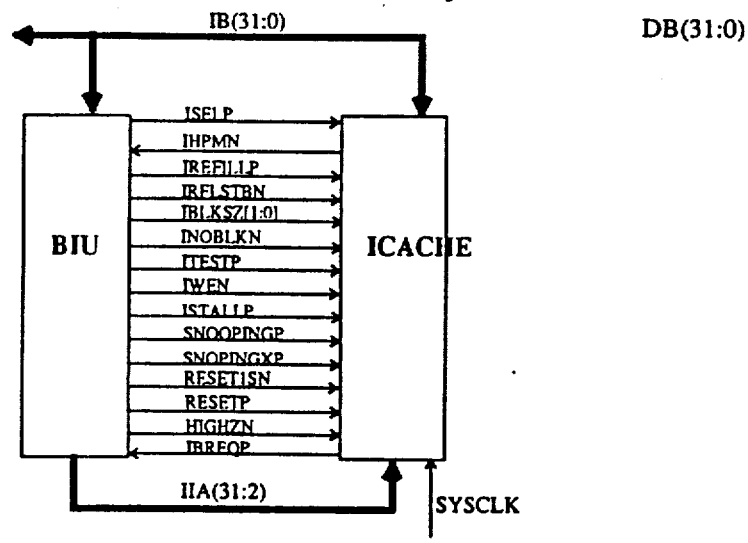
FIG: 3.1   BIU - ICACHE INTERFACE
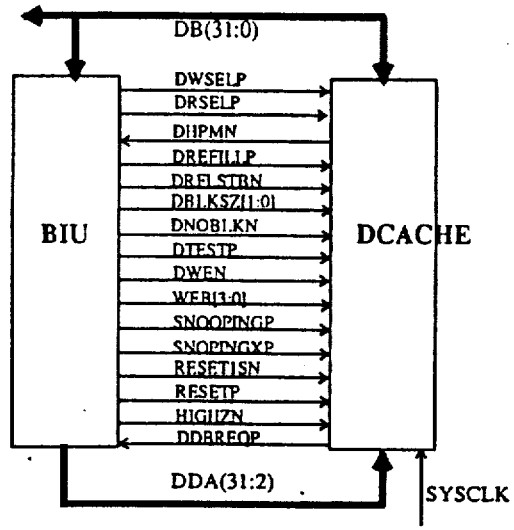
FIG: 3.2   BIU - DCACHE INTERFACE
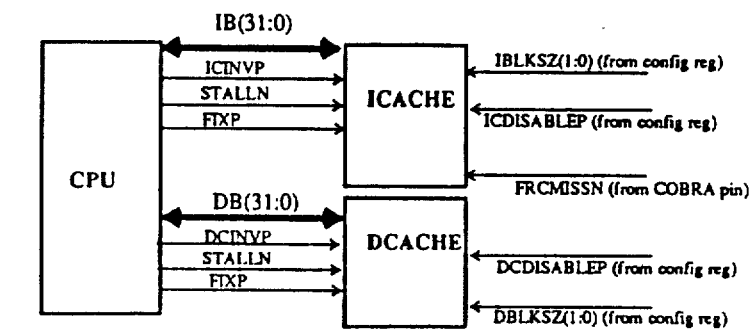
FIG 4:  CPU/COBRA/CONFIG REG - CACHE INTERFACE MIPS Notes signals. (Note that fig.1.2 shows a mux and 4 bit counter in the Icache and Dcache datapaths. The 4 bit counter is used to count the least significant 4 bits of the IA and DA (bits 5:2) to generate the addresses needed to support block refill. The counter starts from 0 and hence has a reset input.)

The Cache connects to the BIU and CPU. Fig.2 shows a high level view of the CPU-CACHE-BIU interface. Figs 3 and 4 show the CACHE-BIU and CACHE-CPU interfaces in detail. In the normal course of events the CPU accesses the cache every cycle to read an instruction and to read/write data in case of a load/store instruction. The tag portion of the address issued by the CPU is compared with the corresponding tag from the tag ram. A hit/miss signal is raised by the cache controller for every cache access. In case of a cache miss during a RUN cycle the BIU stalls the CPU and initiates a main memory read operation to refill the 'missing' block(s) in the cache.

1.2 Design Goals for the Cache Unit:

The primary design goals are : (1) Fast operation - should scale easily with increased frequency. This means avoiding muxes, latches etc. in the cache datapath as far as possible. (2) Minimising space taken up by control logic, address latches and comparators because the cache RAMs take up a lot of space by themselves. (Refer secn. 5 for area requirements of the RAMs). (3) Reducing power consumption as much as possible by powering down the RAMs when not being accessed. This is really the most important goal to be kept in mind for the Cobra Chip. (Refer secn. 5 for details of power consumption of the cache RAMs).

1.3 RAM specifications:

1.3.1 Specifications for the High Density RAMs:

High Density RAMs are used to implement the ITag, ID and DD RAMs for the instruction and data caches. The fig. shown below shows the read and write access times for the high density RAMs using the CS as the enabling signal.

LSI Logic Corp.

Confidential

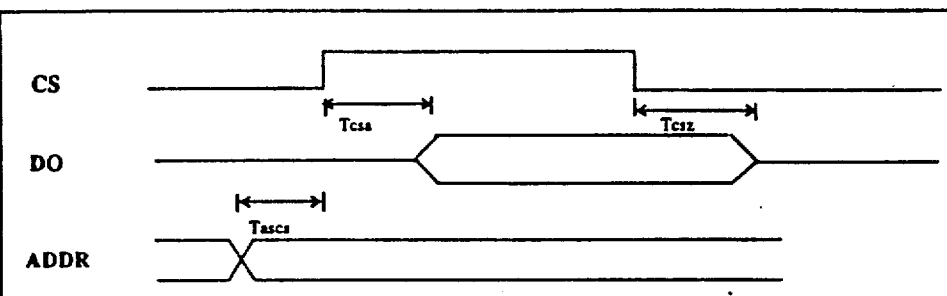
READ CYCLE: OE=1, CS initiates Read Sequence
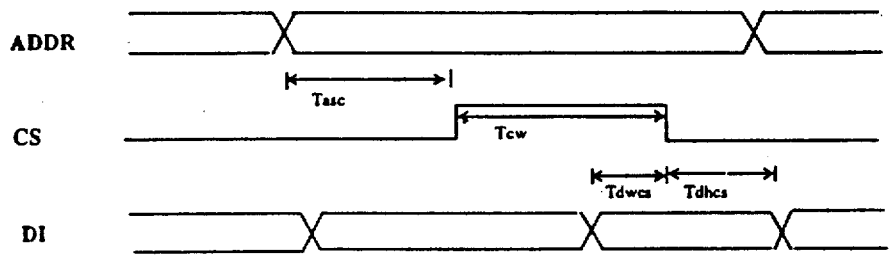
WRITE CYCLE: WE active, CS initiates write sequence
The timing parameters for the Itag, ID and DD RAMs are listed in table below.

MIPS Notes

| PARAMETER | DESCRIPTION | Min/Max | ID(ns) | ITag(ns) | DD(ns) |
|---|---|---|---|---|---|
| Tcsa | CS Enable time | Max | 9.18 | 8.0 | 8.3 |
| Tcsz | CS disable time | Min | 0.8 | 0.8 | 0.8 |
| Tascs | Addr setup for CS read | Min | 2.4 | 2.0 | 2.4 |
| Tasc | Addr setup for CS write | Min | 2.4 | 2.0 | 2.4 |
| Tcw | CS to end of write | Min | 6.3 | 5.7 | 6.1 |
| Tdwcs | Data valid to end of write | Min | 5.8 | 4.8 | 4.8 |
| Tdhcs | Data hold time | Min | 0.0 | 0.0 | 0.0 |

NOTE : All times are wccom

2.0 Cache Access Modes:

The RAM's in the cache unit are accessed ( to read or write ) under four different circumstances which are called "Modes" for purpose of this discussion. The four different modes are :

Mode 1 : During a normal run cycle - to read instructions and to read/write data.
Mode 2 : During Block refill - to write a block of datum into ICache or DCache.
Mode 3 : During testing of the cache rams -- involves both reading and writing.
Mode 4 : During Bus Snooping on DMA writes -- involves reading and writing.

The mechanics of accessing the cache are different for each mode. This is because the source of addresses and source/destination of data is different in each mode. Also, depending on the mode either Instruction Cache only, Data Cache only, or both Instruction and Data caches may be accessed. Again, depending on the mode the access to a cache is either read only or write only or both read and write. For Mode 1 the CPU issues the addresses and is the source/destination of the data. In this mode the Instruction Cache is read only whereas the Data Cache can be read as well as written. For Mode 2 the source of address is the address latch/counter in the cache unit and the source of data is the BIU (which gets it from main memory). In this mode the caches are only written . There is no cache read operation in this mode. For Mode 3 the source of address as well as the source/destination of the data is the BIU (which gets it from the tester). In this mode the caches can both be written and read. For Mode 4 the source of addresses is the BIU (which gets it from the external Bus Master). There is no data transfer in this mode - only tag comparison and invalidation.

Thus it can be seen that the sequence of control signals needed to do a cache access is different for each mode.

LSI Logic Corp.                                                                                                          Confidential MIPS Notes The following sections describe in detail the cache operations in each of these modes.

2.1 Mode 1 : Normal RUN cycle

This access mode is the one in which the cache is accessed during a RUN cycle to read an instruction and to read/write data or to do a cache invalidate. The CPU puts out the instruction address in phase 2 of the IF stage and the data address in phase 2 of the ALU stage. Both the addresses are latched by the cache unit in phase 2. (Note that there is a need to latch the addresses in the cache megacell in order to support the block refill operation because the addresses needed for the block refill operation are generated within the cache megacell by an address counter (fig. 1.2) ). The mechanics of accessing the Icache is different from that of the Dcache. Each case is explained below.

2.1.1 Instruction Cache access in Mode 1. (Ref. fig.5, fig.6 and fig. 1)

Figs. 5 and 6 show the instruction read operation for a RUN cycle. Fig 5 shows the signal changes as seen at the CACHE-BIU interface and fig. 6 shows the signals internal to the cache megacell along with the interface signals. The transactions labeled "i" are for instruction i and those labeled "i+1" are for instruction i+1.

The instruction address put out by the CPU is a 2s signal. This is presented to the Cache unit and latched on the trailing edge of phase 2 (using a phase 2 transparent latch ). Thus the instruction address is presented to the ITag and ID RAM's in phase 2. However, in order to save power, the ID RAM is powered down in phase 2. It is selected (powered up) with the leading edge of the following phase 1. The ITag RAM is however, powered up in phase 2 and powered down in phase 1. Thus the tag and valid bit lookup for the instruction addr is done in phase 2. The BIU issues an ISELP signal which is asserted for every run cycle except in case of an invalid instruction address or a non-cacheable address or for stall cycles). The ISELP signal is used to power down the ICache Data RAM during run cycles whenever it is not asserted.

The instruction is read out of the ID RAM in phase 1 and is a 1v signal . The ITag RAM is read in phase 2. The tag read out of the ITag RAM is compareed with the Tag portion of the instruction address issued by the CPU and the Hit/Miss signal IHPMN is asserted as a 2s signal. If the IHPMN indicates a miss then the BIU generates an ISTALLP signal and proceeds to do a ICache refill.

The instruction cache can also be accessed in this mode to do Icache invalidation. This is determined by the assertion of the ICINVP signal by the CPU. When this signal is asserted then it means that the instruction address ZIIA coming from the BIU is the address in the cache which is to be invalidated. The cache controller then invalidates the line in the cache corresponding to that address (if it is mapped in the ICache). The actual invalidation takes place in phase 1.

LSI Logic Corp.                                                                                                                                    Confidential

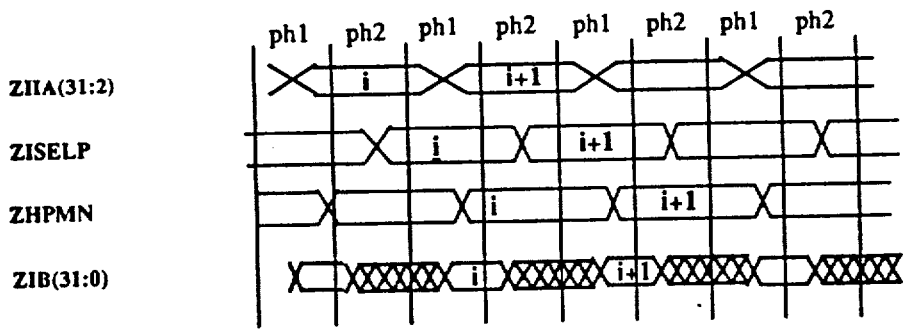

FIG 5 : INSTR READ OPERATION -- (AT INTERFACE)

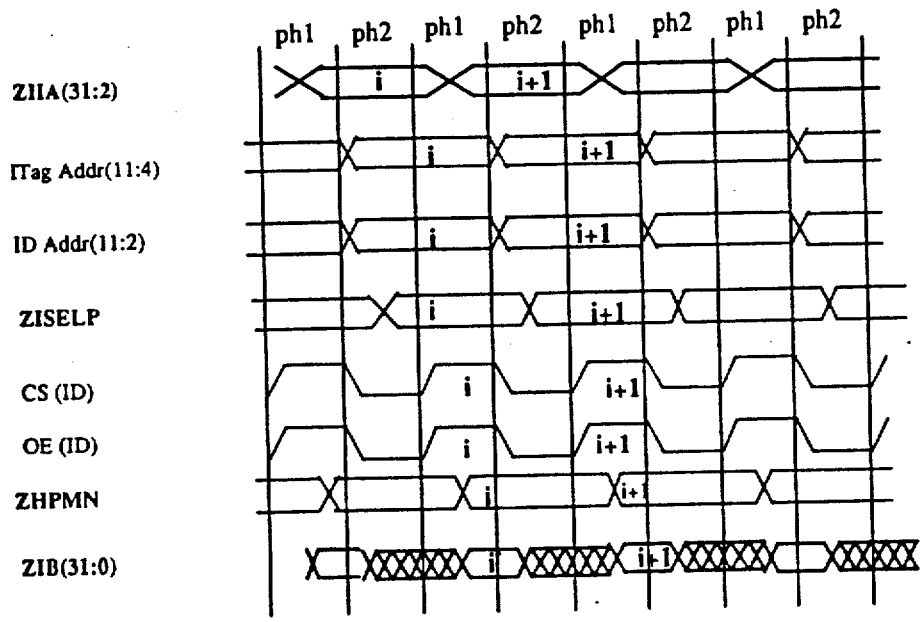

FIG 6 : INSTR READ OPERATION -- (includes internal signals)

2.1.2 Data Cache access in Mode 1. (Ref. figs. 7,8,9,10 and fig.1)

Figs. 7 and 8 show the timing diagram of the data read operation in this mode. Figs. 9 and 10 show the timing diagram of the data write operation. Figs. 7 and 9 show the signal changes at the interface while figs. 8 and 10 also show the internal signals along with the

MIPS Notes changes at the interface while figs. 8 and 10 also show the internal signals along with the interface signals.

The CPU puts out the data address as a 2s signal in phase 2 of the ALU stage. In case of a load operation, it expects the data as a 2v signal in phase 2 of the MEM stage. For a store operation, the write is to be completed by end of phase 2 of MEM stage. (Recall that the write policy is write through and there is a one-deep write buffer on chip).

The data address is presented to the cache unit in phase 2 of the ALU stage and is latched using a phase 2 transparent latch (latch d1, fig.1). The DTag RAM is read in phase 2 of the ALU stage itself. However, the DD RAM is accessed in phase 1 of the MEM stage. (It is powered down in phase2 for a lw instruction and powered down in phase 1 for a sw instruction. It is powered down in both the phases in absence of any lw or sw instructions). The data address coming through the d1 latch is latched by a phase 1 transparent latch (latch d2, fig.1) in phase 1 of the MEM stage and is used to access the DD RAM in phase 1 of the MEM stage. (The actual cs signal for the DD RAM will be the phase1 clock qualified by the DRSELP signal - among other signals - coming from the BIU and the Hit/Miss signal from the DTag lookup done in phase2 of the ALU stage. The DRSELP coming from BIU is 1s signal. The DRSELP is not asserted by the BIU for non cacheable data reference or an invalid address or for stall cycles). Also note that the DTag RAM is a low power RAM and is always powered up. The BIU also issues a DWSELP signal to distinguish a sw instruction. This signal is used to qualify the CS signal for the DD RAM during phase 2.

Thus, the implementation of the DD RAM access is pipelined because in a given phase 2 the DTag lookup of the current load/store instruction in the ALU stage of the pipeline is overlapped with the DD access of the load/store instruction in the MEM stage of the pipeline. This is shown in figs. 7 and 8 where the DTag lookup for instruction i+1 is shown overlapped with the data read/write access for instruction i.

Figs. 7 and 8 show the timing diagrams for a data read operation. Fig 7 shows the signal changes at the interface and fig. 8 shows in addition the signals internal to the cache megacell also.

The Dcache can be accessed in this mode to do Dcache invalidation. This is determined by the signal DCINVP. When the CPU assertes this signal it means that the address ZDDA on the data address bus coming from the BIU contains the address which is to be invalidated. The Dcache control then invalidates the line corresponding to that address (if it is mapped in the DCache).

MIPS Notes
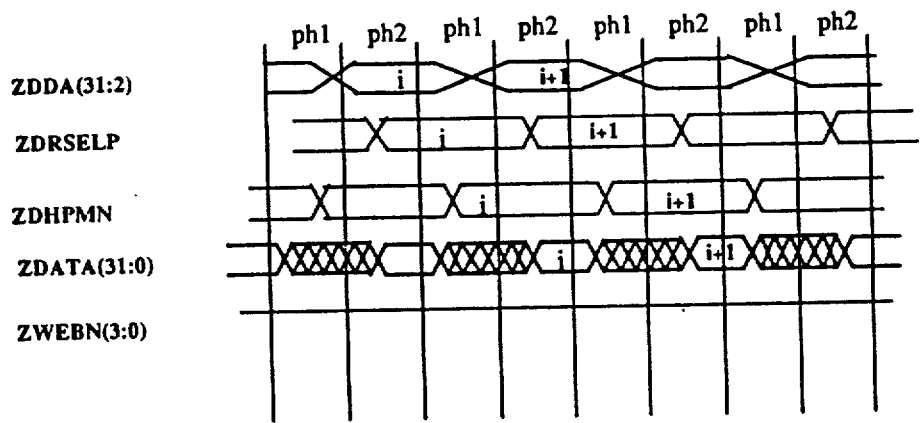
FIG 7 : DATA READ OPERATION (AT INTERFACE)
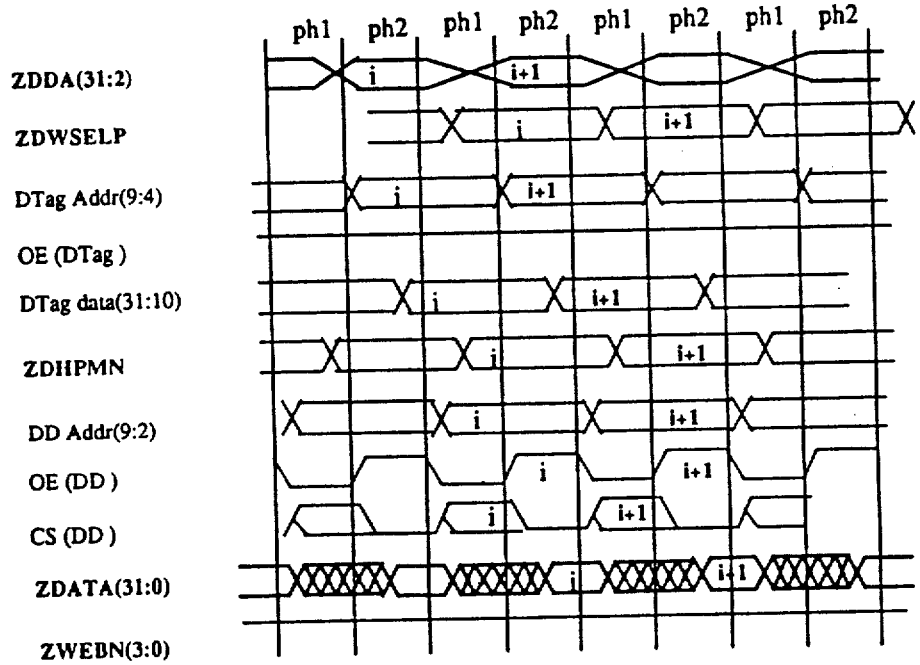
FIG 8 : DATA READ OPERATION (includes internal signals)
Figs. 9 and 10 show the timing diagram for a data write operation. Again, fig. 9 shows the signals with respect to the interface and fig. 10 shows the signals internal to the cache
LSI Logic Corp.                                                                 Confidential also. The WE signal of the DD RAM is asserted only if the ZWEBN signal from the BIU is asserted and there was a Hit in the tag comparison operation done in previous phase 2.
NOTE: For a data write operation the OE of the DD RAM has to be deasserted.
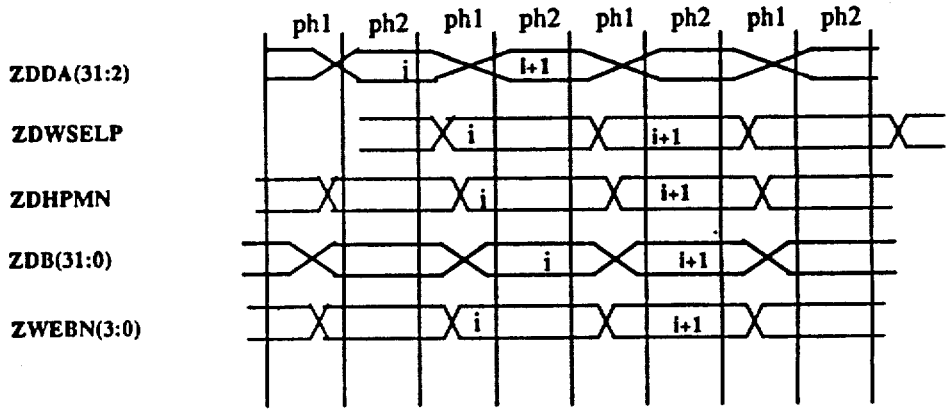
FIG 9 : DATA WRITE OPERATION (AT INTERFACE)
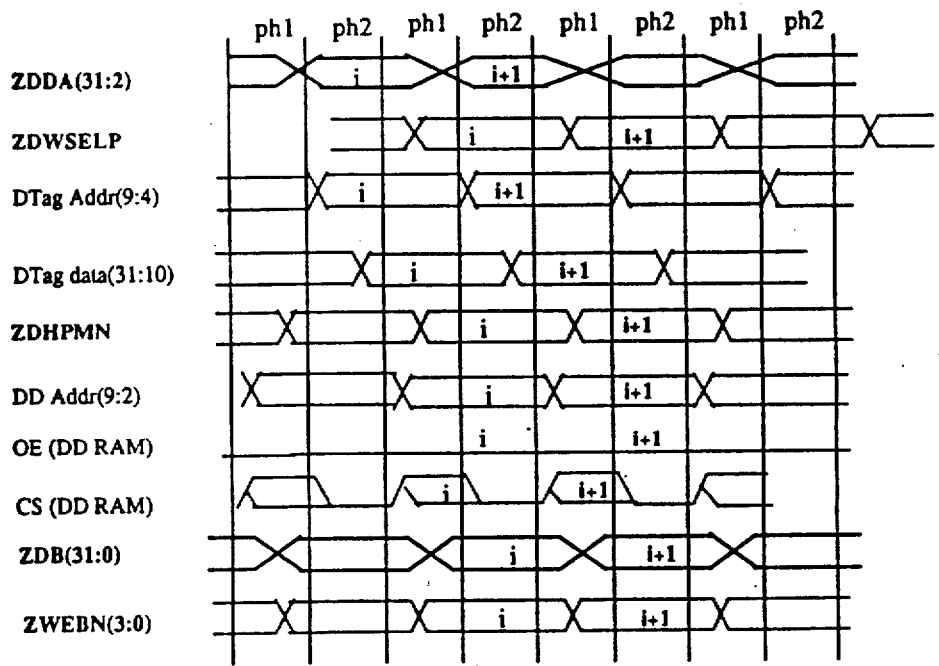
FIG 10 : DATA WRITE OPERATION (includes internal signals)

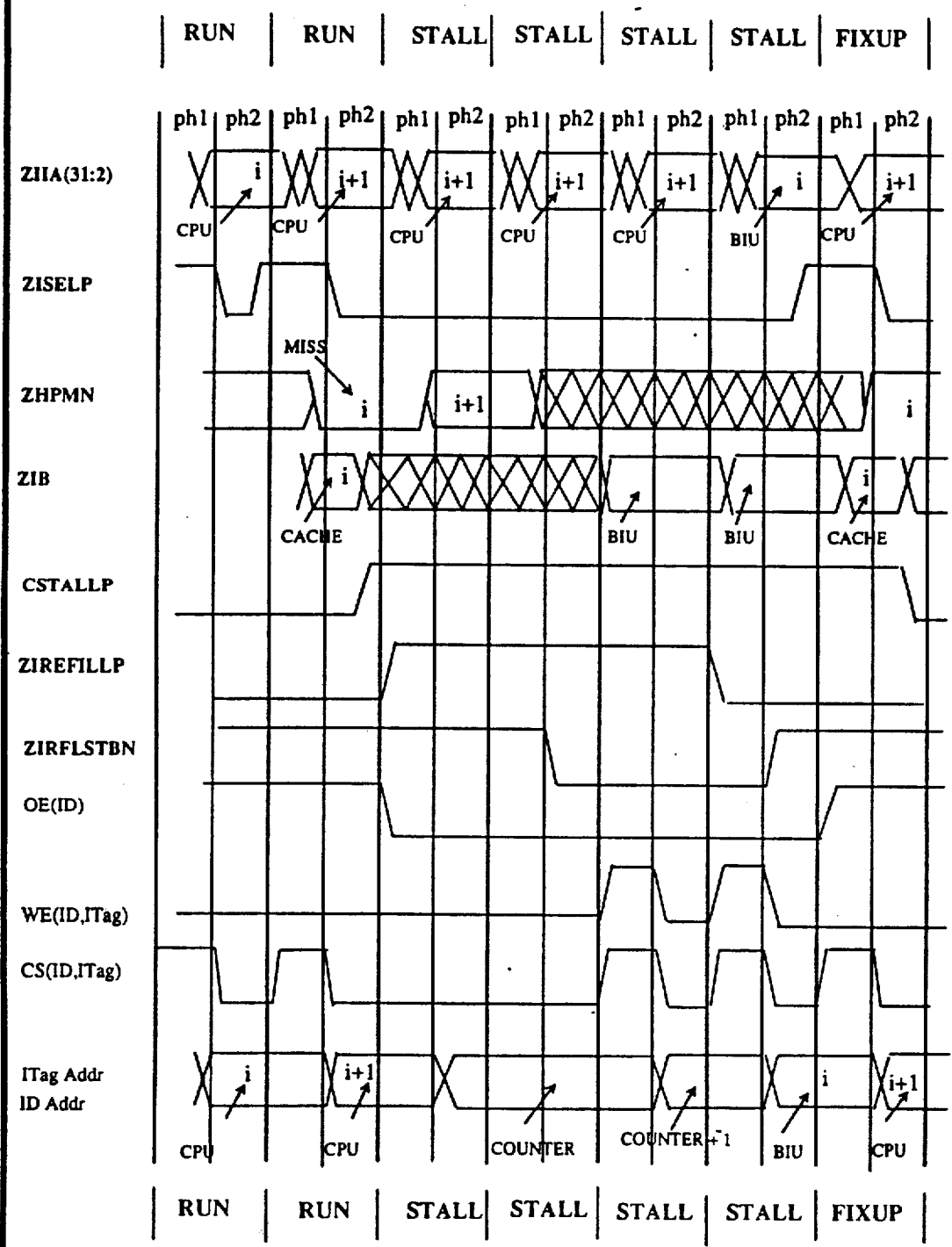
FIG 11 : INSTR REFILL OPERATION -- 2 WORD BLK FETCH whether it is an instruction cache test request or data cache test request.

Testing of a cache involves writing the tag, the datum and the valid bits at the addressed location and later reading that location. If this read operation results in a miss then it indicates a Tag RAM (Itag or Dtag) failure. (Note that this presupposes the comparator is defect free). If the read operation indicates a hit then the word read out from the Data RAM is compared by the tester with the word that it had written and the result indicates the working or failure of the Data RAM (ID or DD).

The mechanics of this operation are shown in fig. 12. The assertion of the ITESTP or the DTESTP signal by the BIU tells the Cache unit of the testing operation. This signal is asserted at the beginning of phase 1 of the stall cycle. During testing, as during block refill, both Tag and Data RAMs are written. However, unlike in block refill, the address is generated outside of the cache unit.

2.4 Mode 4 : Bus Snooping (Ref. fig. 13)

During DMA write operations the BIU stalls the CPU and snoops upon the addresses put out by the DMA controller. Each snooped address is given to the cache which checks the Tag RAM for a matching entry. In case of a matching entry it invalidates that entry.

Figure 13:
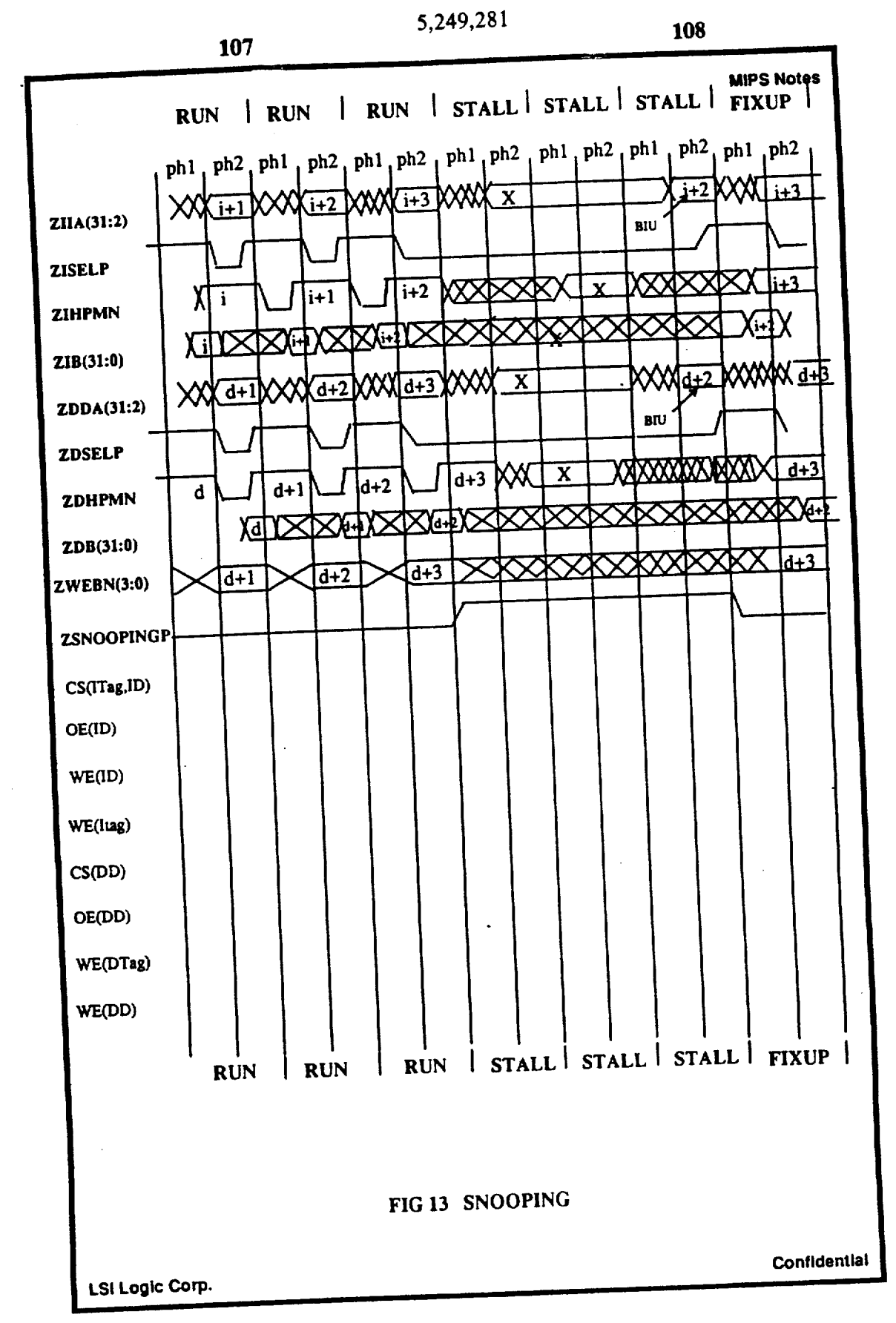

The mechanics of cache access for a snooping operation is given in fig. 13. The BIU asserts the SNOOPINGP at the beginning of the first stall cycle and puts the "snooped" address on both the instruction and data address buses. The cache unit looks up both the ITag and the DTag RAMs with this address. If the address is present in either of the Tag RAMs then that entry is invalidated in the succeeding cycle. Note that the lookup of the Tags follows the same protocol as for the other cases i.e. the ITag lookup is done in phase 2 and DTag lookup is done in phase 2. The Tag invalidation (if needed) is done in the phase 1 of the second clock cycle following phase 2 in which the Tag lookup is done. This implies a need for at least 3 stall cycles to snoop one address, provided the BIU can give the cache unit the "snooped" address at the beginning of phase 1 of the first stall cycle.

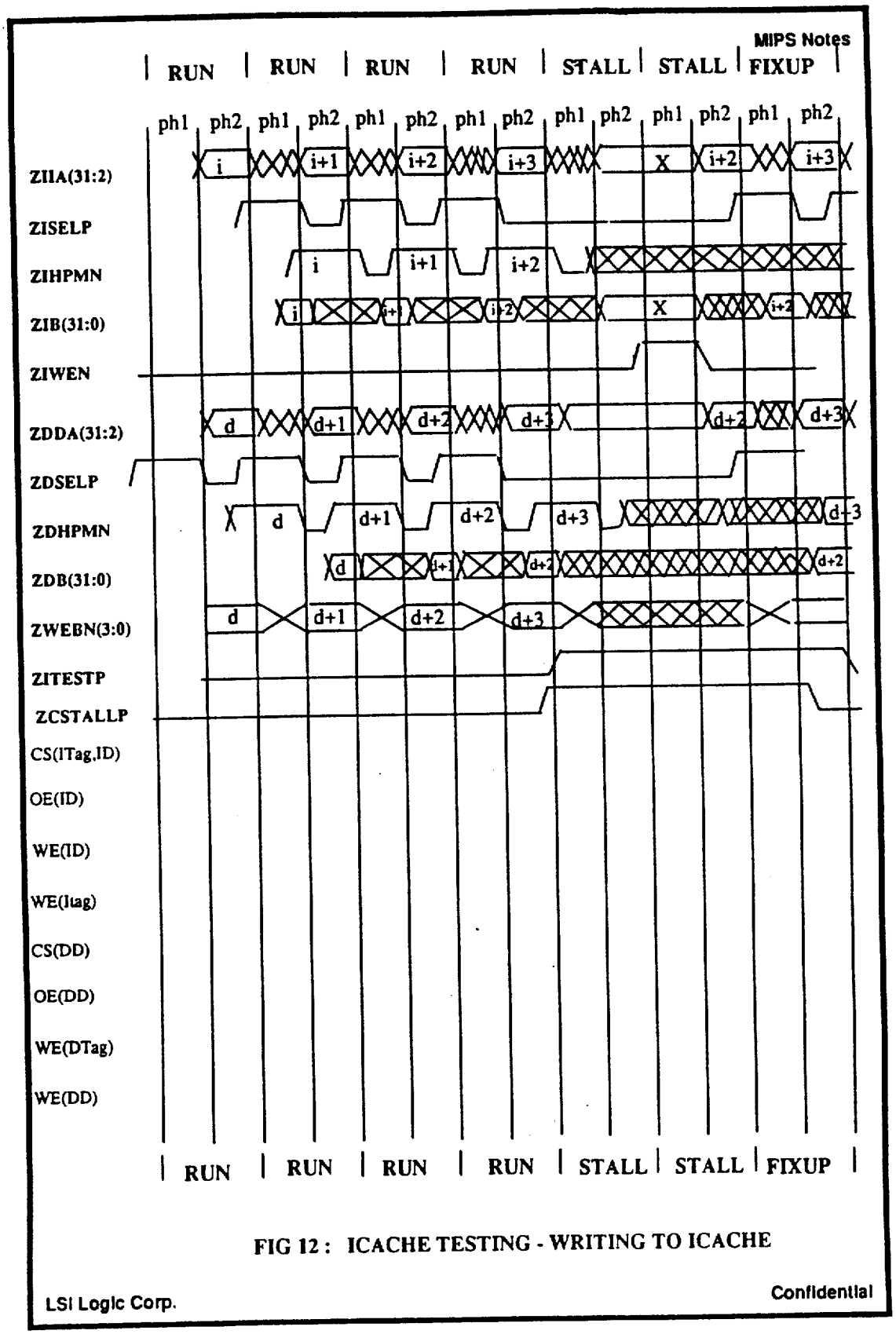
FIG 12 : ICACHE TESTING - WRITING TO ICACHE

MIPS Notes

3.0 Signal Table

| NAME | I/O | FROM/TO | CLASS | DESCRIPTION |
|---|---|---|---|---|
| ZIIA[31:2] | I | BIU/ | 2s | Instruction Address Bus |
| ZDDA[31:2] | I | BIU/ | 2s | Data Address Bus |
| ZIB[31:0] | I/O | /CPU/ | 1v | Instruction Bus (setup=5.5ns)* |
| ZDATA[31:0] | I/O | /CPU/ | 2v | Data Bus (setup=6.6ns)* |
| ZIHPMN | O | /BIU | 2s | Instruction Hit/Miss |
| ZDHPMN | O | /BIU | 2s | Data Hit/Miss |
| ZISELP | I | BIU/ | 1s | Instruction Cache Select |
| ZDRSELP | I | BIU/ | 1s | Data Cache Read Select |
| ZWEBN[3:0] | I | BIU/ | 2s | Data Write Enables |
| ZDWSELP | I | BIU/ | 2s | Data Cache Write Select |
| ZIREFILLP | I | BIU/ | 1s | ICache Refill |
| ZDREFILLP | I | BIU/ | 2s | DCache Refill |
| ZIRFLSTBN | I | BIU/ | 1s | ICache Refill data valid strobe |
| ZDRFLSTBN | I | BIU/ | 1s | DCache Refill data valid strobe |
| ZINOBLKN | I | BIU/ | 2v | Single word instruction refill |
| ZDNOBLKN | I | BIU/ | 2v | Single word data word refill |
| ZIBLKSZ[1:0] | I | CONFIG REG/ | | Instruction block refill size |
| ZDBLKSZ[1:0] | I | CONFIG REG/ | | Data block refill size |
| ZIWEN | I | BIU/ | 1s | Instruction cache write enable |
| ZITESTP | I | BIU/ | 1v | Instruction cache test mode |
| ZDTESTP | I | BIU/ | 1v | Data cache test mode |
| ZDWEN | I | BIU/ | 2s | Data Cache test mode write |
| ZSNOOPINGP | I | BIU/ | 1v | Snooping mode |
| ZSNOPINGPX | I | BIU/ | | Snooping mode |
| ZHIGHZN | I | BIU/ | 2s | Tri-state on power up |
| ZRESET1SN | I | BIU/ | 1s | Reset |
| ZSYSCLK | I | BIU/ | | System clock |
| ZRESETP | I | BIU/ | 2s | Reset |
| ZICINVP | I | CPU/ | 2s | Instruction Cache line Invalidate |
| ZDCINVP | I | CPU/ | 2s | Data Cache line Invalidate |
| ZICDISABLEP | I | CONFIG REG/ | 2s | Instruction Cache disable |
| ZDCDISABLEP | I | CONFIG REG/ | 2s | Data Cache Disable |
| ZFRCMISSN | I | COBRA | 2s | Force Miss in ICache |
| ZSTALLN | I | CPU | 1s | Global stall signal |
| ZIBREQP | O | /BIU | 1s | Instruction Bus Request |
| ZDDBREQP | O | /BIU | 2v | Data Bus Request |

* Timings are wccom. These are preliminary numbers. The actual numbers would depend upon bus loading ..

4.0 Signal Description:

This section describes the signals listed in section 3.0.

ZIHPMN : Instruction Cache Hit (positive) Miss (negative). This signal tells the BIU about an instruction reference hit or miss.

DHPMN : The corresponding signal for a data reference.

ISELP : Instruction cache select (positive). This signal is generated by the BIU and LSI Logic Corp.      Confidential

FIG 13 SNOOPING

MIPS Notes tells the cache unit to select the instruction cache. It is used to qualify the chip select signal of the instruction cache ITag and ID RAMs. It is not asserted by the BIU in case of an invalid instruction address or for a non-cacheable reference.

DRSELP: Data cache Read select (positive). The correpsonding signal for selecting data cache.

WEBN[3:0]: Byte write enables for the data cache. Generated by the BIU for a data write operation. For a word write all the 4 byte-write signals are asserted.

IREFILLP: Instruction Refill (positive). This signal is generated by the BIU and tells the cache unit of an instruction refill operation. BIU keeps it asserted for the duration of the entire refill operation.

DREFILLP: Data Refill (positive). The corresponding signal for a data refill operation.

IRFLSTBN: Instruction Refill Strobe (negative). This signal is asserted by the BIU during an instruction refill operation everytime it has received a word fro, the external memory and has put on the internal instruction bus. This strobe is used by the cache unit to do the actual writing into the caches during the refill.

DRFLSTBN: Data Refill Strobe (negative). The corresponding signal for data refill.

INOBLCKN: The BIU asserts this signal when an instruction block refill is not supported i.e. when there is going to be a single word instruction refill.

DNOBLCKN: The corresponding signal for data refill. Tells the cache of single word data refill.

IBLKSZ[1:0] : Instruction Block refill size. These are the configuration signals which tell the cache about the size of the instruction block during a block refill operation. The 2 signals allow for supporting a block size of 2,4,8 or 16 words.

DBLKSZ[1:0] : Data Block Refill size. The corresponding signals for the size of data block.

ITESTP: Instruction Cache Test (positive). This signal is asserted by the BIU to signal an instruction cache testing operation. It remains asserted as long as the instruction cache test operation lasts.

LSI Logic Corp.  Confidential

DTESTP: Data Cache Test (positive). The corresponding signal for a data cache testing operation.

SNOOPINGP: Snoop operation. When asserted by the BIU it tells the cache of a snooping operation.

SNOPINGPX : Snooping operation. When asserted by the BIU it tells the cache of a snooping operation.

IWEN : Instruction Cache write enable. This signal is asserted by BIU whenever the ICache is to be written during Instruction Cache Testing.

DWEN : Data Cache Test write. This signal is asserted by BIU whenever the Dcache is to be written during the DCache Testing.

ICINVP : Instruction Cache invalidate.

DCINVP: Data Cache invalidate.

ICDISABLEP : Instruction cache disable. Disables the ICache by powering it down.

DCDISABLEP : The corresponding signal for the Dcache.

FRCMISSN : This is a COBRA chip pin which when asserted forces a miss in the ICache for the current instruction fetch.

The rest of the signals from the table in secn. 3.0 are self explanatory i.e. they are global in nature.

5.0 Area and Power Estimates:

5.1 Area :

The total area taken up by the Cache Megacell is the sum of the areas of the following:

1. ID RAM
2. ITag RAM
3. DD RAM
4. DTag RAM
5. Cache Controller + 2 comparators + 3  32-bit latches  + 2  4-bit counters The area occupied by the RAMs is obtained from MEMCOMP as follows:

MIPS Notes

```
ID RAM  (1024x32) : W=4.285mm  H=3.236mm  AREA=13.87 square mm
ITag RAM (256x24): W=3.323mm  H=1.222mm  AREA=  4.06 square mm
DD RAM  (256x32) : W=4.285mm  H=1.258mm  AREA=  5.39 square mm
DTag RAM (64x26) : W=1.454mm  H=2.095mm  AREA=  3.05 square mm
```

TOTAL Area taken up by RAMs :          26.37 square mm

NOTE: The actual area taken up by the RAMs would be higher than this to allow for routing of wires.

The area occupied by the cache controller, comparators etc. is roughly estimated as 3.5 square mm. ( This is based upon Tim's estimate of the counter/timer module ).

Therefore the total area occupied by the Cache Megacell is approx 30 square mm.

AREA = 30 square mm

5.2 Power :

The Power consumption of the 4 RAMs is obtained from MEMCOMP as follows:

|          | Total active current | Active current with OEi=0 |
|----------|----------------------|---------------------------|
| ID RAM   | 160ma                | 121.6ma                   |
| ITag RAM | 120ma                | 91.2ma                    |
| DD RAM   | 160ma                | 121.6ma                   |
| DTag RAM | 0                    | 0                         |
| TOTAL    | 440 ma               | 334.4 ma                  |

If the RAMs are powered up in both phases of the clock cycle then the avg power consumption is (440+334.4)/2 = 387.2 ma. However, if the RAMs are powered up for only phase and shut down in other phase then the avg. power consumption is 440/2 = 220 ma.

LSI Logic Corp.                                              Confidential

MIPS Notes

Thus, powering down of the RAMs for one phase results in savings of 167.2 ma (viz. approx .84 watts).

Thus, the power requirement of the 4 RAMs is 220 ma (viz. 1.1 watt) -- assuming that RAMs are powered in one phase of each clock cycle.

The power requirement of the cache controller, comparator etc. is roughly estimated to be 100 milli watts.

Therefore, the total power requirement of the Cache Megacell is approx 1.2 watts.

NOTE: The actual power consumption will be MUCH less than the above figure. This is because the above calculations (for the RAMs) assume that there is an instruction read and data read operation out of the cache on every clock cycle and hence that the RAMs need to be powered up for one phase of each cycle. This is of course not true as typically only about 30-40% of the instructions are data reads/writes. This means that the Data Cache RAMs are not acessed every clock cycle. Also, out of all instruction and data references, a certain percentage will be to non-cacheable locations which would preclude powering up of the RAMs. Also, a certain percentage of the total clock cycles will be stall cycles. During stall cycles, while the CPU is waiting for the main memory to respond with requested datum, the RAMs will be powered down.

6.0 Note on Stall Handling :

During stall cycles the cache RAMs are powered down except during those stall cycles which require cache access. The latter case would be stall cycles for refill, testing and snooping. These are identified by the BIU by assertion of the BIU-CACHE interface signals REFILLP, TESTP and SNOOPINGP. During stall cycles in which the cache RAMs are powered down, the instruction bus (IB) and data bus (DB) would be driven by the BIU because the the instruction and data words from the ID and DD RAMs are not latched in the cache unit (ref. figs 1.1 and 1.2).

7.0 Open Issues:

1. IBV signal generation - whether the cache unit has to generate it or the BIU generates it.

LSI Logic Corp.                                                                 Confidential MIPS Notes

8.0 Reset implementation.

During power on reset the Cache Unit disables the outputs of the RAMs using the HIGHZN signal from the BIU. As long as this signal is asserted the OE of the RAMs remains deasserted. In case of a warm reset also the OE of the RAMs is deasserted and the cache controller will be put in known state in preparation for a normal RUN cycle once the reset is deasserted.

9.0 Area and Power Estimates for various sizes of RAMs:

The table below shows the Area and Power requirements of different sized RAMs. It should be noted that MEMCOMP imposes the following restrictions on the maximum available size of the low power and high density RAMs.

Max size for low-power RAMs    : 64x72
    Max size for high-density RAMs : 2048x36

Thus, RAMs with less than 64 words can be implemented with the low-power variety whereas larger sized RAMs need to be implemented with the high density variety.

| RAM Size | W mm | H mm | AREA sq.mm | Total Active Current(ma) | Type |
|---|---|---|---|---|---|
| 64x32 | 1.78 | 2.13 | 3.81 | 0 | Low-power |
| 128x24 | 3.32 | 0.89 | 2.97 | 120 | High-density |
| 128x32 | 4.28 | 0.93 | 3.98 | 160 | High-density |
| 256x24 | 3.23 | 1.22 | 4.06 | 120 | High-density |
| 256x32 | 4.28 | 1.25 | 5.39 | 160 | High-density |
| 512x24 | 3.32 | 1.88 | 6.25 | 120 | High-density |
| 512x32 | 4.28 | 1.91 | 8.22 | 160 | High-density |
| 1024x32 | 4.28 | 3.23 | 13.87 | 160 | High-density |
| 2048x32 | 4.28 | 5.87 | 25.00 | 160 | High-density |

10.0 Force Miss Feature.

This feature was added to the ICache to facilitate in circuit emulation. It consists of a dedicated pin on the COBRA chip called the FRCMISSN. When asserted this signal causes a miss in the ICache irrespective of whether the current instruction access by the CPU is mapped in the ICache or not. It causes the processor to stall and go external to fetch the instruction. Thus this feature can be used to interrupt the processor executing out of the cache and force instructions to the CPU from outside. These externally forced instructions LSI Logic Corp.  Confidential may not be cached.

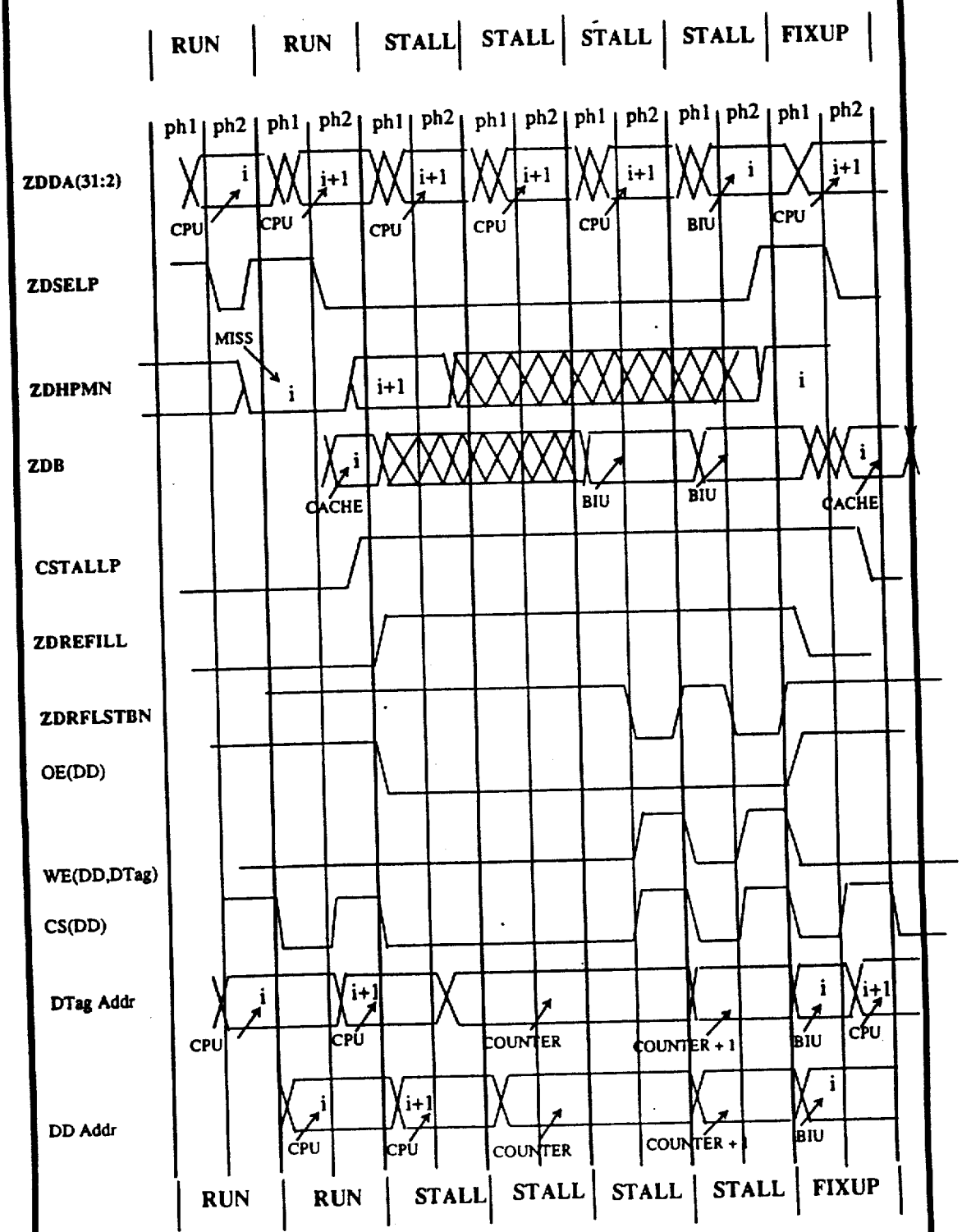
FIG 14 : DATA REFILL OPERATION -- 2 WORD BLK FETCH

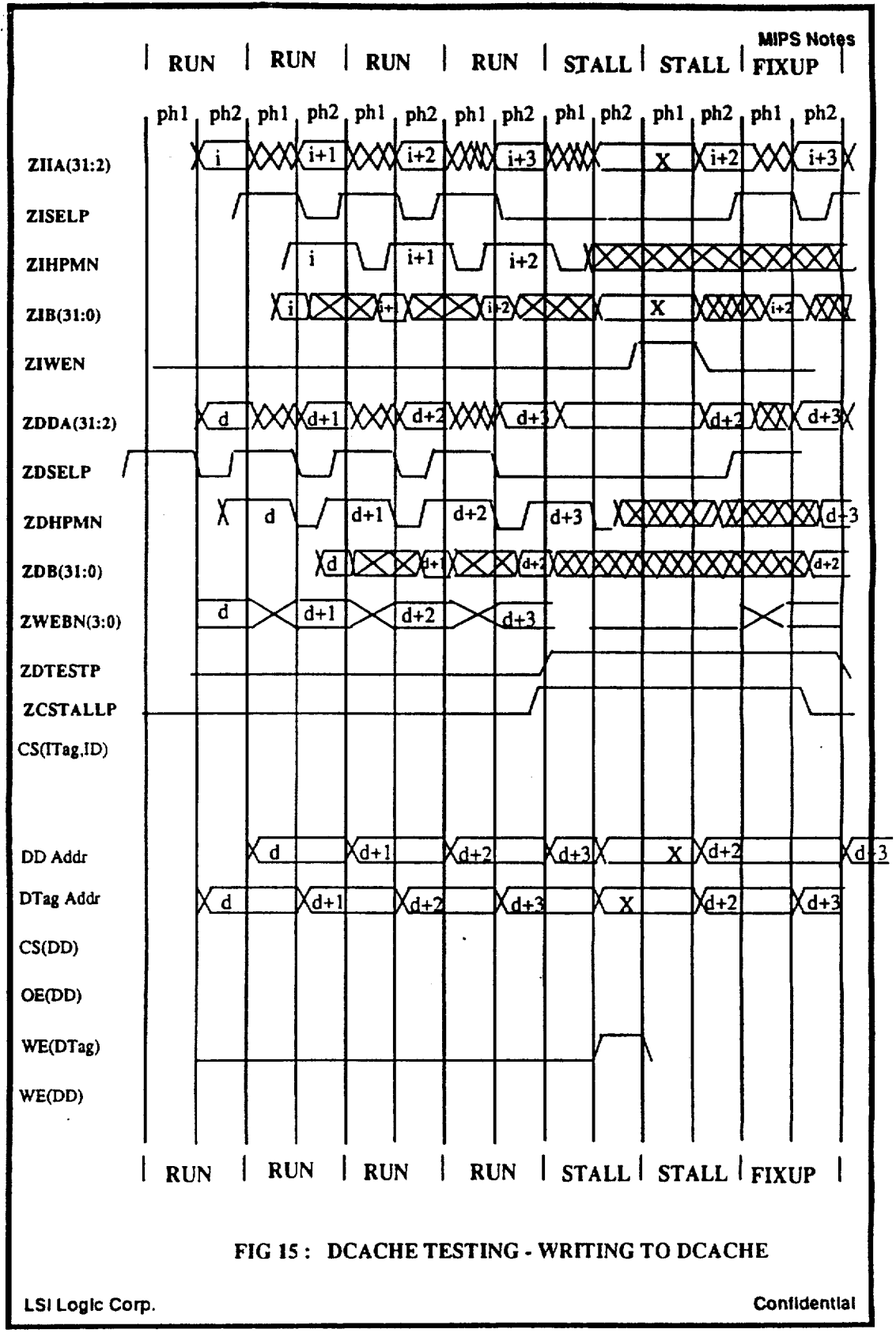
FIG 15 : DCACHE TESTING - WRITING TO DCACHE

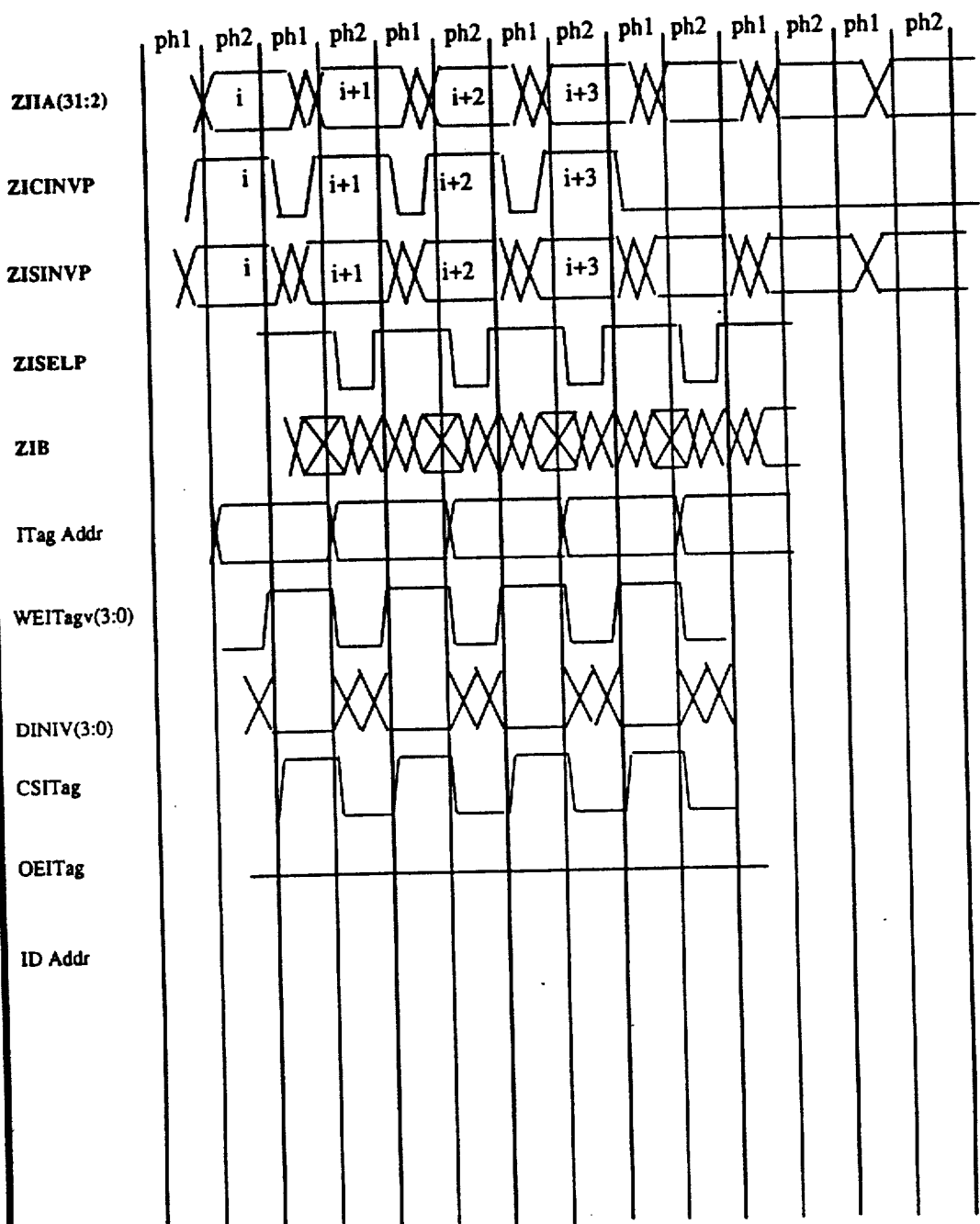
FIG 16 : INSTRUCTION CACHE INVALIDATE

MIPS NOTES

SUBJECT: BIU Module Definition.

AUTHOR: Michael L. Fuccio

CREATED: 12/4/89

FILE NAME: /home/ups1/a/mlf/biu/cobra/biudef.frame

*APPENDIX 3*

Revision History

| Revision # | Rev Date | Rev Time | Rev Author | Revision |
|---|---|---|---|---|
| 0.0 | 12/4/89 | 11:10 | Michael Fuccio | REVIEW DRAFT |
| 0.1 | 12/21/89 | 1200 | Michael Fuccio | Post Group Review DRAFT (incomplete) |
| 0.2 | 12/22/89 | 1200 | Michael Fuccio | Partial updates. |
| 1.0 | 1/8/90 | 1700 | Michael L. Fuccio | |

Missing sections:
  Cache Invalidation.
  External Signal Electrical Specifications
  Block Diagram
  8-bit PROM interface
  External signal Timing Specifications

COBRA

29 I/PINS
  14 O/PINS
  70 BD-PINS
  ---
  113 ACTIVE PINS.

—Inst. streaming.

LSI Logic Corp.                                    Confidential

MIPS Notes

1.0) Module name and General Overview

This document describes the bus interface unit henceforth called the BIU.

The BIU is the intermediary logic between the CPU and other system components. On CO-BRA,, the BIU controls the CPU interface to external memory as well as to on-chip data and instruction caches.

BIU supports the following features:

1) One cycle Instruction cache access
2) One cycle Data Cache access.
3) Test Mode for Cache Control and Observability.
4) Two-cycle external memory access
5) Support for wait states in external memory access.
6) Block fetch transaction for cache refill.
7) External Memory Bus Arbitration.
8) Transaction Retry
9) Asynchronous Interrupts
10) Bus Snooping and Cache Invalidation
11) One deep Write Buffer

2.0) Module Functional Description

Figure 1 shows an architecture diagram of the BIU. It is composed of the following blocks:

1) I/O Buffer Block (BBUF)
2) Parity Check Block (BPAR)
3) Reset Block (BRST)
4) Write Strobe Generate Block (BWSG)
5) Icache Select Block (BISSEL)
6) Dcache Select Block (BDSSEL)
7) Write Buffer Block (BWBUF)
8) Memory Transaction control Block (BMXC)
9) Block Fetch Control Block (BFTCHC)
10) Stall Control Block (BSTALLC)
11) Snoop control Block
12) Test Mode Block In addition to these blocks, are a number of multiplexers, registers and three-state buffers which will be collected into blocks as the design progresses.

LSI Logic Corp.                                    Confidential

MIPS Notes

2.1) I/O Buffer Block (BBUF).

This block consists of the Input and output buffers for each external pin. Input buffers have TTL to CMOS level translation as well as static discharge protection circuits. Output buffers are all three-statable.

2.2) Parity Check Block

This block performs a check for byte-wise, even parity on all memory read transactions which specify that parity checking is to be performed (MPEN input). In the event that odd parity is detected on any incoming byte, the CFPU is signaled that the parity error has occurred. Note that on write transactions, the CPU generates the parity bits for the external system.

2.3) Reset Block

This block accepts the RESETN and HIGHZN inputs and generates a synchronized reset signal for all other modules on chip. It also generates a signal BHIGHZN which is used by all modules on power-up to keep multiple drivers off of shared wires.

See Fuccio; A Modest Proposal for Reset; MIPS Notes; Nov. 30, 1989.

2.4) Write Strobe Generate Block

This block takes in the two least significant address bits from the instruction address bus and data address bus as well as the access type and endian-ness information and decodes this to generate the MWRN[3:0] write strobes for external memory transactions. It also keeps track of this information for data cache refills (partial word writes).

2.5) Icache Select Block

This block is used to generate the Icache select signal on instruction accesses. It will not select the Icache if the access is to a non-cacheable memory location or if a peripheral (timer) address is generated ( In this case, the peripheral will indicate that it has been selected instead of the Icache.).

This block also performs address mapping for kseg0 and kseg1 address segments.

2.6) Dcache Select Block.

This block is used to generate the Dcache select signal on instruction accesses. It will not select the Dcache if the access is to a non-cacheable memory location or if a peripheral (timer) address is generated ( In this case, the peripheral will indicate that it has been selected instead of the Icache.).

This block also performs address mapping for kseg0 and kseg1 address segments.

LSI Logic Corp.                                                                                          Confidential

2.7) Write Buffer Block

This block accepts write transaction information such as address, data, access type and parity and puts it in a 1 deep buffer. This allows writes to occur at the speed of the cache. Recall that the cache write policy is write-through. The buffered write information is used to access primary memory while the CPU continues to run. Only if the CPU generates a second write transaction before the buffered transaction has completed will the BIU stall the CPU.

2.8) Memory Transaction Control Block

This block generates the memory interface control signals. It samples the MPEN, MDRDYN, MCACHEN, BERRORN, BREQN, RRETRYN and MBLKFTCHN inputs and takes appropriate action.

2.9) Block Fetch control Block.

This control block controls the part of the memory transaction following the first transaction of a block fetch transaction. In this part of the transaction, the BERROR and MCATCHN input signals are sampled and appropriate action taken.

2.10) Stall Control Block.

This block is responsible for generating and terminating processor stalls. Stall cycles are generated by external memory read transactions, overflow of write buffer, cache test mode and relinquish and retry operations.

2.11) Snoop Control Block.

This block is responsible for managing the bus snooping operation. Note that the address for the cache invalidate is asynchronously latched with the input MASN. Similarly, the MWRN inputs used to detect a write by an external bus master are also sampled asynchronously.

*Was synchronous operation was decided on?*

2.12) Test Mode Control Block.

This block controls the reading and writing to the instruction and data caches when in test mode.

3.0 ) Module Interface

In this section, the BIU interface is described. Section 3.1 describes the external system interface while section 3.2 describes the interface to the CPU Section 3.3 describes the interface with the ICACHE and DCACHE.

3.1) External System Interface

3.1.1) Primary Memory Interface

> MADDR[31:0]. Memory address bus. BIU Bidirectional.
> > This bus conveys address information to the memory system.
> > In cache test mode, and while performing bus snooping
> > operations, this bus conveys address information to
> > the on-chip caches.
>
> MDATA[31:0]. Memory data bus. BIU Bidirectional.
> > This bus conveys data to and from primary memory.
>
> MDATAP[3:0]. Memory data bus parity. BIU Bidirectional.
> > These signals are used to generate and check byte-wise,
> > even parity over MDATA[31:0].
>
> MXSTARTN. Memory Transaction Start. BIU Output.
> > This signal, when asserted, indicates the start of a
> > memory transaction. This signal is asserted for one clock
> > period at the beginning of each memory transaction.
> >
> > This signal can be used to generate a RAS signal without
> > waiting for MASN to be asserted.
>
> MASN. Memory address Strobe. BIU Bidirectional.
> > When asserted (low), this signal indicates the presence of
> > a valid address on MADDR[31:0]. This signal becomes an
> > input when the processor is not the master of the BUS
> > (ie BGNT asserted) for the purpose of performing cache
> > snooping and invalidation.
>
> MRDN. Memory Read Strobe. BIU Output.
> > When asserted, this signal indicates that the memory may
> > place data on the MDATA[31:0] bus. When negated
> > (high), only the megacell unit may drive the MDATA[31:0] bus.
>
> MWRN[3:0]. Memory Byte Write Strobes. BIU Outputs.
> > When asserted, these byte marks indicate valid data on their
> > respective byte of MDATA[31:0]. Assertion of these
> > signals depends upon the Endian-ness configuration of the LSI Logic Corp.                                                                                       Confidential MIPS Notes

CPU.

MWPRN    Memory Write/Read. BIU Bidirectional.
When a logic 1, this signal
indicates that the memory transaction to be performed is a
write to memory. When 0, this signal indicates that the memory
transaction to be performed is a read from memory. When in
test-mode, this signal is an input and is used to indicate a
read or write operation to the caches. This signal
becomes an input when the processor is not
the master of the bus (ie BGNT asserted) for the purposes of
data cache snooping MDRDYN.    Memory data ready. BIU Input.
When asserted, this signal indicates that the memory will
provide or accept data so that the memory transaction
can terminate. In the case of block fetches, the memory
system must assert MDRDYN for each datum in a block.

MPEN.    Memory Parity Enable. BIU Input.
When asserted (logic 0) this signal indicates that
the processor should perform byte-wise, even parity
checking on the MDATA[31:0] and MDATAP[3:0] buses
during read transactions. When negated (logic 1), the
processor will not perform parity checking of read transactions.
When asserted on block fetch transactions, parity checking
will be done for each word of the block. Note that parity
checking is done for every byte of a word irrespective of the
data size expected by the processor.

BERRORN.    Memory Bus Error. BIU Input.
When asserted during a memory
transaction, this signal indicates that an exceptional condition
has occurred and the on-going memory transaction is to
terminate irrespective or the MDRDYN signal.

MCACHEN.    Cacheable datum. BIU input.
When asserted (logic 0)
during a memory read transaction, this signal indicates
that the datum fetched may be cached. When negated, ( logic 1)
this signal indicates that the fetched datum may not be cached.
When asserted during the fetch of the first word of a block fetch
transaction, the entire block of fetches will be cached. In the
event that the processor begins a block fetch and the system
indicates, by negation of MCACHEN, that the data is not to be LSI Logic Corp.    Confidential MIPS Notes cached, the system must also prevent the block fetch from occurring by negating MBLKFTCHN. (See description of MBLKFTCHN).

MBFREQP. Memory Block Fetch Request. BIU Output.
When asserted, this
signal indicates that the Megacells want to perform a block fetch transaction. Such might be the case on an instruction cache miss.

MBLKFTCHN. Memory block fetch. BIU input.
When asserted, this tells the BIU to expect a block of data from the memory. This input should remain asserted until the end of the block fetch transaction.

BREQN: Bus Request. BIU Input. This signal is used by external bus masters to request possession of the MADDR and MDATA busses.

BGNTP. Bus Grant. BIU output.
This signal, when asserted indicates that the following signals are in the high impedance state (Tri-state):

- MDATA[31:0]
- MADDR[31:0]
- MASN
- MRDN
- MWR[3:0]
- MDATAP[3:0]
- MXSTARTN
- MWPRN

With these signal in the high impedance state, the requesting bus master can control these signals and has possession of the bus. BGNTP will only be asserted when there is no on-going bus transaction. If the BREQN signal is asserted during an on-going bus transaction, the BGNTP signal will not be asserted until the transaction has completed.

RRETRYN. Relinquish and Retry. BIU Input.
When this signal is asserted, the following signals are put in a high impedance state:

MDATA[31:0]
MADDR[31:0]
MASN
MRDN

LSI Logic Corp.                                              Confidential

MWR[3:0]
MDATAP[3:0]
MXSTARTN
MWPRN

*Again, Is MBFREQ? hi-stated?*

With these signals in the high impedance state, an external bus master can take possession of the bus. Unlike the BREQN signal, this granting of the bus is preemptive. That is it may occur in the middle of an on-going memory transaction. Upon negation of the RRETRYN signal,( low to high transition) the preempted memory transaction is retried.

RRACK. Relinquish and Retry Acknowledge. BIU output.
When this signal is asserted, the signals described under RRETRYN are in the high impedance state

3.1.2) Test Mode Signals

MITESTP. Instruction cache test. BIU Input. When asserted, this signal indicates the megacells are in the test-mode for the Instruction cache. The MADDR[31:0], MASN and MWPRN signals are made inputs.

MDTESTP. Data cache test. BIU Input. When asserted, this signal indicates the megacells are in the test-mode for the data cache. The MADDR[31:0], MASN and MWPRN signals are made inputs.

3.1.3) Peripheral's Signals

RTTIMEOUTN. Refresh Timer Time-out. BIU Output. When asserted this signal indicates that the refresh timer has reached its configured value. This signal will remain asserted until the RTACK signal is asserted.

RTACK. Refresh Timer acknowledge. BIU Input. When asserted, this signal causes the negation of RTTIMEOUTN. This signal must be asserted for at least two clock cycles to guarantee negation of RTTIMEOUTN.

T2TIMEOUT. Timer 2 time-out.

T2ACK/EN. Timer 2 count and enable.

3.1.4) Configuration Signals

ENDIAN. Endian-ness Configuration. BIU Input.
This input when asserted (logic 0), indicates that the
processor supports little endian" byte addressing
(ie DEC byte order) and when negated (logic 1) indicates
that the processor supports "big endian" byte addressing
(ie IBM byte order).

DBLKSIZE[1:0]. Data Cache Block Size. BIU Input. These two inputs are
used to configure the block size used to fill the data cache. The
block size (in words) is configured as shown below:

| DBLKSIZE[1] | DBLKSIZE[0] | Size of Block Fetched |
|---|---|---|
| 0 | 0 | 2 Words |
| 0 | 1 | 4 Words |
| 1 | 0 | 8 Words |
| 1 | 1 | 16 Words |

IBLKSIZE[1:0]. Instruction Cache Block Size. BIU Input. These inputs are
used to configure the block size used to fill the instruction
cache. The block size (in words) is configured as shown below:

| IBLKSIZE[1] | IBLKSIZE[0] | Size of Block Fetched |
|---|---|---|
| 0 | 0 | 2 Words |
| 0 | 1 | 4 Words |
| 1 | 0 | 8 Words |
| 1 | 1 | 16 Words |

INT[5:0]. Interrupts. BIU Inputs. These six inputs are used to cause the
MegaMIPS1 processor to take an interrupt exception.
(Branch to general Exception vector.) These pins are not
encoded. The MIPS architecture specification has one level
of orthogonal interrupts.

CPCONDP[3:0]. Condition. BIU Inputs. These four inputs are used to signal
an external condition to the processor. The logic level of these
signals can be tested by the CPU via the Branch-on-Coprocess-
or-Condition instructions.

3.1.5) Status Signals.

MIPDN. Memory Transaction Type. BIU Output. When high (logic 1) this
signal indicates that the memory transaction is an instruction
fetch. When low (logic 0), this signal indicates that the memory
transaction is a data read or write.

LSI Logic Corp.                                                    Confidential

STALLP. Stall. BIU Output. When asserted, this signal indicates that the MegaMIPS1 processor is in a stall state.

TDONEP. Test Mode Transaction Done. BIU Output.
When asserted, this signal indicates that the tes-mode read or write transaction has completed.

3.1.6) Miscellaneous Signals

SYSCLK. System Input Clock. BIU Input. This is the primary clock input to MegaMIPS1. It determines the instruction cycle time of the processor.

RESETN. Reset. BIU Input. This input signal is used (when asserted) to reset the state of the MegaMIPS1. Reset behaviour is compatible with the LR3000 architecture specification.

HIGHZN. High Impedance State. BIU Input. This signal, when asserted (logic 0) puts all MegaMIPS1 outputs in an high impedance state (three-state). This signal is used for power-on reset.

This signal may also be used for board testing purposes.

VDD. Power.

VSS. Ground.

3.1.7) External Memory Protocols.

The external memory interface consists of the pins described in section 3.1.1. There are three native memory transaction protocols, namely, the READ transaction, the WRITE transaction and the BLOCK FETCH transaction.

3.1.7.1) READ Transaction.

Figure 2 shows the READ transaction wherein data is transferred from the external system into the MEGAMIPS processor. The READ transaction is composed of four distinct "states" (S1,S2,S3,S4) which are described below.

STATE: ACTION:
S1 MADDR[31:0] issued. MXSTART asserted indicating the beginning of a transaction. MWPRN is asserted low indicating that the transaction is a READ transaction. MBFREQN is asserted (if appropriate) indicating LSI Logic Corp.  Confidential whether or not a block fetch is being requested. MASN is negated (logic 1) in this state. MRDN is negated (logic 1) in this state. MWRN[3:0] signals are also negated (logic 1) in this state.

MDRDYN, MPEN, BERRORN, MCACHEN, MBLKFTCHN, MDATA[31:0], and MDATAP[3:0] are inputs in the READ transaction.

S2     MASN is asserted indicating the presence of a valid address on the MADDR bus. MRDN is asserted indicating that the external system may place data on the MDATA and MDATAP busses. MADDR, MXSTARTN, MWRN, MWPRN and MBFREQN maintain their levels from state S1.

S3     In this state the MDRDYN, MPEN, BERRORN, MPEN and MBLKFTCHN inputs are sampled. All output signals except MXSTART keep their logic levels from state S2. MXSTART is negated.

If MDRDYN or BERRORN are sampled as logic 0 in S3 then the READ transaction progresses to state S4. If both MDRDYN and BERROR are sampled as logic 1 during state S3 then this state becomes a WAIT state. If a wait state is placed into the memory transaction, then all inputs sampled in state S3 will be sampled every clock cycle until MDRDYN or BERRORN are asserted to make the memory transaction progress to state S4.

S4     In this state, the data (MDATA[31:0]) and parity (MDATAP[3:0]) are sampled. At the end of this state, the MASN, MRDN, and MBFREQN control signals are negated. The MADDR, MXSTART, MWRN[3:0] and MWPRN signals maintain their logic levels from state S3.

LSI Logic Corp.            Confidential

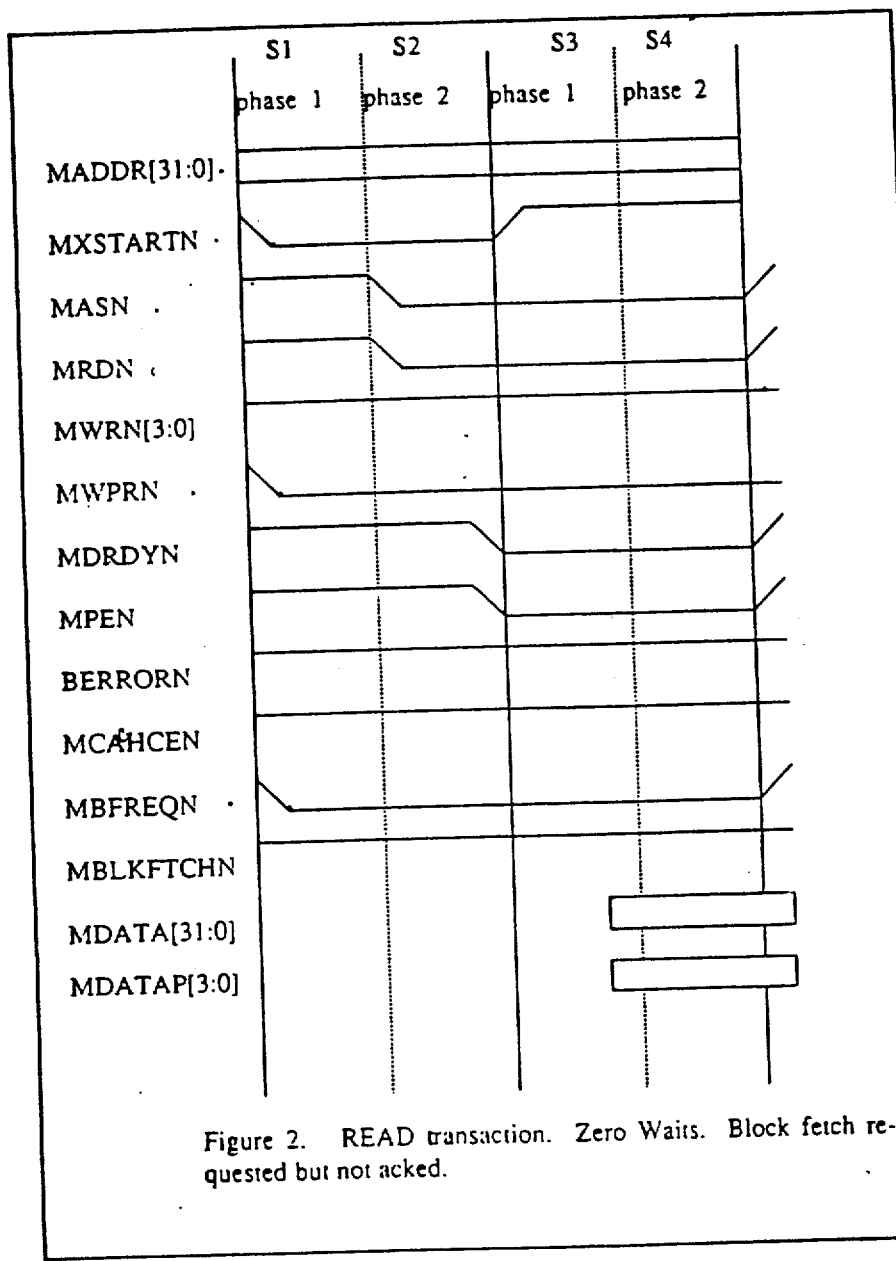
Figure 2. READ transaction. Zero Waits. Block fetch requested but not acked.
Figure 2a shows the read transaction with one wait cycle between states 2 and 3

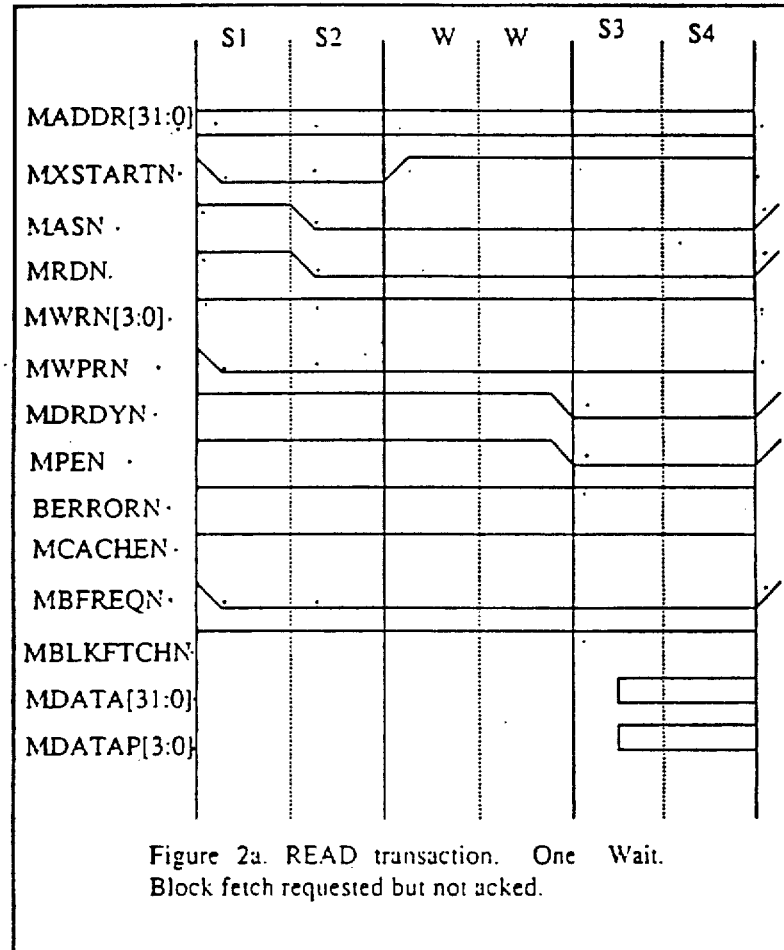
Figure 2a. READ transaction. One Wait. Block fetch requested but not acked.
3.1.7.2) WRITE Transaction
Figure 3 shows the WRITE transaction wherein data is transferred to the external system from the MEGAMIPS processor. The WRITE transaction is composed of four distinct "states" (S1,S2,S3,S4) which are described below.
LSI Logic Corp.            Confidential MIPS Notes

| STATE: | ACTION: |
|---|---|
| S1 | MADDR[31:0] issued. MXSTART is asserted indicating the beginning of a transaction. MWPRN is asserted high indicating that the transaction is a WRITE transaction. MASN is negated (logic 1) in this state. MRDN is negated (logic 1) in this state. MWRN[3:0] signals are also negated (logic 1) in this state.

MDRDYN, MPEN, BERRORN, MCACHEN, MBLKFTCHN, MDATA[31:0], and MDATAP[3:0] are inputs in the WRITE transaction. MPEN and MCACHEN are not relevant to WRITE Transactions and are ignored for the duration of the WRITE transaction. |
| S2 | MASN is asserted indicating the presence of a valid address on the MADDR bus. MRDN keeps its logic level from state S1. The data for the write is issued on the MDATA[31:0] bus and at the same time parity bits are generated for each byte on the MDATAP[3:0] bus. MADDR, MXSTARTN, MWPRN and MBFREQN maintain their levels from state S1. At the end of state S2, the MWRN[3:0] signals are asserted for each valid byte of data on the data bus (MDATA[31:0]). |
| S3 | In this state the MDRDYN, MPEN, BERRORN, and MBLKFTCHN inputs are sampled. All output signals except MXSTART keep their logic levels from state S2. MXSTART is negated.

If MDRDYN or BERRORN are sampled as logic 0 in S3 then the WRITE transaction progresses to state S4. If both MDRDYN and BERROR are sampled as logic 1 during state S3 then this state becomes a WAIT state. If a wait state is placed into the memory transaction, then all inputs sampled in state S3 will be sampled every clock cycle until MDRDYN or BERRORN are asserted to make the memory transaction progress to state S4. |
| S4 | At the end of this state, the MASN, MWRN[3:0], and MBFREQN control signals are negated. The MADDR, MXSTART, MRDN and MWPRN signals maintain their logic levels from state S3. |

LSI Logic Corp.  Confidential

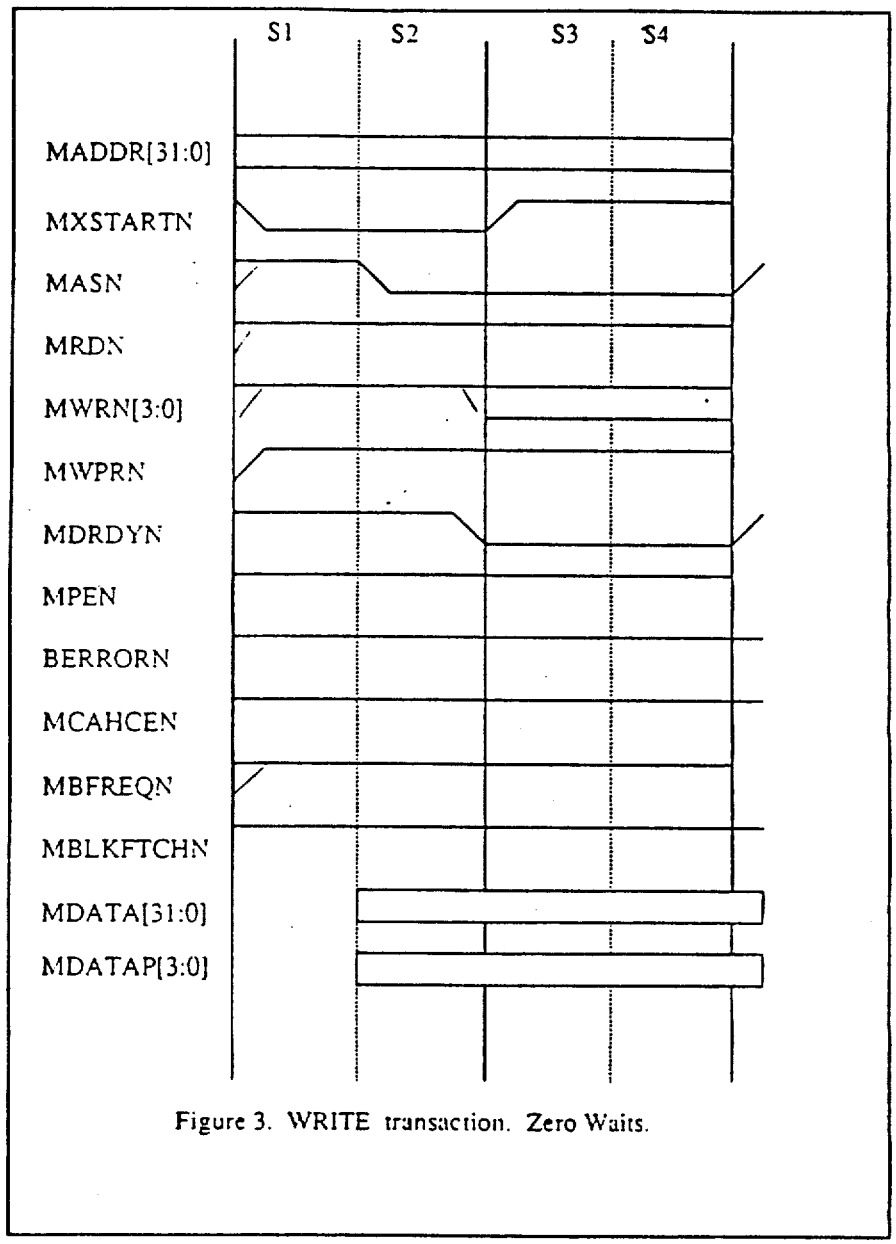
Figure 3. WRITE transaction. Zero Waits.
Figure 3a shows a write transaction with one wait cycle.

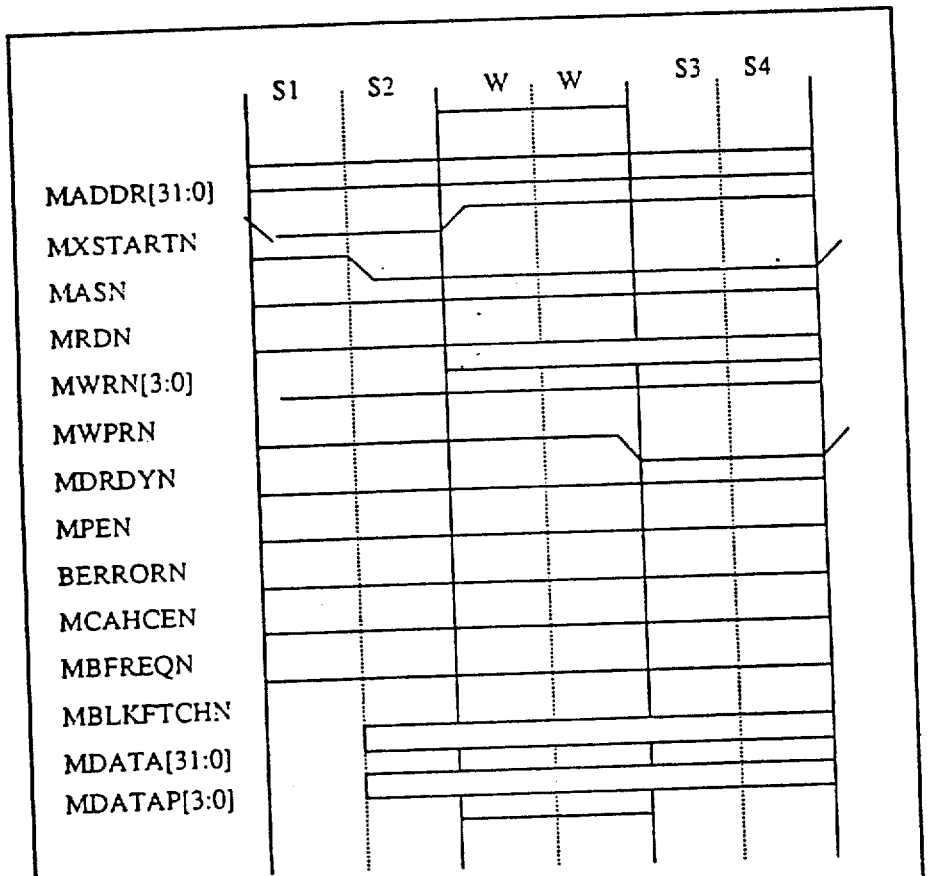
Figure 3a  WRITE transaction. One Wait.
3.1.7.3) Block Fetch Transaction.
Figure 4 shows a block fetch transaction. In this block fetch, the first four states are the same as described for the READ transaction. In the block fetch case, however, the MBFREQN (block fetch request) is acknowledged by the assertion of the MBLKFTCHN input. The READ transaction is then followed by subsequent states described below.

| STATE | ACTION |
|---|---|
| B1 | In state B1, the MDRDYN is negated. The inputs MPEN, MCACHEN and RREQN are ignored. All other outputs retain their logic levels from state S4 of the read transaction. Note that MADDR[31:0] and MASN remain asserted for the duration of the block fetch. If MDRDYN is negated in this state then this state is a wait state. |
| B2 | In this state, MDRDN is asserted indicating that the external system is allowed to put data on the MDATA bus. In this state MDATA and MDATAP are sampled. If MDRDYN was asserted in B1 then the data on the MDATA bus will be accepted into the processor and put in the appropriate cache. If MDRDYN was not asserted in B1, then the data on MDATA is discarded. States B1 and B2 are iterated until the entire block has been fetched. The size of the block is configured using the IBLKSIZE[1:0] and DBLKSIZE[1:0] pins. |

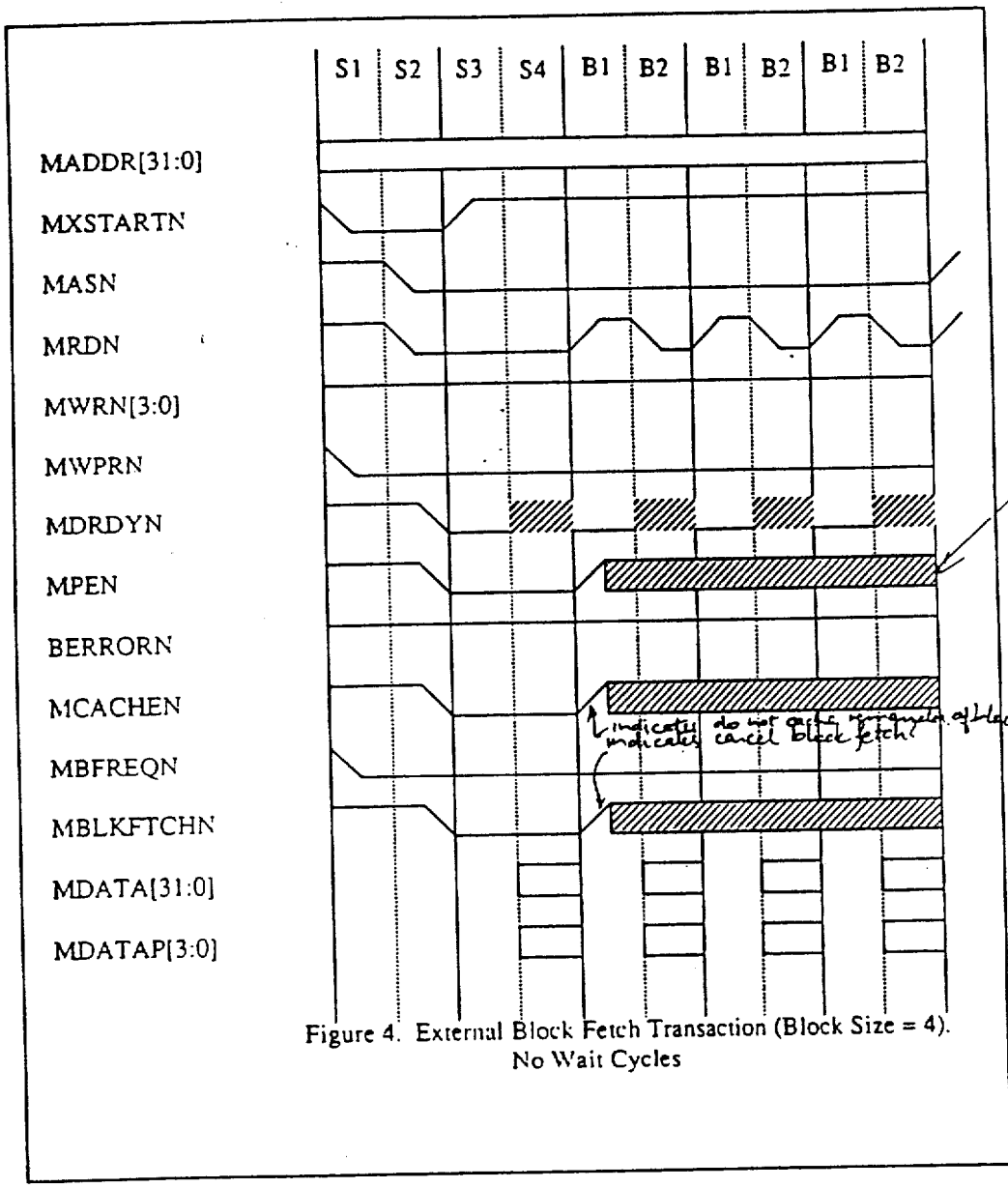
Figure 4. External Block Fetch Transaction (Block Size = 4). No Wait Cycles
3.1.7.4) Bus Arbitration
Bus arbitration is the mechanism whereby an external device can obtain control of the external memory interface (bus). There are two methods for obtaining possession of the bus. The first is via the Bus request signal BREQN and the second is with the relinquish and retry feature discussed in the next section. Figure 5 shows the bus arbitration sequence.

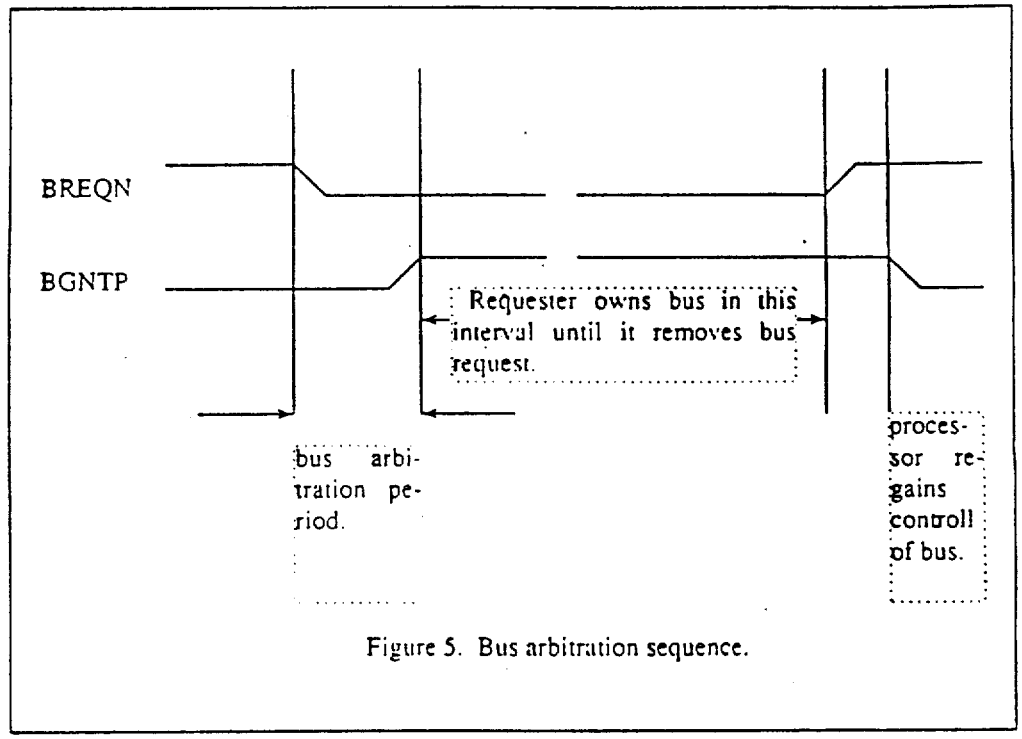

Figure 5. Bus arbitration sequence.

In this method of bus arbitration, the bus-requester asserts BREQN and waits for the processor to grant the bus in return. The processor will wait for any on-going memory transaction to complete before granting the bus to the requester. This is shown in figure 5a MIPS Notes

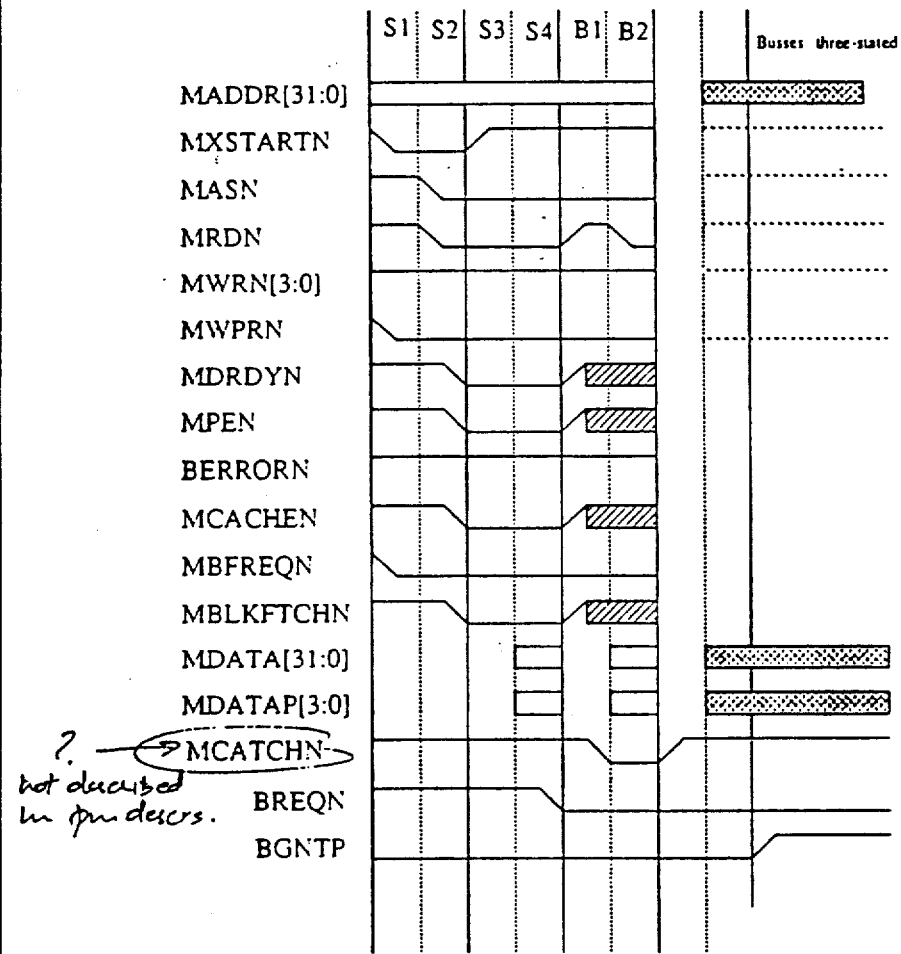

Figure 5a. Bus arbitration during a block fetch transaction. Transaction completes before

3.1.7.5) Relinquish and Retry

Figure 6 shows a transaction that is pre-empted by the relinquish and retry request (RRETRYN). Note that RRETRYN is sampled in state S3. If RRETRYN is asserted in S3 or a WAIT cycle, the ongoing transaction will terminate. the MASN, MDRDN, MWRN[3:0]

LSI Logic Corp.                                                                             Confidential will be negated. After negation of the control strobes, the followong outputs are put in the high impedance state:

MDATA[31:0]
    MADDR[31:0]
    MASN
    MRDN
    MWRN[3:0]
    MDATAP[3:0]
    MXSTART
    MWPRN

Once in the High impedance state, the relinquish and retry acknowledge signal (RRACK) is asserted, indicating that another bus master may obtain possession of the bus. The bus will remain in the high impedance state until the relinquish and retry request is negated, whereupon, the processor reestablished ownership of the bus and re-executes the previously preempted transaction. RRACK is negated after negation of RRETRYN.

This relinquish and retry mechanism has various utility. One possible use is in the support of DRAM refresh.

LSI Logic Corp.  Confidential

MIPS Notes

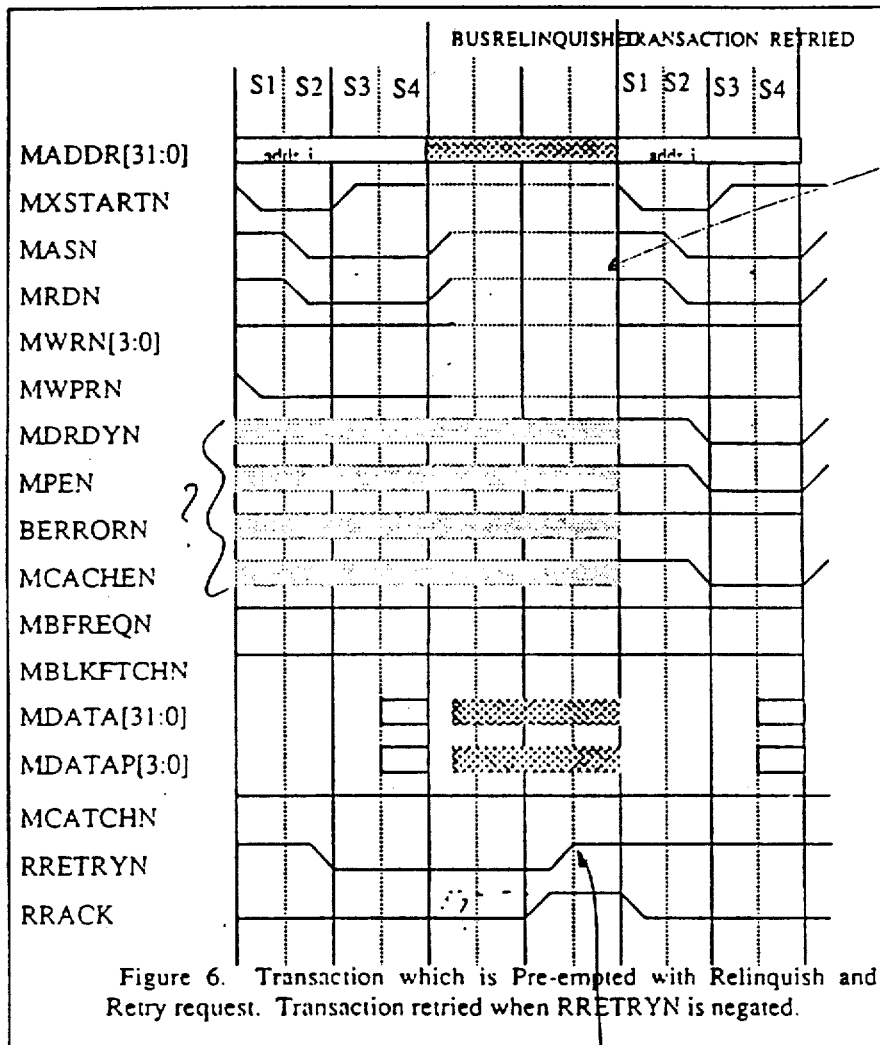

Figure 6. Transaction which is Pre-empted with Relinquish and Retry request. Transaction retried when RRETRYN is negated.

*3.1.7.6) Bus Error*

Figure 7 shows an external memory transaction which is terminated by the assertion of BERRORN in state S3 (WAIT cycle). Note that, in a transaction which is terminated by assertion of BERRORN, the control signals are negated as if the MDRDYN signal was recog- LSI Logic Corp.  Confidential nized. However, on a memroy read transaction, any data on the MDATA bus is ignored and the CPU is signalled that an error has occurred. If the error occurred during an instruction fetch, the CPU is so informed via the BIBEP signal (See Section on CPU interface). If the error occurred during a data fetch, the CPU is informed of this via the BDBEP signal (See Section on CPU interface).

If a bus error is signalled during state B1 of a block fetch, the entire block fetch is prematurely terminated and the CPU is informed of this fact as described above. this is shown in figure 7a.

LSI Logic Corp.

Confidential

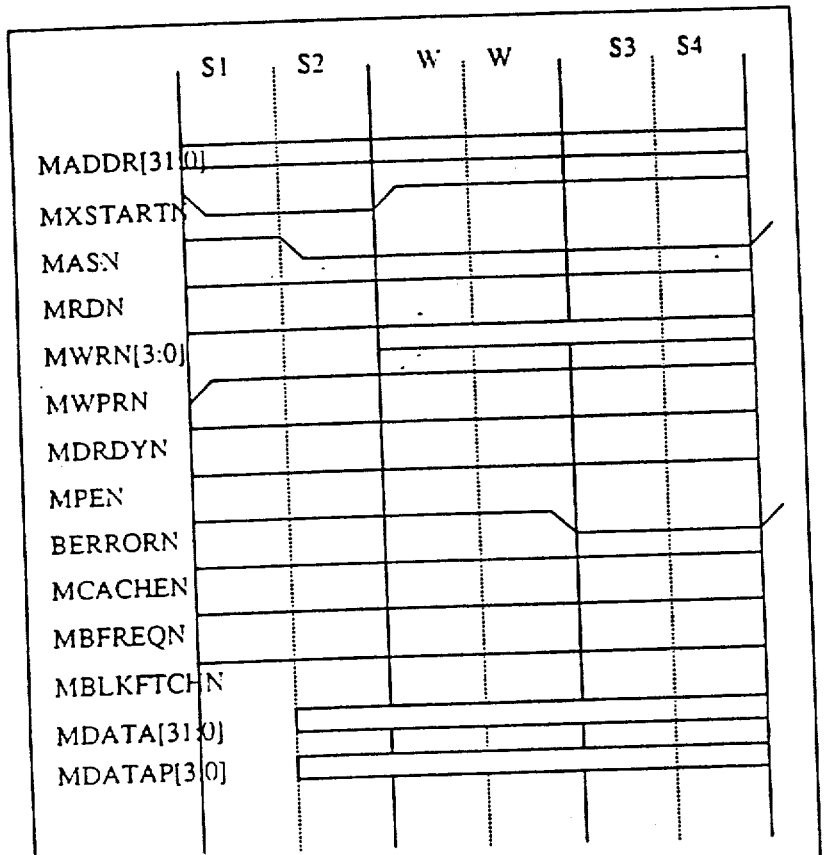
Figure 7. WRITE transaction. Terminated by a bus error.

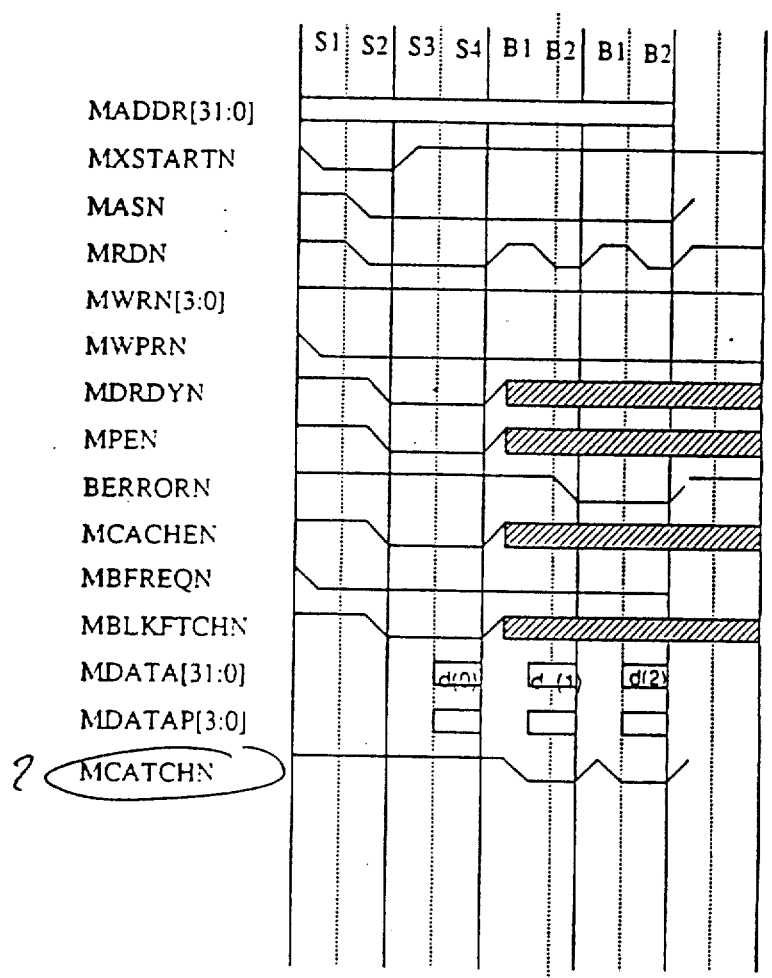
Figure 7a. External Memory Block Fetch Transaction terminated prematurely by a bus error (block size ==4)
3.1.8) Precedence of Memory Interface Inputs
The following inputs are all sampled in state S3 of a memory transaction :
MDRDYN MIPS Notes

BERRORN
RRETRYN

MPEN
MCACHEN
MBLKFTCHN

The first three inputs have the ability to terminate a memory transaction irrespective of the second group of three. Assertion of BERRORN or RRETRYN signals will void the function of the MPEN, MCACHEN and MBLKFTCHN signals.  *Re-explain further.*

Of the transaction terminating inputs (MDRDYN, BERRORN and RRETRYN) the assertion of any one during a memory transaction will terminate the transaction. If both BERRORN and RETRYN are asserted in state S3 then the on-going transaction is terminated and the transaction will be retried when RRETRYN is negated. That is to say that BERRORN does not void the behaviour of RRETRYN.

3.1.9) Interrupts

The BIU module has the responsibility of sampling the interrupt pins INT[5:0]. These signals are sampled as if they are asynchronous, level signals. Since they are asynchronous, they need not have clock related specifications. That is, they have no set-up and hold time requirements, except that they be asserted for at least 3 clock cycles in order to be recognized. *(Do we want to support async. inputs?)*

In addition to the external interrupts, the BIU module accepts two interrupt signals from the on-chip timers. These signals are combined with INT[1] and INT[0] when interrupts are presented to the CPU.

3.2) Interface to CPU

The interface between the CPU and BIU modules is described in

*Wei, James; CPU Interface Document; MIPS Notes; Nov. 2, 1989* and also described in this document.

In this section I have adopted the names given to the CPU's signals and have removed the C prefix and replaced it with a B for the BIU. A brief description of the CPU interface pins follows. *Add I/O Bid rect. to each signal*

BMDREQP. When asserted (logic 1), a device is signalling that the BDAP, BDACC, and BSTNLDP signals have relevance. ie. a request to use data memory is generated.

BDAP[31:0].    Data Address Bus. This bus conveys adresses for non-instruction memory accesses.

LSI Logic Corp.                                Confidential

BDACCP[1:0]   Data Access Type. This bus specifies the data type to be to be conveyed in the memory transaction according to the following table:

| BDACCP[1] | BDACCP[0] | Data Type: |
|---|---|---|
| 0 | 0 | Byte |
| 0 | 1 | Halfword |
| 1 | 0 | Triple-Byte |
| 1 | 1 | Word |

BSTNLDP.   Store/Load. When 1, this signal indicates that the requested transaction is a write to memory. When 0, this signal indicates that the requested transaction to memory is a read.

BMDINVP   Data Request Invalidate. When asserted, this signal indicates that the previously requested memory access should be nullified.

BDBREQP   Data Bus request. When asserted, the BIU is signalling its intention to drive the BDATAP bus in the next phase.

BDATAP   This is a shared 32-bit bus which conveys non-instruction data between megacells BDATVP   This signal when asserted (logic 1), indicates the presence of valid information on the BDATAP and BDPARP buses.

BDPARP   This bus conveys, bytewise, even parity for CPU writes.
BDPARP[3] covers bits 31-24 of BDATAP
BDPARP[2] covers bits 23-16 of BDATAP
BDPARP[1] covers bits 15-8 of BDATAP
BDPARP[0] covers bits 7-0 of BDATAP BIAP   This 32-bit bus conveys instruction addresses to the mega-cells.

BIAVP   This signal, when asserted, indicates the presence of a valid instruction address on the BIAP bus.

BIBP   This 32-bit bus conveys instructions (non data) to the CPU mega-cell.

BIBVP   This signal, when asserted (logic 1) indicates the presence of valid information on the instruction bus (BIBP)

BDBEP   This signal indicates the occurrenc of an error condition (BERRORN asserted) during a fetch of non-instruction data.

MIPS Notes

BIBEP — This signal, when asserted (logic 1), indicates the occurrence of an error condition (BERRORN asserted) during the fetch of an instruction.

BDPEP — This signal, when asserted (logic 1) indicates that a parity violation was detected while fetching non-instruction data from primary memory.

BIPEP — This signal, when asserted (logic 1), indicates that a parity violation was detected while fetchin an instruction from primary memory.

BDCMP — This signal, when asserted (logic 1) indicates, to the CPU that a data cache miss has occurred. *( This is set when data cache is isolated in the R3000 architecture. We do not now support isolating the caches )*.

BINTP — This six-bit bus conveys the presence of an interrupt request to the CPU. These signals are a synchronized version of INTP[5:0] and, in addition, the timer interrupts are connected to BINTP[1] and BINTP[0].

*FPA Int should not be synced —*

BDSTALLP. — This signal, when asserted indicates to the CPU that a stall cycle must be executed in the CPU because of a data fetch operation or a cache snoop operation or a data cache test mode operation or when the external bus is granted to another bus master.

BISTALLP. — This signal, when asserted, indicates, to the CPU, that a stall cycle must be executed in the CPU because of an instruction fetch, instruction cache test mode access.

BRESETP. — This signal indicates that the reset sequence is to be performed.

BHIGHZN. — This signal, when asserted, indicates that any driver on a shared wire must be put into the high impedance state.

BMMUYN. — This signal, when logic 0, indicates that no MMU is present. When logic 1, this signal indicates the presence of an MMU. In the LR3100 (Cobra) design this signal is logic 0.

BYTEORDERP. — This signal when logic 0, indicates that the processor is configured for DEC byte order (little endian). When a logic 1, this signal indicates that the processor is configured for IBM byte order (big endian).

LSI Logic Corp.    Confidential

3.2.1) No- Stall Transactions

There is one case where the BIU acts on behalf of the CPU in accessing memory that does not cause a stall of the CPU. This is in the instance of a write to memory which goes to an empty write buffer in the BIU. In the write-to-memory case, if the cache has a hit, the write will occur in the cache and also to memory via the write buffer. If the write-to-memory operation results in a cache miss then the cache will ignore the write operation and the write to memory will occurr via the write buffer.

Figure 8 shows the CPU-BIU interaction for the case where there are no stall cycles.

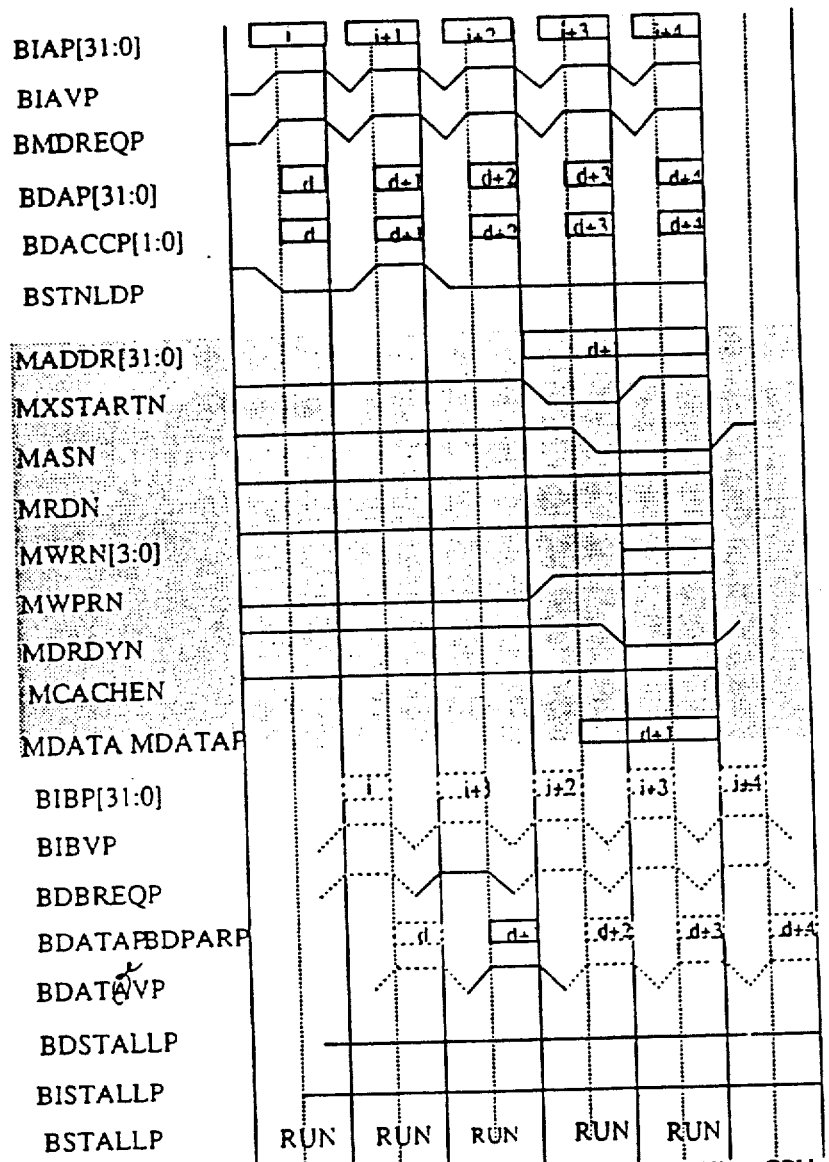
Figure 8. Instruction Cache Hit followed by data cache Hit.. CPU-BIU Interaction.
Figure 9 shows a special case for write transactions wherein the control for the memory write is not issued because of an exceptional condition in the CPU. This exceptional condition is indicated by the assertion of the BMDRINVP signal.

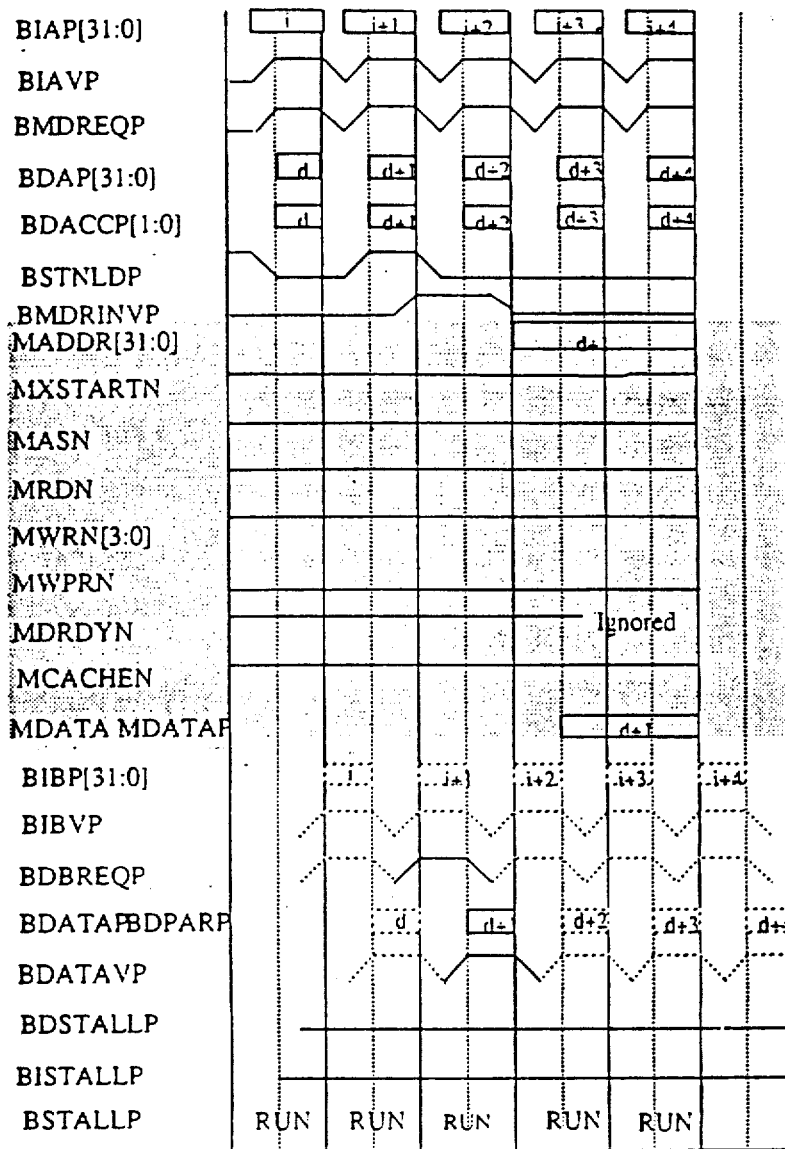
Figure 9. Instruction Cache Hit followed by data cache Hit.. CPU-BIU Interaction. Aborted Write Transaction
3.2.2) Stall Scenarios
The following list describes the various scenarios where the BIU module introduces a stall in the CPU while acting on the CPU's behalf to fetch/store from/to external memory.

MIPS Notes

1) Stall caused by read from memory for uncacheable instruction.
   (Section 3.2.2.1)

2) Stall caused by read from memory for uncacheable data
   (Section 3.2.2.2)

3) Stall caused by read from memory with instruction cache miss.
   (Section 3.2.2.3)

4) Stall caused by read from memory with data cache miss.
   (Section 3.2.2.4)

5) Stall caused by write to memory when write buffer is full (busy).
   (Section 3.2.2.6)

6) Stall caused when an external memory trnsaction is required but the external bus has been granted to another bus master.

7) Stall caused by test-mode operation ie. an external device is accessing the on-chip cache memories.

8) Stall caused by cache snooping operation.

9) Stall caused by relinquish and retry request during a write from the write buffer 10) Stall caused by need fo memroy read transaction while on-going write operation from write buffer.

3.2.2.1) Read from memory for uncacheable instruction.

Figure 10 shows the case where the BIU accesses external memory because the required data resides in a non-cacheable portion of the processor's address space. Note that the access to external memory (shaded area) occurs immediately after the non-cacheble address is detected. No cycles are used to access cache memory for the uncacheable instruction.

LSI Logic Corp.                                                                                              Confidential

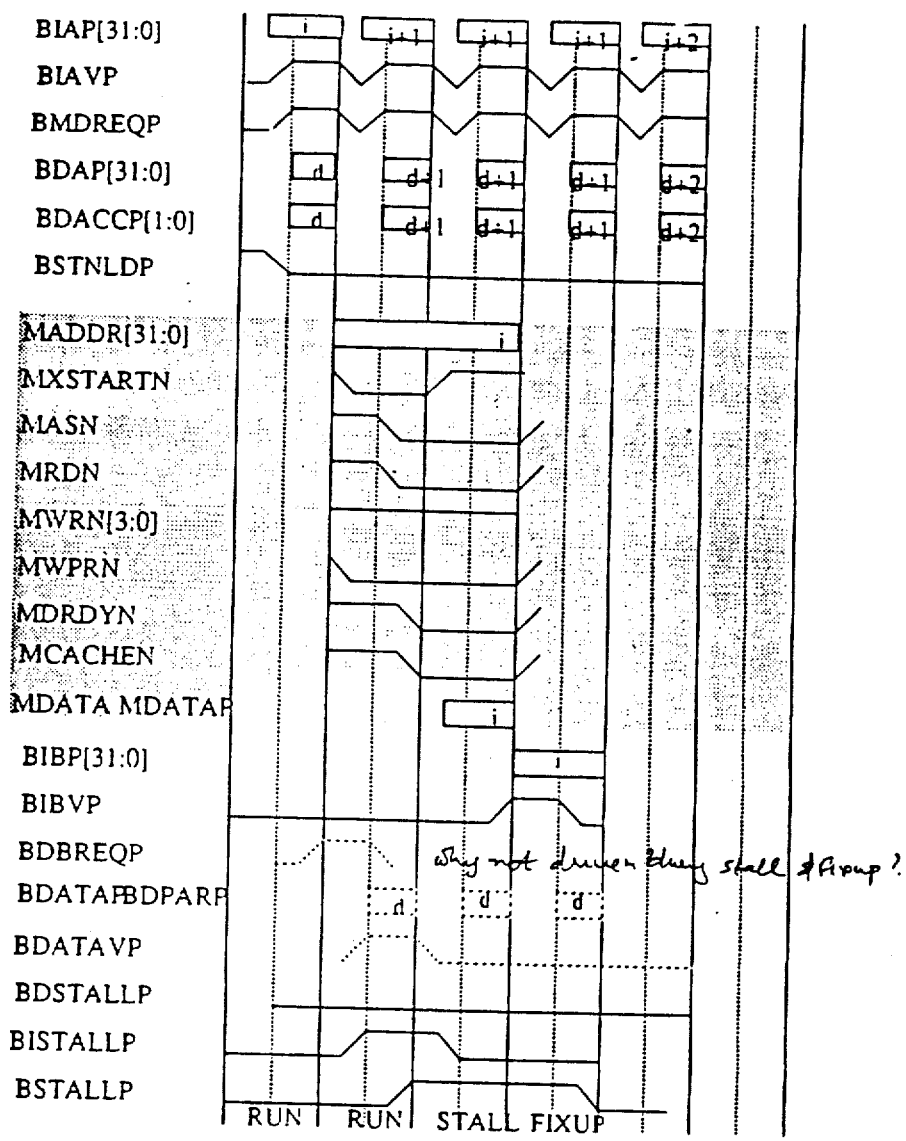
Figure 10. Non-Cacheable Instruction followed by data cache Hit.
3.2.2.2) Read From Memory for Uncacheable Data
Figure 10a shows a memory fetch for uncacheable data.

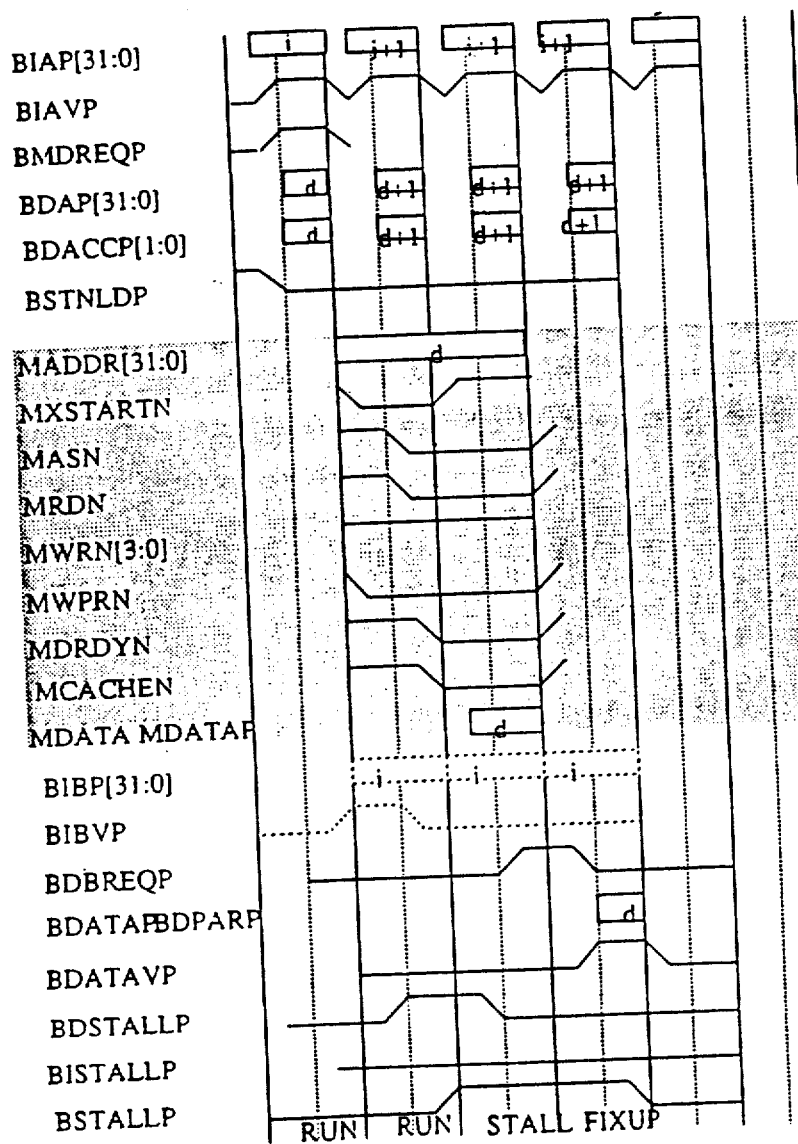
Figure 10a. Non-Cacheable Data fetch followed by instruction cache Hit. CPU-BIU Interaction.
↳ how is this determined?
3.2.2.3) Instruction Cache Miss
Figure 11 shows the CPU-BIU interaction on an instruction cache miss wherein the BIU fetches a single instruction for the CPU.

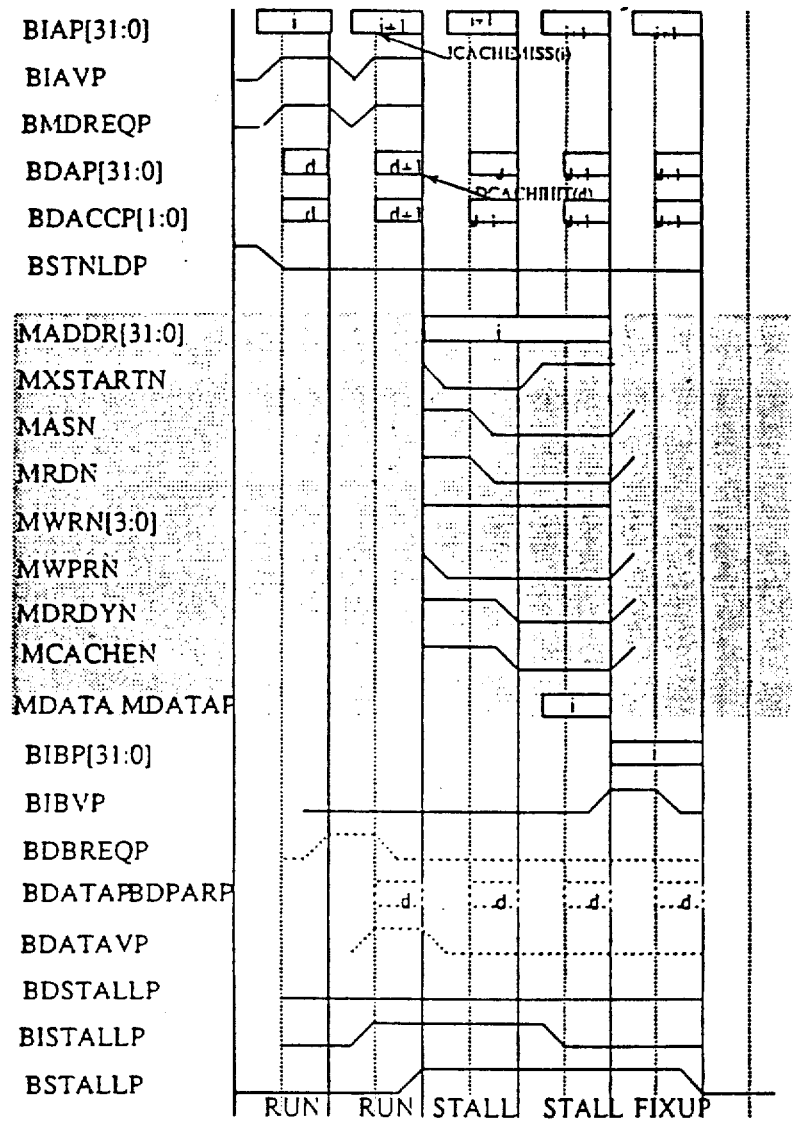
Figure 11. Instruction Cache Miss followed by data cache Hit. CPU-BIU Interaction.
3.2.2.4) Data Cache Miss on Read
Figure 12 show the interaction between the BIU and CPU for a data cache miss. The BIU fetches one word for the CPU.

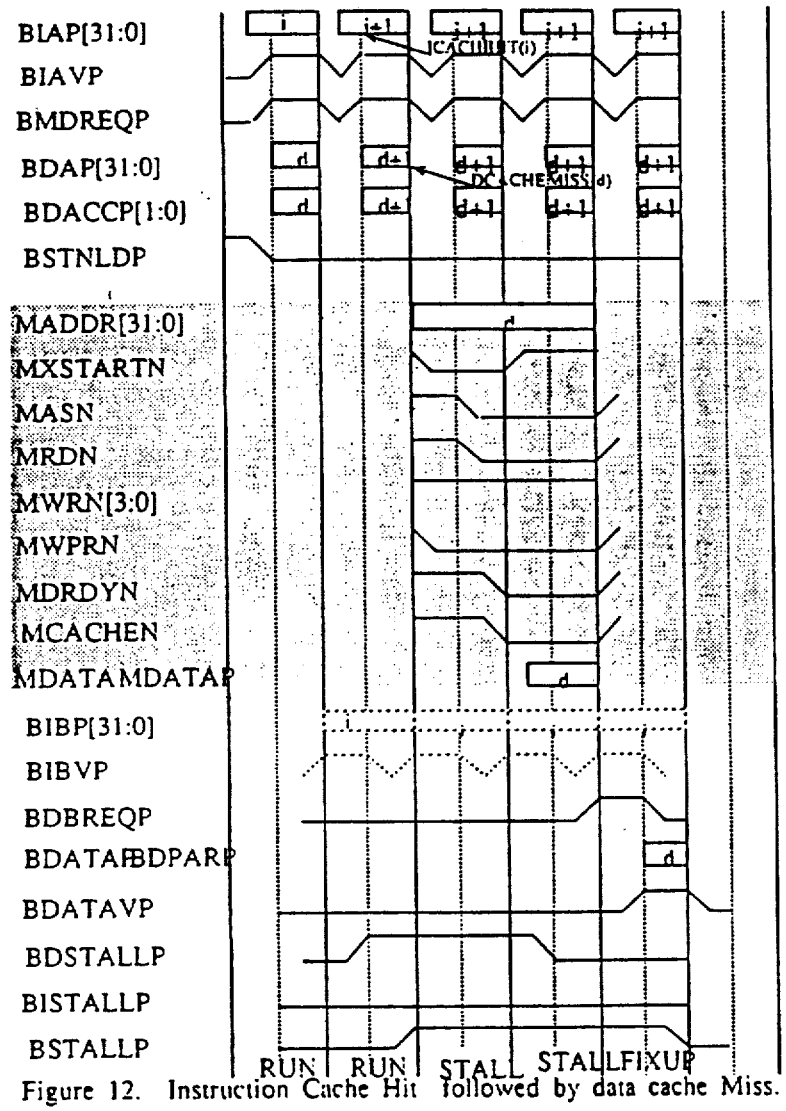
Figure 12. Instruction Cache Hit followed by data cache Miss.
3.2.2.5) Instruction Cache Miss followed by Data Cache Miss
Figure 13 shows the case when both the instruction and data caches incur a miss. In the figure the BIU fetches one word for each miss.

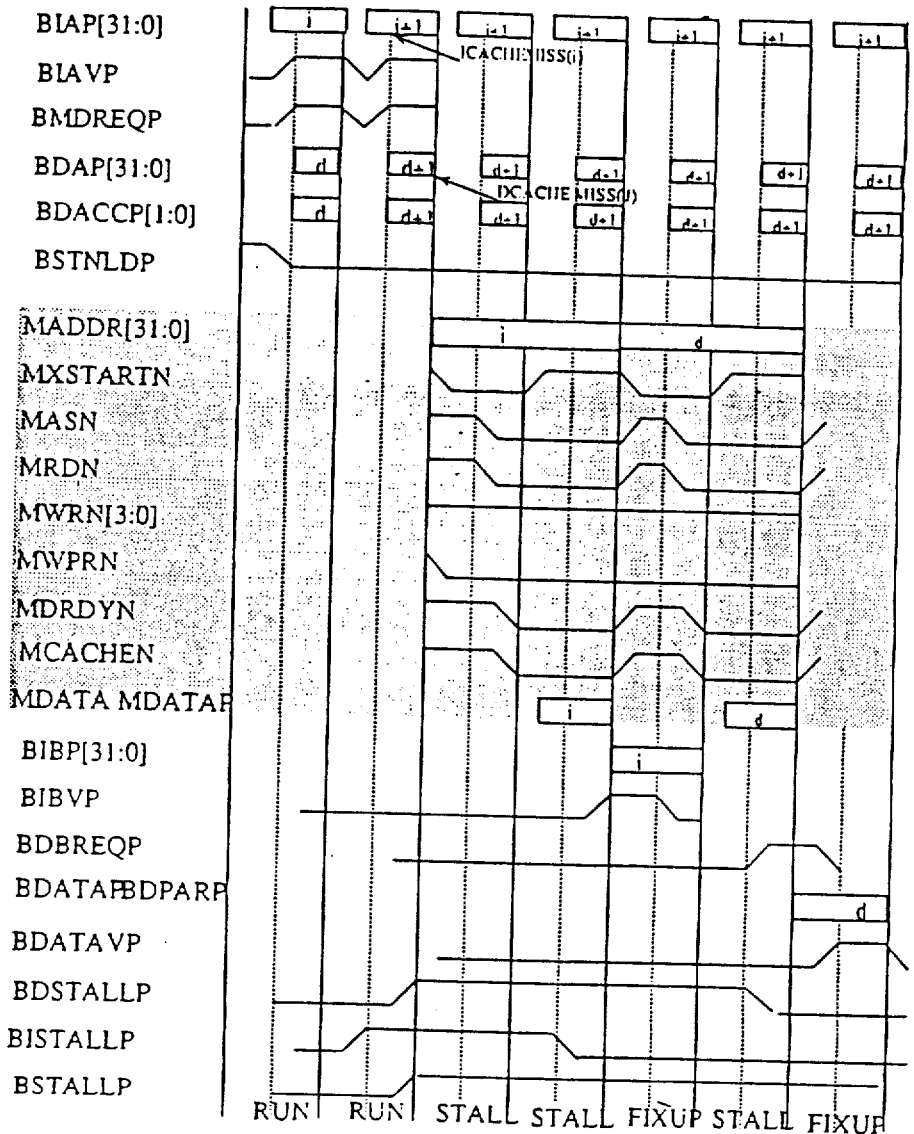
Figure 13. Instruction Cache Miss followed by data cache Miss. CPU-BIU Interaction.
3.2.2.6) Stall for Busy Write Buffer
Figure 14 shows a stall caused by a CPU write operation to a busy write buffer. In the figure, d+1 and d+2 are consecutive writes.
LSI Logic Corp.  Confidential

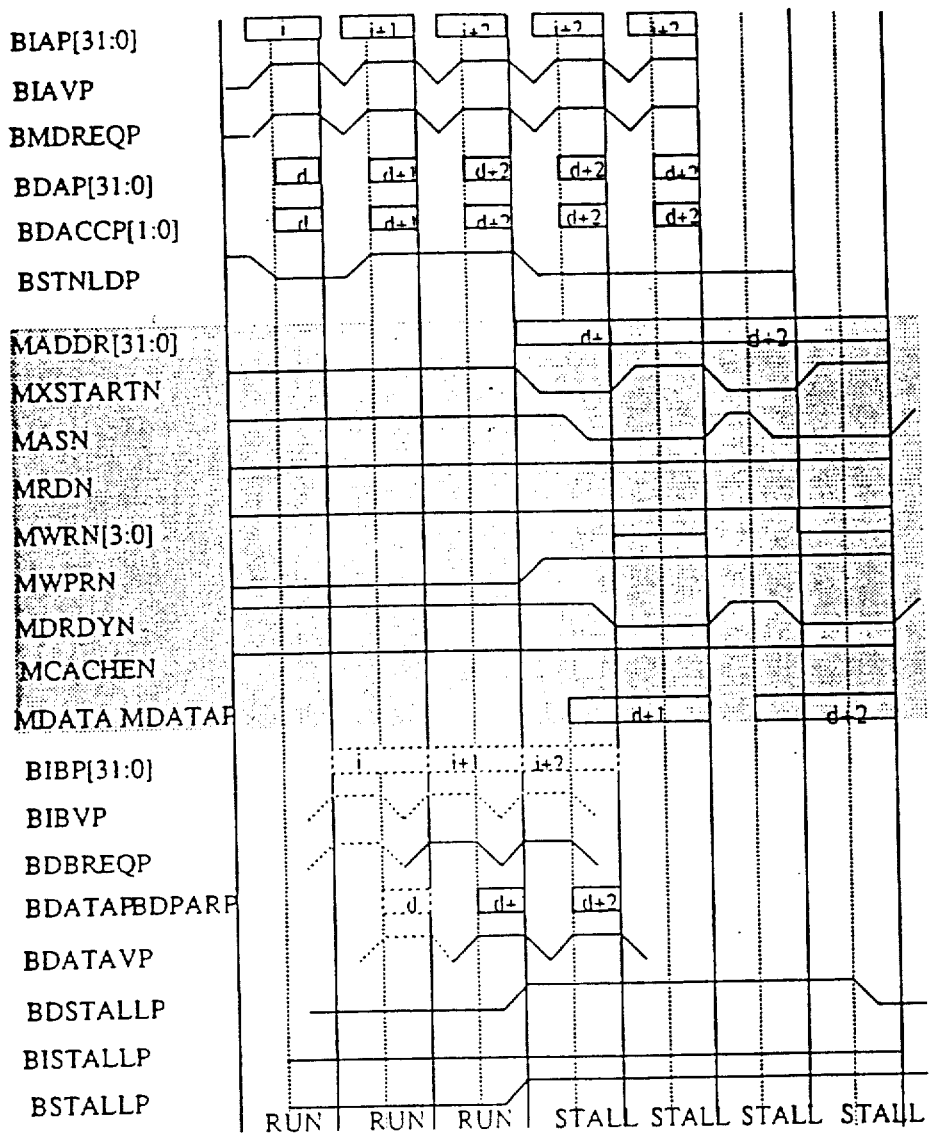
Figure 14. Instruction cache hits with TWO consecutive writes causing write buffer busy stall. (d+1 and d+2 are consecutive writes).
3.2.X) CPU Interface Signal List
Table 1 summarizes the interconnection between the CPU and BIU for the Cobra design. Recall that BIU signals have a "B" pre-pended to the signal name in place of "C" used for CPU signals.

Table 2 shows the signals which are configured specifically for the Cobra design. Because the
Cobra design has no MMU and some of the cache features supported by the LR3000 are also not supported, the signals in Table ?? are either "no connects" or are strapped to Vss or Vdd in the BIU module.

| NAME: | I/O | CLASS | FROM/TO | REMARKS |
|---|---|---|---|---|
| BMDREQP | I | 2S | CPU | Data access request. |
| BDAP[31:0] | I | 2S | CPU | Data Address |
| BDACCP[1:0] | I | 2S | CPU | Data Access type |
| BSTNLDP | I | 2S | CPU | Data Store/Load |
| BSTALLP | I | 2S | CPU | STALL |
| BDBREQP | I | 1S | CPU | Data bus Request |
| BDATAP[31:0] | I/O | | CPU | Data Bus |
| BDATAVP | I/O | | CPU | Data Valid indicator |
| BDPARP[3:0] | I | | CPU | Data Parity for Writes |
| BIAP[31:0] | I | 2S | CPU | Instruction Address |
| BIAVP | I | 2S | CPU | Instruction Address Valid |
| BIBP | O | 1V | CPU | Instruction Bus |
| BIBVP | O | 1V | CPU | Instruction Bus Valid |
| BDBEP | O | 2S | CPU | Data Access Error |
| BIBEP | O | 2S | CPU | Instruction acess error |
| BDPEP | O | 2V | CPU | Data Access Parity Error |
| BIPEP | O | 1V | CPU | Instruction Access Parity error |
| BDCMP | O | 2V | CPU | Data Cache Miss |
| BINTP[5:0] | O | 2S | CPU | Synched Interrupts |
| BDSTALLP | O | 2V | CPU | Data Stall |
| BISTALLP | O | 2V | CPU | Instruction Stall |
| BEXCFIXP | I | 1S | CPU | |
| BEXCTAKP | I | 2S | CPU | |
| BINTGRP | I | 2S | CPU | |
| BPZP | I | 2S | CPU | |
| BYTEORDERP | O | 1S | CPU | Endian-ness indicator |
| BMMUYN | O | 1S | CPU | MMU Present/Not Present |
| BRESETP | | | CPU,CACHE | Synched Reset |
| BHIGHZN | O | 2S | CPU,CACHE | Tri-state shared signals |

Table 1.  CPU-BIU Signal list (Active Signals)

| Name: | I/O | CLASS | FROM/TO | Remarks: |
|---|---|---|---|---|
| CXCREQP | | | | Unconnected CPU output |
| CXCPFNTP | | | | Unconnected CPU Output |
| BDMISSP | | | Vss | CPU Input. Grounded. |
| BDPGINVP | | | Vss | CPU Input. Grounded. |
| BDMODP | | | Vss | CPU Input. Grounded. |
| BIMISSP | | | Vss | CPU Input. Grounded. |
| BIPGINVP | | | Vss | CPU Input. Grounded |
| BMTSP | | | Vss | CPU Input. Grounded |
| BPXBUSYP | | | Vss | CPU Input. Grounded. |
| BPBUSYP[3:0] | | | Vss | CPU Inputs. Grounded. |
| CXCFIXP | | | | CPU Output. Unconnected. |
| CMDFIXP | | | | CPU Output. Unconnected |
| CSWCP | | | | CPU Output. Unconnected |
| CISCP | | | | CPU Output. Unconnected. |

Table 2. CPU-BIU Connections specific to LR3100 (Cobra) design.

3.3) Interface to CACHE

In this section, the interface between the BIU and the two cache memories is described. A brief description of the cache interface signals follows:

> BBIA. Instruction Cache Address bus. This 30 bit bus conveys instruction address information to the instruction cache during CPU memory accesses, bus snooping accesses and test-mode accesses.

BISELP. This signal, when asserted, indicates that the CPU has generated a
memory access which is to be serviced in the instruction cache.

BIHPMN. This signal inidcates whether the iformation required by the CPU
is present in the instruction cache (HIT) or not (MISS). A
logic 1 on this signal indicates a hit. a logic 0 on this signal indicates
a miss.

BIREFILLP. this signal indicates that the BIU is performing a fetch from
memory for the purposes of refilling the instruction cache with a
block of instructions.

BINOBLKN. This signal, when asserted, (logic 0) indicates that the refill block
size is one word. When negated, the refill block size is as specified
by the BIBLKSZ[1:0] signals.

BIBLKSZ[1:0]. This bus indicates the size of the refill block which will be
provided to the instruction cache. The block size is determined by
the following rules:

| BIBLKSZ[1] | BIBLKSZ[0] | ICACHE Block Size: |
|---|---|---|
| 0 | 0 | 2 words |
| 0 | 1 | 4 words |
| 1 | 0 | 8 words |
| 1 | 1 | 16 words |

BIRFLSTBN. This signal, when asserted, indicates that data is available
on the BIBP bus to be latched into the instruction cache. This
signal is asserted during refill operations.

BITESTP. This signal, when asserted, indicates that the Icache is being
accessed in the TEST Mode. In the test Mode, the Icache can
be read and written.

BBDA[31:0]. this bus is used to present address information to the Data
Cache for cache accesses, snoop invalidation and in the
test mode.

BDSELP. This signal, whne asserted, selects the Data Cache for
performing an operation such as cache access, snoop invalid-
ation, and test-mode. When negated, the Data Cache ignores
all activity by the CPU and BIU.

BDHPMN. This signal inidcates whether the iformation required by the CPU
is present in the data cache (HIT) or not (MISS). A logic 1 on this signal indicates a hit. a logic 0 on this signal indicates a miss.

BDREFILLP. this signal indicates that the BIU is performing a fetch from memory for the pruposes of refilling the data cache with a block of data.

BDNOBLKN. This signal, when asserted, (logic 0)indicates that the refill block size is one word. When negated, the refill block size is as specified by the BDBLKSZ[1:0] signals.

BDBLKSZ[1:0]. This bus indicates the size of the refill block which will be provided to the data cache. The block size is determined by the following rules:

| BDBLKSZ[1] | BDBLKSZ[0] | DCACHE Block Size: |
|---|---|---|
| 0 | 0 | 2 words |
| 0 | 1 | 4 words |
| 1 | 0 | 8 words |
| 1 | 1 | 16 words |

BDRFLSTBN. This signal, when asserted, indicates that data is available on the BDATAP bus to be latched into the data cache. This signal is asserted during refill operations.

BDTESTP. This signal, when asserted, indicates that the Dcache is being accessed in the TEST Mode. In the test Mode, the Dcache can be read and written.

BWEB[3:0]. These signals, when asserted (logic 0), indicate that the data cache is to be written with the data on the BDATA bus. This signal is used for normal cache accesses and in the test-mode. Writing to the DCACHE for the purposes of refilling is done with BDRFLSTBN. Each BWEB[*] signal corresponds to a byte of data as per the following table:

BWEB[3] is used for bits 7-0 of BDATAP
BWEB[2] is used for bits 15-8 of BDATAP
BWEB[1] is used for bits 23-16 of BDATAP
BWEB[0] is used for bits 31-24 of BDATAP BSNOOPINGP. When asserted, (logic 1) this signal indicates that the BIU both CACHES are examining the external bus for write transactions. When a write transaction is discovered on the MADDR and MWPRN signals, the cache location(s) corresponding to MADDR is invalidated if a cache hit is detected.

3.3.1) Instruction and Data Cache Hit

Figure 15 shows an instruction cache hit followed by a data cache hit with the BIU and cache interaction.

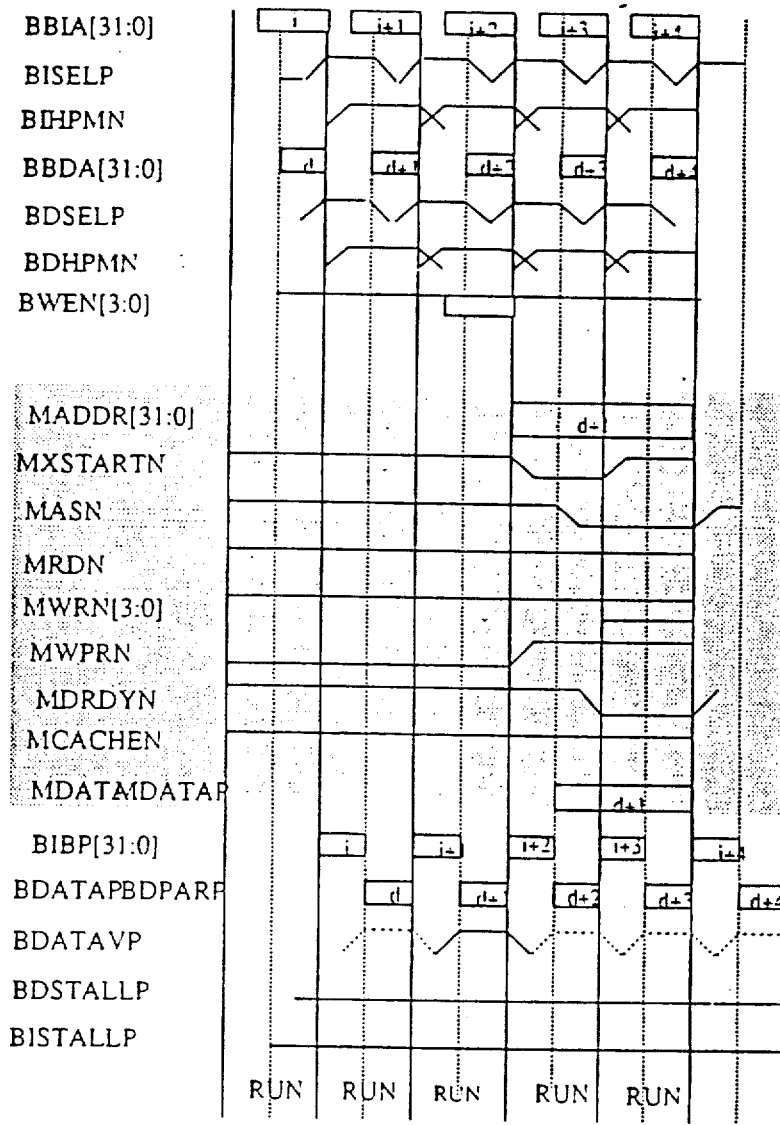
Figure 15. Instruction Cache Hit followed by data cache Hit.. CACHE-BIU Interaction.
Figure 15a shows an aborted write operation. This write operation (d+1) is aborted to the DCACHE and to primary memory due to a CPU exception condition which is indicated by assertion of BMDRINVP. See Section 3.2.
LSI Logic Corp.                                   Confidential

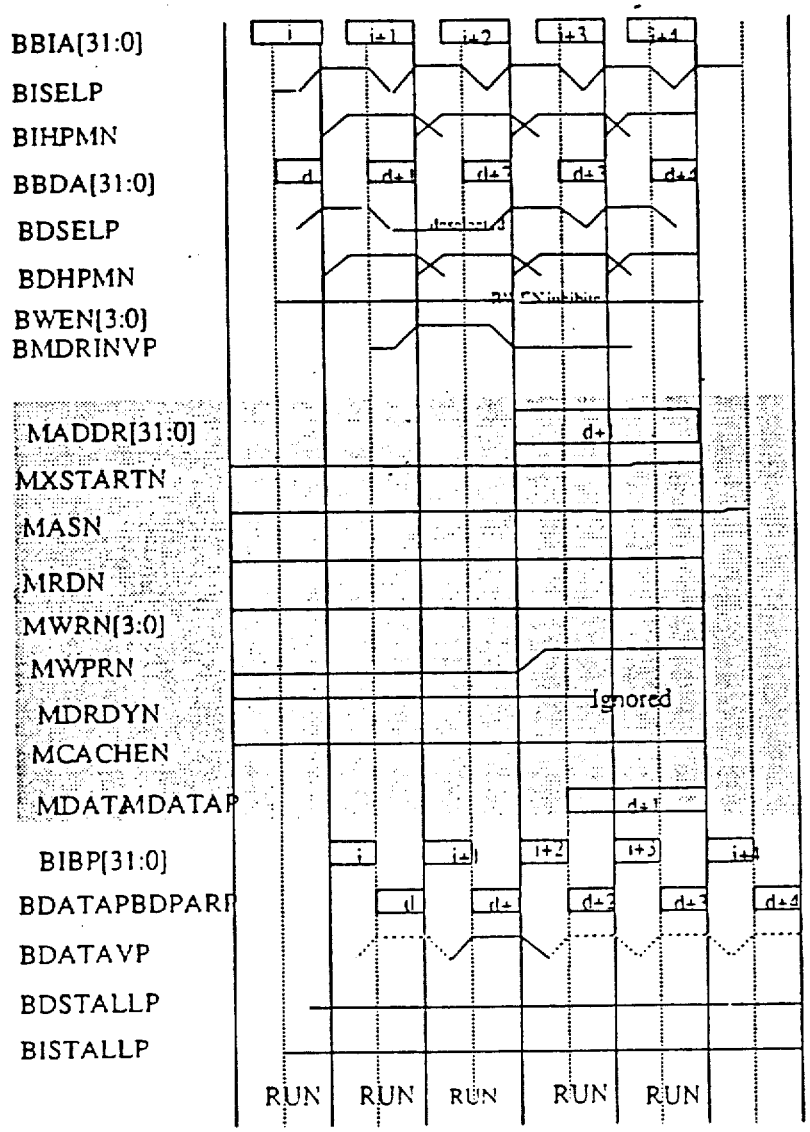
Figure 15a. Instruction Cache Hit followed by data cache Hit.. CACHE-BIU Interaction.
3.3.2) Instruction Cache Miss
Figure 16 shows the BIU-CACHE interaction for an instruction cache miss. Here the BIU fetches one word to fill the instruction cache.

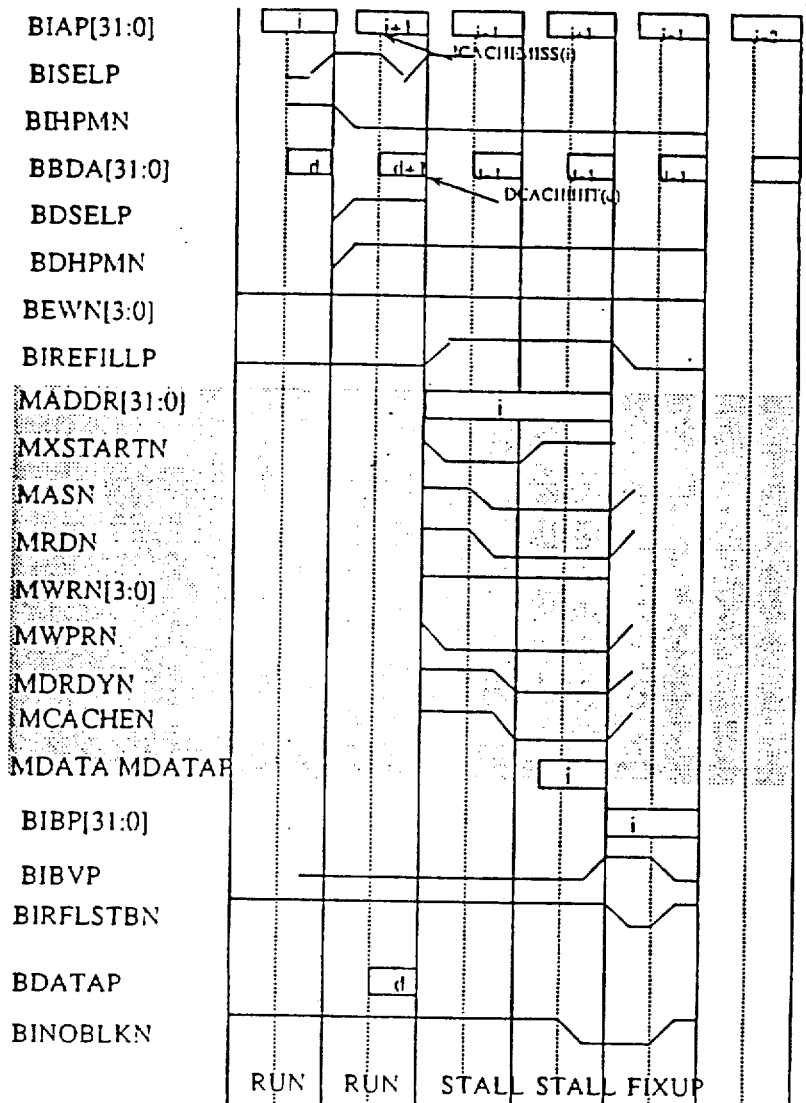
Figure 16. Instruction Cache Miss followed by data cache Hit. CACHE-BIU Interaction.
3.3.3) Data Cache Miss on Read
Figure 17 shows the BIU Cache insteraction when a data cache miss occurs on a read operation. In figure 17, the BIU fetches only one word.

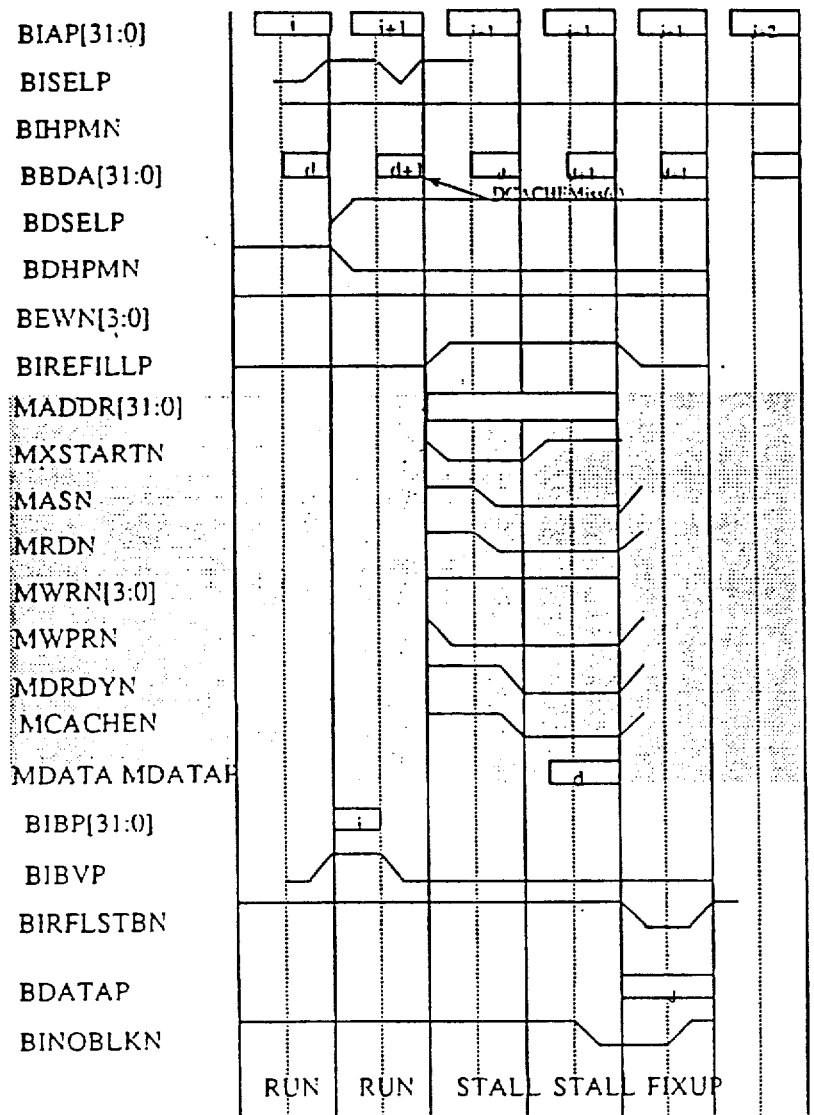
Figure 17. Instruction Cache Hit followed by data cache Miss. CACHE-BIU Interaction.
Figure 17a shows data cache miss but uncacheable data returned from memory (MCACHEN not asserted by the memory system).
3.3.4) Instruction Block Refill'

Figure 18 shows an instruction cache miss where the BIU fetches a block (2 words in the figure) of memory to fill the cache.
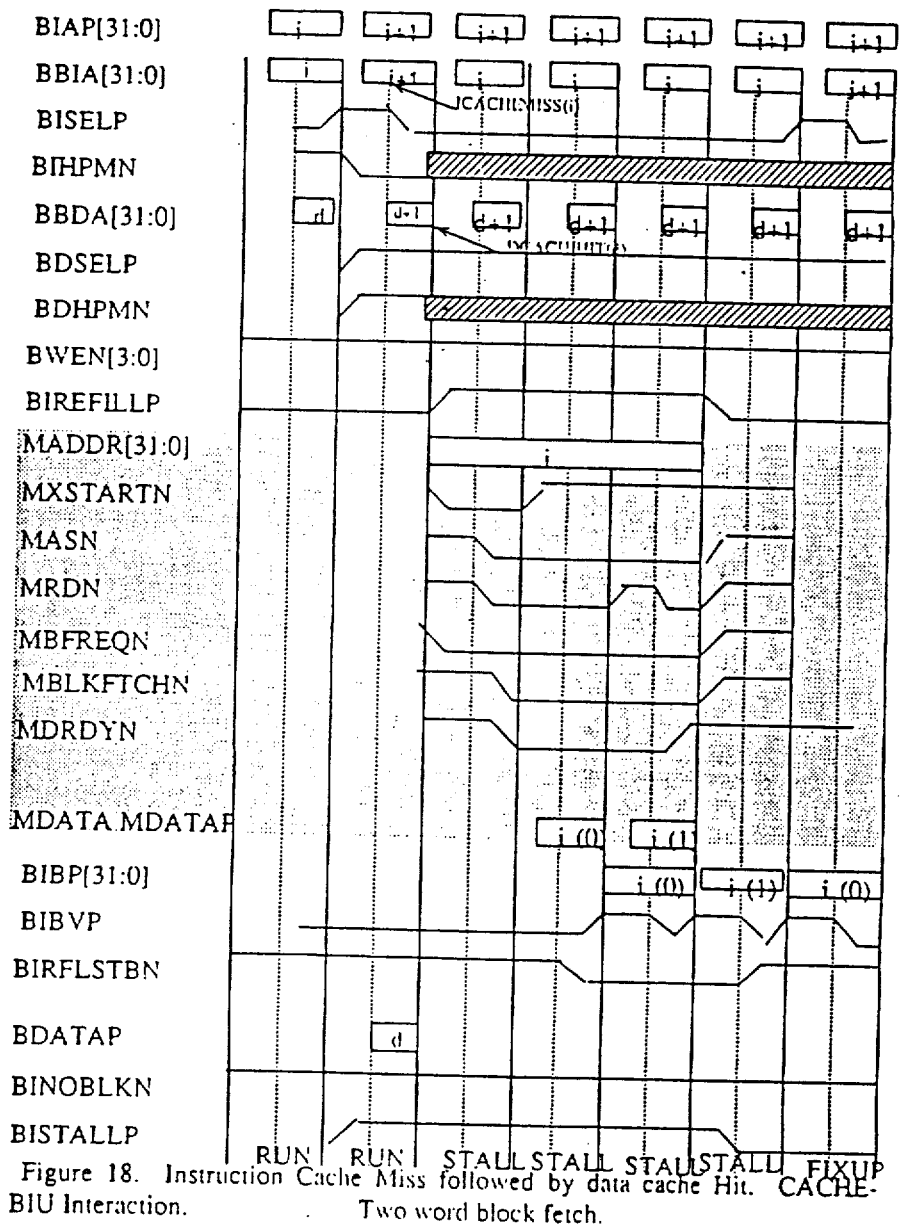
Figure 18. Instruction Cache Miss followed by data cache Hit. CACHE-BIU Interaction. Two word block fetch.
3.3.5) Data Block Refill Figure 19 shows a data cache miss with a block refill (using external block fetch protocol).
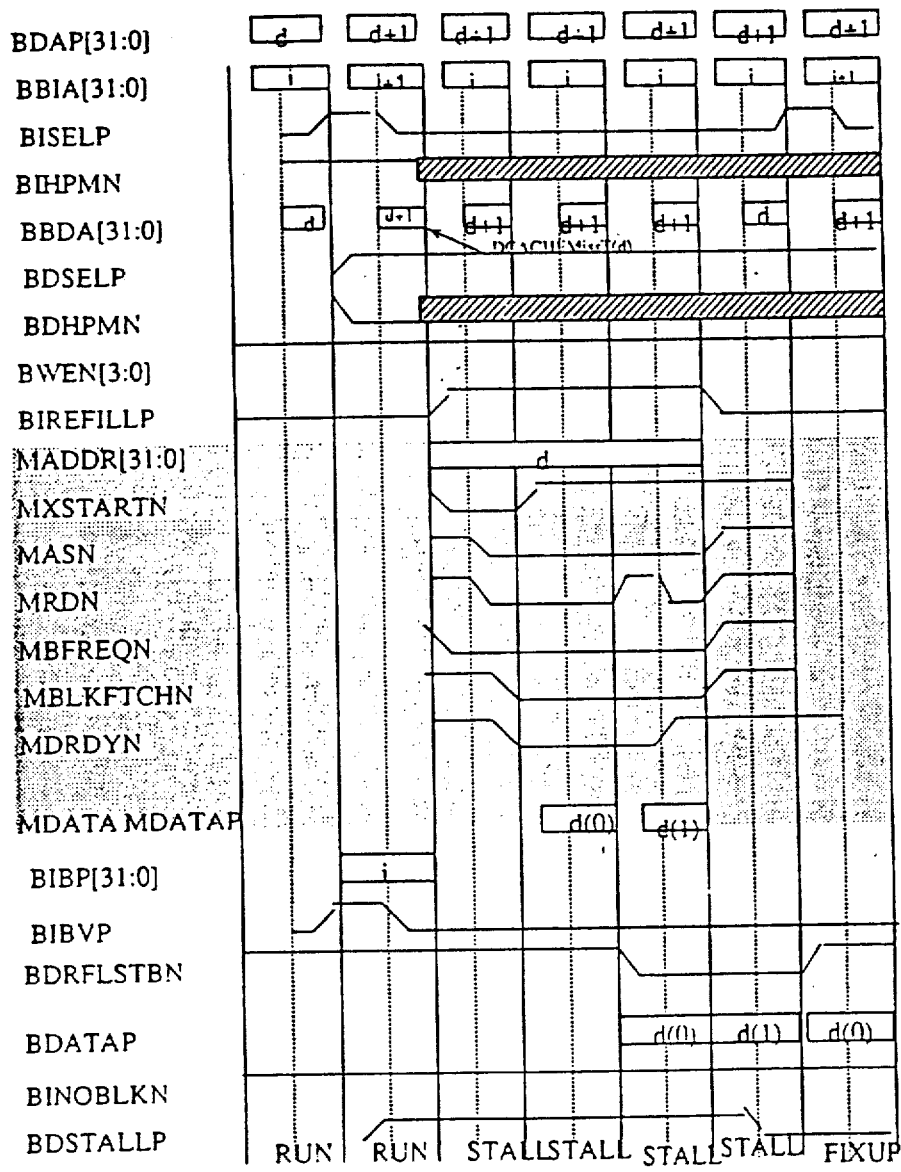
Figure 19. Instruction Cache Hit followed by data cache Miss. Data Block Refill. CACHE-BIU Interaction. Two word block fetch.
3.3.6) Bus Snooping Figure 20 shows the bus snooping operation. While the external memory bus is granted to another bus master, the address strobe (MASN) and MWPRN signals are monitored by the BIU. In the event that an external bus master asserts the MASN signal, the BIU wil use MASN to latch the address which is on the MADDR bus. The BIU will then determine if the external bus operation is a write operation by examining the level of the MWPRN signal. If the signal is logic 1 (ie the external bus master is writing to memory) then the BIU will synchronize the address and request a stall from the CPU. While the CPUis stalled, the BIU and cache invalidate the entry in the cache corresponding to the address latche with MASN. Note that invalidation is done on a word basis. Block fetch transactions on the external bys by an external bus master cannot be accommodated by bus snooping. The bus snooping mechanism requires an address strobe assertion for each address presented on the external bus.

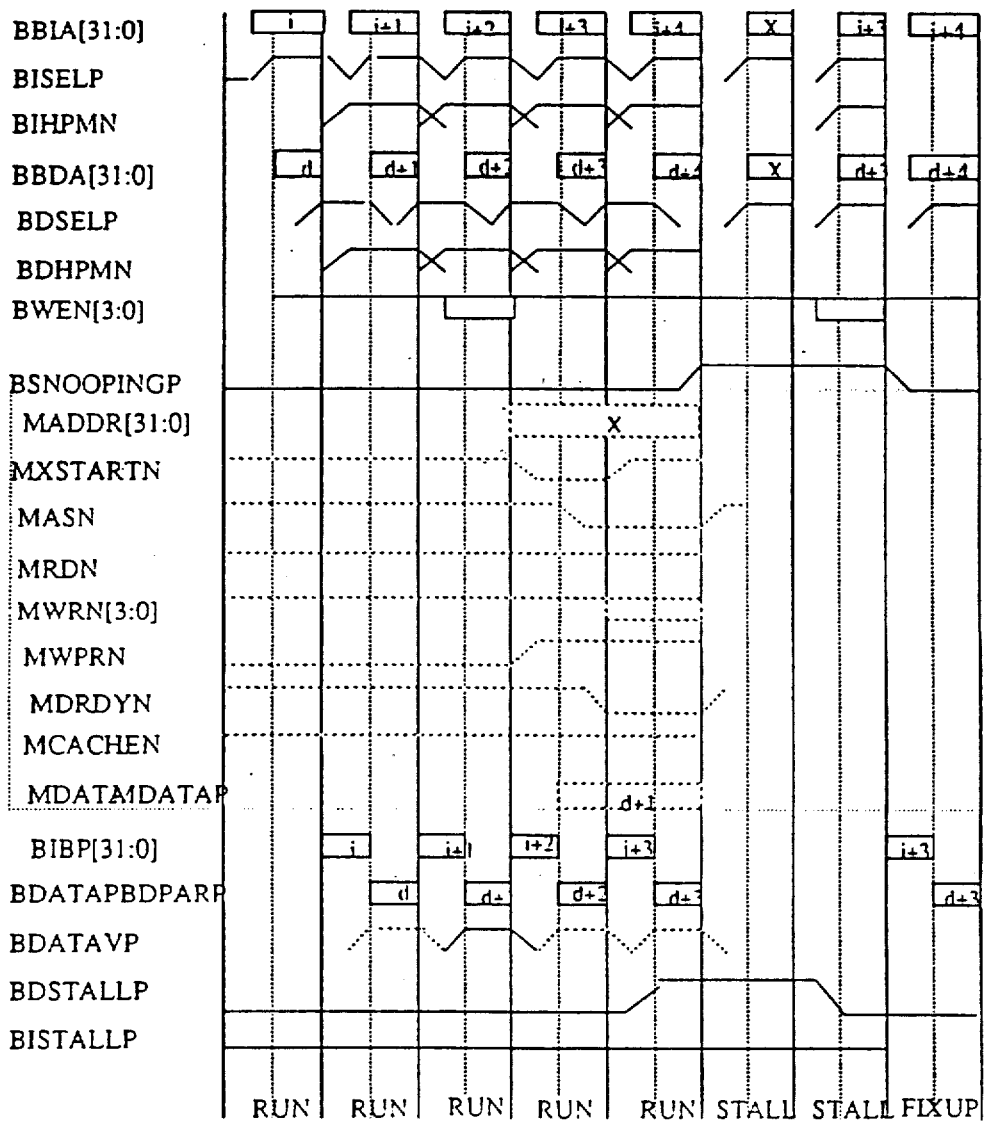
Figure 20. Cache Snooping While fetching from cache.
Figure ?? shows the cache snooping performed when the processor is previously stalled
3.3.7) Cache test Mode
In this section the COBRA chip's cache test mode feature is described. the cache mode test feature allows the on-chip caches to be accessed directly from the memory interface signals. Direct writing and reading to/from the instruction and data caches (data RAMs) allows the testing of the functionality of the cache memory arrays. The cache TAG RAMs are testable indirectly using this cache test-mode feature. Note that the external memory interface must be granted to an external master via the bus arbitration mechanism so that the test mode operation can be utilized. Note that the test-mode can be used in a system to load the on-chip caches. That is to say that the test-mode can be used for other than testing purposes. Figure 21 shows a test-mode write to the instruction cache.

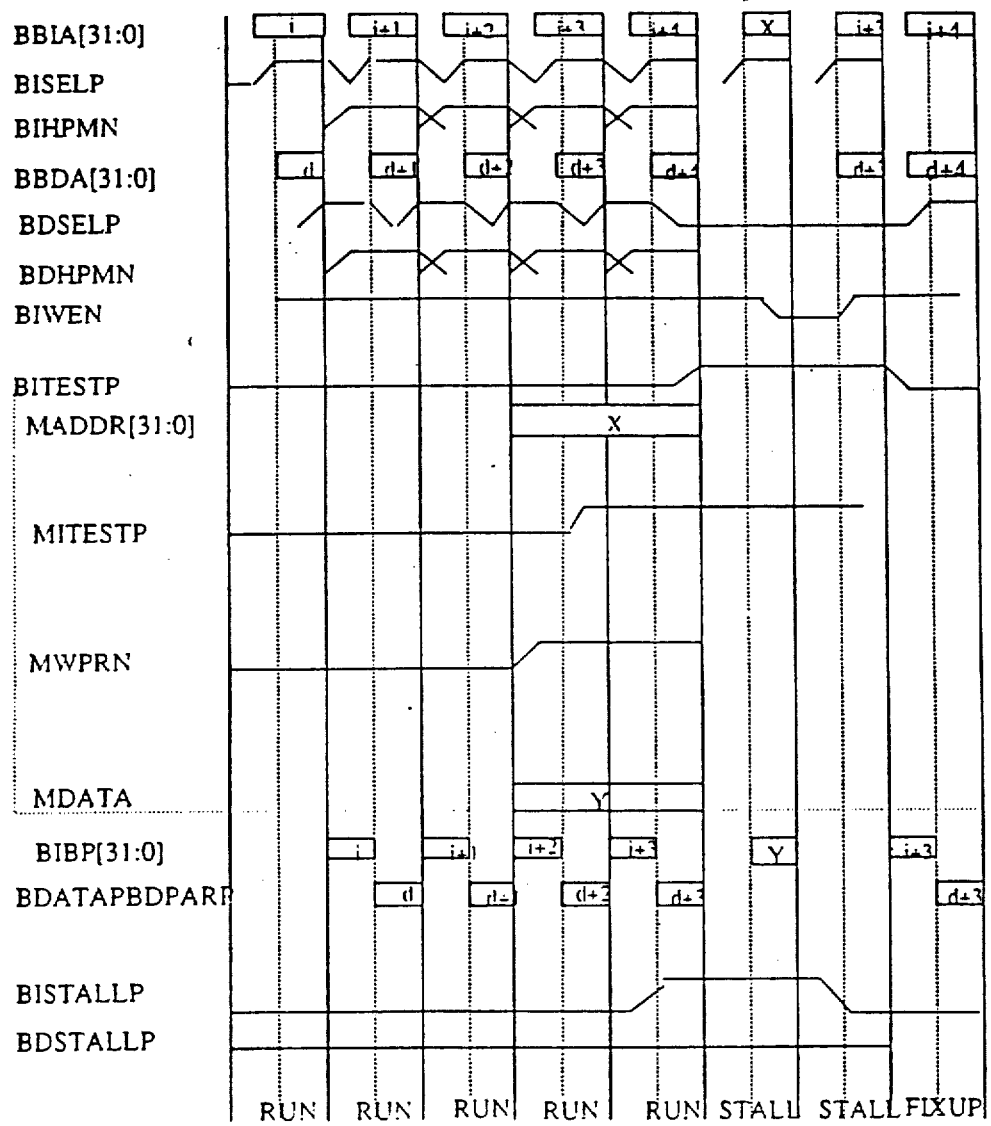
Figure 21. Icache Test Mode. Write to Icache.
Figure 21a show a test-mode write to the data cache.

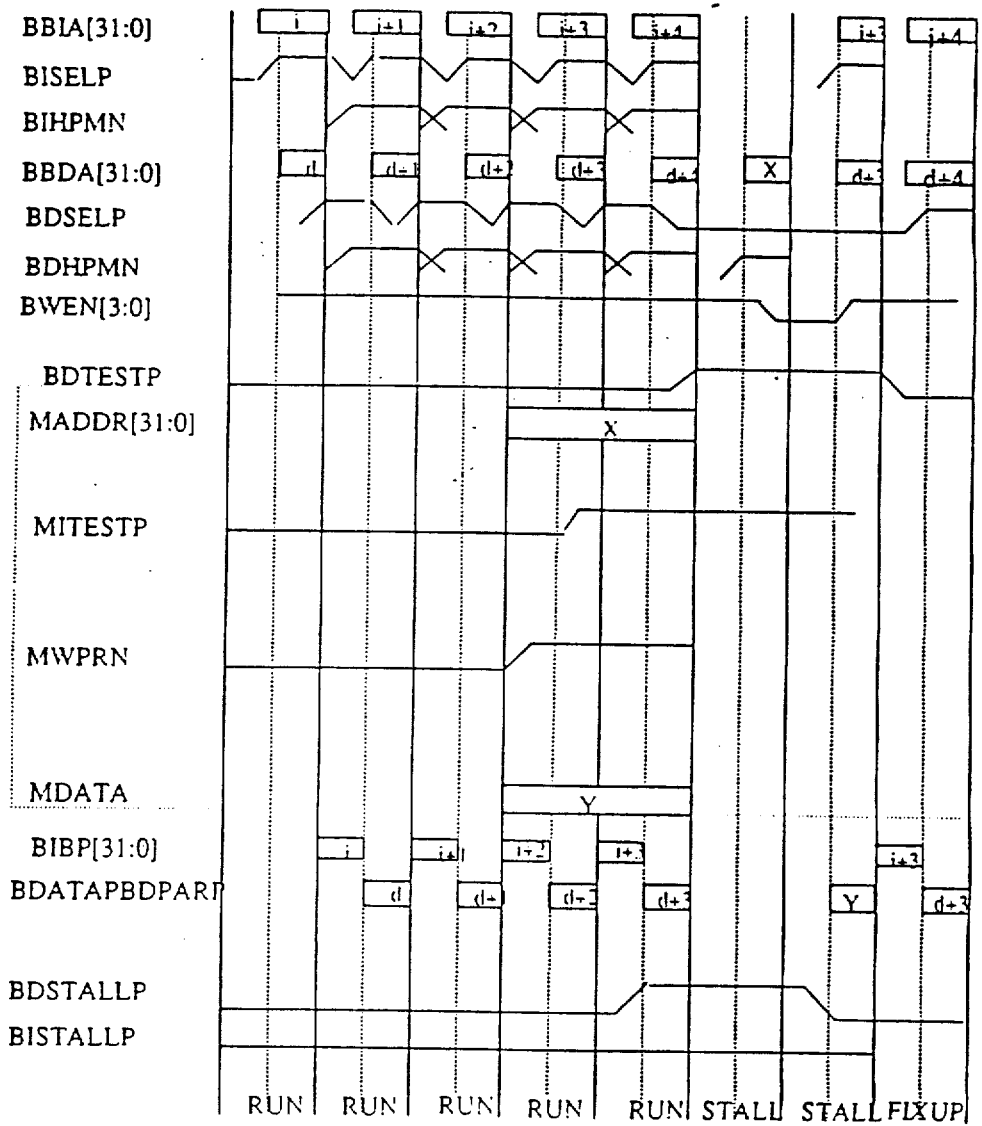
Figure 21a. Dcache Test Mode. Write to Dcache.
Figure 21b shows a test-mode read of the data cache.
LSI Logic Corp.                                                                                                  Confidential

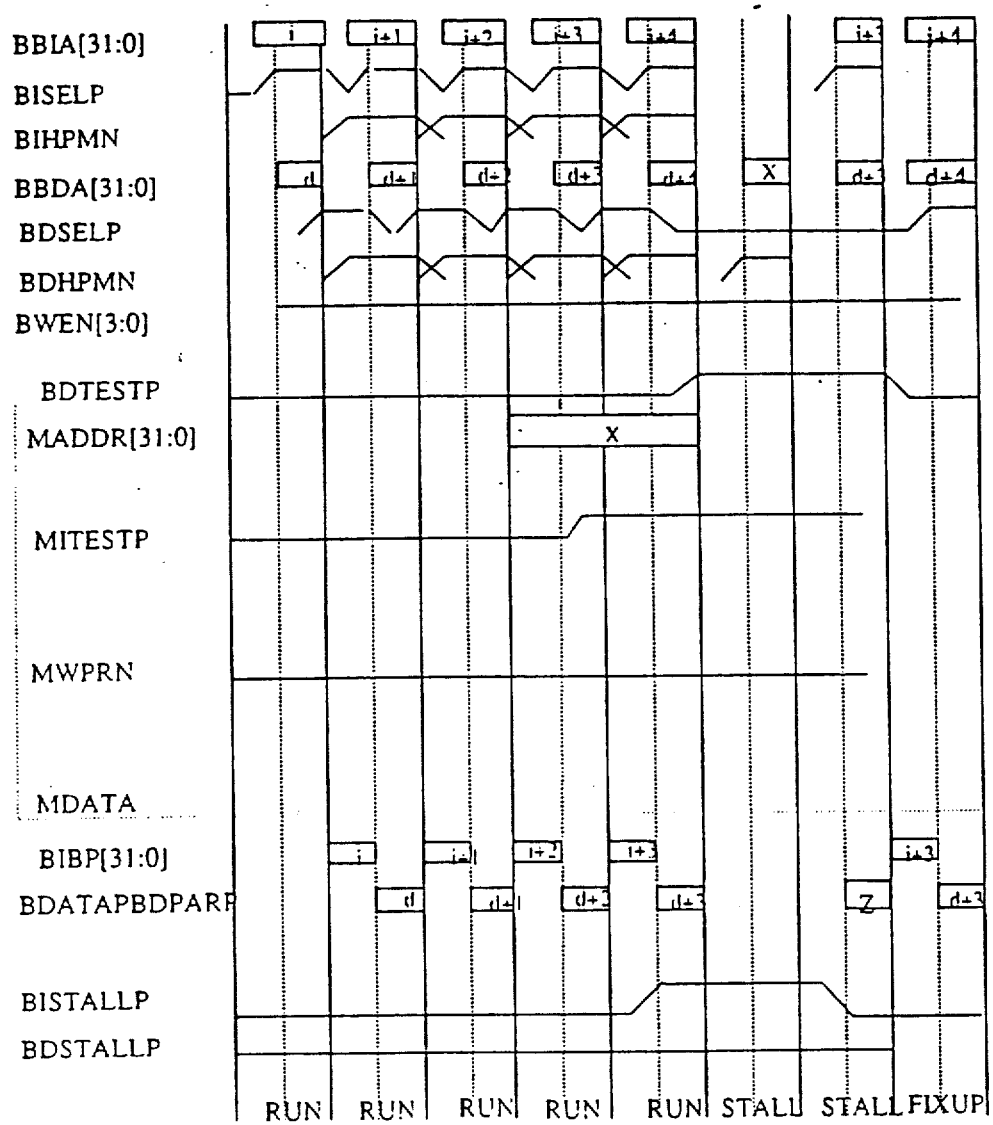
Figure 21b. Dcache Test Mode. Read From Dcache.
Figure 21c shows a test-mode read of the instruciton cache.

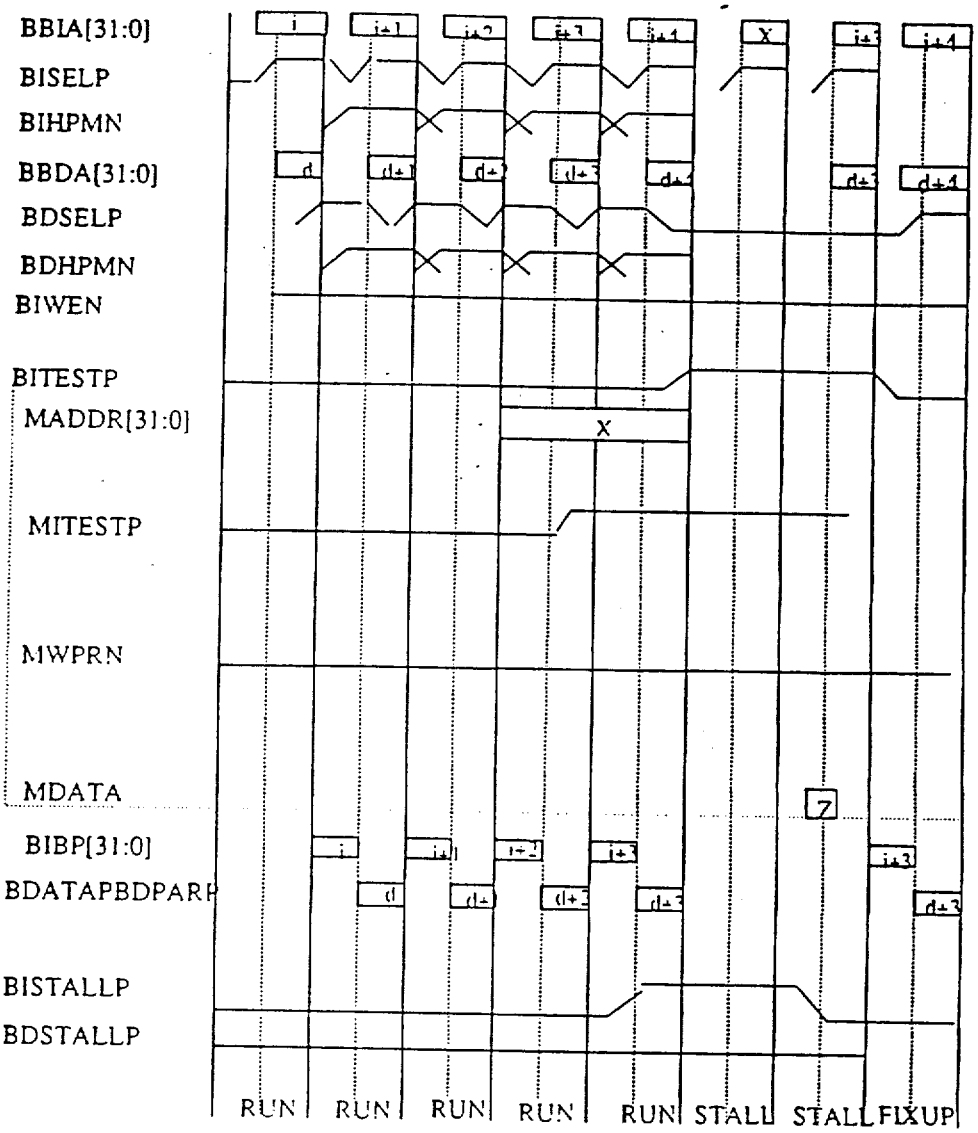
Figure 21c. Icache Test Mode. Read From Icache.
3.3.X) Cache Interface signal list.

| NAME: | I/O | CLASS | FROM/TO | REMARKS: |
|---|---|---|---|---|
| BBIA[31:2] | O | 2S | BIU-IS | Instruction address |
| BIREFILLP | O | 1V | BIU-IS | ICACHE Refill |
| BIHPMN | I | 1V | IS-BIU | ICACHE Hit/Miss |
| BIBLKSZ[1:0] | O | 1S | BIU-IS | Instruction Block Size |
| BITESTP | O | 2S | BIU-IS | ICACHE Test Mode |
| BINOBLKN | O | 2V | BIU-IS | ICACHE No Block Refill |
| BIRFLSTBN | O | 1S | BIU-IS | ICACHE Refill Srobe |
| BISELP | O | 1S | BIU-IS | ICACHE Select |
| BIWN | O | 1S | BIU-IS | ICACHE Write Enable |
| | | | | |
| BBDA[31:0] | O | 2S | BIU-DS | Data Address |
| BDREFILLP | O | 1V | BIU-DS | DCACHE Refill |
| BDHPMN | I | 1V | DS-BIU | DCACHE Hit/Miss |
| BDBLKSZ[1:0] | O | 1S | BIU-DS | Data Block Size |
| BDTESTP | O | 2S | BIU-DS | DCACHE Test Mode |
| BDNOBLKN | O | 2V | BIU-DS | DCACHE No Block Refill |
| BDRFLSTBN | O | 2S | BIU-DS | DCACHE Refill Strobe |
| BWEB[3:0] | O | 1V | BIU-DS | DCACHE Write marks |
| BDSELP | O | 1S | BIU-DS | DCACHE Select |
| | | | | |
| BSNOOPINGP | O | 1S | BIU-I/DS | Snooping mode. |
| BCERRORP | O | 2V | BIU-IS/DS | Error on Rfill |
| BRESETP | O | 2S | BIU-I/DS | Reset |
| BHIGHZN | O | 2S | BIU-I/DS | High impedance |

3.4) Interface to Peripherals (Timers)

| NAME | I/O | CLASS | FROM/TO | REMARKS: |
|------|-----|-------|---------|----------|
| BTSELP | I | | | Timers Selected |
| BT01P | I | | | Timer 1 Interrupt |
| BT02P | I | | | Timer 2 Interrupt |
| BTRTCP | I | | | |
| BTRACKP | O | | | Refresh Timer Acknowledge |
| BT2TCP | I | | | |
| BT2CENP | O | | | Timer2 Enable |

3.5) Reset

The reset operation of the BIU module is detailed in:

*Fuccio, Michael; A modest Proposal for Reset; MIPS Notes; Nov. 30. 1989.*

Figure ?? shows the reset sequence as described in the document above.

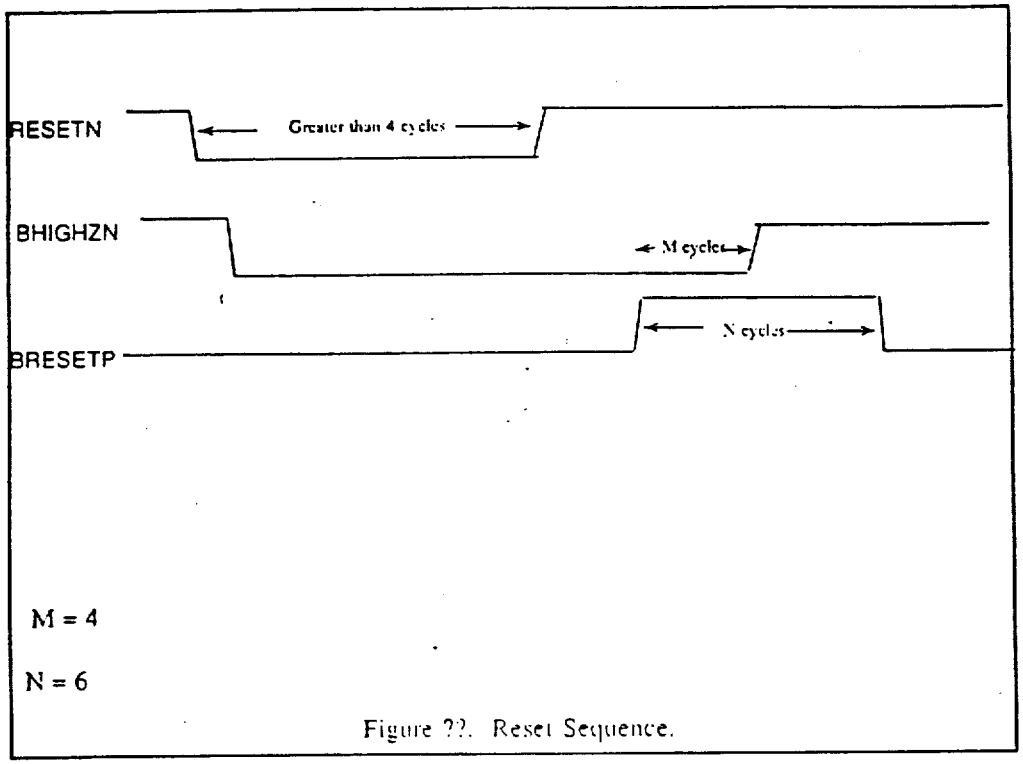
Figure ??. Reset Sequence.
4.0) Implementation Guidlines
5.0) Other
6.0) Open Issues
Cache Invalidate
Branch Taken Status Signal
Signal to CPU to Get off of the IB and DB during test mode
Separate STALL signal for snooping and TEST Mode ?

COBRA
MIPS High Performance
Embedded Processor

LSI LOGIC PRIVATE

ADVANCE INFORMATION

*APPENDIX 4*

Description

The COBRA processor is a MIPS compatible single chip controller designed for high performance embedded processor applications. This processor maintains user binary software compatibility with the LR2000 and LR3000 implementations of the MIPS architecture. COBRA integrates several features which facilitate low cost embedded processor designs requiring high performance 32-bit processing capabilities.

COBRA consists of a MIPS CPU core along with system functions which significantly reduce the overall number of chips required to build a system. This reduction in component count helps to substantially cut the overall system cost and improve system reliability.

COBRA's bus interface design allows it to interface to the rest of the system in a simple and cost effective manner. COBRA's "system on a chip" approach integrates the following units onto a single device:
- MIPS CPU
- I-Cache
- D-Cache
- Write Buffer
- Timers/Counters
- DRAM Controller

Features

- RISC architecture
  - MIPS instruction set
  - Single cycle instruction execution
  - LR2000/LR3000 user software binary compatibility
- High on-chip integration
  - 8 kbyte I-Cache
  - 1 kbyte D-Cache
  - 1 deep write buffer
  - 3 Timers/Counters
  - Integrated DRAM controller
- Simple I/O interface
  - Direct DRAM interface
  - 8 and 32 bit wide boot PROM support
  - Direct interface to other memories and peripherals
  - DMA interface support
  - Programmable wait state generation
- Simple 1X clock input
- Debug features
  - Hardware breakpoint registers
  - Instruction trace capabilities
- Cache coherency support
  - Bus snooping
  - Cache invalidate command
- High performance
  - Five stage pipeline
  - Efficient handling of pipeline stalls and exceptional events
- Reduced power requirements
- Three speed versions
  - 25, 33, and 40 MHz April 30, 1990: Rev. 1.6

*Preliminary*

COBRA
MIPS High Performance Embedded Processor

LSI LOGIC PRIVATE

ADVANCE INFORMATION

Block Diagram  The COBRA processor consists of the following major units: a core CPU which is compatible with the MIPS architecture, a 8 kbyte I-cache, a 1 kbyte D-cache, a one deep write buffer, two 24-bit general purpose timers, a 12-bit refresh timer, DRAM controller, 8 and 32-bit wide boot PROM support, programmable wait state generation, two chip selects, and an improved memory interface.

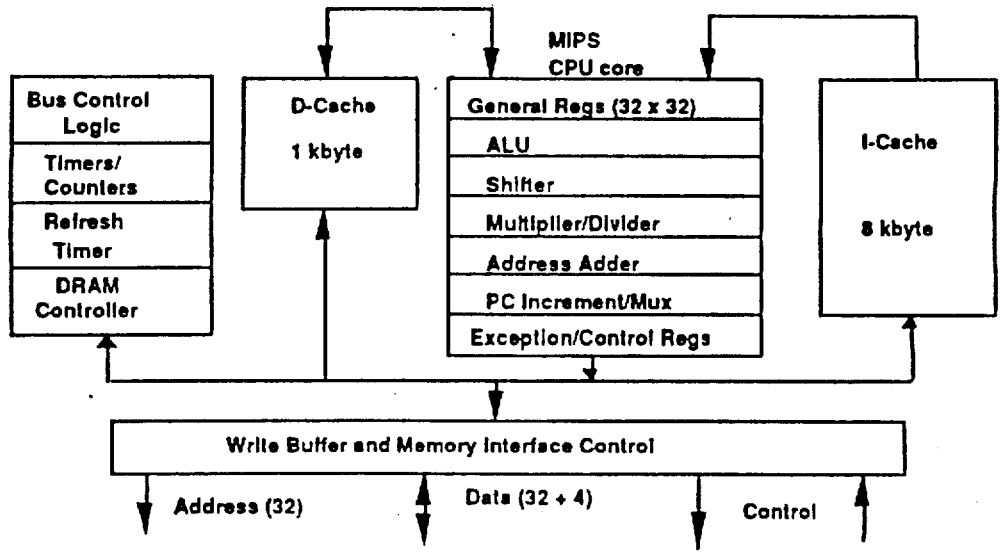

Figure 1. Functional Block Diagram

Programming Model  As illustrated in figure 2, COBRA provides 32 general purpose registers, a 32-bit program counter, and two 32-bit registers which hold the results of the multiply and divide operations. The status and cause registers provide the functions traditionally provided by the program status word (PSW) register.

The COBRA processor also defines a 32-bit word, a 16-bit half word, and an 8-bit byte. The byte ordering is configurable into either big-endian or little-endian format. When configured as a big-endian system, byte 0 is always the most significant byte, providing compatibility with MC680xx and IBM 370 conventions. When configured as a little-endian system, byte 0 is always the least significant byte, providing compatibility with DEC VAX, iAPX x86, and NS32000 conventions.

April 30, 1990:  Rev. 1.6               *Preliminary*

COBRA
MIPS High Performance
Embedded Processor

Programming Model (cont.)

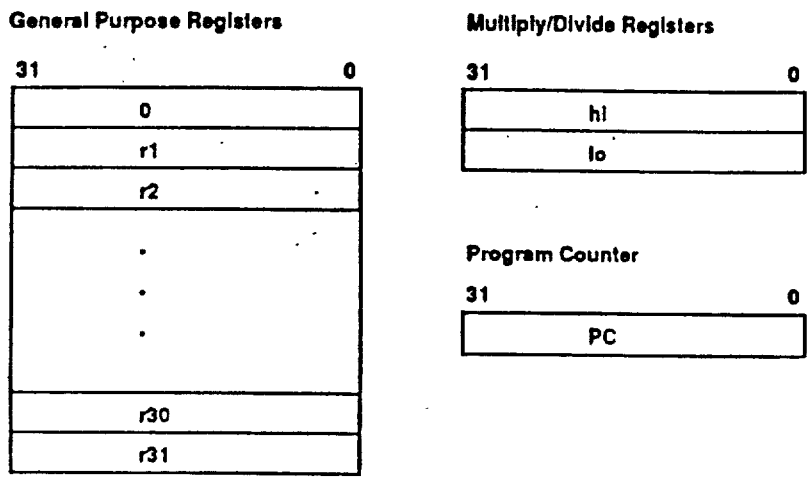

Figure 2 CPU Registers

Bit 0 is always the least significant bit thus bit designations are always little-endian (although no instructions explicitly designate bit positions within words). Figures 3 and 4 below show the ordering of bytes within words and the ordering of words within multiple word structures.

Big Endian

| higher address | 31 | | | 0 | word address |
|---|---|---|---|---|---|
| | 8 | 9 | 10 | 11 | 8 |
| | 4 | 5 | 6 | 7 | 4 |
| lower address | 0 | 1 | 2 | 3 | 0 |

Figure 3

Little Endian

| higher address | 31 | | | 0 | word address |
|---|---|---|---|---|---|
| | 11 | 10 | 9 | 8 | 8 |
| | 7 | 6 | 5 | 4 | 4 |
| lower address | 3 | 2 | 1 | 0 | 0 |

Figure 4

April 30, 1990: Rev. 1.6                                    Preliminary

COBRA
MIPS High Performance
Embedded Processor

LSI LOGIC PRIVATE

ADVANCE INFORMATION

Instruction Set

The COBRA processor retains instruction set compatibility with the LR3000 architecture in order to maintain code compatibility across both devices. Also, the instruction set from the LR2000 is upward compatible with the LR3000 and COBRA, meaning LR2000 code can also be ported to COBRA. All COBRA instructions are 32 bits in length. To simplify decoding, only three instruction formats are supported: immediate, jump and register (I, J, and R). The instruction set can be divided into the following groups.

- Load/store instructions move data between memory and the general purpose registers. All instructions execute on the data stored in these registers. No other operations are performed directly on data stored in memory. Load and stores are all I-type instructions, and the addressing mode is base register + 16-bit offset.

- Computational instructions perform arithmetic, logical, and shift operations on values in registers. These can be R-type (both values are in registers) or I-type (one operand is a 16-bit immediate) instruction formats.

- Jump and branch instructions change the program flow. All jump and branch instructions occur with a one instruction delay. The instruction immediately following the jump or branch is always executed while the target instruction is being fetched from storage. Jumps always occur to a paged absolute address formulated by combining a 26-bit target with four bits of the program counter (J-type format for subroutine calls) or 32-bit register address (R-type for returns and dispatches). Branches have 16-bit offsets relative to the program counter (I-type). Jump and link instructions save the return address in register 31.

- Special instructions perform a variety of tasks including movement of data between special and general purpose registers as well as the handling of traps and breakpoints. They are always R-type.

- To assist the user in program debug and reliability, the processor traps on the coprocessor and TLB instructions whose functions are not implemented in the COBRA processor.

April 30, 1990: Rev. 1.6

*Preliminary*

COBRA
MIPS High Performance
Embedded Processor

ADVANCE INFORMATION

Table 1. Instruction Summary

| OP | Description |
|---|---|
| | Load/Store Instructions |
| LB | Load Byte |
| LBU | Load Byte Unsigned |
| LH | Load Halfword |
| LHU | Load Halfword Unsigned |
| LW | Load Word |
| LWL | Load Word Left |
| LWR | Load Word Right |
| SB | Store Byte |
| SH | Store Halfword |
| SW | Store Word |
| SWL | Store Word Left |
| SWR | Store Word Right |
| | Arithmetic Instructions (ALU Immediate) |
| ADDI | Add Immediate |
| ADDIU | Add Immediate Unsigned |
| SLTI | Set on Less than Immediate |
| SLTIU | Set on Less than Immediate Unsigned |
| ANDI | AND Immediate |
| ORI | OR Immediate |
| XORI | Exclusive OR Immediate |
| LUI | Load Upper Immediate |
| | Arithmetic Instructions (3-operand, register-type) |
| ADD | Add |
| ADDU | Add Unsigned |
| SUB | Subtract |
| SUBU | Subtract Unsigned |
| SLT | Set on Less than |
| SLTU | Set on Less than Unsigned |
| AND | AND |
| OR | OR |
| XOR | Exclusive OR |
| NOR | NOR |
| | Shift Instructions |
| SLL | Shift Left Logical |
| SRL | Shift Right Logical |
| SRA | Shift Right Arithmetic |
| SLLV | Shift Left Logical Variable |
| SRLV | Shift Right Logical Variable |
| SRAV | Shift Right Arithmetic Variable |

| OP | Description |
|---|---|
| | Multiply/Divide Instructions |
| MULT | Multiply |
| MULTU | Multiply Unsigned |
| DIV | Divide |
| DIVU | Divide Unsigned |
| MFHI | Move From HI |
| MTHI | Move to HI |
| MFLO | Move From LO |
| MTLO | Move to LO |
| | Jump and Branch Instructions |
| J | Jump |
| JAL | Jump and Link |
| JR | Jump to Register |
| JALR | Jump and Link Register |
| BEQ | Branch on Equal |
| BNE | Branch on Not Equal |
| BLEZ | Branch on Less than or Equal to Zero |
| BGTZ | Branch on Greater than Zero |
| BLTZ | Branch on Less than Zero |
| BGEZ | Branch on Greater than or Equal to Zero |
| BLTZAL | Branch on Less than Zero and Link |
| BGEZAL | Branch on Greater than or Equal to Zero and Link |
| | Special Instructions |
| SYSCALL | System Call |
| BREAK | Break |
| RFE | Return From Exception |
| | System Control Coprocessor (CP0) Instructions |
| MTC0 | Move to CP0 |
| MFC0 | Move from CP0 |

April 30, 1990: Rev. 1.6  *Preliminary*

COBRA
MIPS High Performance
Embedded Processor

ADVANCE INFORMATION

| Instruction Format | Instruction formats are shown in Figure 5. |
|---|---|
| | Where: OP — a 6-bit operation code |
| | Rs — a 5-bit source register specifier |
| | Rt — a 5-bit target register or branch condition |
| | Immediate — a 16-bit immediate branch or address displacement |
| | Target — a 26-bit jump target address |
| | Rd — a 5-bit destination register specifier |
| | shamt — a 5-bit shift amount |
| | funct — a 6-bit function field |

I-Type (Immediate)

| OP | Rs | Rt | Immediate |
|---|---|---|---|
| 31   26 | 25   21 | 20   16 | 15                    0 |

J-Type (Jump)

| OP | Target |
|---|---|
| 31   26 | 25                                    0 |

R-Type (Register)

| OP | Rs | Rt | Rd | shamt | funct |
|---|---|---|---|---|---|
| 31  26 | 25  21 | 20  16 | 15  11 | 10  6 | 5   0 |

Figure 5 COBRA Instruction Formats

| Pipeline Architecture | The execution of a single COBRA instruction consists of five primary steps as shown in Figure 6. |
|---|---|
| IF | Instruction fetch. Access an instruction from the I-cache. Note that the instruction is not actually read into the processor until the beginning (phase 1) of the RD stage. |
| RD | Read any required operands from the CPU registers (RF = register fetch) while decoding the instruction. |
| ALU | Perform the required operation on the operands. |
| MEM | Access memory (D-cache) if required for a load or store operation. |
| WB | Write ALU results back to the register file. |

| IF | RD | | ALU | MEM | WB |
|---|---|---|---|---|---|
| I-Cache | RF | | OP | D-Cache | WB |

Figure 6. COBRA Instruction Execution Sequence

April 30, 1990: Rev. 1.6

*Preliminary*

LSI LOGIC PRIVATE

COBRA
MIPS High Performance
Embedded Processor

ADVANCE INFORMATION

Pipeline Architecture

Each of the five steps requires an average of one CPU cycle. COBRA uses a five stage pipeline (identical to the LR3000) to approach an instruction execution rate of one instruction per CPU cycle (when operating from the internal cache). The pipeline operates efficiently because different CPU resources (address and data bus accesses, ALU operations, register accesses, etc.) are utilized on a non-interfering basis. Figure 7 illustrates this concurrency.

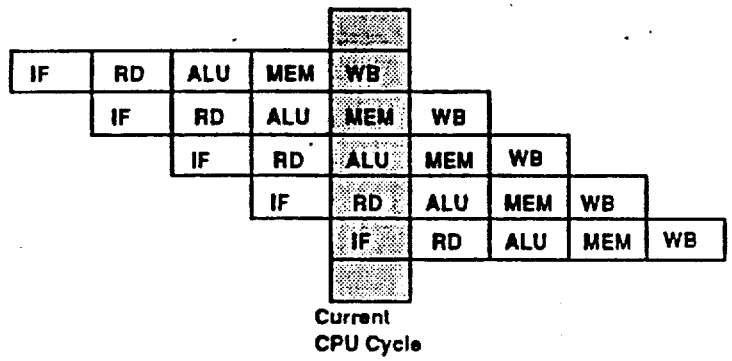

Current
CPU Cycle

Figure 7

Exception Coprocessor

The exception coprocessor (CP0) contains the exception handling functions for COBRA. The CP0 registers shown in figure 8 are used to configure the exception handling capabilities.

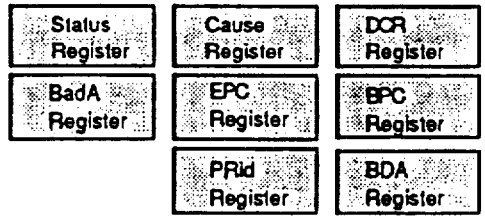

Figure 8. CP0 Registers

| Register | Number | Description |
|---|---|---|
| Status | 12 | Mode, interrupt enables, and diagnostic status information |
| Cause | 13 | Indicates the nature of the last exception |
| EPC | 14 | Exception program counter |
| BadA | 8 | Most recent bad address |
| PRid | 15 | Processor revision identification |
| BPC | 3 | Breakpoint on Program Counter (contains address of instruction flow breakpoint) |
| BDA | 5 | Breakpoint on Data Address (contains address of data flow breakpoint) |
| DCR | 7 | Debug, status, and cache control register |

April 30, 1990: Rev. 1.6

*Preliminary*

COBRA
MIPS High Performance
Embedded Processor

ADVANCE INFORMATION

---

LR2000/LR3000
Compatibility    The COBRA processor provides instruction set compatibility with the LR2000 and LR3000. Therefore, software developed for LR2000 and LR3000 based systems can be directly ported to COBRA, significantly reducing software development time and resources. Since the coprocessor interface and the memory management unit are not implemented on COBRA, the following instructions will produce results which may differ from the LR3000.

| | |
|---|---|
| LWCz | Load Word to Coprocessor |
| SWCz | Store Word from Coprocessor |
| CTCz | Move Control to Coprocessor |
| CFCz | Move Control from Coprocessor |
| COPz | Coprocessor Operation |
| BCzT | Branch on Coprocessor z True |
| BCzF | Branch on Coprocessor z False |
| MTCz | Move to Coprocessor z |
| MFCz | Move from Coprocessor z |
| TLBR | Read Indexed TLB Entry |
| TLBWI | Write Indexed TLB Entry |
| TLBWR | Write Random TLB Entry |
| TLBP | Probe TLB for Matching Entry |

For Coprocessor 0 (CP0):
- If coprocessor usability bit 0 (CU0) = 1 or processor in kernel mode: RFE, MTC0, and MTF0 may be used. If CU0 = 0, execution of these instructions will cause a reserved instruction (RI) exception.
- CFC0, CTC0, BCF0, and BCT0 cannot be used and will cause an RI exception
- LWC0, SWC0, TLBP, TLBR, TLBWI, and TLBWR cannot be used and will cause an RI exception.

- Because of the exclusion of the MMU function in CP0 for COBRA, the following registers are not implemented: EntryHi, EntryLo, Index, Random, and Context. References to these registers will cause a trap, as well as references to the undefined registers (6, 9, 11, 16-31).
- To enhance the debugging and trace capabilities, the following registers have been added to CP0 in the COBRA processor: DCR, BPC, and BDA registers.

For other coprocessors (CP1, CP2, and CP3)
- LWCz, SWCz, CTCz, CFCz, BCzT, BCzF, COPz, MFCz, and MTCz cannot be used. The user should set coprocessor usability bit (CU) to zero for CP1, CP2, and CP3. Otherwise, execution of these instructions will cause an undefined result.

To further enhance program debugging and instruction tracing, the COBRA processor has two additional Breakpoint registers embedded in the design. These registers reside in the set of CP0 registers. The breakpoint register will cause the processor to break on an instruction address or a data address. The instruction trace capability, facilitates capturing of the last non-sequential instruction which the processor executed. Both the breakpoint and the trace capabilities are controlled by the appropriate bits in the debug and cache status register (DCR)

April 30, 1990:  Rev. 1.6                                                                 *Preliminary*

LSI LOGIC PRIVATE

COBRA
MIPS High Performance
Embedded Processor

ADVANCE INFORMATION

---

| | |
|---|---|
| Cache Memory System | COBRA contains an on-chip 8 kbyte instruction cache and a 1 kbyte data cache which provide single cycle access for instruction and data fetches. Integrating the caches in conjunction with the CPU core substantially reduces the system cost over an external cache system. Both caches are direct mapped, and the data cache is write through.<br><br>The caches may be filled with single word memory references, or can be filled in blocks, with the refill block size programmable independently for the instruction and data caches. Refill block sizes can be set to 2, 4, 8, or 16 words per block.<br><br>Cache entries can be invalidated under software control by setting bits in the DCR Register (CP0 register), in conjunction with Store Instructions. |
| Write Buffer | Embedded within the bus interface logic on COBRA is a one deep write buffer. The function of this logic is to offload the write to memory process from the CPU. The processor continues operating while the write buffer stores the entry in external memory. If the write buffer is full and the CPU executes a write to external memory, the processor will stall until the buffer is free. Also, if an entry is located in the cache, the processor will update the cache as well as updating main memory. |
| Timers/ Counters | COBRA contains three on chip timer/counter circuits which are available for use as system resources.<br><br>Timer1 and Timer2 are general purpose, setable, 24-bit down counters which reload the initial count when a count of 0 is reached. Each of the counters operates at the system clock rate. Timer1 and Timer2 can be programmed to interrupt the processor when a 0 count is reached. Timer2 also provides a terminal count output pin and has a count enable input which can be used for counting external events.<br><br>The third timer, RCount, is a 12-bit counter which is functionally equivalent to the other counters but is primarily intended to serve as a DRAM refresh counter. When the on chip DRAM controller is enabled, the RCount timer provides a signal to the DRAM controller so it can begin a refresh operation when the counter reaches zero. When the DRAM controller is disabled, RCount provides a terminal count output which is asserted when a counter value of 0 is reached and deasserted under control of an acknowledge input pin.<br><br>The counters are accessed and controlled via dedicated memory mapped addresses as follows:<br><br>    0xFFFE0000    Timer1    read/write<br>    0xFFFE0004    Timer1    control<br>    0xFFFE0008    Timer2    read/write<br>    0xFFFE000C    Timer2    control<br>    0xFFFE0010    RCount    read/write |

April 30, 1990: Rev. 1.6

*Preliminary*

LSI LOGIC PRIVATE

COBRA
MIPS High Performance
Embedded Processor

ADVANCE INFORMATION

---

Bus Interface  The COBRA's bus interface provides the means to interface simply to many types of devices on a single bus. COBRA simultaneously supports 8 and 32 bit wide boot PROMs, DRAMs, and "synchronous" devices (ie. SRAMs, UARTs, DMA controllers, etc.) as described below.

---

Boot PROM  The PROM interface enables COBRA to execute code from both 8-bit and 32-bit devices with no external glue logic. This interface allows the processor to execute from this memory region by gathering 4 bytes from the boot device when the BYTEWIDE* pin is enabled. The access time used for each byte or word will be programmable, from 0 to 15 wait states, through the on-chip wait state generator (WSG). This allows the user the flexibility of choosing from a wide variety of devices with different access times. Furthermore, the user can override the internal wait state generator by setting a bit in the configuration register and using the external DRDY. The PROM space is a fixed 16 Mbytes mapped at 0x1F00.0000 to 0x1FFF.FFFF. When the BEV bit is set in the CPU, this memory region includes the Reset Exception vector and the other exception vectors. When the CPU accesses memory in this region, the WSG generates an active EPSEL output to an external pin, and on the last wait state, generates the DRDY internally to the processor. An external pin provides the choice between 8-bit or 32-bit width for this address space.

---

I/O Space  The I/O interface enables COBRA to interface directly to 8-bit and 32-bit devices. COBRA can perform reads and writes to this memory region. During a read operation, this interface performs byte gathering when the BYTEWIDE* signal is active; otherwise, it performs normal 32-bit accesses. The access time used for each byte or word will be programmable, from 0 to 15 wait states, through the on-chip wait state generator (WSG). This allows the user the flexibility of choosing from a wide variety of devices with different access times. Furthermore, the user can override the internal wait state generator by setting a bit in the configuration register and using the external DRDY signal. The I/O space is a fixed 16 Mbytes mapped at 0x1E00.0000 to 0x1EFF.FFFF. When the CPU accesses memory in this region, the WSG generates an active IOSEL output to an external pin, and on the last wait state, generates the DRDY internally to the processor.

---

DRAM Controller  COBRA contains a DRAM controller which provides the RAS, CAS, and OE signals for easy interfacing to page mode DRAMs. A fixed address space of 0 to 0x0FFF.FFFF provides 256 Mbytes of address space for a DRAM memory array. The controller generates RAS timing to accommodate RAS precharge times and CAS timing while also providing the appropriately timed data ready signal back to the processor. To handle DRAM refresh, the "CAS-before-RAS" mode of refresh is supported. To interface to a DRAM array, an address multiplexor and buffers for the control signals are required to drive the array. However, for a small memory array, the chip can directly drive 8 or 9 memory devices. The DRAM controller will also work with external DMA controllers which adhere to a synchronous bus protocol. With minimal external control logic, COBRA can support single cycle, block refill with interleaving. The DRAM controller can be disabled for those systems which do not require its use.

---

April 30, 1990: Rev. 1.6

*Preliminary*

COBRA
MIPS High Performance
Embedded Processor

ADVANCE INFORMATION

---

Configuration Register

The configuration register defines the various memory control options. It resides at address 0xFFFE.0020, and its contents are defined as follows:

DRAMEN    Bit 0. DRAM Controller enable bit. Set to 0 on a power-on reset but not affected on a warm reset. All operations of the DRAM controller, including refresh, are disabled when this bit is cleared.

CASLNTH    Bit 1. A bit which determines the active time for the CAS output pin. On read or write accesses, CAS always goes active two cycles after RAS. On refresh sequences, CAS goes active one cycle before RAS. This bit, when set, also extends the RAS active time by one cycle.
         0 = CAS active 1.5 cycles
         1 = CAS active 2.5 cycles

RASPCHG    Bit 2. This bit determines the minimum length of the RAS Precharge, or inactive time which is forced between DRAM references.
         0 = 2 cycles
         1 = 3 cycles

RFSHEN    Bit 3. When set, this bit enables the on-chip refresh generator.

BLKFDIS    Bit 4. When set, this bit disables DRAM block fetches, meaning all access cycles to DRAM are single word only.

RDYGEN    Bit 5. When set, this bit enables the on-chip data ready generation for DRAM accesses. When cleared, a DRAM access cycle is terminated by an off chip DRDY signal. This can be useful for when implementing an interleaved, single cycle access DRAM system.

DPEN    Bit 6. When set, this bit enables parity checking for the DRAMs. The DRAM controller will internally assert the PEN signal accordingly.

PWAIT(4)    Bits 11:8. This is a four bit field which defines the number of wait states to insert in the PROM address space (0x1FXX.XXXX). It is set to 15 (0xF) on a reset.

PDIS    Bit 12. When set, this bit disables the on chip DRDY generation for the PROM address space. Thus the PROMCS pin will go active when this address space is accessed, but it will not go inactive and the bus cycle will not terminate until an external generated DRDY signal is received.

IOWAIT(4)    Bits 16:13. This is a four bit field which defines the number of wait states to insert in the I/O address space which is 0x1EXX.XXXX.

IODIS    Bit 17. When set, this bit disables the on chip DRDY generation for the I/O address space. Thus the IOCS pin will go active when this address space is accessed, but it will not go inactive and the bus cycle will not terminate until an external generated DRDY signal is received.

---

April 30, 1990: Rev. 1.6          *Preliminary*

COBRA
MIPS High Performance
Embedded Processor

Configuration Register

DBLKSIZE(2) Bits 19:18. Data Cache Block size.

These bits are used to configure the block size used to fill the data cache. The block size (in words) is configured as shown below:

| DBLKSIZE[1] | DBLKSIZE[0] | Size of Block Fetched |
|---|---|---|
| 0 | 0 | 2 Words |
| 0 | 1 | 4 Words |
| 1 | 0 | 8 Words |
| 1 | 1 | 16 Words |

IBLKSIZE(2) Bits 21:20  Instruction Cache Block size

These bits are used to configure the block size used to fill the data cache. The block size (in words) is configured as shown below:

| IBLKSIZE[1] | IBLKSIZE[0] | Size of Block Fetched |
|---|---|---|
| 0 | 0 | 2 Words |
| 0 | 1 | 4 Words |
| 1 | 0 | 8 Words |
| 1 | 1 | 16 Words |

DCDISABLE Bit 22. Data Cache Disable. When set, this bit disables all data cache operations. All data requests will be treated as non-cacheable.

ICDISABLE Bit 23. Instruction Cache Disable. When set, this bit disables all instruction cache operations. All instruction requests will be treated as non-cacheable.

Package Information

COBRA will be available in two package types. The 25, 33, and 40 MHz versions will be available in a 155 pin CPGA. The 25 MHz version will also be available in a 160 pin PQFP.

April 30, 1990:  Rev. 1.6

*Preliminary*

COBRA
MIPS High Performance
Embedded Processor

| Operating Modes | COBRA has two operating modes: user mode and kernel mode. The processor normally operates in user mode until an exception is detected, forcing it into the kernel mode. It remains in kernel mode until the processor executes a restore from exception (RFE) instruction. The operating mode of COBRA determines the manner of the memory address mapping. Figure 9 shows the address space for the two operating modes. |

Modes

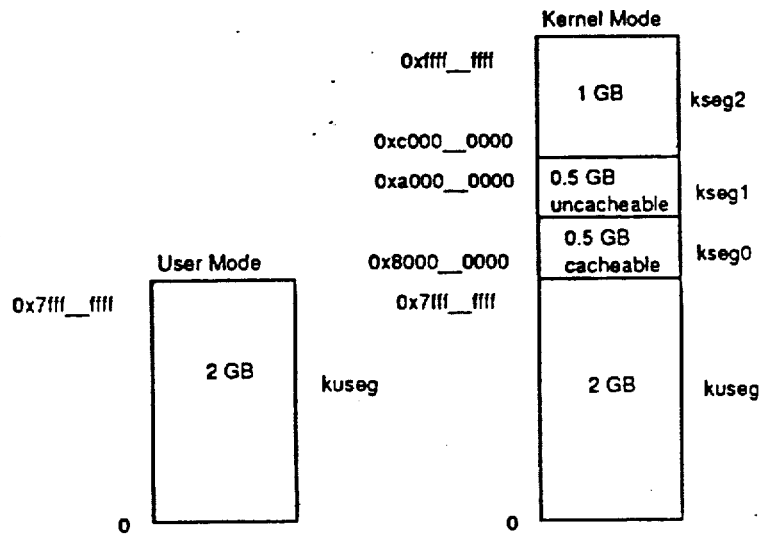

Figure 9.

| User Mode | In this mode, a single, uniform address space (kuseg) of 2 Gbytes is available. Use of the internal cache can be controlled via the CACHEDT* input pin. |
| Kernel Mode | Four separate segments are defined in this mode: | kuseg - when in kernel mode, references to this segment are treated like user mode references, streamlining kernel access to user data.

kseg0 - references to this 512 Mbyte segment may be cached. This segment is mapped to the lowest 0.5 Gbytes of physical memory (i.e. address bits 31, 30, and 29 = 0).

kseg1 - references to this 512 Mbyte segment will not be cached. They are hard mapped into the same 0.5 Gbyte segment of physical memory space as kseg0.

kseg2 - references to this 1 Gbyte segment are mapped to the upper 1 Gbyte of memory. By using the CACHEDT* pin, hardware can determine if the word the processor is reading will be cached.

COBRA
MIPS High Performance
Embedded Processor

LSI LOGIC PRIVATE

ADVANCE INFORMATION

LSI LOGIC

---

Pin Descriptions

Memory Interface Signal Description

ADDR[31:0] Address Bus. Bidirectional.
This 32-bit bus conveys address information to the memory and peripherals. It is an output when the processor is master of the bus and is an input when the bus is owned by another bus master. This allows the processor to perform bus snooping on the addresses. (See description of Bus Arbitration signals.)

DATA[31:0] Data Bus. Bidirectional.
This 32-bit bus conveys data to and from the memory and peripherals.

DATAP[3:0] Data Bus Parity. Bidirectional.
These four signals are used to generate and check byte-wise, even parity, over the DATA[31:0] signals. The data parity option can be enabled or disabled via the PEN* input signal.

PEN* Memory Parity Enable. Input.
When asserted (active low) during a read transaction, this signal instructs the processor to perform byte-wise, even parity checking on the DATA and DATAP buses. When negated, the processor will not perform parity checking of read transactions.

MXSTART* Memory Transaction Start. Output.
This signal, when asserted (active low), indicates the start of a memory transaction. This signal is asserted for one clock period at the beginning of each memory transaction. It is asserted one half cycle before the AS* signal.

AS* Address Strobe. Bidirectional.
When asserted (active low) this signal indicates the presence of a valid address on the address bus. This signal becomes an input when the processor is not the bus master (ie. BGNT asserted). In the input mode, COBRA can then perform cache snooping and invalidation operations.

RD* Read Strobe. Output.
When asserted (active low), this signal indicates that the memory may place data on the data bus. When negated (high), only COBRA may drive the data bus.

**WR*[3:0]** Byte Write Strobes. Outputs.
When asserted (active low), these byte marks indicate valid data on their respective byte of DATA[31:0]. Assertion of these signals depends upon the endian-ness configuration of the CPU.

---

April 30, 1990: Rev. 1.6

*Preliminary*

LSI LOGIC PRIVATE

**COBRA
MIPS High Performance
Embedded Processor**

ADVANCE INFORMATION

---

Pin Descriptions

Memory Interface Signal Description (cont)

W/R*  Write/Read. Bidirectional.
When high, this signal indicates that the memory transaction to be performed is a write to memory. When low, this signal indicates that the memory transaction to be performed is a read from memory. When in test-mode or when COBRA is not the owner of the bus, this signal becomes an input. When COBRA relinquishes the bus, this signal is used for the purpose of bus snooping. In test mode, this pin signals reads and writes to the internal cache.

DRDY*  Data Ready. Input.
When asserted (active low), this signal indicates that the memory will provide data or can accept data so that the memory transaction can terminate.

DMXSEL  Mux Select. Output.
This signal is used for row and column address multiplexing to the DRAM array. An external mux is required in order to properly drive the address lines of the DRAM array.

DRAS*  Row Address Strobe. Output.
When asserted (active low) during a DRAM memory transaction, this signal indicates that the address presented to the DRAM array is the row address.

DCAS*  Column Address Strobe. Output.
When asserted (active low) during a DRAM memory transaction, this signal indicates that the address presented to the DRAM array is the column address DOE*  DRAM Output Enable. Output
When asserted (active low), this signals sends an output enable indication to the DRAM array.

EPSEL*  External PROM Select. Output.
When asserted (active low), this signal indicates that COBRA is accessing the PROM address space and can be used as a chip select signal. COBRA will generate its own DRDY* signal a programmable number of wait states after the transaction begins. The external PROM logic may override the internal wait state generator and use the DRDY* signal to control the number of wait states.

IOSEL*  I/O Select. Output.
When asserted (active low), this signal indicates that COBRA is accessing the I/O address space 0x1EXX.XXXX and can be used as a chip select signal. COBRA will generate its own DRDY* signal a programmable number of wait states after the transaction begins. The external I/O logic may override the internal wait state generator and use the DRDY* signal to control the number of wait states.

April 30, 1990: Rev. 1.6                                                                                   *Preliminary*

LSI LOGIC PRIVATE

COBRA
MIPS High Performance
Embedded Processor

*ADVANCE INFORMATION*

---

Pin Descriptions

Memory Interface Signal Description (cont)

BERROR*  Bus Error. Input.
When asserted (active low) during a memory transaction, this signal indicates that an exceptional condition has occurred and that the on-going memory transaction is to terminate irrespective of the DRDY* signal.

CACHEDT* Cacheable Datum. Input.
When asserted (active low) during a memory read transaction, this signal indicates that the datum fetched may be cached. When negated, this signal indicates that the fetched datum may not be cached.

BYTEWIDE* Byte Wide Port. Input.
When asserted (active low), this signal indicates that the memory interface is 8 bits wide for the PROM address space, 0x1FXX.XXXX. Having detected this signal, the CPU will fetch four bytes from memory (ie 8 bit wide PROM), beginning at the byte address generated, until the complete addressed word has been collected.

BLKFREQ Block Fetch Request. Output.
When asserted (active high), this signal indicates that the processor wants to perform a block fetch transaction. This request will occur when a cache miss occurs and the block refill size is greater than one.

BLKFTCH* Block Fetch. Input.
When asserted (active low), in response to BFREQ, this signal tells the processor to expect a block of data from the memory. This input should remain asserted until the end of the block fetch transaction. When memory accesses are executed through the DRAM controller, the DRAM controller will automatically generate the signal internally to acknowledge the BFREQ from the processor.

April 30, 1990: Rev. 1.6

*Preliminary*

COBRA
MIPS High Performance
Embedded Processor

Pin Descriptions

Bus Arbitration Signals

BREQ* Bus Request. Input.
> External bus masters use this signal to request possession of the ADDR and DATA buses and relevant control signals. It is active low.

BGNT Bus Grant. output.
> This signal, when asserted (active high), indicates that the following signals are in the high Impedance state (Tri-state):
>
> | | |
> |---|---|
> | DATA[31:0] | DATAP[3:0] |
> | ADDR[31:0] | MXSTART |
> | AS* | W/R* |
> | RD* | MI/D* |
> | WR*[3:0] | BLKFREQ |
>
> With BGNT asserted, the requesting bus master gains control of the bus and can control the above signals. BGNT will only be asserted when there is no on-going bus transaction. If the BREQ* signal is asserted during an on-going bus transaction, the BGNT signal will not be asserted until the transaction has completed. Also, after the COBRA releases the bus, it goes into bus snooping mode to monitor the bus transactions to determine if cache entries must be invalidated.

DMARQST* DMA Request. Input
> When asserted (active low), this signal indicates a request for the DRAM bus and the DRAM controller. The requesting device must hold this signal active until the request is acknowledged.

DMAGNT DMA Grant. Output
> When asserted (active high), this signal acknowledges the DMARQST* and indicates that the DRAM controller has started the access for the requesting device. During this DRAM access, the DRAM controller controls the signals associated with the DRAM controller function. This bus request scheme differs from the BREQ/BGNT scheme in that the CPU continues to run and it continues to control the address and data buses. Note, a device using this method must drive the DRAM's address and data buses meaning the DRAM array will be set up in a multi-port configuration.

ISTEST Instruction Cache Test. Input.
> When asserted, this signal indicates the processor is in the test-mode for the Instruction cache. The ADDR[31:0], AS* and W/R* signals are made inputs.

DSTEST Data Cache Test. Input.
> When asserted, this signal indicates the processor is in the test-mode for the data cache. The ADDR[31:0], AS* and W/R* signals are made inputs.

April 30, 1990: Rev. 1.6 — *Preliminary*

COBRA
MIPS High Performance
Embedded Processor

Pin Descriptions

Peripheral Signals

RTMOUT*/REFRESH* Refresh Timer Time-out/Refresh. Output.
    When the internal DRAM controller is disabled, this signal indicates that the refresh timer has counted down from its preset value to zero. This signal will remain asserted (active low) until the RTACK signal is asserted. When the DRAM controller is enabled, this signal indicates that a refresh operation is in progress.

RTACK Refresh Timer Acknowledge. Input.
    When asserted (active high), this signal causes the negation of RTMOUT*. This signal must be asserted for at least two clock cycles to guarantee negation of RTMOUT*.

T2TMOUT Timer 2 Timeout. Output
    This signal when asserted (active high) indicates that timer 2 has counted down from its preset value to zero.

T2EN* Timer 2 enable. Input
    When asserted, (active low), this signal enables the operation of timer 2. This pin can be used to enable the counter to count events external to the processor.

Configuration Signals

ENDIAN Endian-ness Configuration. Input.
    This input when asserted (active low), indicates that the processor supports "little endian" byte addressing (ie DEC byte order) and when negated indicates that the processor supports "big endian" byte addressing (ie. IBM byte order)

Interrupt/Condition Signals

INT[5:0] Interrupts. Inputs.
    These six inputs are used to cause the processor to take an Interrupt exception. (Branch to general Exception vector) These pins are not encoded. The MIPS architecture specification has one level of orthogonal interrupts.

April 30, 1990: Rev. 1.6      *Preliminary*

LSI LOGIC PRIVATE

COBRA
MIPS High Performance
Embedded Processor

ADVANCE INFORMATION

---

Pin Descriptions

Status Signals

MI/D* Memory Transaction Type. Output.
When active high, this signal indicates that the bus transaction is an instruction fetch. When active low, this signal indicates that the bus transaction is a data read or write transaction.

STALL Stall. Output.
When asserted (active high), this signal indicates that the processor is in a stall state.

TDONE Test Mode Transaction Done. Output.
When asserted (active high), this signal indicates that a test mode read or write operation has completed. For test mode reads, this signal indicates the presence of data on the data bus.

BRTAKEN Branch Taken. Output.
When asserted (active high), this signal indicates that the CPU is taking a branch in the instruction execution. This signal is useful for tracing instruction flow.

Miscellaneous Signals

SYSCLK System Input Clock. Input.
This is the primary clock input to the processor. It determines the instruction cycle time of the processor.

RESET* Reset. Input.
This input signal (active low) is used to reset the state of the processor. Reset behavior is compatible with the LR3000 architecture specification.

HIGHZ* High Impedance State. Input.
This signal, when asserted (active low) puts all processor outputs in an high impedance state (three-state). This signal must be applied low during the power-on reset (cold reset). If HIGHZ* is high while RESET* is low, then a warm reset will occur. The warm reset has the same effect on COBRA as a reset, except that the DRAM Controller is not affected on a warm reset.

FRCMISS* Force Cache Miss. Input.
When asserted (active low), this signal forces an instruction cache miss. This signal is intended for testing and in circuit emulation purposes.

---

April 30, 1990: Rev. 1.6

*Preliminary*

Preliminary

Appendix 5

Cobra Microprocessor Memory Interface

Version 1.2
06/20/90

This application note describes the Cobra memory interface features and protocols, and provides example diagrams for connecting to SRAM, DRAM, PROM, and peripherals.

The memory interface bus includes 32 bits of data, 4 bits of optional byte parity, 32 bits of address, and a set of control signals. These were defined to make it easy to interface various devices of any speed, with flexible control over several options, and with the express purpose of minimizing off-chip glue logic.

Outline:

1.0) Basic Memory sequences and protocols.
2.0) DRAM Controller sequences and interface protocol.
3.0) Programmable Wait State Generators.
4.0) 8-bit Read Interface.
5.0) Example SRAM Interfaces.
6.0) Example DRAM Interfaces.
7.0) Example EPROM Interfaces.

LSI Logic Corp.

Confidential

Preliminary                                                                                          Cobra Memory Interface

1.0 External Memory Basic Protocols.

There are three native memory transaction protocols, namely, the READ transaction, the WRITE transaction and the BLOCK FETCH transaction.

The part of the Cobra chip responsible for handling these transactions is the Bus Interface Unit, or BIU. This term(BIU) will be used in the rest of the document.

The diagrams show the protocol relationship of the signals, and illustrate which clock edge they will be asserted or sampled on, but are not intended to show exact timing. Propagation delays and input setup times will be specified in the datasheet.

For definition purposes, a clock cycle is divided into 2 phases: phase1 is when the clock is high, and phase2 is when the clock is low. Each phase is a distinct state as described below, although when a wait state is inserted, it is always 1 full clock cycle, or 2 phases.

1.1 READ Transaction.

Figure 2 shows the READ transaction wherein data is transferred from the external system into the Cobra processor. The READ transaction is composed of four distinct "states" (S1,S2,S3,S4) which are described below.
MDRDYN, MPEN, BERRORN, MCACHEN, MBLKFTCHN, MDATA[31:0],
    and MDATAP[3:0] are inputs in the READ transaction.

| STATE: | ACTION: |
|---|---|
| S1 | MADDR[31:0] issued. MXSTARTN asserted low indicating the beginning of a transaction. MWPRN is asserted low indicating that the transaction is a READ transaction. MBFREQN is asserted low (if appropriate) indicating whether or not a block fetch is being requested. MASN is inactive (logic 1) in this state. MRDN is inactive (logic 1) in this state. MWRN[3:0] signals are also inactive (logic 1) in this state. |
| S2 | MASN is asserted low indicating the presence of a valid address on the MADDR bus. MRDN is asserted low indicating that the external system may place data on the MDATA and MDATAP busses. MADDR, MXSTARTN, MWRN, MWPRN and MBFREQN maintain their levels from state S1. |
| S3 | In this state the MDRDYN, MPEN, BERRORN, MPEN,MCACHEN, and MBLKFTCHN inputs are sampled. All output signals except MXSTART keep their logic levels from state S2. MXSTART is asserted high.<br><br>If MDRDYN or BERRORN are sampled as logic 0 in S3 then the READ transaction progresses to state S4. If both MDRDYN and BERROR are sampled as logic 1 during state S3 then this state becomes a WAIT state. If a wait state is placed into the memory transaction, then all inputs sampled in state S3 will be sampled every clock cycle until MDRDYN or BERRORN is sampled low to make the memory transaction progress to state S4. |
| S4 | In this state, the data (MDATA[31:0]) and parity (MDATAP[3:0]) are sampled. Following this state, the MASN, MRDN, and MBFREQN control signals are asserted high. The MADDR, MXSTART, MWRN[3:0] and MWPRN signals maintain their logic levels from state S3. |

LSI Logic Corp.                                                                                                  Confidential

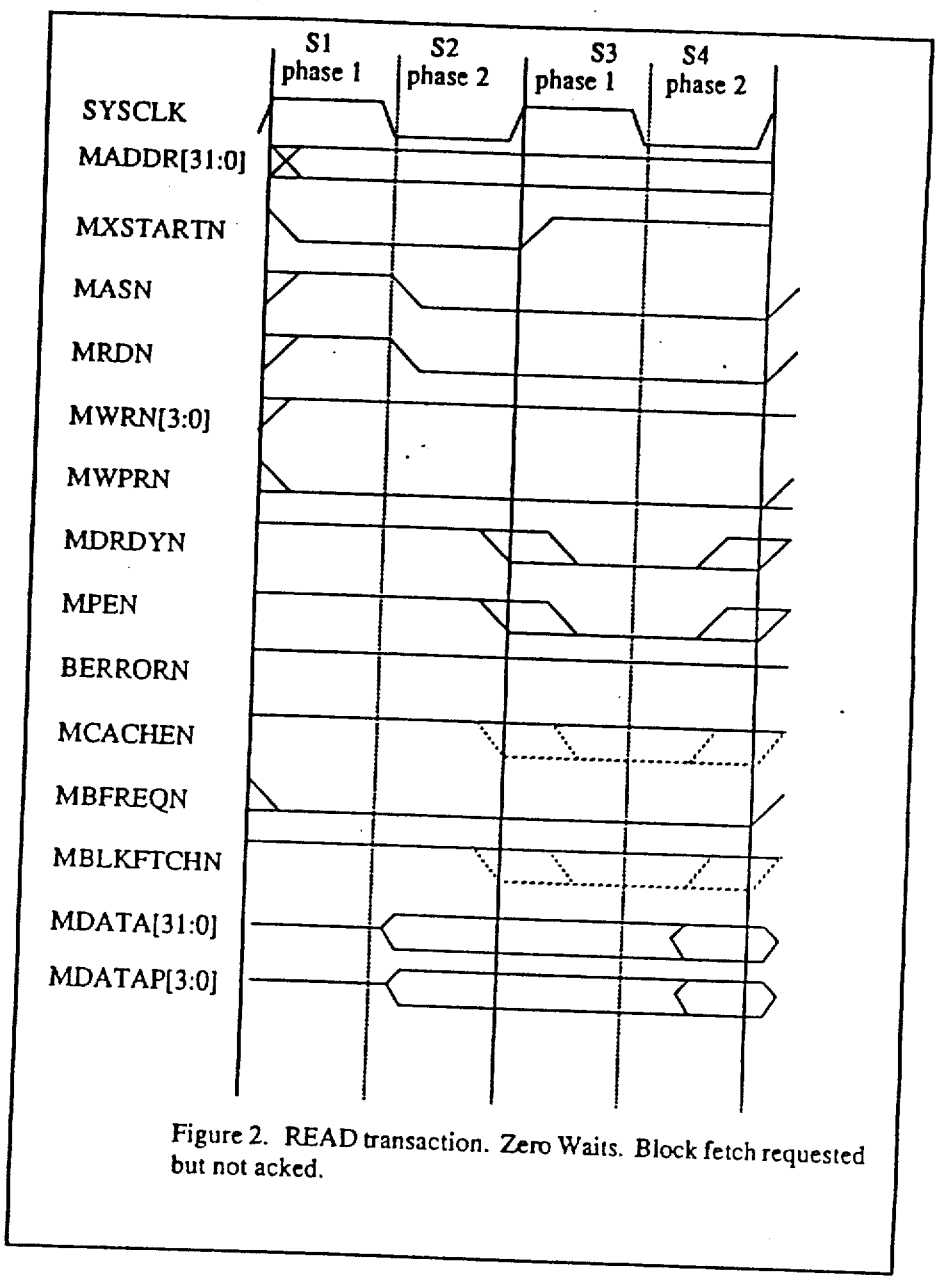
Figure 2. READ transaction. Zero Waits. Block fetch requested but not acked.

Preliminary

Cobra Microprocessor Memory Interface

Version 1.2
06/20/90

This application note describes the Cobra memory interface features and protocols, and provides example diagrams for connecting to SRAM, DRAM, PROM, and peripherals.

The memory interface bus includes 32 bits of data, 4 bits of optional byte parity, 32 bits of address, and a set of control signals. These were defined to make it easy to interface various devices of any speed, with flexible control over several options, and with the express purpose of minimizing off-chip glue logic.

Outline:

- 1.0) Basic Memory sequences and protocols.
- 2.0) DRAM Controller sequences and interface protocol.
- 3.0) Programmable Wait State Generators.
- 4.0) 8-bit Read Interface.
- 5.0) Example SRAM Interfaces.
- 6.0) Example DRAM Interfaces.
- 7.0) Example EPROM Interfaces.

LSI Logic Corp.                                                                                   Confidential Preliminary Cobra Memory Interface

1.0 External Memory Basic Protocols.

There are three native memory transaction protocols, namely, the READ transaction, the WRITE transaction and the BLOCK FETCH transaction.

The part of the Cobra chip responsible for handling these transactions is the Bus Interface Unit, or BIU. This term(BIU) will be used in the rest of the document.

The diagrams show the protocol relationship of the signals, and illustrate which clock edge they will be asserted or sampled on, but are not intended to show exact timing. Propagation delays and input setup times will be specified in the datasheet.

For definition purposes, a clock cycle is divided into 2 phases: phase1 is when the clock is high, and phase2 is when the clock is low. Each phase is a distinct state as described below, although when a wait state is inserted, it is always 1 full clock cycle, or 2 phases.

1.1 READ Transaction.

Figure 2 shows the READ transaction wherein data is transferred from the external system into the Cobra processor. The READ transaction is composed of four distinct "states" (S1,S2,S3,S4) which are described below.

MDRDYN, MPEN, BERRORN, MCACHEN, MBLKFTCHN, MDATA[31:0], and MDATAP[3:0] are inputs in the READ transaction.

| STATE: | ACTION: |
|---|---|
| S1 | MADDR[31:0] issued. MXSTARTN asserted low indicating the beginning of a transaction. MWPRN is asserted low indicating that the transaction is a READ transaction. MBFREQN is asserted low (if appropriate) indicating whether or not a block fetch is being requested. MASN is inactive (logic 1) in this state. MRDN is inactive (logic 1) in this state. MWRN[3:0] signals are also inactive (logic 1) in this state. |
| S2 | MASN is asserted low indicating the presence of a valid address on the MADDR bus. MRDN is asserted low indicating that the external system may place data on the MDATA and MDATAP busses. MADDR, MXSTARTN, MWRN, MWPRN and MBFREQN maintain their levels from state S1. |
| S3 | In this state the MDRDYN, MPEN, BERRORN, MPEN,MCACHEN, and MBLKFTCHN inputs are sampled. All output signals except MXSTART keep their logic levels from state S2. MXSTART is asserted high. |
| | If MDRDYN or BERRORN are sampled as logic 0 in S3 then the READ transaction progresses to state S4. If both MDRDYN and BERROR are sampled as logic 1 during state S3 then this state becomes a WAIT state. If a wait state is placed into the memory transaction, then all inputs sampled in state S3 will be sampled every clock cycle until MDRDYN or BERRORN is sampled low to make the memory transaction progress to state S4. |
| S4 | In this state, the data (MDATA[31:0]) and parity (MDATAP[3:0]) are sampled. Following this state, the MASN, MRDN, and MBFREQN control signals are asserted high. The MADDR, MXSTART, MWRN[3:0] and MWPRN signals maintain their logic levels from state S3. |

LSI Logic Corp.

Confidential

Figure 2a shows the read transaction with one wait cycle between states 2 and 3
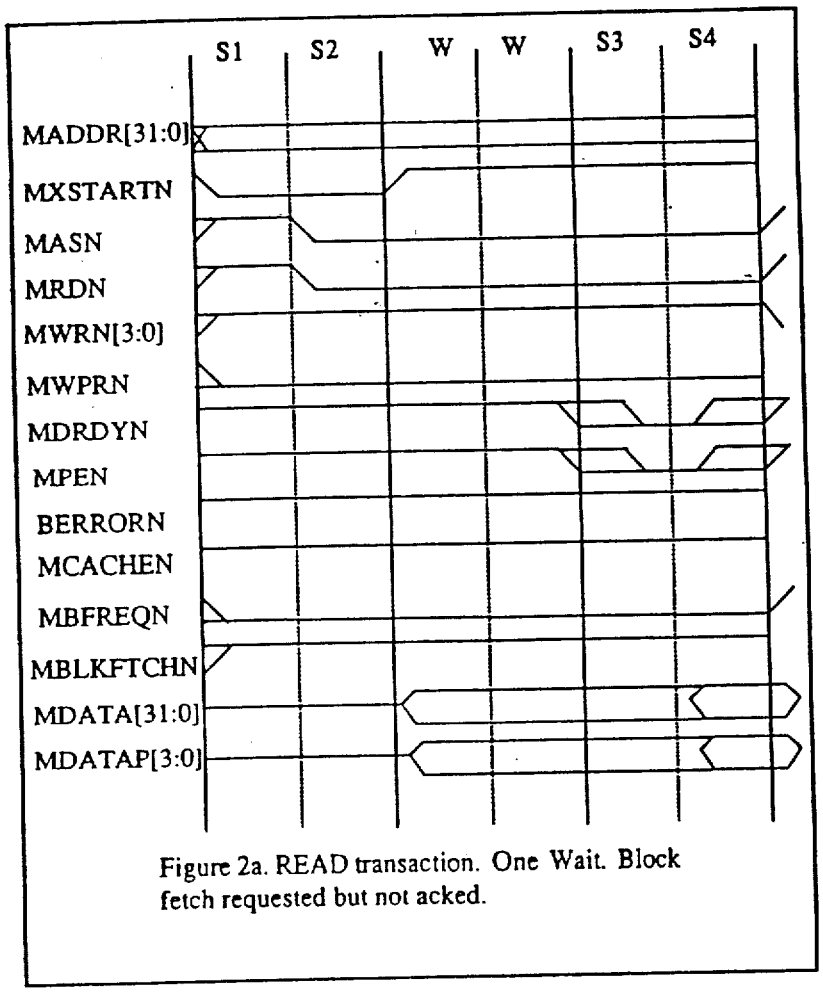
Figure 2a. READ transaction. One Wait. Block fetch requested but not acked.

Preliminary

Cobra Memory Interface

1.2 WRITE Transaction

Figure 3 shows the WRITE transaction wherein data is transferred to the external system from the Cobra processor. The WRITE transaction is composed of four distinct "states" (S1,S2,S3,S4) which are described below.
MDRDYN, BERRORN, are inputs in the WRITE transaction. MPEN, MCACHEN, and MBLKFTCHN are not relevant to WRITE transactions and are ignored for the duration of the WRITE transaction.

| STATE: | ACTION: |
|---|---|
| S1 | MADDR[31:0] issued. MXSTART is asserted low indicating the beginning of a transaction. MWPRN is asserted high indicating that the transaction is a WRITE transaction. MASN is inactive (logic 1) in this state. MRDN is inactive (logic 1) in this state. MWRN[3:0] signals are also inactive (logic 1) in this state. |
| S2 | MASN is asserted low indicating the presence of a valid address on the MADDR bus. MRDN keeps its logic level from state S1. MADDR, MXSTARTN, MWPRN and MBFREQN maintain their levels from state S1. |
| S3 | The data for the write is issued on the MDATA[31:0] bus and at the same time parity bits are generated for each byte on the MDATAP[3:0] bus. The MWRN[3:0] signals are asserted for each valid byte of data on the data bus (MDATA[31:0]). All remaining output signals except MXSTARTN keep their logic levels from state S2. MXSTARTN is asserted high. |
| | In this state the MDRDYN and BERRORN inputs are sampled. If MDRDYN or BERRORN are sampled as logic 0 in S3 then the WRITE transaction progresses to state S4. If both MDRDYN and BERROR are sampled as logic 1 during state S3 then this state becomes a WAIT state. If a wait state is placed into the memory transaction, then all inputs sampled in state S3 will be sampled every clock cycle until MDRDYN or BERRORN is activated to make the write transaction progress to state S4. |
| S4 | At the end of this state, the MASN, MWRN[3:0], and MBFREQN control signals are asserted high. MDATA[31:0] and MDATAP[3:0] are tristated. The MADDR,MXSTART, MRDN and MWPRN signals maintain their logic levels from state S3. |

LSI Logic Corp.

Confidential

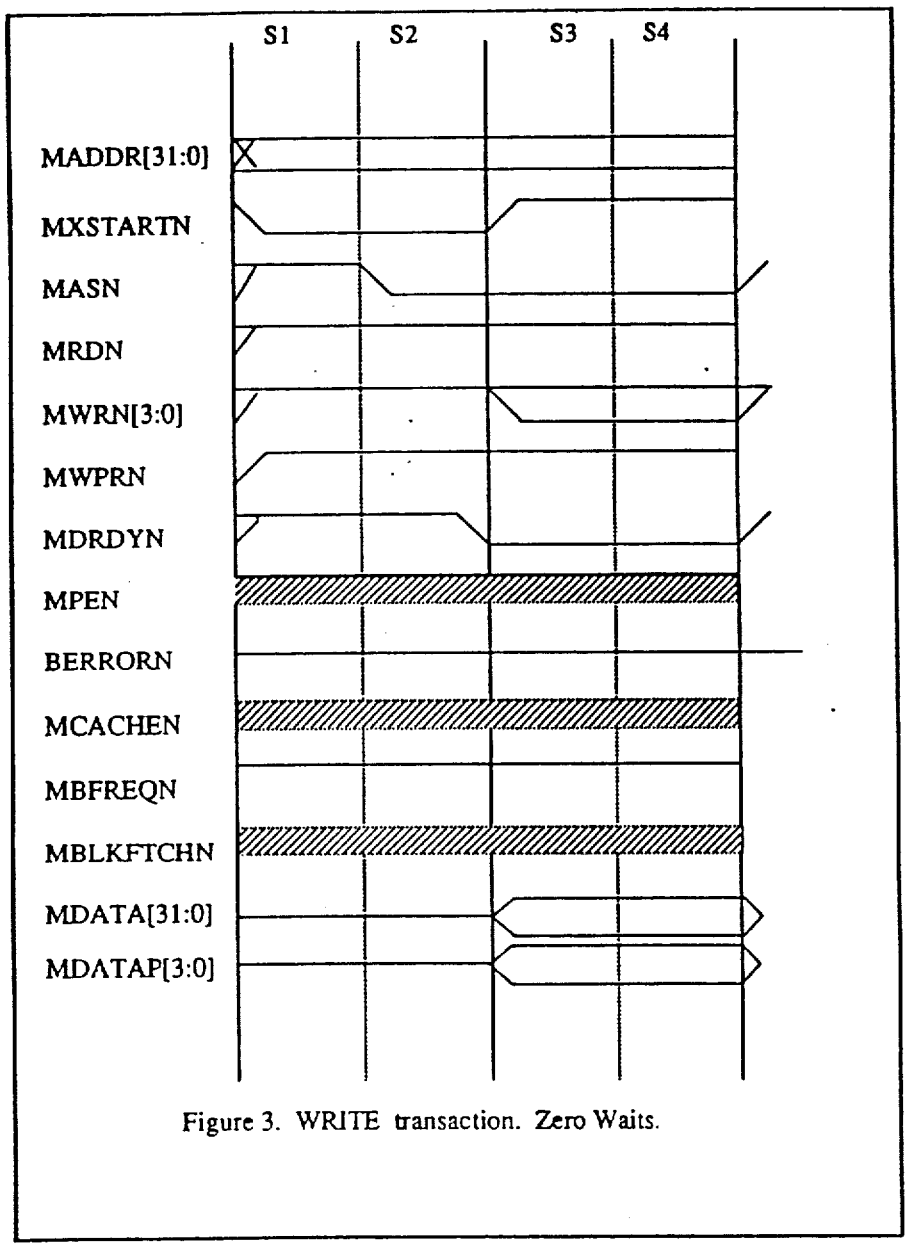
Figure 3. WRITE transaction. Zero Waits.

Figure 3a shows a write transaction with one wait cycle.
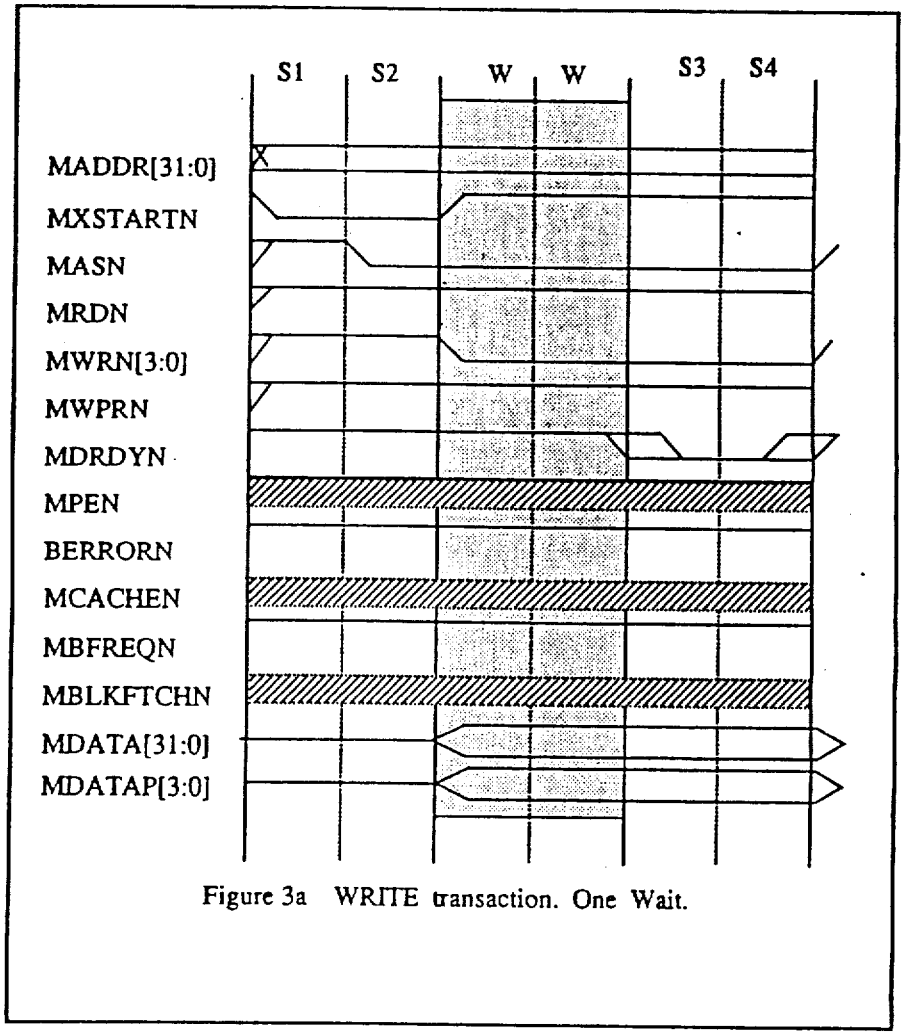
Figure 3a   WRITE transaction. One Wait.

Preliminary

Cobra Memory Interface

1.3 Block Fetch Transaction.

Figure 4 shows a block fetch transaction. In this block fetch, the first four states are the same as described for the READ transaction. In the block fetch case, however, the MBFREQN (block fetch request) is acknowledged by the assertion of the MBLKFTCHN input. Also, one wait state *must* be inserted before the first word in the block. If the MBLKFTCHN input is sampled active in S3, then the block address portion of MADDR(Bits 5:2 according to the block size) is set to 0 during state 4. The READ transaction is then followed by subsequent states described below.

| STATE | ACTION |
|---|---|
| B1 | In state B1, the MDRDYN input is sampled. The inputs MPEN and MCACHEN are ignored. All other outputs retain their logic levels from state S4 of the read transaction. MASN remains asserted for the duration of the block fetch. If MDRDYN is sampled inactive in this state then this state is a wait state. MADD |
| B2 | In this state, MDRDYN is asserted low indicating that the external system is allowed to put data on the MDATA bus. In this state MDATA and MDATAP are sampled. If MDRDYN was sampled low in B1 then the data on the MDATA bus will be accepted into the processor and put in the appropriate cache. Also the block address portion of MADDR will be incremented. If MDRDYN was not asserted in B1, then the data on MDATA is discarded, and MADDR does not change. States B1 and B2 are iterated until the entire block has been fetched. The size of the block is configured using the IBLKSIZE[1:0] and DBLKSIZE[1:0] bits in the memory configuration register. |

LSI Logic Corp.

Confidential

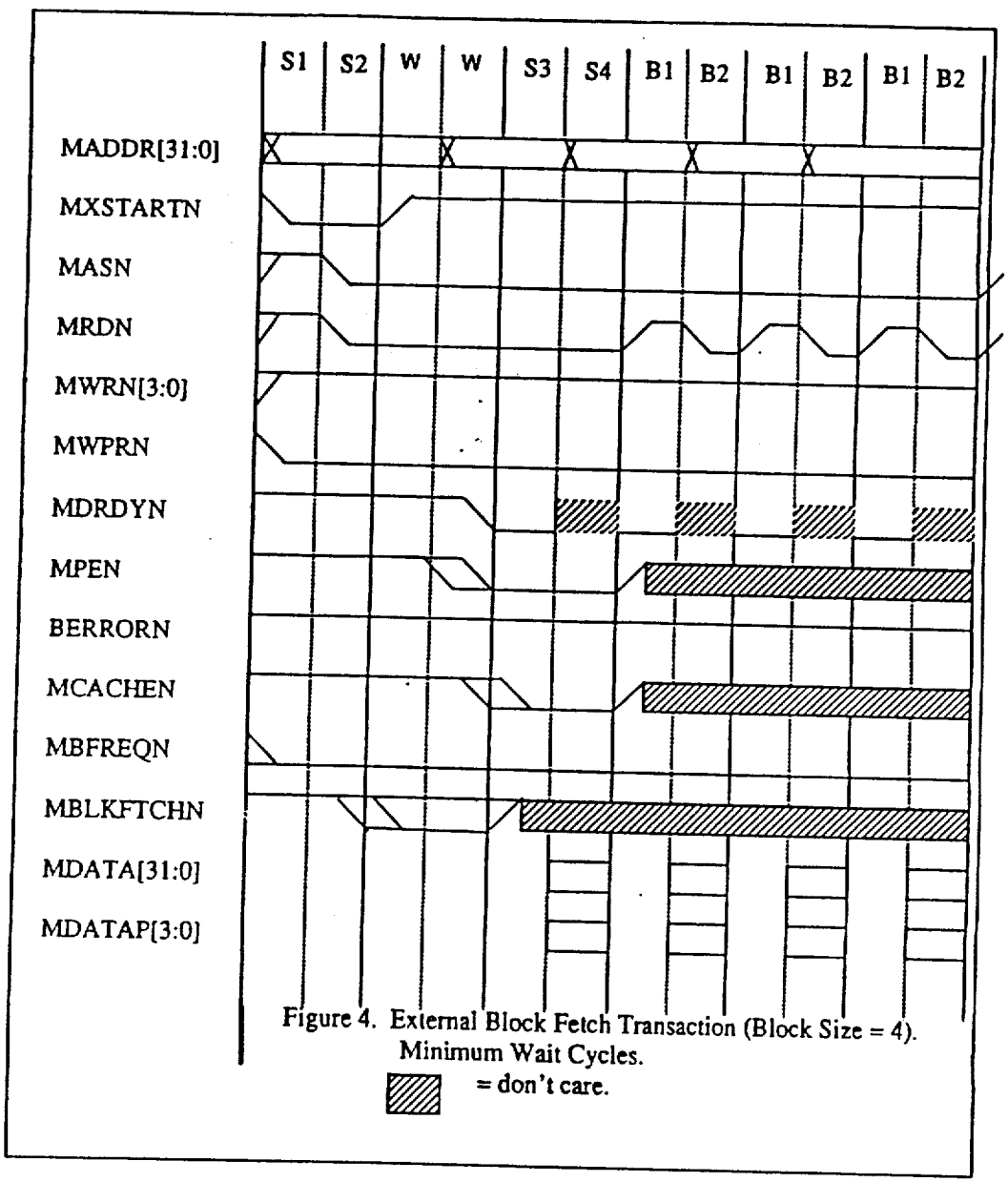
Figure 4. External Block Fetch Transaction (Block Size = 4). Minimum Wait Cycles.
▨ = don't care.

1.4 Bus Arbitration

Bus arbitration is the mechanism whereby an external device can obtain control of the external memory interface (bus). Figure 5 shows the bus arbitration sequence.

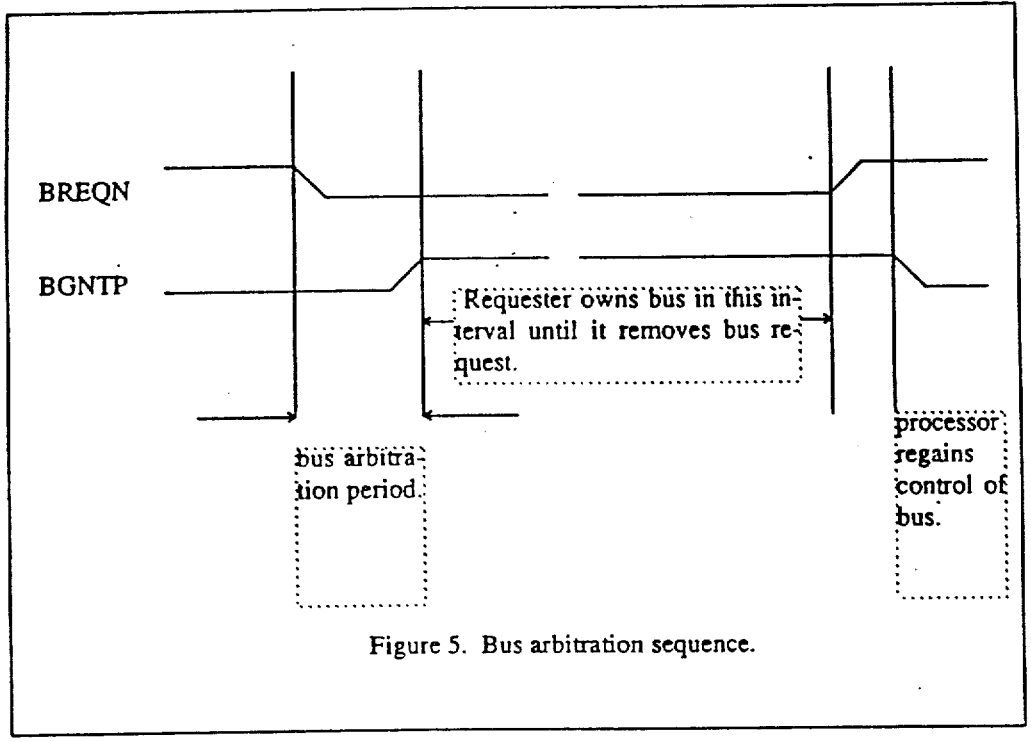

Figure 5. Bus arbitration sequence.

In this method of bus arbitration, the bus-requester asserts BREQN low and waits for the processor to grant the bus in return. The processor will wait for any on-going memory transaction to complete before granting the bus to the requester. This is shown in figure 5a.

The control outputs which are tristated are first asserted to a high state for 1 phase.(The phase after state B2 in the following diagram.) On chip pull-up resistors on all control lines are provided to keep lines which are not asserted externally from floating low. When the external bus master de-asserts BREQN, it is expected that it will also insure all control lines are first pulled high.

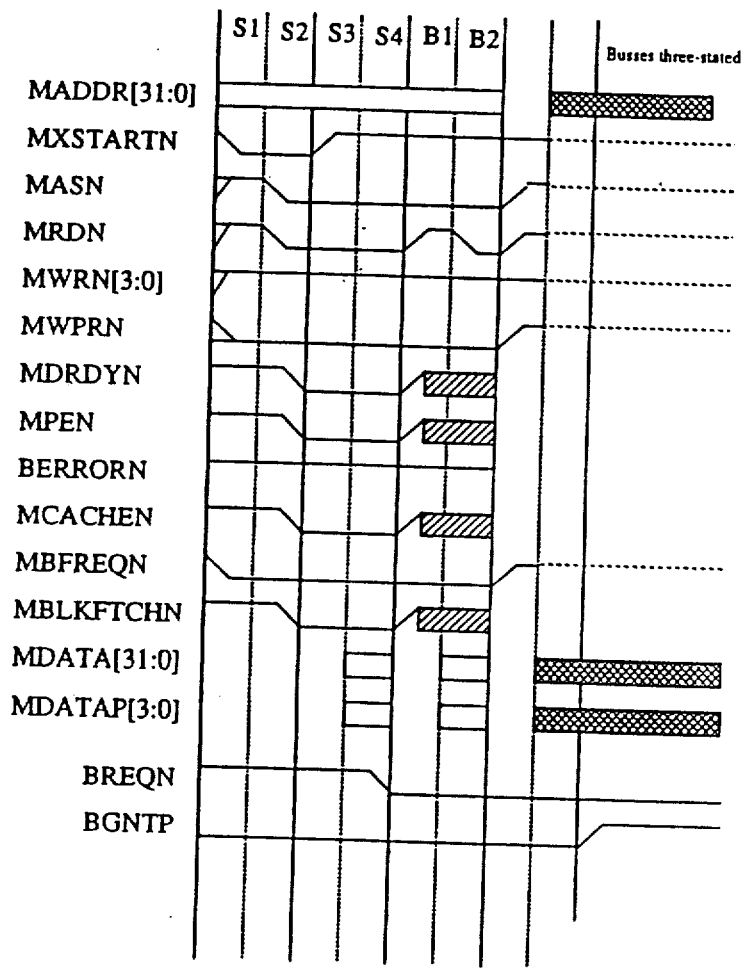
Figure 5a. Bus arbitration during a block fetch transaction. Transaction completes before bus is granted.
1.5 Bus Error

1.6 Bus Error

Figure 6 shows an external memory transaction which is terminated by the assertion of BERRORN in state S3 (WAIT cycle). Note that, in a transaction which is terminated by assertion of BERRORN, the control signals are de-asserted as if the MDRDYN signal was recognized. However, on a memory read transaction, any data on the MDATA bus is ignored and the CPU is signalled that an error has occurred. This will cause the CPU to execute a Bus Error Exception.

If a bus error is signalled during state B1 of a block fetch, the entire block fetch is prematurely terminated and the CPU is informed of this fact as described above.

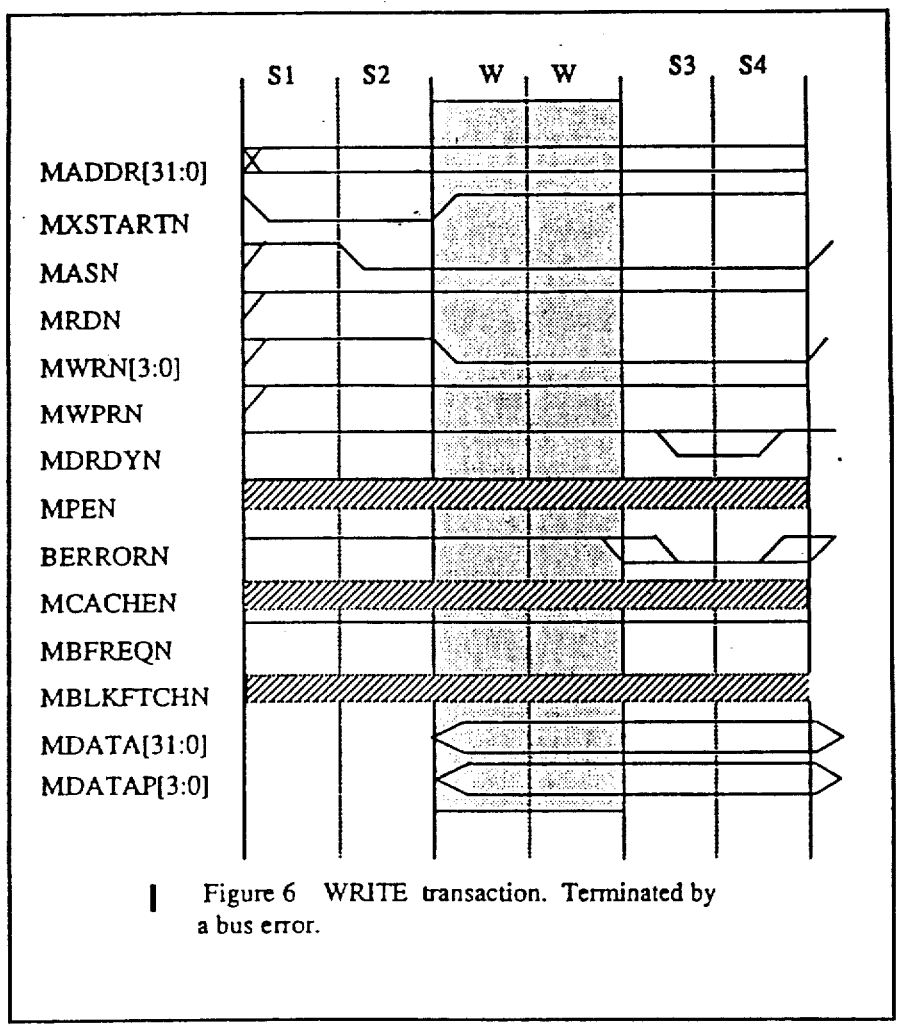

Figure 6  WRITE transaction. Terminated by a bus error.

1.7 Precedence of Memory Interface Inputs

The following inputs are all sampled in state S3 of a memory transaction:

MDRDYN
    BERRORN

MPEN
    MCACHEN
    MBLKFTCHN

The first two inputs have the ability to terminate a memory transaction irrespective of the second group of three. Assertion of the BERRORN signal will void the function of the MPEN, MCACHEN and MBLKFTCHN signals.

Of the transaction terminating inputs (MDRDYN, BERRORN) the assertion of any one during a memory transaction will terminate the transaction.

Preliminary

2.0 DRAM Controller

2.1 Features

1) Generates RAS and CAS, and is programmable to some extent for CAS and RAS active time, and RAS precharge time.

2) Handles DRAM refresh cycles, using the CAS before RAS mode available in most current DRAMS.

3) Provides the flexibility of easily working with different sized DRAM arrays through the use of off chip address multiplexers.

4) Can be used with external DMA controllers which can adhere to a specific, syncrononous bus protocol.

5) Built in hooks allow single cycle interleaving with minimal external control logic.

6) Has a fixed address space of 0 to 0x0FFF.FFFF, to simplify decoding. This provides a fixed space of 256Mbytes. Applications which need to detect unused addresses in this space can use the BUS ERROR bus input with an off chip address decoder.

7) Can be disabled for off chip DRAM controllers.

The DRAM controller can generate 2 types of DRAM sequences: A Read/Write Sequence, also refered to as an Access sequence, and a Refresh sequence. The Access sequence can be triggered by an Internal Cobra CPU request to the DRAM address space, By an external bus master request to DRAM space, or by the DMARQSTN Input pin, which uses the DMA controller but not the memory bus. The refresh sequence is triggered by the Refresh Timer timeout. Arbitration between CPU, external bus master, DMARQSTN, and Refresh is handled by Cobra.

2.1.1 Access Sequence

An access sequence is a sequence which generates the DRAM timing and bus control for a Read or Write bus cycle. The CPU or external bus master initiates a generic memory interface read or write cycle, and the DRAM controller adds control for the RAS,CAS, and MXSEL signals. An access sequence is triggered by one of 3 events:

1) The BIU has control of the generic bus(BGNT is inactive), Initiates a cycle with MXSTART, and the ADDR bus is less than 0x1000.0000.

2) The generic bus is controlled externally(BGNT is active due to BREQN active ), The ASN input is sampled low, and the ADDR bus is less than 0x1000.0000.

3) An External devices asserts DMARQSTN. When this input is sampled low by the DMA Controller, it signals that a device wishes to use the DRAM controller, but not the Cobra memory bus. Thus, if this sequence is initiated, it is assumed that the external device wants a DRAM access, and will externally multiplex the address and data to the DRAM. This allows full dual port DRAM access without tying up the Cobra memory bus. The signal DMACYCN will be asserted by the DRAM Controller when a DMA access cycle has been initiated.

An access sequence will be held in a wait state, and will not start until 1) an ongoing Refresh sequence is ended, and 2) The Precharge time from a previous sequence is satisfied.

LSI Logic Corp.   Confidential

Priority of access is as follows:
1) Refresh will always be first, and will be initiated the cycle after the Refresh timer expires, or immediately following the current Access cycle if one is in progress.
2) The external bus master device will be given the bus at the end of the current CPU bus cycle or Refresh sequence. Thus the BREQN input could lock the CPU off the bus for long periods, and the system must be designed accordingly. Even if the bus is granted for long periods, however, the Refresh will always occur at the end of the current Access sequence.
3) The CPU alternates priority with the DMARQSTN input.

Preliminary

Figure 2.0 shows a Cobra Initiated access cycle. The case of a CPU doing a noncacheable read is shown.

It is expected that this is the timing sequence that would be used for a single bank of Fast Page mode DRAMs. Preliminary timing shows a good fit at 32MHz with certain 80ns Fast Page DRAMs.(i.e. Toshiba 514256-80)

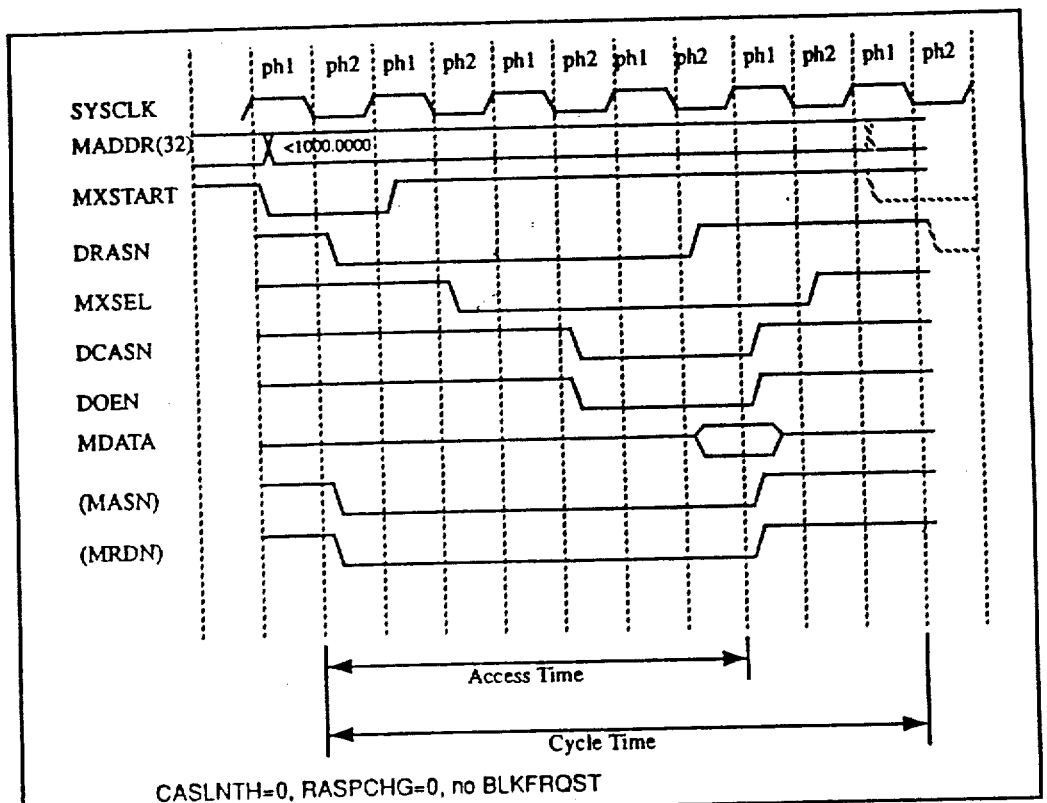

Figure 2.0 CPU Initiated DRAM single word read access cycle. '()' shows memory bus signals for reference.

LSI Logic Corp.

Confidential

Figure 2.1 shows the same sequence, only for a CPU write operation. The WRN signals are sent through external buffers straight to the DRAM chips. The DOEN signal remains inactive. Note that Cobra never does multiple word, or block, writes and BLKFREQ will always be inactive on write transactions.
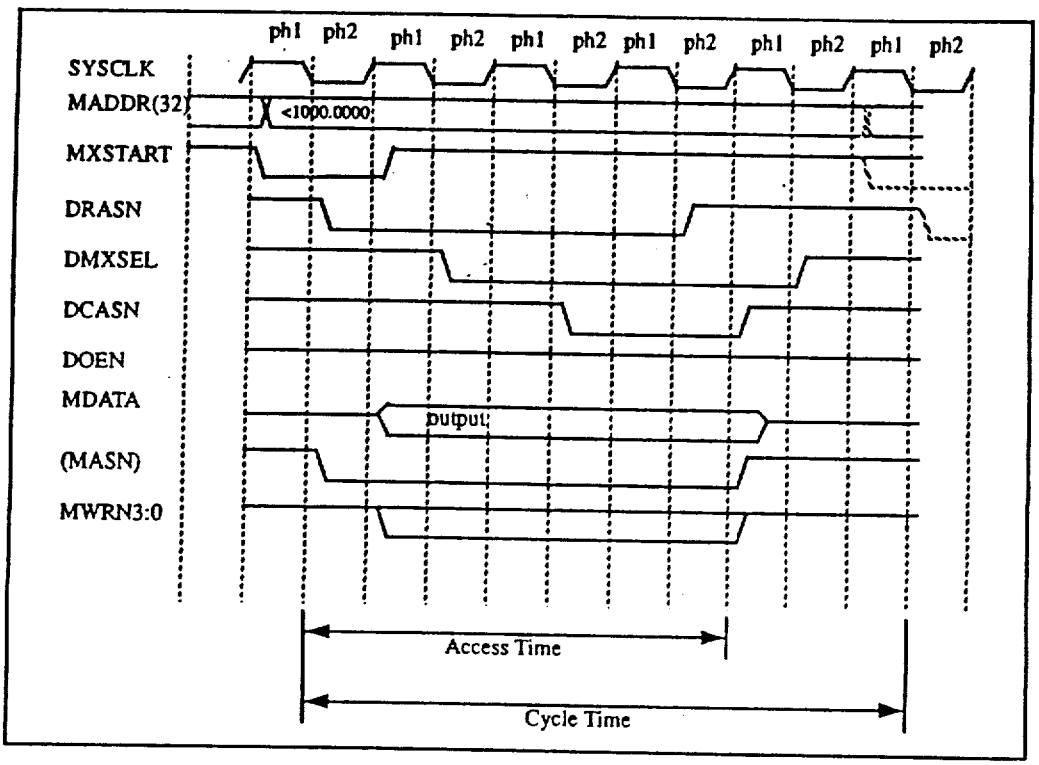
Figure 2.1 CPU Initiated Write cycle Figure 2.2 shows part of the sequence generated when CASLNTH=1, PCHGLNTH=1. Only the ending sequence is shown. The initial sequence, up to CAS active, is the same as the previous figures. Note that the RASN active length is 4 cycles(instead of 3 cycles) and the CASN active length is 2.5 cycles(instead of 1.5 cycles).
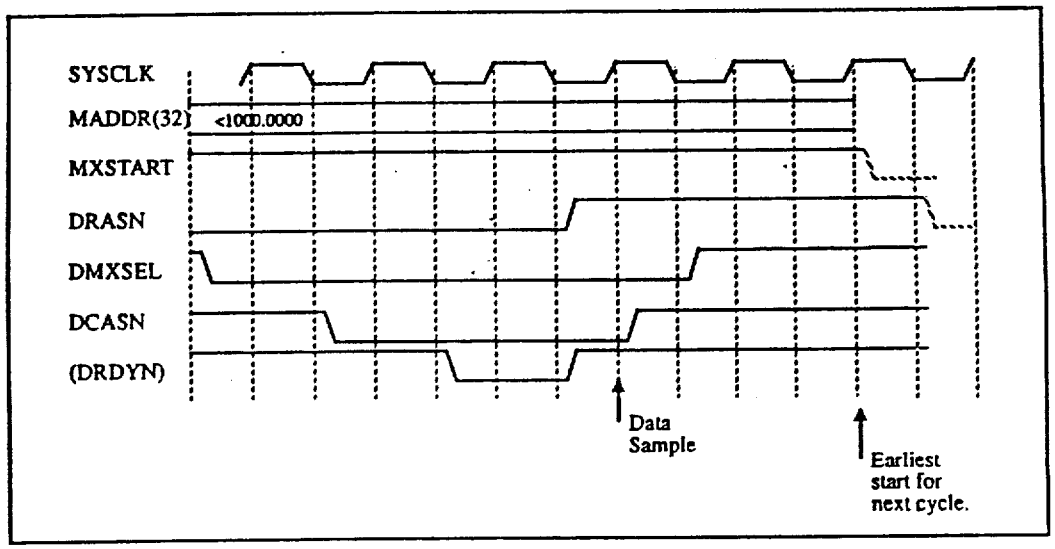
Figure 2.2 Ending sequence for CASLNTH=1 and RASPCHG=1, no BLKFRQST.

Figure 2.3 shows the ending sequence for a 2 word Block Read sequence. The starting sequence is the same as for the previous diagrams, except that a block fetch is signaled by assertion of the MBFREQN signal. The DRAM controller responds to MBFREQN by asserting DBLKFTCHN.(Internal signal is ORed with external input signal. Block fetching is initiated by the BIU for all cacheable instruction and data requests. If it is not desired for the DRAM controller to do block access sequences, it can be disabled by setting the BLKFDIS bit in the configuration register. This sequence uses the Fast Page mode capability of the DRAM. The CPU increments the block address at each sampling of RDYN low.

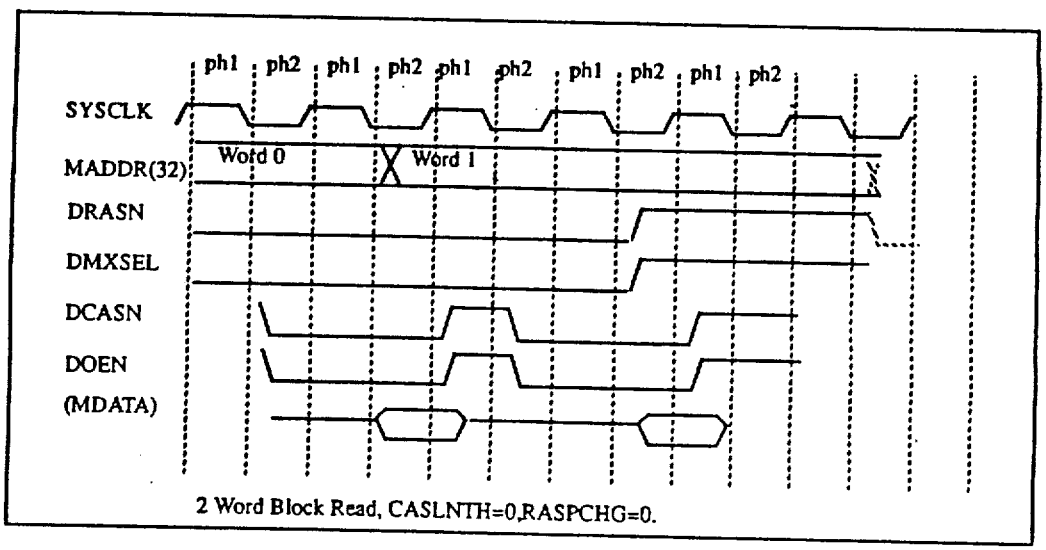

Figure 2.3 Ending Sequence for 2 word Block Read.

2.3.1 Refresh Sequence

A single Refresh sequence is generated as a result of each Refresh Timer timeout. To keep things simple, arbitration is simple: The refresh sequence will take place immediately upon receiving the timeout if no DRAM sequence is in progress. If a DRAM sequence is in progress, the Refresh sequence will occur immediately after the current access sequence and will take priority over a CPU or External Bus Master request.

It will be necessary for each system to load an appropriate value into the Refresh timer at system initialization, before the DRAM controller is enabled. The maximum amount of time the Refresh could be delayed must be accounted for in the timer cycle time. The Refresh cycle does not require the generic memory bus or any signal besides DRASN,DCASN, and DRFSHN, so access times to other devices do not need to be considered.

The Refresh Sequence requires that the DRAM chips being used support the CAS before RAS refresh option. Most currently available, fast DRAMs support this option.
Figure 2.4 shows the CAS Before RAS refresh cycle generated for CASLNTH=0 and RASPCHG=0. The state of MADDR,MDATA,MWRN, etc are don't care, and these signals are not shown. If CAS is presented before RAS as shown, the DRAM chips will use an internal address counter to do the refresh, and will stay off the data bus.

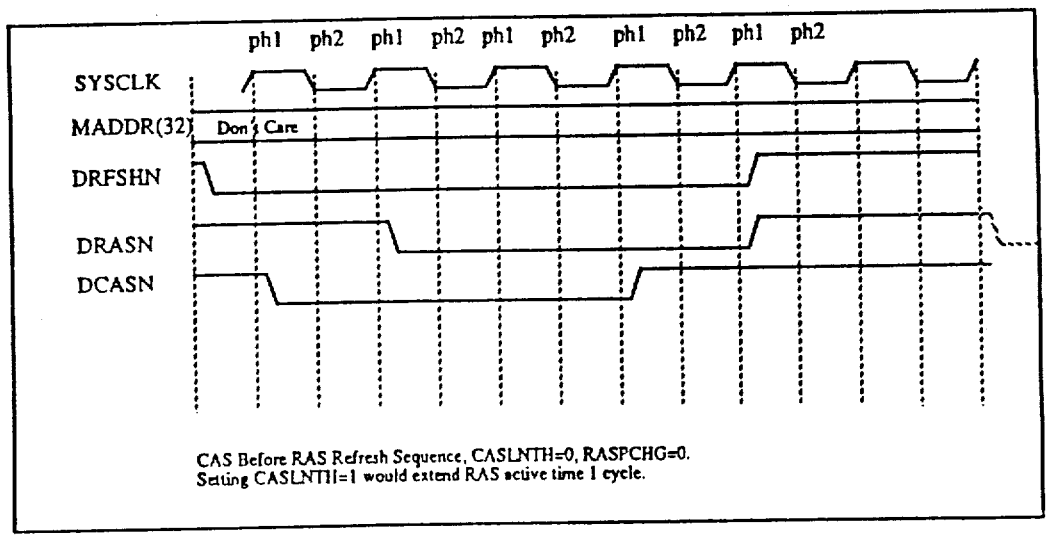

Figure 2.4 Refresh Sequence

3.0 Programmable Wait State Generators

Automatic Wait State Generation(AWG) has been provided to reduce the external logic needed to access many external devices. The AWG independently controls 2 fixed 16Mbyte address spaces, designated PROM and IO.
The AWG block contains a simple address decoder which decodes the address ranges 0x1FXX.XXXX(PROM) and 0x1EXX.XXXX(IO), where capital X is a don't care bit. When one of the address ranges is decoded and MXSTARTN is asserted, the appropriate chip select output(EPSELN or IOSELN) is asserted low. The value of the appropriate WAIT field in the configuration register is then used to count cycles(PWAIT or IOWAIT). If the WAIT value is 0, no wait states are inserted and the CS is de-asserted in the next cycle. The DRDYN signal is internally asserted when the internal wait state generator counts to zero, to signal a sequence termination to the BIU.

If an externally generated DRDYN signal is applied before the internal DRDYN, the external signal will terminate the cycle and cause the CS to be de-asserted. This feature allows the system designer to use the EPSELN or IOSELN signal along with some additional external address decoding to select devices with different access times in the same address range.

The PWAIT field in the configuration register is set to 15 on a reset. This allows the use of this feature at power-on boot time for fetching the exception vector and power-on boot program. The boot program may at any time change the PWAIT value to a smaller number to take advantage of a faster PROM chip.

In addition, if the EPSEL signal is asserted and the MBYTEWIDEN input is asserted low, the CPU will go into a 8-bit bus mode as defined below. Thus in the single boot PROM system, EPSEL should be connected to MBYTEWIDEN to signify an 8-bit device.

Block fetch mode is not supported.

Parity checking may be externally enabled by using the MPEN input pin.

The following figure provides some timing examples.

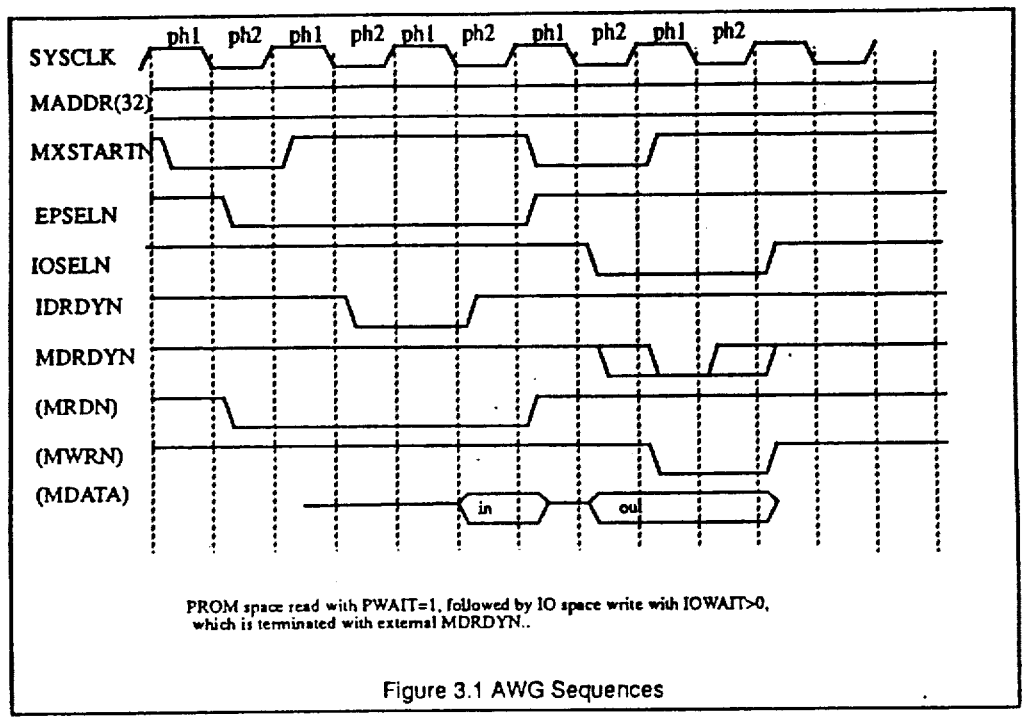
Figure 3.1 AWG Sequences

Preliminary

4.0 8-bit Read Interface

The 8-bit read interface has been provided to support the execution of instructions out of a single 8-bit PROM, especially for booting.

When the MBYTEWIDEN input is asserted low in response to a read request, the CPU assumes that an 8-bit port is being used. This will cause the CPU to fetch 4 independent bytes for a word access, and perform byte gathering before continuing. The 8-bit device must be attached to bits 7 to 0 of the data bus.

Parity checking should not be enabled(MPEN should be asserted high), or if parity checking is required, correct parity must be generated for the entire 32 bit bus.

The core CPU always fetches all 4 bytes and gathers them into a word before proceeding, regardless of the Load Instruction type. No special support is provided for store Instructions, but stores to an 8-bit device can be handled by properly addressing the device from the CPU, using the standard 32 bit memory interface.

LSI Logic Corp.

Confidential

Preliminary

5.0 Example SRAM Interfaces

The following figure illustrates an example SRAM interface. This is a very simple interface, which does not use the block fetch sequence. The interface logic is simply an address decoder, to generate the chip select, and a register to generate the DRDYN input to the BIU to signal the end of the transaction. This generates a 0 wait state memory sequence. The address decoder, AND function, and FF could of course be implemented in a simple PLD.

The 4 WRN signals are attached to the appropriate bytes of the RAM array. ADRS,CSN, and OEN are attached to each RAM chip.

For slower memories, the DRDYN signal would be delayed the appropriate number of clock cycles.

Parity can be added by adding 4 bits to the RAM array, attaching them to the appropriate WRN signals and to DATAP, and activating MPEN at the same time as DRDYN.

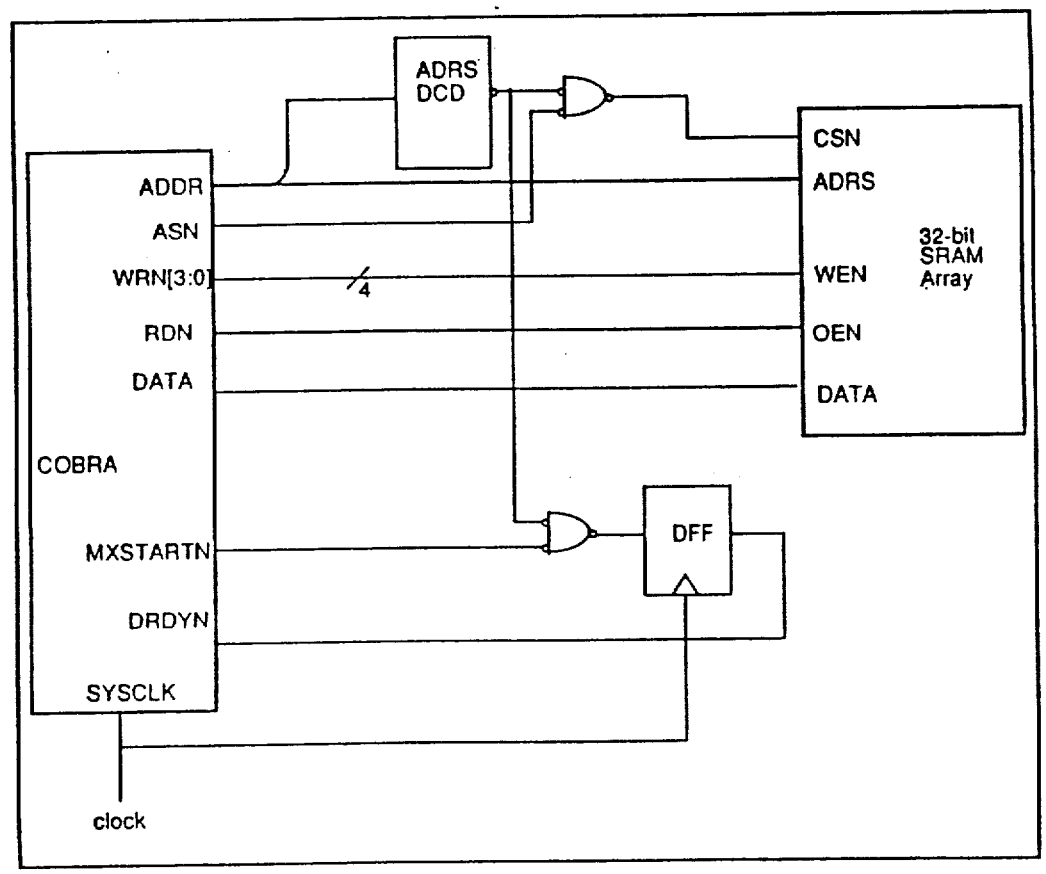

Figure 5.1 Example SRAM Interface using the basic memory bus

The next figure illustrates a memory system which uses the block fetch capability of the Cobra chip for high performance cache refill. In this case a single bank of SRAMs is used. Multiple, interleaved banks could be used to improve the refill rate.

The counter is placed in the address path for the block address of the RAM. This may be 1,2,3, or 4 bits. The CNT is cleared at the beginning of the transaction if BFREQN is active, and incremented for each subsequent word in the block. DRDYN must be asserted active for each word, but can be de-asserted between words to insert wait states for slower memories.

The IPDN output from Cobra can be used to implement different block sizes for the Instruction and Data block fetches. This signal indicates whether instructions or data are being fetched. The block sizes must be programmed accordingly in the Cobra memory configuration register.

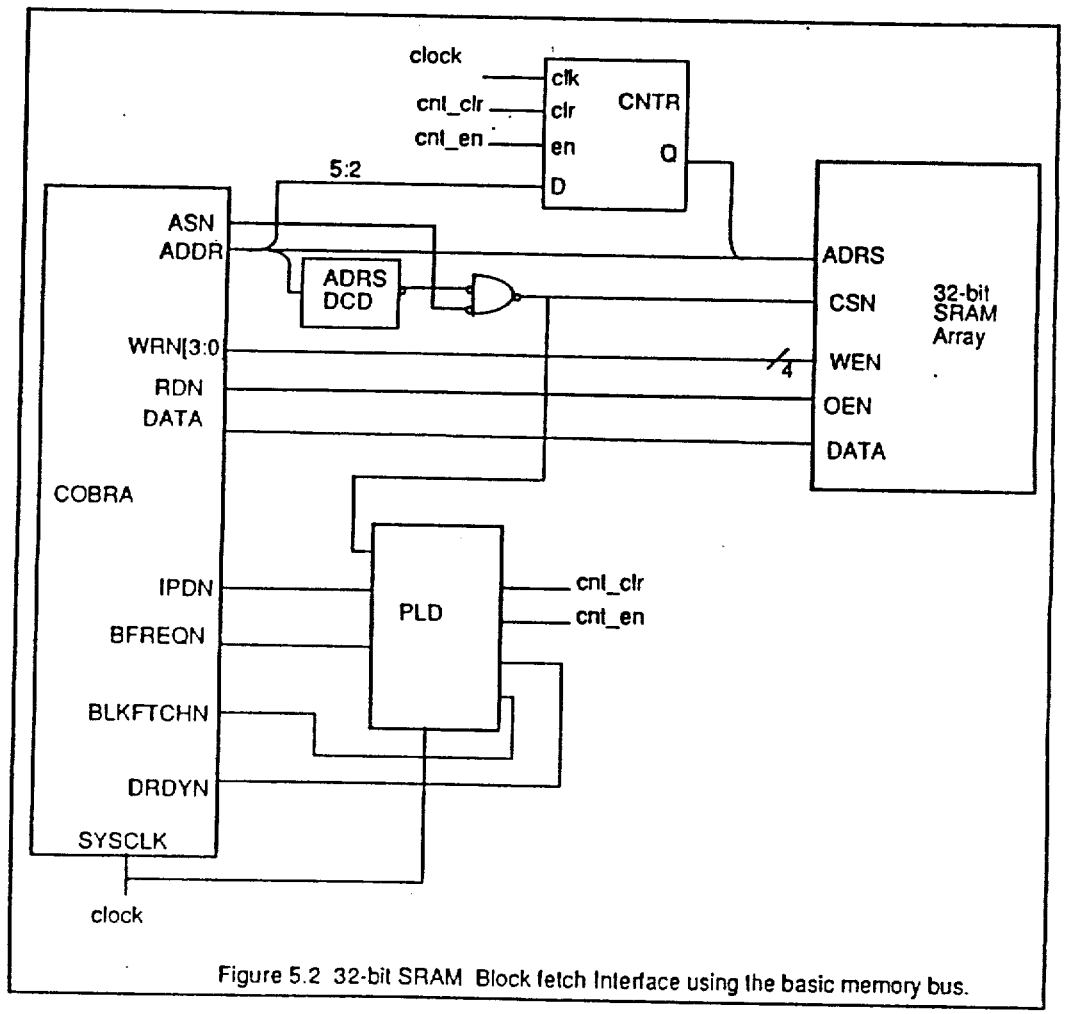

Figure 5.2 32-bit SRAM Block fetch Interface using the basic memory bus.

Preliminary

Interfacing non-burst mode SRAM, or SRAM style peripherals to the Cobra chip is extremely simple if the IO address space and Programmable Wait State Generator are used. The IOWAIT configuration register field is programmed according to the access time of the device. The following figure illustrates the necessary connections.

In this case the basic memory interface signals, RDN and WRN[3:0] are used for distinguishing between reads and writes, and the IOSELN pin is used to select the RAM array. The IOSELN pin will be active for any access in the 16Mbyte IO space, so accesses to unused RAM area will be shadows of used RAM. The 4 WRN pins are routed to the appropriate bytes.

In this example parity is not used. Parity could be enabled by using the DATAP pins and asserting the MPEN pin low when IOSELN is low.

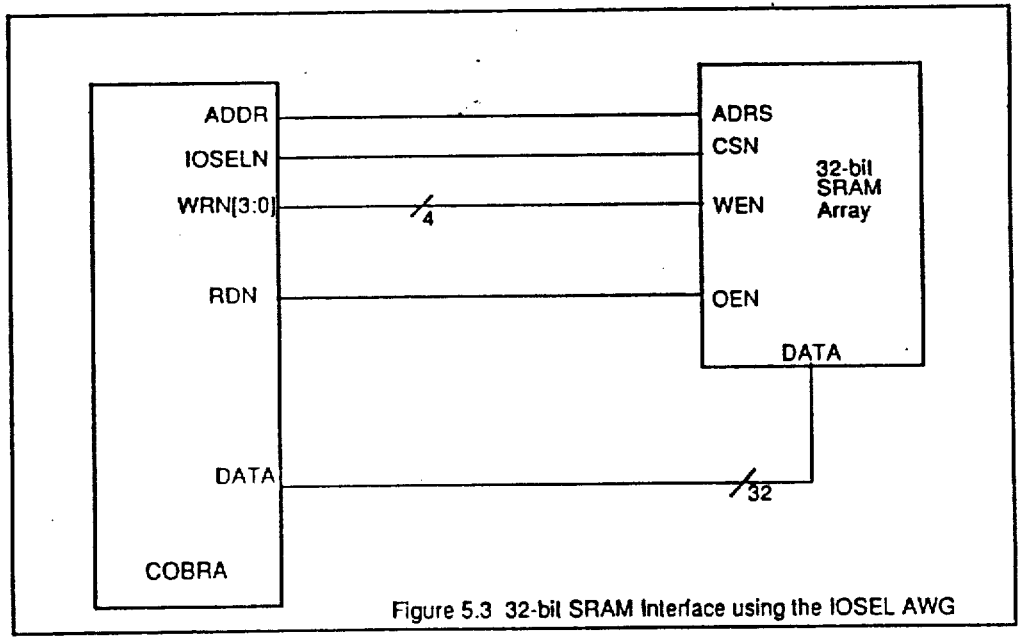

Figure 5.3 32-bit SRAM Interface using the IOSEL AWG

6.0 Example DRAM Interfaces

The following figure shows a minimal DRAM system when using the on chip DRAM Controller. The DRAM array may be 8 or 9 chips at 256k by 4 or 1Meg by 4, 32 or 36 chips at 1M by 1, etc. Driving different size arrays is just a matter of changing the Address multiplexor ROW and COLUMN addresse bits, and the number of bits which are multiplexed. The buffers then must be matched to the amount of load they are driving. RAS and CAS timing can be controlled by the on chip configuration register.

The ADRS, RASN, CASN, and OEN signals are routed to each of the DRAMs. The 4 WRN signals are routed to the chips which correspond to the 4 bytes in a word. Thus WRN[0] is routed to the DRAMs attached to DATA[7:0] and if parity is used, DATAP[0]. If 4 bit wide DRAMs and parity are used, the parity chip must have write per bit capability.

No additional external control or refresh timer logic is needed.

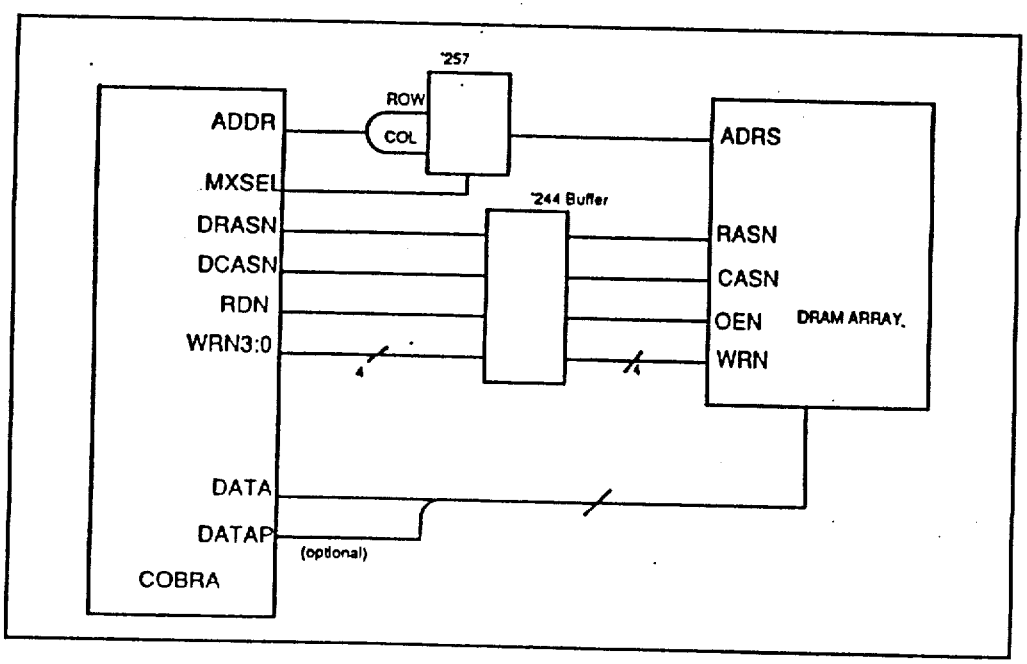

Figure 6.1 Minimal DRAM System

The following figure shows an interleaved DRAM system which uses the on chip DRAM Controller with additional external control logic. In this case the memories are 2-way interleaved. The Cobra on-chip DRAM controller is used to initiate a cycle, and external logic is then used to generate the CAS and Block address to the DRAMs, and to control the data multiplexor which selects the appropriate bank. In addition, the external control block must generate the DRDYN and BLKFETCHN signals into the CPU.

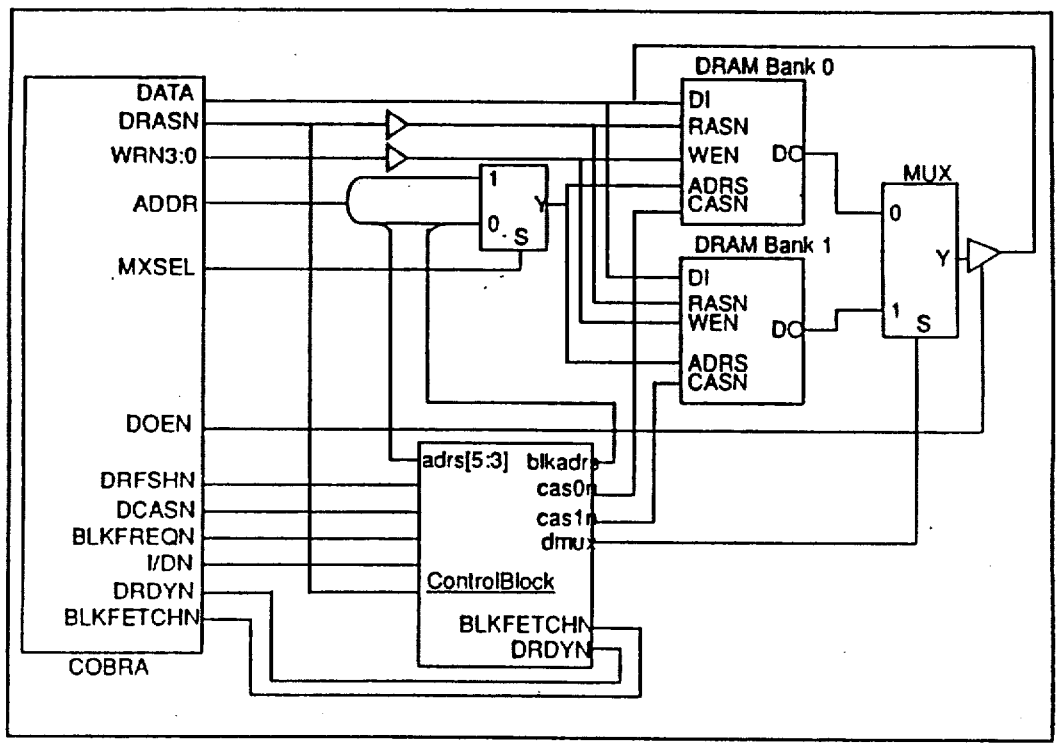

Figure 6.2 Interleaved DRAM Example

7.0 Example BOOT PROM Interfaces

If a basic 8 bit PROM or EPROM is to be used as the boot device, and speed is not critical, interfacing is very easy. The only extra chip required is a 8-bit tristate driver, due to the long tristate disable times for most slow PROMs. The following figure illustrates the connections. Notice the EPSEL signal must be connected to the MBYTEWIDEN signal to signify a 8 bit port.

This interface uses the AWG feature on Cobra to eliminate external control logic. After a power on reset, instructions and data will be fetched from the PROM with 15 inserted wait states, until software changes the PWAIT field in the configuration register.

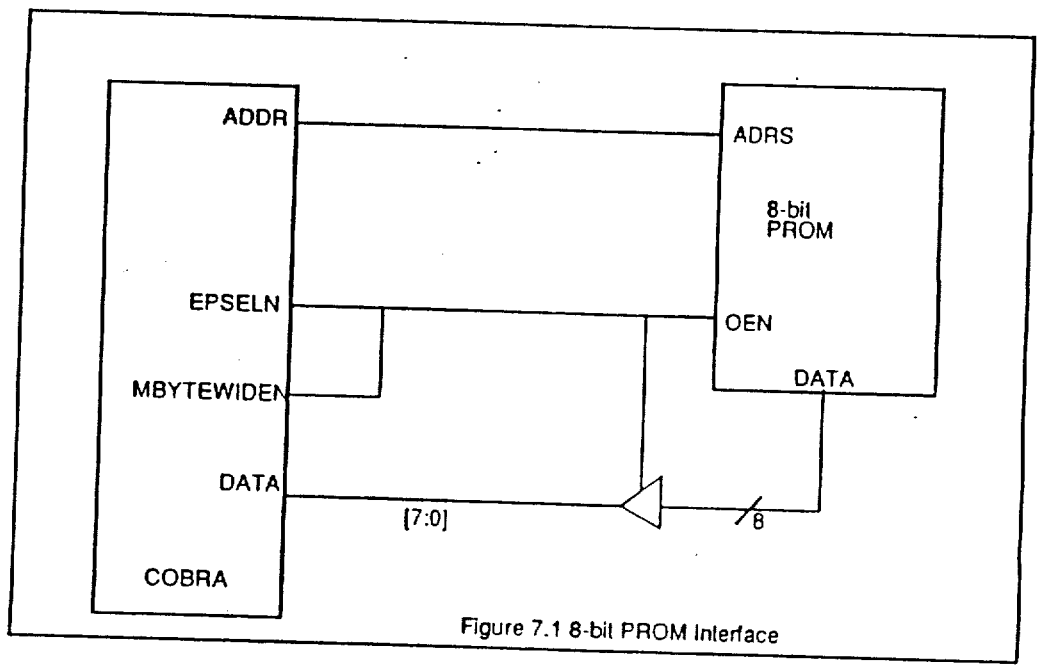

Figure 7.1 8-bit PROM Interface

For a higher performance PROM interface, 32 bit PROM can be supported in a similar manner as demonstrated in the following figure. Note that MBYTEWIDEN is pulled high to indicate a 32 bit bus.
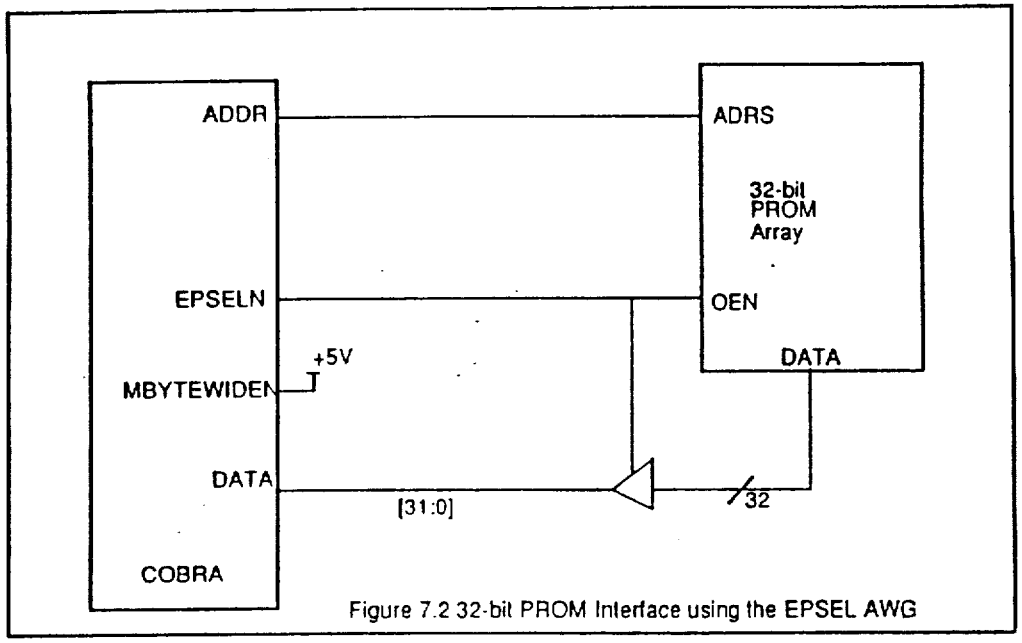
Figure 7.2 32-bit PROM Interface using the EPSEL AWG

MIPS NOTES

MIPS Notes

SUBJECT: BIU MODULE BLOCK DESCRIPTIONS

AUTHOR: MICHAEL L. FUCCIO

CREATED: August 29 1990

Appendix 6

FILE NAME: /usr/up/data/cobra/mlf/documents/biublock.frame & biu_block_io_list

Revision History

| Revision | Rev Date | Rev Time | Rev Author | Revision |
|---|---|---|---|---|
| 1.0 | 8/29/90 | 12:00 | Michael Fuccio | Original Document |
| 1.1 | 10/2/90 | 12:00 | Michael L. Fuccio | Rev 1 |
| 1.2 | 10/4/90 | 12:00 | Michael L. Fuccio | Rev 2 showing test-mode. |

LSI Logic Corp.  Confidential

MIPS Notes
0.0) OVERVIEW
In this document I briefly describe the function of the blocks in the COBRA BIU module. The BIU module is composed of 19 blocks as shown in the following figure:.
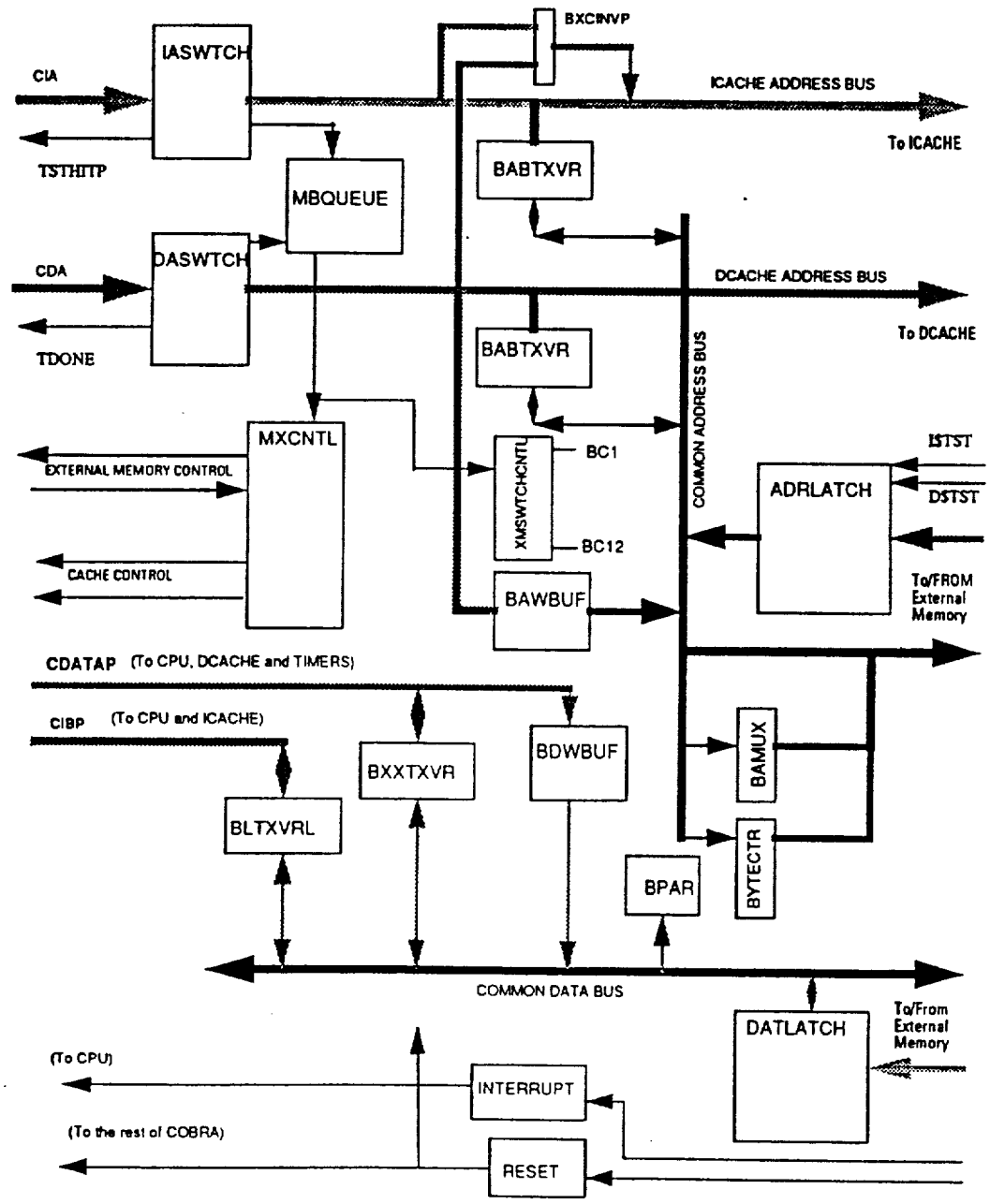
LSI Logic Corp.      - 2 -      Confidential MIPS Notes

1.0) IASWTCH

The IASWTCH block determines whether an instruction fetch for the CPU is in cacheable or non-cacheable memory space. The address (*BSIA*) for an instruction fetch is latched (ph2). This address I will call address i for the i-th instruction address. If the i-th address is for cacheable space the IASWTCH block issues an icache select signal (*BISELP*) and waits for a hit/miss indication (*BHPMN*) from the icache. If the icache indicates a hit then IASWTCH will issue a request to fetch from external memory (*BIXAC*). IASWTCH will also indicate that the requested fetch is an instruction fetch and that it is for cacheable memory space (*BNCABLE*). During the time that the cache determines hit or miss status, the CPU will issue another address (the i+1st instruction address). If IASWTCH has requested an instruction fetch from external memory the i+1st address is ignored and the previously latched ith address is applied to the BIU's common address bus so that it may be presented off-chip.

Having determined that an off-chip memory transaction is required, IASWTCH issues an instruction stall request (*BISTALLP*). This instruction stall request is cleared when the required transaction has completed.

In addition to the aforementioned stall request, the IASWTCH block issues an instruction stall request if an ifetch is required and the external bus has been granted. This stall request is cleared after the bus has been relinquished by the external system and the instruction fetch requested has completed. An istall request is generated if an ifetch is required and the external bus is busy doing a write (possible because of write buffer). This stall request is cleared when the on-going write has finished and the instruction fetch has been serviced. The IASWTCH block also issues an instruction stall request when bus snooping is being performed. Buss snooping stalls are fixed in duration. The last reason for generating an instruction stall request is for icache access mode (test-mode). An instruction cache read takes 3 stall cycles and an icache write takes 2 cycles.

2.0) DASWTCH

This block is analogous to IASWTCH except that it performs services for the data cache and the data memory transaction.

The DASWTCH block determines whether a data transaction is in cacheable or non-cacheable memory space. The address (*BDA*) for a data read/write is latched (ph2). If this i-th data address is for cacheable space the DASWTCH block issues a dcache select signal (*BDRSELP,BDWSELP*) and waits for a hit/miss indication (*BDHPMN*) from the dcache. While DASWTCH is waiting for this hit/miss indicator the CPU may issue another data address (the i+1st data address). When a dcache miss is detected the DASWTCH block requests a data read/write operation from external memory (*BDXACP*). If a data fetch is required, the DASWTCH block selects the previously latched (ith) address to be placed on the BIU's common address bus to be sent to external memory. In the case of a store request, the address for the store is placed on the BIU's common address bus by LSI Logic Corp.    Confidential the write buffer (BAWBUF block). If the dcache indicates a hit the i+1st address is latched and sent to the data cache for the next dcache access.

Having determined that an external data fetch is required the DASWTCH block issues a data stall request. This request remains asserted until the external fetch has completed.

In addition to the aforementioned stall request, the DASWTCH block issues stall requests if a data fetch is required while an on-going write transaction is taking place on the external memory bus. Similarly, if a data store operation is requested while a write transaction is on-going with external memory a data stall will be requested. This stall request is cleared when the on-going write operation has completed.

3.0) MBQUEUE

This block consists of a 3-deep/ 4-bit wide queue. This queue maintains four bits of information pertaining to external memory accesses. First is the External memory transaction start bit (*BTXSTART*). Second is the instruction/data transaction bit (*BIPDN*). Third is the cacheable/non-cacheable transaction bit (*BNCABLEP*). Fourth is the read/write transaction bit (*BWRRD*).

These four bits are derived from information provided from the IASWTCH and DASWTCH blocks. In the event that two accesses (instruction and data) are required (as determined in the IASWTCH and DASWTCH blocks) the information pertaining to both these accesses are placed in the queue with the instruction access information being placed ahead of the data accessd information in the queue. Thus the queue can be parallel-loaded. The presence of the transaction start (*BTXSTART*) information at the head of the queue causes an external memory access to be started using the information from the head of the queue. Information at the head of the queue is also used to configure the BIU data paths to provide information from the correct source to the correct destination.

When an external memory transaction for the request at the head of the queue has completed, the contents of the queue are shifted so that the next queued access is brought to the head of the queue and the external memory transaction for that request is started.

4.0) MXCNTL

This block is responsible for issuing external memory control signals and responding to external control inputs. The controller is stimulated by an external transaction request from the MBQUEUE block. The MXCNTL block issues memory control sequences based upon the information at the head of the queue in the MBQUEUE block.

If the requested transaction is for non-cacheable data then the MXCNTL block will not assert the block fetch request and not assert control strobes for the caches. If the requested transaction is for cacheable data then MXCNTL will request a block fetch and, regardless of whether the block fetch is acknowledged, will issue control signals to the appropriate cache to perform cache refilling.

MIPS Notes

When the memory transaction is done, the MXCNTL block indicates this fact so that the queue (MBQUEUE) can be shifted and the appropriate stall ( see IASWTCH or DASWTCH) can be alleviated.

The transaction done signals are issued when the memory transaction terminates via assertion of the data ready signals ( *MDRDYN* or *XDRDYN*) or in response to assertion of bus error signals (*BERRORN*).

5.0) XMSWTCHCNTL

This block controls the BIU data path configuration. The block is composed of a decoder whose outputs configure the BIU data path depending upon the inputs from the MBQUEUE block and also inputs from IASWTCH and DASWTCH blocks. The BIU data path must be configured for the following operations:

1) Instruction fetch/refill
2) Data fetch/refill
3) Data Write
4) Instruction cache access read. (test-mode read of icache)
5) Instruction cache access write (test-mode write to icache)
6) Data cache access read.( test-mode read of dcache)
7) Data cache access write ( test-mode write to dcache)
8) Bus snooping.
9) High Impedance mode
10) Default operation.

In operation 1, the CPU instruction address bus is enabled onto the BIU's common address bus, the BIU's common data bus is enabled onto the CPU's instruction bus while the CPU's data address bus is passed to the data cache and the BIU is the default driver of the CPU's data bus until it is disabled by some data bus request (ie from the dcache).

In operation 2, the CPU data address bus is enabled onto the BIU's common address bus. The BIU's common data bus is enabled onto the CPU's data bus while the CPU's instruction address bus is passed to the instruction cache. The BIU is default driver of the CPU's instruction bus until it is disabled by some instruction bus request (ie the icache).

In operation 3, the write-buffer (BAWBUF) address is enabled onto the BIU's common address bus while the write-buffer (BDWBUF) data is enabled onto the BIU's common data bus.

In operation 4, the address on the external pins is placed on the BIU's common address bus, then passes through BABTXVR block to the ICACHE's address bus. Data from the ICACHE is placed on the CPU's instruction bus and passed through BLTXVRL to the BIU's common data bus where it is passed to the external data bus.

LSI Logic Corp.                                                                                          Confidential MIPS Notes In operation 5, the address on the external address pins is placed on the BIU's common address bus, then passed through BABTXVR to the ICACHE's address bus. Data from the external data bus is placed on the BIU's internal data bus via the DATLATCH block. Data is then placed on the CPU's instruction bus by passing through BLTXVRL block.

In operation 6, the address on the external address pins is placed on the BIU's common address bus being passed through the ADRLATCH block. This address is then passed to the DCACHE's address bus via the BABTXVR block. Data is then passed from the CPU's data bus (CDATAP) to the BIU's common data bus via the BXXTXVR block. From the BIU's common data bus the data is passed to the external data bus pins.

In operation 7, the address on the external address bus is passed to the BIU's common address bus vie the ADRLATCH. This address is then passed to the DCACHE address bus by passing through the BABTXVR block. Data for this operation is taken from the external data bus and placed on the BIU's common data bus by the DATLATCH block. Data is then passed to the CPU's data bus (CDATAP) via the BXXTXVR block.

In operation 8, the address on the external address pins is passed to the BIU's common address bus via the ADRLATCH block. This address is then passed to both the ICACHE address bus and the DCACHE address bus via the two BABTXVR blocks. Data bus configuration is irrelevant to this operation.

For operation 9, the external busses are three-stated as well as relevant internal busses.

For operation 10, the default configuration, address information is passed from IASWTCH to the Instruction cache's address bus. Address information is also passed from DASWTCH to the Data cache's address bus. In this default mode, the instruction address from IASWTCH is placed on the BIU's common address bus and sent to the external address pins.

The following describes the function of the XMSWTCHCNTL outputs:

*BC1*: This output enables address from BIU's common address bus onto the instruction cache's address bus.

*BC2*: This output enables address from the instruction cache's address bus onto the BIU's common address bus.

*BC3*: This output enables address from the BIU's common address bus onto the data cache's address bus.

*BC4*: This output enables address from the data cache's address bus onto the BIU's common address bus.

*BC5*: This output enables address from the IASWTCH block onto the instruction cache's LSI Logic Corp.      Confidential address bus.

*BC6*: This output enables address from the DASWTCH block onto the data cache's address bus.

*BC7*: This output enables data from CPU's data bus (CDATAP) onto the BIU's common data bus.

*BC8*: This output enables data from the CPU's instruction bus (CIBP) onto the BIU's common data bus.

*BC9*: This output enables address from the write buffer (BAWBUF) onto the BIU's common address bus.

*BC10*: This output enables data from the write buffer (BDWBUF) onto the BIU's common data bus.

*BC11*: This output enables data from the BIU's data latch onto the BOI's common data bus.

*BC12*: This output enables address in the BIU's address latch onto the BIU's common address bus.

Given these data path control signals it should be noted that the following are mutually exclusive.
That is two or more of the following sets of outputs cannot be high (logic 1) at the same time or else a bus conflict will arise: {*BC1,BC5*: instruction cache address bus}, {*BC2,BC4,BC9,BC12* : BIU's common address bus}, {*BC3, BC6* ; data cache address bus}, {*BC7,BC8,BC10,BC11* : BIU's common data bus}.

6.0) DATLATCH

This block contains the data latch used to sample data on the external memory data bus. This data latch is complicated by the byte-gathering required by the 8-bit port feature on bits 7-0 of the data bus. Loading of each byte is individually controlled by another block ( BYTECTR). This data latch is also used to capture data for access-mode (test mode) operations to the internal caches.

7.0) BPAR

This block checks parity on read operations. Data is provided to this block from the DATLATCH block. Parity is checked on the last datum latched in the DATLATCH on read operations where parity checking is enabled. If a parity error is found, this block generates a parity error signal to the CPU.

8) BYTECTR

LSI Logic Corp.  		-7-  		Confidential

MIPS Notes

This block is used to generate the byte address in an 8-bit port fetch where byte gathering is done. This block contains a loadable modulo-4 counter. The address bits[1:0] are loaded into this counter and the address is incremented modulo-4 until the four bytes have been fetched. This block controls the way bytes are gathered in the DATLATCH block depending upon the byte-order (endianness) configuration.

9) BAMUX

This block multiplexes the proper number of bits (per block size (instruction or data)) onto the external address bus so that the block address is generated for DRAM (or other) accesses. The incrementation of the block address takes place in the MXCNTL block.

10) ADRLATCH

This block latches bus snooping address when the external bus is granted. It also recognizes the need to preform snoop invalidation and issues a request to the IASWTCH bloc to generate stalls for snooping invalidation of the caches. In addition, this block recognizes the cache-access mode (TEST MODE) and requests the appropriate stall cycles for the test-mode be generated in the IASWTCH and DASWTCH blocks.

11) INTERRUPT

This block is very simple. In this block the external interrupt signals are latched and passed to the CPU. Also in this block the COBRA TIMER interrupt requests are logically ORed with the external interrupt signals.

12) BRST

This block recognizes the external reset pin and the HIGHZN pin. This block generates the reset signals for the cold and warm reset operations. When RESETN and HIGHSZN are asserted together this block issues cold reset signals. When RESETN is asserted alone, this block issues warm reset signals (The reset Inhibit signal (BRSTINHP) is asserted.

13) BLTXVRL

This block connects a latched version of the BIU's common data bus to the CPU's instruction bus via 3-state transceivers. These transceivers are controlled by the BC8 output of the XMSWTCHCNTL block and also the icache's instruction bus request signal. In addition, this block provides a flow through path for data during the icache access mode ( TEST-MODE) to/from the icache and the BIU's common data bus. The latch in this block is used to hold instructions until the next fixup cycle. A data fetch may occur before this fixup cycle so the latched instruction must be retained in the latch since the latch in the DATLATCH block will be overwritten by the data fetch.

LSI Logic Corp.      Confidential

MIPS Notes

14) BXXTXVR

This block connects the CPU's data bus to a latched version of the BIU's common data bus via 3-state transceivers. These transceivers are controlled by the BC7 output of XMSWTCHCNTL block as well as the dcache and TIMER data bus request signals.

15) BABTXVR

There are two instantiations of this block in the BIU design namely, U9 and U11.

U11 connects the instruction cache's address bus to the BIU's common address bus via 3-state transceivers. These transceivers are controlled by the BC1 and BC2 signals from the XMSWTCHCNTL block.

U9 connects the data cache's address bus to the BIU's common address bus via 3-state transceivers. These transceivers are controlled by the BC3 and BC4 signals from the XMSWTCHCNTL block.

16) BAWBUF

BAWBUF is the address part of the write-buffer. In this block, addresses for write transactions are stored until used by an external write transaction. As many as two write addresses must be stored. Note also that the byte-marks for the write transaction are also stored in this part of the write-buffer.

17) BDWBUF

BDWBUF is the data portion of the write buffer. In this block, data for write transactions is stored until used by an external write transaction. As many as two data must be stored.

18) BXCINV

This block contains a multiplexer which is used to place the invalidation address on the icache address bus for the cache invalidate operation.

19) Attachments

Attached is a BIU signal list showing the signals associated with each BIU block and their function.

LSI Logic Corp.  Confidential

*MIPS NOTES*

MIPS Notes

| SUBJECT: | On an 8-bit bus size. |
|---|---|
| AUTHOR: | Michael L. Fuccio |
| CREATED: | 12/14/89 |
| FILE NAME: | |

*Appendix 7*

Revision History

| Revision # | Rev Date | Rev Time | Rev Author | Revision |
|---|---|---|---|---|
| 1.0 | 12/14/89 | 11:10 | Michael Fuccio | Original Document |

LSI Logic Corp.      Confidential

MIPS Notes

1.0) Introduction

In this memo I briefly describe a byte-wide interface which can provide the COBRA chip with the ability to fetch instructions and data in a byte-wise fashion from and 8-bit port such as 8-bit wide boot PROM. The COBRA has a 32-bit word instruction size and also accesses data types of words (32-bits) halfwords (16-bits) and bytes (8-bits). In order to fetch an instruction from an eight bit device, therefore, requires four fetches (8-bits each) before the instruction can be used by the COBRA. Similarly, a data size of a word requires four fetches from an 8-bit device. The halfword data fetch requires two fetches from an 8-bit port. Writes to memory become problematic because the data written to an eight bit port must know on which eight bits of the bus the device resides, or else the data must be replicated for each byte. In addition, the word write operation requires four byte writes and the halfword write operation requires two byte writes.

2.0) Dynamic Bus Sizing.

Dynamic bus sizing is a feature where a 32-bit machine can accommodate and 8-bit or 16-bit wide memory system. In addition, the dynamic aspect of this feature means that the size of the memory device that is supported is determined on a per transaction basis. The MC 68020 from Motorola was the first microprocessor to fully support dynamic bus sizing (at least to my knowledge). In addition to supporting a variable bus size (8,16 or 32 bits) it also supported non-aligned memory fetches.

3.0) Complexity.

Dynamic bus sizing is complex because of all the combinations of data types, placement of ports on the bus, parity generation/checking, and endian-ness. In addition, complexity is increased when one considers each exceptional condition which may occur on any memory fetch ie retry or bus error.

My goal in this memo is to provide as simple an interface to an 8-bit port as I can and hope that it is acceptable to customers.

4.0) Eliminating complexity.

I propose here a method to support 8-bit wide boot PROM in the COBRA architecture. It is heavily biased towards keeping the COBRA BIU design as simple as possible. I make the following assumptions:

> 1) Every time COBRA accesses the 8-bit port, it performs a fetch of four bytes regardless of the data size. This is implied for instruction fetches, however, enforcing this on data fetches even for HALFWORD and BYTE data types simplifies the implementation. In this scheme four bytes are gathered, irrespective of the data size the CPU requires. The CPU will only recognize that data which it is fetching given that it LSI Logic Corp.      Confidential MIPS Notes is presented a WORD.

2) No support for WORD or HALFWORD *writes* to 8-bit memory. Since the object is to support boot PROM this seems to be acceptable. This significantly reduces BIU complexity. Byte writes to the 8-bit port can only occur on bits 7-0 of the data bus. this corresponds to MADDR[1:0] of 00 or 11 depending upon the configured "endian-ness".

3) All instruction words in the boot PROM are at word aligned addresses.

4) Support for both byte orderings in the COBRA architecture.

5) Assume 8-bit PROM resides on bits 7-0 of the MDATA bus.

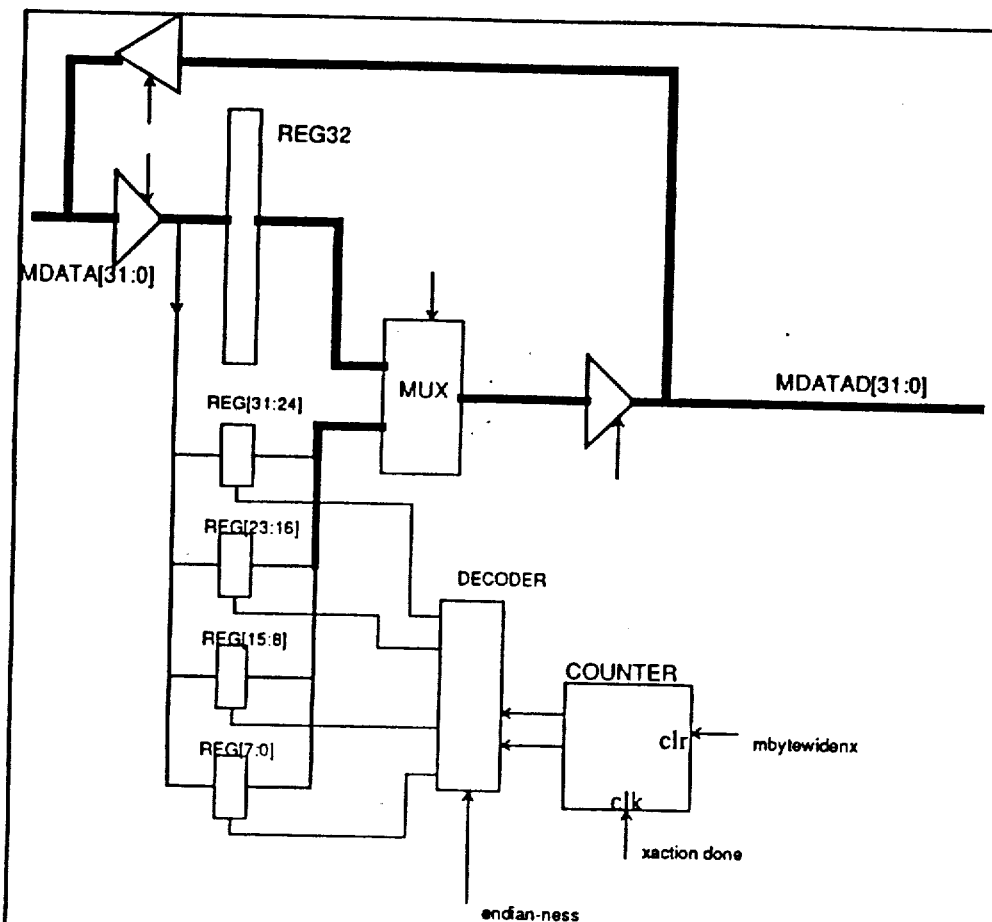

Figure 1. Internal DATA Path Modifications

From figure 1 one sees that the first cut impact on the data path (MDATAD) is the addition of four eight bit registers and a multiplexer. To control the register and MUX is a 2-bit counter and a 2:4 decoder which has selective inversion of its outputs based on the "endian-ness" configuration.

In addition to this impact, the parity checking circuitry must be configurable to recognize that parity for the word accesses is only to be checked on bits 7-0 of the data bus.

Figure 2 shows the impact on the address path (MADDRD). As can be seen, here a 2-bit, loadable, modulo 4, counter is needed to increment the address for each fetch. In addition, a 2-bit 2:1 multiplexer is required to select the output of the counter for bits [1:0] of the memory address.'

As far as impact on the control of the memory interface, I plan to use a method similar to the retry MIPS Notes in order to generate the additional memory transactions. Basically, the state machine which controls a memory transaction will be re-started once for each byte fetched from the 8-bit port. After each memory transaction is complete the address will be incremented. When four fetches are completed, the data gathered in a bytewise fashion will be presented to the CPU and/or cache memory as a WORD. The state machine will be configured to restart by an externally generated signal BYTEWIDEN which will be sampled at the same time as other memory transaction inputs.

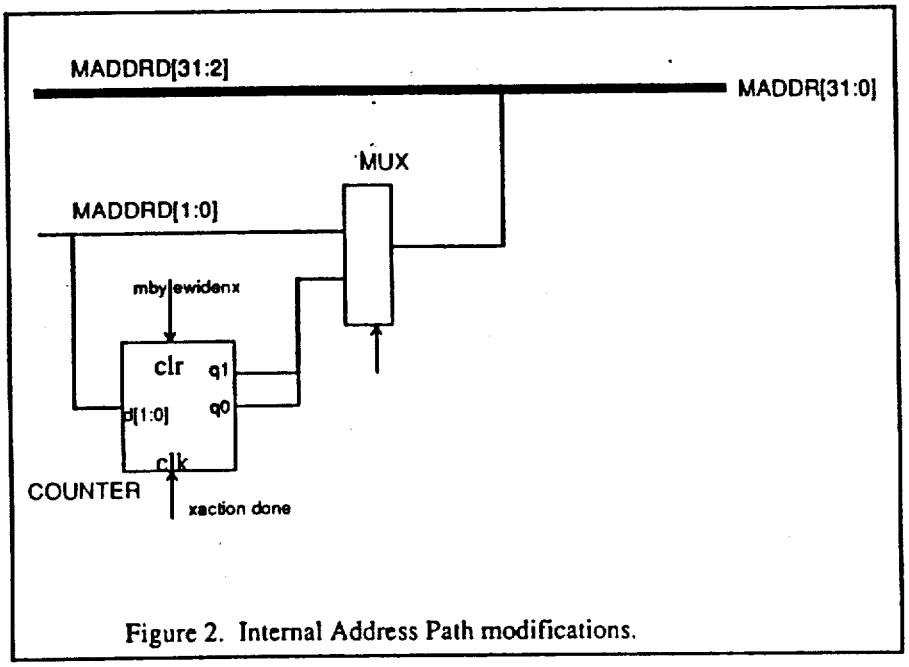

Figure 2. Internal Address Path modifications.

5.0) System Perspective

The requirements on the system designer, given the assumptions in section 4 are as follows:

1) 8-bit port resides on bits 7-0 of the data bus (MDATA[7:0]). Byte writes can only be to MADDR[1:0] = 00 or 11 depending upon endian-ness. Since the objective is to support boot PROM this write restriction is probably moot.

2) Endian-ness is properly configured.

4) When the PROM is accessed (memory space decode) the external system asserts the BYTEWIDEN pin. This always causes the MIPS Notes
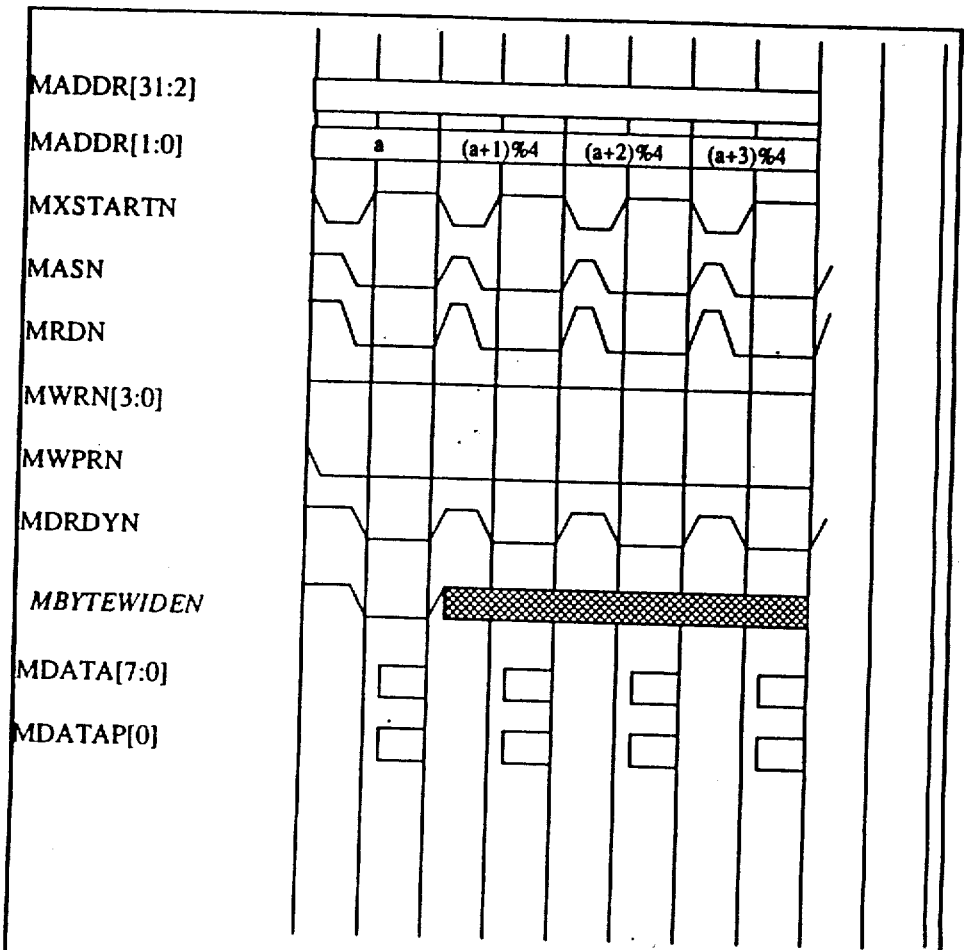
Figure 3. External Interface Protocol.
In figure 3, each individual transaction will accept RRETRYN requests, MPEN requests and MDRDYN inputs. Hence, each individual byte fetch can be retried, parity checking enabled and have variable number of wait states. In addition, each byte fetch can be signalled with BERRORN.
LSI Logic Corp.    - 7 -    Confidential MIPS Notes However, if a byte-wide port is indicated via the MBYTEWIDEN pin at the same time that a block fetch request is acknowledged (MBLKFTCHN) the block fetch will NOT be performed. Rather, the byte collection for the fetched word is completed and no block fetching is performed for subsequent words of a block.

6.0) Conclusion

I have described the behaviour of a mechanism which allows support of a byte-wide boot PROM. It is a minimal interface placing some restrictions on the system designer/programmer.

7.0) Remaining Questions

Is this minimal interface adequate for the targeted markets/customers?

Can data type restrictions (WORD) be enforced upon the programmer?

What is claimed is:

1. Embedded testable cache memory system on a microprocessor chip consisting essentially of:

a processor (CPU) having an external memory interface, said external memory interface including a multi-bit external memory address signal;

a multi-bit cache address signal formed of a first portion of said multi-bit memory address signal;

a multi-bit comparison address signal formed of a second portion of said multi-bit memory address signal, said comparison address signal providing a comparison address value;

a cache, responsive to the cache address signal, having a first part for storing data or instructions and a second part for storing address tags;

a bus interface unit (BIU) for controlling interchange of signals between the CPU, the cache, and the external memory interface;

a comparator associated with the second part of the cache for issuing a tag hit signal when an address tag stored at a cache location indicated by said cache address signal matches the comparison address value, and for issuing a tag miss signal when the address tag stored at the cache location indicated by the cache address signal differs from the comparison address value;

said BIU copying data values from selected accesses between the CPU and the external memory interface into the first part of the cache, and storing address tags corresponding to the data values so stored into the second part of the cache;

said BIU providing data values to the CPU from the second part of the cache when the comparator issues a tag hit signal in response to a CPU access;

means for placing said BIU in a test mode;

means for bypassing said BIU in said test mode and writing data directly into the first and second parts of the cache;

means for bypassing said BIU in said test mode and providing an externally generated value to the comparator; and means for outputting the tag hit signal and the tag miss signal in the test mode.

2. Method for testing an embedded cache memory system on an microprocessor chip comprising:

providing a microprocessor chip consisting essentially of:

a processor (CPU) having an external memory interface, said external memory interface including a multi-bit external memory address signal;

a multi-bit cache address signal formed of a first portion of said multi-bit memory address signal;

a multi-bit comparison address signal formed of a second portion of said multi-bit memory address signal, said comparison address signal providing a comparison address value;

a cache, responsive to the cache address signal, having a first part for storing data or instructions and a second part for storing address tags;

a bus interface unit (BIU) for controlling interchange of signals between the CPU, the cache, and the external memory interface;

a comparator associated with the second part of the cache for issuing a tag hit signal when an address tag stored at a cache location indicated by said cache address signal matches the comparison address value, and for issuing a tag miss signal when the address tag stored at the cache location indicated by the cache address signal differs from the comparison address value;

said BIU copying data values from selected accesses between the CPU and the external memory interface into the first part of the cache, and storing address tags corresponding to the data value so stored into the second part of the cache;

said BIU providing data values to the CPU from the second part of the cache when the comparator issues a tag hit signal in response to a CPU access;

means for placing the BIU in a test mode;

means for bypassing said BIU in said test mode and writing data directly into the first and second parts of the cache;

means for bypassing said BIU in said test mode and providing an externally generated value to the comparator; and means for outputting the tag hit signal and the tag miss signal in the test mode;

placing the BIU the test mode;

writing data value directly to the first part of the cache and a tag value to the second part of the cache;

performing a first CPU read access such that the comparison value matches the tag value written to the second part of the cache and monitoring the tag hit signal and tag miss signal responses thereto;

performing a second CPU read access such that the comparison value differs from the tag value written to the second part of the cache and monitoring the tag hit signal and tag miss signal responses thereto;

comparing the tag hit signal and tag miss signal responses to the first read access with a first expected tag hit signal value and a first expected tag miss signal value, respectively; and comparing the tag hit signal and tag miss signal responses to the second read address with a second expected tag hit signal value and a second expected tag miss signal value, respectively.

* * * * *